United States Patent
Yamazaki et al.

(10) Patent No.: US 7,808,000 B2
(45) Date of Patent: Oct. 5, 2010

(54) THIN FILM TRANSISTOR, DISPLAY DEVICE HAVING THIN FILM TRANSISTOR, AND METHOD FOR MANUFACTURING THE SAME

(75) Inventors: Shunpei Yamazaki, Setagaya (JP); Yoshiyuki Kurokawa, Sagamihara (JP); Yasuhiro Jinbo, Atsugi (JP); Satoshi Kobayashi, Atsugi (JP); Daisuke Kawae, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 29 days.

(21) Appl. No.: 12/243,097

(22) Filed: Oct. 1, 2008

(65) Prior Publication Data

US 2009/0090916 A1    Apr. 9, 2009

(30) Foreign Application Priority Data

Oct. 5, 2007    (JP) ............................. 2007-262738
Oct. 12, 2007   (JP) ............................. 2007-267075

(51) Int. Cl.
    *H01L 29/10* (2006.01)
(52) U.S. Cl. .................... 257/66; 257/72; 257/E21.533; 257/E21.535
(58) Field of Classification Search .................. 257/66, 257/72, E21.533, E21.535
    See application file for complete search history.

(56) References Cited

U.S. PATENT DOCUMENTS

| | | | |
|---|---|---|---|
| 4,409,134 A | 10/1983 | Yamazaki |
| 5,453,858 A | 9/1995 | Yamazaki |
| 5,514,879 A | 5/1996 | Yamazaki |
| 5,614,732 A | 3/1997 | Yamazaki |
| 5,701,167 A | 12/1997 | Yamazaki |
| 5,849,601 A | 12/1998 | Yamazaki |
| 5,859,445 A | 1/1999 | Yamazaki |
| 6,011,277 A | 1/2000 | Yamazaki |
| 6,023,075 A | 2/2000 | Yamazaki |
| 6,252,249 B1 | 6/2001 | Yamazaki |
| 6,281,520 B1 | 8/2001 | Yamazaki |
| 6,306,213 B1 | 10/2001 | Yamazaki |

(Continued)

FOREIGN PATENT DOCUMENTS

JP    58-092217    6/1983

(Continued)

*Primary Examiner*—Zandra Smith
*Assistant Examiner*—Paul E Patton
(74) *Attorney, Agent, or Firm*—Eric J. Robinson; Robinson Intellectual Property Law Office, P.C.

(57) ABSTRACT

A thin film transistor with excellent electric characteristics, a display device having the thin film transistor, and a method for manufacturing the thin film transistor and the display device are proposed. The thin film transistor includes a gate insulating film formed over a gate electrode, a microcrystalline semiconductor film formed over the gate insulating film, a buffer layer formed over the microcrystalline semiconductor film, a pair of semiconductor films to which an impurity element imparting one conductivity type is added and which are formed over the buffer layer, and wirings formed over the pair of semiconductor films to which the impurity element imparting one conductivity type is added. A part of the gate insulating film or the entire gate insulating film, and/or a part of the microcrystalline semiconductor or the entire microcrystalline semiconductor includes an impurity element which serves as a donor.

15 Claims, 63 Drawing Sheets

U.S. PATENT DOCUMENTS

| | | |
|---|---|---|
| 6,737,676 B2 | 5/2004 | Yamazaki |
| 7,067,844 B2 | 6/2006 | Yamazaki |
| 7,098,479 B1 | 8/2006 | Yamazaki |
| 7,115,902 B1 | 10/2006 | Yamazaki |
| 7,205,171 B2 | 4/2007 | Luo et al. |
| 7,375,372 B2 | 5/2008 | Luo et al. |
| 7,420,209 B2 * | 9/2008 | Suzawa et al. ............ 257/59 |
| 2007/0018165 A1 | 1/2007 | Yamazaki |

FOREIGN PATENT DOCUMENTS

| | | |
|---|---|---|
| JP | 60-160170 | 8/1985 |
| JP | 62-067872 | 3/1987 |
| JP | 63-258072 | 10/1988 |
| JP | 04-242724 | 8/1992 |
| JP | 06-326312 | 11/1994 |
| JP | 2005-049832 | 2/2005 |

* cited by examiner

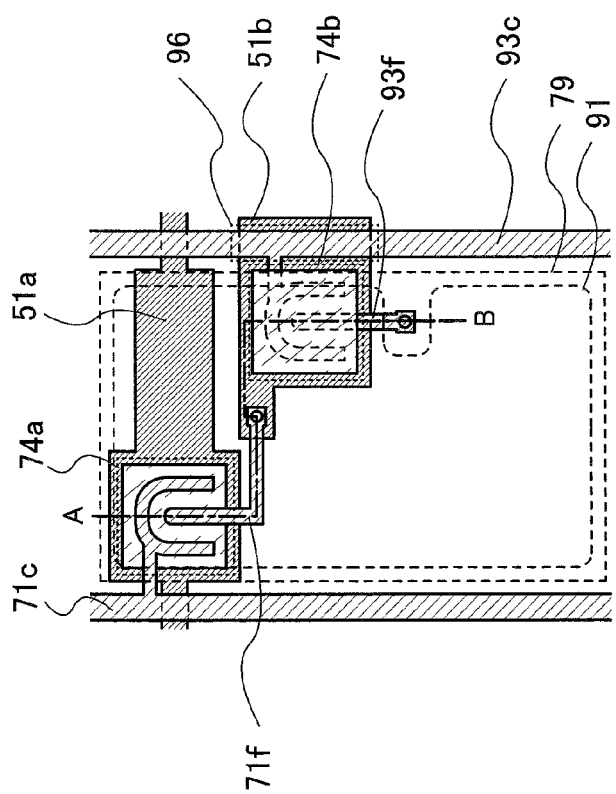
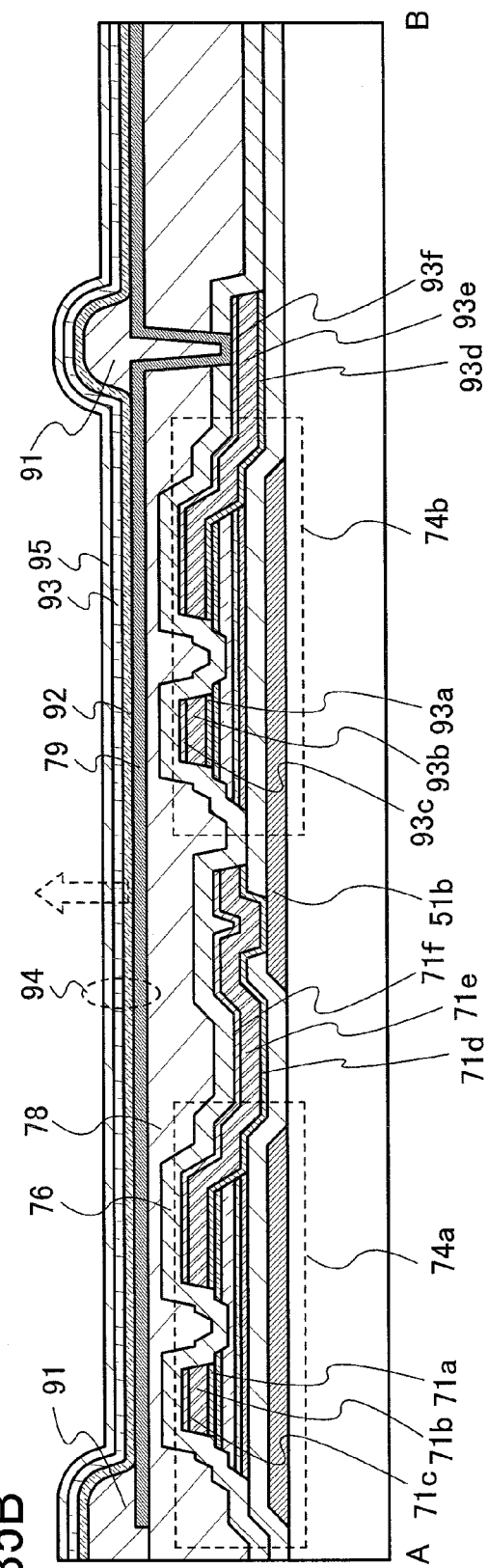
FIG. 35A
FIG. 35B

THIN FILM TRANSISTOR, DISPLAY DEVICE HAVING THIN FILM TRANSISTOR, AND METHOD FOR MANUFACTURING THE SAME

BACKGROUND OF THE INVENTION

1. Field of the Invention

The present invention relates to a thin film transistor, a display device having the thin film transistor at least in a pixel portion, and a method for manufacturing the thin film transistor and the display device.

2. Description of the Related Art

In recent years, technology for forming thin film transistors using a thin semiconductor film (with a thicknesses of from several tens of nanometers to several hundreds nanometers, approximately) formed over a substrate having an insulating surface has been attracting attention. Thin film transistors are applied to a wide range of electronic devices such as ICs or electro-optical devices, and prompt development of thin film transistors that are to be used as switching elements in display devices, in particular, is being pushed.

As a switching element in a display device, a thin film transistor including an amorphous semiconductor film, a thin film transistor including a polycrystalline semiconductor film, or the like is used. As a method for forming a polycrystalline semiconductor film, a technique is known in which a pulsed excimer laser beam is processed into a linear shape with an optical system, and an amorphous silicon film is scanned with the linear beam, thereby being crystallized.

As a switching element in a display device, further, a thin film transistor including a microcrystalline semiconductor film is used (see Reference 1: Japanese Published Patent Application No. H4-242724 and Reference 2: Japanese Published Patent Application No. 2005-49832).

SUMMARY OF THE INVENTION

A thin film transistor including a polycrystalline semiconductor film has advantages that the field effect mobility thereof is two or more orders of magnitude higher than that of a thin film transistor including an amorphous semiconductor film, and that a pixel portion and a peripheral driver circuit of a display device can be formed over one substrate. However, the thin film transistor including a polycrystalline semiconductor film requires a more complicated process than the thin film transistor including an amorphous semiconductor film because of crystallization of the semiconductor film. Thus, there are problems such as reduction in yield and increase in cost.

Further, an inverted staggered thin film transistor including a microcrystalline semiconductor film has problems in that the crystallinity of an interface region between a gate insulating film and a microcrystalline semiconductor film is low and electric characteristics are poor.

In view of the above problems, it is an object of the present invention to provide a thin film transistor having excellent electric characteristics, a display device having the thin film transistor, and a method for manufacturing the thin film transistor and the display device.

An aspect of the present invention is a thin film transistor including a gate insulating film formed over a gate electrode, a microcrystalline semiconductor film formed over the gate insulating film, a buffer layer formed over the microcrystalline semiconductor film, a pair of semiconductor films to which an impurity element imparting one conductivity type is added and which is formed over the buffer layer, and wirings formed over the pair of semiconductor films to which the impurity element imparting one conductivity type is added; in which a part of the gate insulating film or the entire gate insulating film, and/or a part of the microcrystalline semiconductor film or the entire microcrystalline semiconductor film includes an impurity element which serves as a donor.

Further, typically, a feature of the thin film transistor of the present invention is that a region of the microcrystalline semiconductor film which is in contact with the gate insulating film includes the impurity element which serves as a donor. In that case, the entire microcrystalline semiconductor film may include the impurity element which serves as a donor. Further, only a region of the microcrystalline semiconductor film which is in contact with the gate insulating film may include the impurity element which serves as a donor. In that case, a first microcrystalline semiconductor film including the impurity element which serves as a donor is formed in the region which is in contact with the gate insulating film, and a second microcrystalline semiconductor film is formed over the first microcrystalline semiconductor film. The second microcrystalline semiconductor film does not include the impurity element which serves as a donor at a higher concentration than the detection limit of secondary ion mass spectrometry (SIMS).

Alternatively, a feature of the thin film transistor of the present invention is that the gate insulating film includes the impurity element which serves as a donor.

Further alternatively, a feature of the thin film transistor of the present invention is that a first microcrystalline semiconductor film that is in contact with a gate insulating film, a second microcrystalline semiconductor film that is in contact with the first microcrystalline semiconductor film and includes an impurity element which serves as a donor, and a third microcrystalline semiconductor film that is in contact with the second microcrystalline semiconductor film including the impurity element which serves as a donor are formed. The first microcrystalline semiconductor film and the third microcrystalline semiconductor film do not include the impurity element which serves as a donor at a higher concentration than the detection limit of SIMS.

Here, the peak concentration of the impurity element which serves as a donor and is included in the gate insulating film or the microcrystalline semiconductor film is from $6 \times 10^{15}$ atoms/cm$^3$ to $3 \times 10^{18}$ atoms/cm$^3$ inclusive, preferably from $3 \times 10^{16}$ atoms/cm$^3$ to $3 \times 10^{17}$ atoms/cm$^3$ inclusive. Further, the concentration of the impurity element which serves as a donor is determined by the peak value of the concentration distribution (concentration profile) which is measured by SIMS.

Another feature of the present invention is that a gate insulating film and/or a microcrystalline semiconductor film which includes an impurity element which serves as a donor is formed and a thin film transistor is formed in which the microcrystalline semiconductor film serves as a channel formation region. In the microcrystalline semiconductor film that serves as a channel formation region, the peak concentration of the impurity element which serves as a donor is from $6 \times 10^{15}$ atoms/cm$^3$ to $3 \times 10^{18}$ atoms/cm$^3$ inclusive, preferably from $3 \times 10^{16}$ atoms/cm$^3$ to $3 \times 10^{17}$ atoms/cm$^3$ inclusive.

Typically, a gate insulating film is formed over a gate electrode; a gas including an impurity element which serves as a donor is introduced to a reaction chamber, and then a microcrystalline semiconductor film including the impurity element which serves as a donor is formed over the gate insulating film, using a deposition gas including silicon or germanium, and hydrogen; and a thin film transistor is manufactured using the microcrystalline semiconductor film including the impurity element which serves as a donor.

Alternatively, a gate insulating film is formed over a gate electrode; a first microcrystalline semiconductor film including an impurity element which serves as a donor is formed over the gate insulating film, using a gas including the impurity element which serves as a donor, a deposition gas including silicon or germanium, and hydrogen; a second microcrystalline semiconductor film is formed over the first microcrystalline semiconductor film including the impurity element which serves as a donor, using a deposition gas including silicon or germanium, and hydrogen; and a thin film transistor is manufactured using the first microcrystalline semiconductor film including the impurity element which serves as a donor and the second microcrystalline semiconductor film.

Further alternatively, a gate insulating film including an impurity element which serves as a donor is formed over a gate electrode, using a gas including the impurity element which serves as a donor, and a deposition gas including silicon or germanium; a microcrystalline semiconductor film including the impurity element which serves as a donor is formed over the gate insulating film including the impurity element which serves as a donor, using a deposition gas including silicon or germanium, and hydrogen; and a thin film transistor is manufactured using the microcrystalline semiconductor film including the impurity element which serves as a donor.

Further alternatively, a protective film including an impurity element which serves as a donor is formed on an inner wall of a reaction chamber of a plasma CVD apparatus, using a gas including the impurity element which serves as a donor, a deposition gas including silicon or germanium, and hydrogen; then, a substrate provided with a gate electrode is carried into the reaction chamber; a gate insulating film is formed over the gate electrode; a microcrystalline semiconductor film is formed over the gate insulating film, using a deposition gas including silicon or germanium, and hydrogen; and a thin film transistor is manufactured using the microcrystalline semiconductor film.

Further alternatively, a gas including an impurity element which serves as a donor is supplied to a reaction chamber of a plasma CVD apparatus; then, a gate insulating film including the impurity element which serves as a donor is formed over a substrate provided with a gate electrode; a microcrystalline semiconductor film is formed over the gate insulating film, using a deposition gas including silicon or germanium, and hydrogen; and a thin film transistor is manufactured using the microcrystalline semiconductor film.

Further alternatively, a gate insulating film is formed over a substrate provided with a gate electrode; a gas including an impurity element which serves as a donor is supplied to a reaction chamber of a plasma CVD apparatus; then, a microcrystalline semiconductor film including the impurity element which serves as a donor is formed over the gate insulating film, using a deposition gas including silicon or germanium, and hydrogen; and a thin film transistor is manufactured using the microcrystalline semiconductor film including the impurity element which serves as a donor.

Further alternatively, a first gate insulating film is formed over a substrate provided with a gate electrode; a gas including an impurity element which serves as a donor is supplied to a reaction chamber of a plasma CVD apparatus; then, a second gate insulating film including the impurity element which serves as a donor is formed over the first gate insulating film, using a non-deposition gas including oxygen or nitrogen, and a deposition gas including silicon; a microcrystalline semiconductor film is formed over the second gate insulating film; and a thin film transistor is manufactured using the microcrystalline semiconductor film.

Further alternatively, a first gate insulating film is formed over a substrate provided with a gate electrode; a second gate insulating film is formed over the first gate insulating film; then, a gas including an impurity element which serves as a donor for a semiconductor is supplied to a reaction chamber of a plasma CVD apparatus; subsequently, a third gate insulating film including the impurity element which serves as a donor is formed over the second gate insulating film, using a non-deposition gas including oxygen or nitrogen, and a deposition gas including silicon; a microcrystalline semiconductor film is formed over the third gate insulating film including the impurity element which serves as a donor, using a deposition gas including silicon or germanium, and hydrogen; and a thin film transistor is manufactured using the microcrystalline semiconductor film.

The impurity element which serves as a donor is phosphorus, arsenic, or antimony.

A gate insulating film including an impurity element which serves as a donor is formed over a gate electrode, or an impurity element which serves as a donor is adsorbed onto a gate insulating film, whereby crystallinity can be increased at an interface with the gate insulating film in forming the microcrystalline semiconductor film. Thus, a thin film transistor can be manufactured by using the microcrystalline semiconductor film whose crystallinity has been increased at the interface with the gate insulating film for a channel formation region.

Further, forming a microcrystalline semiconductor film including an impurity element which serves as a donor for a microcrystalline semiconductor film in contact with a gate insulating film can increase the speed of carrier travel in the microcrystalline semiconductor film, so that a thin film transistor with high field effect mobility and high on current can be manufactured.

The peak concentration of the impurity element which serves as a donor and is included in the gate insulating film or the microcrystalline semiconductor film is set to be from $6 \times 10^{15}$ atoms/cm$^3$ to $3 \times 10^{18}$ atoms/cm$^3$ inclusive, preferably from $3 \times 10^{16}$ atoms/cm$^3$ to $3 \times 10^{17}$ atoms/cm$^3$ inclusive, so that an accumulation-type thin film transistor (i.e., a thin film transistor in which a channel formation region includes an n-type impurity element at a low concentration) can be manufactured. When the peak concentration of the impurity element which serves as a donor and is included in the gate insulating film or the microcrystalline semiconductor film is lower than $6 \times 10^{15}$ atoms/cm$^3$, the amount of the impurity element which serves as a donor is insufficient, and thus increase in the field effect mobility and in the on current cannot be expected. Further, when the peak concentration of the impurity element which serves as a donor and is included in the gate insulating film or the microcrystalline semiconductor film is higher than $3 \times 10^{18}$ atoms/cm$^3$, the threshold voltage shifts to the minus side of the gate voltage, and the thin film transistor does not function well; therefore, it is preferable that the concentration of the impurity element which serves as a donor be from $6 \times 10^{15}$ atoms/cm$^3$ to $3 \times 10^{18}$ atoms/cm$^3$ inclusive, preferably from $3 \times 10^{16}$ atoms/cm$^3$ to $3 \times 10^{17}$ atoms/cm$^3$ inclusive.

Further, a buffer layer is formed successively over the microcrystalline semiconductor film, whose crystallinity at the interface with the gate insulating film has been increased, and source and drain regions and source and drain wirings are formed over the buffer layer, so that a thin film transistor is formed.

Another feature of the present invention is that a pixel electrode connected to the thin film transistor is formed and a display device is manufactured.

Further, thin film transistors (TFTs) are manufactured using the microcrystalline semiconductor film of the present invention, and a display device is manufactured using the thin film transistors for a pixel portion and further for a driver circuit. Since the microcrystalline semiconductor film of the present invention has high crystallinity at the interface with the gate insulating film, a thin film transistor including the microcrystalline semiconductor film has a field effect mobility of from 2.5 $cm^2$/V·sec to 10 $cm^2$/V·sec, which is 5 to 20 times as high as that of a thin film transistor including an amorphous semiconductor film; thus, a part of the driver circuit or the entire driver circuit can be formed over the same substrate as that of the pixel portion, so that a system-on-panel can be manufactured.

Display devices include light-emitting devices and liquid crystal display devices. A light-emitting device includes a light-emitting element and a liquid crystal display device includes a liquid crystal element. A light-emitting element includes, in its category, an element whose luminance is controlled with current or voltage; specifically, an organic electroluminescent (EL) element and an inorganic EL element.

In addition, the display devices include a panel in which a display element is sealed, and a module in which an IC and the like including a controller are mounted on the panel. The present invention relates to one mode of an element substrate before the display element is completed in a manufacturing process of the display device, and the element substrate is provided with a means for supplying current to the display element in each of a plurality of pixels. Specifically, the element substrate may be in a state of being provided with only a pixel electrode of the display element, a state after a conductive film to be a pixel electrode is formed and before the conductive film is etched to form the pixel electrode, or any other states.

A display device in this specification means an image display device, a light-emitting device, or a light source (including a lighting device). Further, the display device includes any of the following modules in its category: a module including a connector such as a flexible printed circuit (FPC), tape automated bonding (TAB) tape, or a tape carrier package (TCP); a module having TAB tape or a TCP which is provided with a printed wiring board at the end thereof; and a module having an integrated circuit (IC) which is directly mounted on a display element by a chip on glass (COG) method.

According to the present invention, a microcrystalline semiconductor film which has high crystallinity from an interface with an insulating film can be formed, and a thin film transistor with excellent electric characteristics can be manufactured using the microcrystalline semiconductor film for a channel formation region. Further, a display device having the thin film transistor can be manufactured.

BRIEF DESCRIPTION OF THE DRAWINGS

In the accompanying drawings:

FIGS. 35A and 35B are a top view and a cross-sectional view, respectively, illustrating a display device of the present invention;

DETAILED DESCRIPTION OF THE INVENTION

Figure 1A:
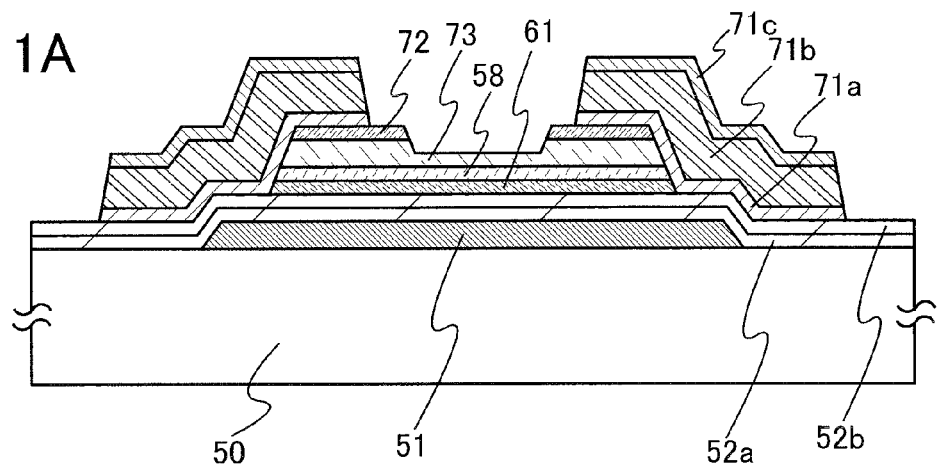
FIGS. 1A and 1D are cross-sectional views illustrating methods for manufacturing a display device of the present invention.

Hereinafter, embodiment modes and embodiments of the present invention are described with reference to the drawings. Note that the present invention is not limited to the following description, and it is easily understood by those skilled in the art that the modes and details disclosed herein can be modified in various ways without departing from the spirit and scope of the present invention. Therefore, the present invention should not be interpreted as being limited to the description of the embodiment modes to be given below. In the structures of the present invention to be described hereinafter, reference numerals which designate the same parts are used in common in different drawings.

Embodiment Mode 1

This embodiment mode describes structures of a thin film transistor which has high crystallinity at an interface between a microcrystalline semiconductor film and a gate insulating film, and has higher field effect mobility and higher on current than a thin film transistor having a conventional microcrystalline semiconductor film in a channel formation region, with reference to FIGS. 1A to 1F, FIGS. 2A to 2F, FIGS. 3A and 3B, and FIGS. 4A to 4D.

In a thin film transistor shown in FIG. 1A, a gate electrode 51 is formed over a substrate 50; gate insulating films 52a and 52b are formed over the gate electrode 51; a microcrystalline semiconductor film 61 including an impurity element which serves as a donor is formed over the gate insulating films 52a and 52b; a microcrystalline semiconductor film 58 not including an impurity element which serves as a donor at a higher concentration than the detection limit of SIMS is formed over the microcrystalline semiconductor film 61; a buffer layer 73 is formed over the microcrystalline semiconductor film 58; a pair of semiconductor films 72 (hereinafter also referred to as source and drain regions 72) to which an impurity element imparting one conductivity type is added are formed over the buffer layer 73; and wirings 71a to 71c are formed over the pair of semiconductor films 72 to which the impurity element imparting one conductivity type is added. In other words, in the microcrystalline semiconductor film formed over the gate insulating film 52*b*, the microcrystalline semiconductor film on the gate insulating film 52*b* side includes the impurity element which serves as a donor.

As the microcrystalline semiconductor film 61 including the impurity element which serves as a donor, a microcrystalline semiconductor film including the impurity element which serves as a donor at a peak concentration of from $6\times10^{15}$ atoms/cm$^3$ to $3\times10^{18}$ atoms/cm$^3$ inclusive, preferably from $3\times10^{16}$ atoms/cm$^3$ to $3\times10^{17}$ atoms/cm$^3$ inclusive is formed. Further, the microcrystalline semiconductor film 61 including the impurity element which serves as a donor has a thickness of from 1 nm to 50 nm inclusive. Examples of the microcrystalline semiconductor film are a microcrystalline silicon film, a microcrystalline silicon film including germanium, and the like. Further, examples of the impurity element which serves as a donor are phosphorus, arsenic, antimony, and the like.

The peak concentration of the impurity element which serves as a donor and is included in the microcrystalline semiconductor film is set to be in the above range, whereby the interface between the gate insulating film 52*b* and the microcrystalline semiconductor film 61 can have improved crystallinity and the microcrystalline semiconductor film 61 can have lower resistivity; thus, a thin film transistor with high field effect mobility and high on current can be manufactured. When the peak concentration of the impurity element which serves as a donor and is included in the microcrystalline semiconductor film is lower than $6\times10^{15}$ atoms/cm$^3$, the amount of the impurity element which serves as a donor is insufficient, and thus increase in the field effect mobility and in the on current cannot be expected. Further, when the peak concentration of the impurity element which serves as a donor and is included in the microcrystalline semiconductor film is higher than $3\times10^{18}$ atoms/cm$^3$, the threshold voltage shifts to the minus side of the gate voltage, and the transistor does not function well; therefore, it is preferable that the concentration of the impurity element which serves as a donor be from $6\times10^{15}$ atoms/cm$^3$ to $3\times10^{18}$ atoms/cm$^3$ inclusive, more preferably from $3\times10^{16}$ atoms/cm$^3$ to $3\times10^{17}$ atoms/cm$^3$ inclusive.

The microcrystalline semiconductor film here is a film including a semiconductor having an intermediate structure between amorphous and crystalline structures (including single crystal and polycrystal). This semiconductor is in a third state which is stable in free energy, and is a crystalline semiconductor having short-range order and lattice distortion, and columnar or needle-like crystals with a diameter of from 0.5 nm to 20 nm have grown in a direction of the normal to the surface of the substrate. Further, an amorphous semiconductor is present between a plurality of microcrystalline semiconductors. A Raman spectrum of microcrystalline silicon, which is a typical example of a microcrystalline semiconductor, is located in lower wave numbers than 520 cm$^{-1}$, which represents single crystal silicon. That is to say, a peak of a Raman spectrum of microcrystalline silicon lies between 520 cm$^{-1}$ and 480 cm$^{-1}$, which represent single crystal silicon and amorphous silicon, respectively. Furthermore, the microcrystalline semiconductor film includes hydrogen or halogen at 1 at. % or more in order to terminate a dangling bond. The microcrystalline semiconductor film may further include a rare gas such as helium, argon, krypton, or neon to further promote lattice distortion, so that the stability is enhanced and a favorable microcrystalline semiconductor film can be obtained. Such description about a microcrystalline semiconductor film is disclosed in, for example, U.S. Pat. No. 4,409,134.

The microcrystallines semiconductor film 61 including the impurity element which serves as a donor and the microcrystalline semiconductor film 58 are each formed with a thickness of from 1 nm to 200 nm inclusive, preferably from 1 nm to 100 nm inclusive, more preferably from 1 nm to 50 nm inclusive. The microcrystalline semiconductor film 61 including the impurity element which serves as a donor functions as a channel formation region of the thin film transistor which is formed later; if the thickness of the microcrystalline semiconductor film 61 is small, the microcrystalline semiconductor film 61 and also the microcrystalline semiconductor film 58 serve as the channel formation region of the thin film transistor which is formed later. When at least the microcrystalline semiconductor film 61 including the impurity element which serves as a donor is formed with a thickness of from 1 nm to 50 nm inclusive, the thin film transistor can be a complete depletion type.

Further, it is preferable that the concentration of oxygen and the concentration of nitrogen in the microcrystalline semiconductor film each be lower than ten times that of the impurity element which serves as a donor, typically lower than $3\times10^{19}$ atoms/cm$^3$, preferably lower than $3\times10^{18}$ atoms/cm$^3$; and that the concentration of carbon be less than or equal to $3\times10^{18}$ atoms/cm$^3$. Lower concentrations of oxygen, nitrogen, and carbon in the microcrystalline semiconductor film can suppress generation of defects in the microcrystalline semiconductor film. Furthermore, oxygen and nitrogen in the microcrystalline semiconductor film hinder crystallization. Therefore, when the microcrystalline semiconductor film includes oxygen and nitrogen at relatively low concentrations and includes the impurity element which serves as a donor, the crystallinity of the microcrystalline semiconductor film can be enhanced.

The microcrystalline semiconductor film including the impurity element which serves as a donor of this embodiment mode includes the impurity element which serves as a donor; therefore, by adding an impurity element which serves as an acceptor to the microcrystalline semiconductor film which serves as the channel formation region of the thin film transistor at the same time as or after formation of the microcrystalline semiconductor film, the threshold voltage can be controlled. A typical example of the impurity element which serves as an acceptor is boron, and an impurity gas such as $B_2H_6$ or $BF_3$ is preferably mixed into silicon hydride at from 1 ppm to 1000 ppm, preferably from 1 ppm to 100 ppm. Further, the concentration of boron is preferably set to be approximately one tenth that of the impurity element which serves as a donor, e.g., from $1\times10^{14}$ atoms/cm$^3$ to $6\times10^{16}$ atoms/cm$^3$.

An amorphous semiconductor film, an amorphous semiconductor film including halogen such as fluorine or chlorine, or an amorphous semiconductor film including nitrogen is used as the buffer layer 73. The buffer layer 73 has a thickness of from 50 nm to 200 nm. Examples of the amorphous semiconductor film are an amorphous silicon film, an amorphous silicon film including germanium, and the like.

The buffer layer 73, which is formed of an amorphous semiconductor film, has a larger energy gap and a higher resistivity than the microcrystalline semiconductor film 58; further, mobility in the buffer layer 73 is one fifth to one tenth that of the microcrystalline semiconductor film 58. In the thin film transistor which is formed later, therefore, the buffer layer 73 functions as a high-resistance region and thus can reduce leak current which is generated between the source and drain regions 72 and the microcrystalline semiconductor film 61. Further, off current can be reduced.

Forming the microcrystalline semiconductor film 58 over the microcrystalline semiconductor film 61 including the impurity element which serves as a donor can prevent the impurity element which serves as a donor in the microcrystalline semiconductor film 61 from being diffused into the buffer layer 73. If the impurity element which serves as a donor is diffused into the buffer layer 73, which is a high-resistance region, resistivity of the buffer layer 73 decreases and leak current flows between the microcrystalline semiconductor film 61 including the impurity element which serves as a donor and the source and drain regions 72, thereby degrading switching characteristics. Therefore, it is preferable to form the microcrystalline semiconductor film 58 between the microcrystalline semiconductor film 61 including the impurity element which serves as a donor and the buffer layer 73.

By formation of an amorphous semiconductor film, moreover, an amorphous semiconductor film including hydrogen, nitrogen, or halogen as the buffer layer 73 over the surface of the microcrystalline semiconductor film 58, surfaces of crystal grains included in the microcrystalline semiconductor film 58 can be prevented from being oxidized naturally. In particular, in a region where an amorphous semiconductor is in contact with microcrystal grains, a crack is likely to be caused due to local stress. When this crack is exposed to oxygen, the crystal grains are oxidized, whereby silicon oxide is formed. However, by formation of the buffer layer 73 over the surface of the microcrystalline semiconductor film 58, the microcrystal grains can be prevented from being oxidized.

For the substrate 50, an alkali-free glass substrate manufactured by a fusion method or a float method, such as a substrate of barium borosilicate glass, aluminoborosilicate glass, or aluminosilicate glass; a ceramic substrate; a plastic substrate which has high heat resistance enough to withstand a process temperature of this manufacturing process; or the like can be used. Further, a metal (e.g., stainless steel alloy) substrate whose surface is provided with an insulating film may be used.

The gate electrode 51 is formed of a metal material. As a metal material, aluminum, chromium, titanium, tantalum, molybdenum, copper, or the like is used. The gate electrode 51 is preferably formed of aluminum or a stacked-layer structure of aluminum and a barrier metal. As a barrier metal, a metal with a high melting point, such as titanium, molybdenum, or chromium, is used. A barrier metal is preferably provided in order to prevent hillocks and oxidation of aluminum.

The gate electrode 51 is formed with a thickness of from 50 nm to 300 nm inclusive. The thickness of from 50 nm to 100 nm inclusive of the gate electrode 51 can prevent a disconnection of a semiconductor film and a wiring, which are formed later. Further, the thickness of from 150 nm to 300 nm inclusive of the gate electrode 51 can lower the resistance of the gate electrode 51.

Since the semiconductor film and the wiring are formed over the gate electrode 51, the gate electrode 51 is preferably processed to have tapered end portions so that the semiconductor film and the wiring thereover are not disconnected. Further, although not illustrated, a wiring or a capacitor wiring which is connected to the gate electrode can also be formed at the same time when the gate electrode is formed.

The gate insulating films 52a and 52b can each be formed using a silicon oxide film, a silicon nitride film, a silicon oxynitride film, or a silicon nitride oxide film with a thickness of from 50 nm to 150 nm. This embodiment mode shows an example in which a silicon nitride film or a silicon nitride oxide film is formed as the gate insulating film 52a, and a silicon oxide film or a silicon oxynitride film is formed as the gate insulating film 52b to form a stacked-layer structure. Instead of a two-layer structure, the gate insulating film can be formed using a single layer of a silicon oxide film, a silicon nitride film, a silicon oxynitride film, or a silicon nitride oxide film.

By forming the gate insulating film 52a using a silicon nitride film or a silicon nitride oxide film, adhesion between the substrate 50 and the gate insulating film 52a is increased, and further, impurities from the substrate 50 can be prevented from diffusing into the microcrystalline semiconductor film 61 including the impurity element which serves as a donor when a glass substrate is used for the substrate 50. Furthermore, oxidation of the gate electrode 51 can be prevented. That is to say, film peeling can be prevented, and electric characteristics of the thin film transistor which is formed later can be improved. Further, the gate insulating films 52a and 52b each having a thickness of greater than or equal to 50 nm are preferable because the gate insulating films 52a and 52b having the above thickness can alleviate reduction in coverage which is caused by unevenness due to the gate electrode 51.

Note that a silicon oxynitride film means a film that includes more oxygen than nitrogen, and includes oxygen, nitrogen, silicon, and hydrogen at concentrations ranging from 55 at. % to 65 at. %, 1 at. % to 20 at. %, 25 at. % to 35 at. %, and 0.1 at. % to 10 at. %, respectively. Further, a silicon nitride oxide film means a film that includes more nitrogen than oxygen, and includes oxygen, nitrogen, silicon, and hydrogen at concentrations ranging from 15 at. % to 30 at. %, 20 at. % to 35 at. %, 25 at. % to 35 at. %, and 15 at. % to 25 at. %, respectively.

If an n-channel thin film transistor is formed, the semiconductor films 72 to which the impurity element imparting one conductivity type is added may be doped with phosphorus, which is a typical impurity element; for example, an impurity gas such as $PH_3$ may be added to silicon hydride. If a p-channel thin film transistor is formed, the semiconductor films 72 to which the impurity element imparting one conductivity type is added may be doped with boron, which is a typical impurity element; for example, an impurity gas such as $B_2H_6$ may be added to silicon hydride. The semiconductor films 72 to which the impurity element imparting one conductivity type is added include phosphorus or boron at a concentration of from $1 \times 10^{19}$ atoms/cm$^3$ to $1 \times 10^{21}$ atoms/cm$^3$, thereby having ohmic contact with the conductive film, and the semiconductor films 72 to which the impurity element imparting one conductivity type is added function as the source and drain regions. The semiconductor films 72 to which the impurity element imparting one conductivity type is added can be formed using a microcrystalline semiconductor or an amorphous semiconductor The semiconductor films 72 to which the impurity element imparting one conductivity type is added are formed with a thickness of from 2 nm to 50 nm inclusive. Reduction in the thickness of the semiconductor film to which the impurity element imparting one conductivity type is added can improve the throughput.

The wirings 71a to 71c are preferably formed with a single layer or stacked layers using aluminum; copper; or an aluminum alloy to which an element for preventing hillocks or an element for improving heat resistance property, such as silicon, titanium, neodymium, scandium, or molybdenum, is added. Alternatively, a film in contact with the semiconductor film to which the impurity element imparting one conductivity type is added may be formed of titanium, tantalum, molybdenum, or tungsten, or a nitride of such an element; and aluminum or an aluminum alloy may be formed thereover to form a stacked-layer structure. Further alternatively, top and bottom surfaces of aluminum or an aluminum alloy may be each covered with titanium, tantalum, molybdenum, tungsten, or a nitride thereof to form a stacked-layer structure. This embodiment mode shows the conductive film having a three-layer structure of the wirings 71a to 71c; a stacked-layer structure in which the wirings 71a and 71c are formed using molybdenum films and the wiring 71b is formed using an aluminum film, or a stacked-layer structure in which the wirings 71a and 71c are formed using titanium films and the wiring 71b is formed using an aluminum film is formed.

Figure 1B:
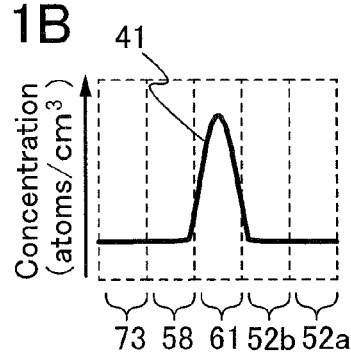
FIGS. 1B, 1C, 1E, and 1F are diagrams showing peak concentrations of an impurity element which serves as a donor in stacked films.
Figure 1C:
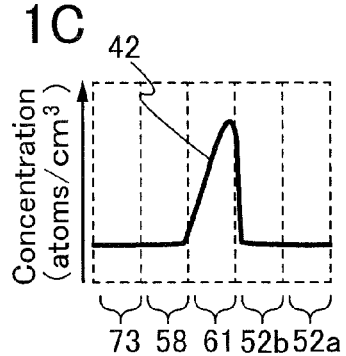

Next, with SIMS, concentration distribution of the impurity element which serves as a donor in a stacked-layer portion including the gate insulating films 52a and 52b, the microcrystalline semiconductor film 61 including the impurity element which serves as a donor, the microcrystalline semiconductor film 58 not including the impurity element which serves as a donor at a higher concentration than the detection limit of SIMS, and the buffer layer 73 is schematically shown by curves 41 and 42 in FIGS. 1B and 1C.

As shown in FIG. 1B, the concentration of the impurity element which serves as a donor in the thin film transistor shown in FIG. 1A has a peak in the microcrystalline semiconductor film 61 including the impurity element which serves as a donor. As shown in FIG. 1B, a peak of the concentration distribution of the impurity element which serves as a donor may be located in or around the center of the microcrystalline semiconductor film 61 including the impurity element which serves as a donor. Further, as in the concentration distribution of the impurity element which serves as a donor which is shown by the curve 42 in FIG. 1C, a peak of the concentration distribution of the impurity element which serves as a donor may be located at or around the interface between the gate insulating film 52b and the microcrystalline semiconductor film 61 including the impurity element which serves as a donor.

Figure 1D:
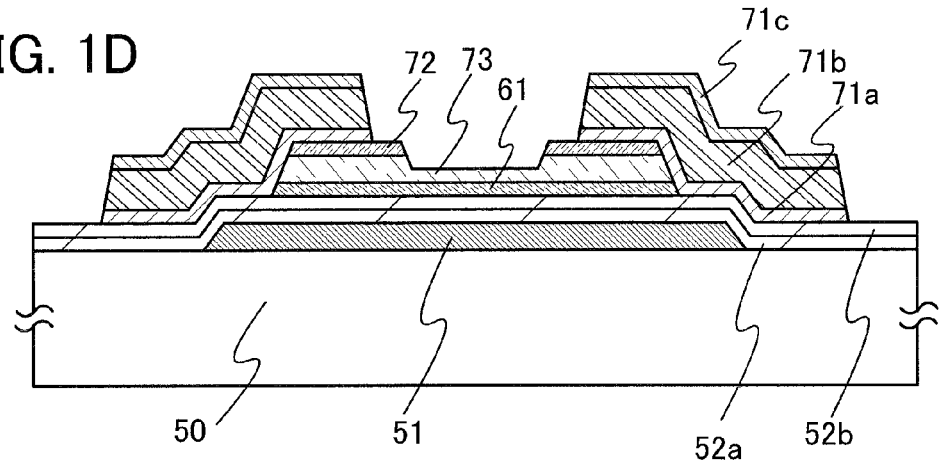

It is not essential that the impurity element which serves as a donor in the microcrystalline semiconductor film be included only in a part on the gate insulating film side. As shown in FIG. 1D, for example, an impurity element which serves as a donor may be included in an entire microcrystalline semiconductor film. That is to say, a microcrystalline semiconductor film 61 including an impurity element which serves as a donor may be formed between a gate insulating film 52b and a buffer layer 73.

In a thin film transistor shown in FIG. 1D, a gate electrode 51 is formed over a substrate 50; a gate insulating film 52a and the gate insulating film 52b are formed over the gate electrode 51; the microcrystalline semiconductor film 61 including the impurity element which serves as a donor is formed over the gate insulating films 52a and 52b; the buffer layer 73 is formed over the microcrystalline semiconductor film 61 including the impurity element which serves as a donor; a pair of semiconductor films 72 to which an impurity element imparting one conductivity type is added are formed over the buffer layer 73; and wirings 71a to 71c are formed over the pair of semiconductor films 72 to which the impurity element imparting one conductivity type is added.

This mode has a feature that the microcrystalline semiconductor film 61 including the impurity element which serves as a donor is formed between the gate insulating film 52b and the buffer layer 73. It is preferable that the peak concentration of the impurity element which serves as a donor be from $6\times10^{15}$ atoms/cm$^3$ to $3\times10^{18}$ atoms/cm$^3$ inclusive, more preferably from $3\times10^{16}$ atoms/cm$^3$ to $3\times10^{17}$ atoms/cm$^3$ inclusive. Further, the microcrystalline semiconductor film 61 including the impurity element which serves as a donor has a thickness of from 5 nm to 100 nm inclusive, preferably from 10 nm to 50 nm inclusive. Furthermore, the peak concentration of the impurity element which serves as a donor may satisfy the above range in the entire microcrystalline semiconductor film 61; or the concentration of the impurity element which serves as a donor may have a peak at or around the interface between the gate insulating film 52b and the microcrystalline semiconductor film 61, and may decrease from the gate insulating film 52b toward the buffer layer 73. Still furthermore, when the peak concentration of oxygen and the peak concentration of nitrogen in the microcrystalline semiconductor film 61 including the impurity element which serves as a donor are each lower than ten times that of the impurity element which serves as a donor and further when the peak concentration of the impurity element which serves as an acceptor (a typical example is boron) is less than or equal to one-tenth that of the impurity element which serves as a donor, crystallinity of the microcrystalline semiconductor film including the impurity element which serves as a donor can be increased further.

The peak concentration of the impurity element which serves as a donor and is included in the microcrystalline semiconductor film is set to be in the above range, whereby the interface between the gate insulating film 52b and the microcrystalline semiconductor film 61 including the impurity element which serves as a donor can have improved crystallinity and the microcrystalline semiconductor film 61 can have lower resistivity; thus, a thin film transistor with high field effect mobility and high on current can be manufactured. When the peak concentration of the impurity element which serves as a donor and is included in the microcrystalline semiconductor film is lower than $6\times10^{15}$ atoms/cm$^3$, the amount of the impurity element which serves as a donor is insufficient, and thus increase in the field effect mobility and in the on current cannot be expected. Further, when the peak concentration of the impurity element which serves as a donor and is included in the microcrystalline semiconductor film is higher than $3\times10^{18}$ atoms/cm$^3$, the threshold voltage shifts to the minus side of the gate voltage, and the thin film transistor does not function well; therefore, it is preferable that the concentration of the impurity element which serves as a donor be from $6\times10^{15}$ atoms/cm$^3$ to $3\times10^{18}$ atoms/cm$^3$ inclusive, preferably from $3\times10^{16}$ atoms/cm$^3$ to $3\times10^{17}$ atoms/cm$^3$ inclusive.

Figure 1E:
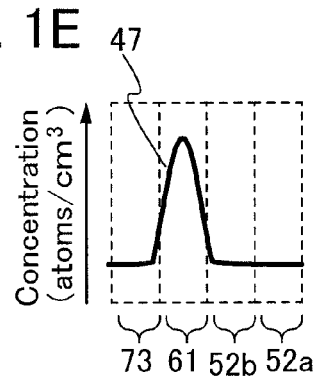
Figure 1F:
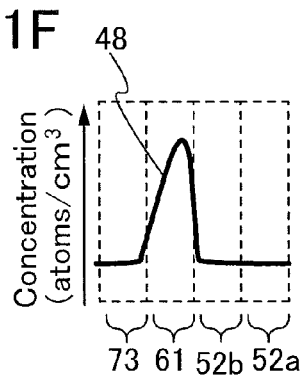

Next, with SIMS, concentration distribution of the impurity element which serves as a donor in a stacked-layer portion including the gate insulating films 52a and 52b, the microcrystalline semiconductor film 61 including the impurity element which serves as a donor, and the buffer layer 73 is schematically shown by curves 47 and 48 in FIGS. 1E and 1F.

As shown by the curve 47 in FIG. 1E, the concentration of the impurity element which serves as a donor in the thin film transistor shown in FIG. 1D has a peak in the microcrystalline semiconductor film 61 which includes the impurity element which serves as a donor and which is provided between the gate insulating film 52b and the buffer layer 73. Further, as in the concentration distribution of the impurity element which serves as a donor which is shown by the curve 48 in FIG. 1F, a peak of the concentration distribution of the impurity element which serves as a donor may be located at or around the interface between the gate insulating film 52b and the microcrystalline semiconductor film 61 including the impurity element which serves as a donor, and the concentration may decrease toward the buffer layer 73.

Next, a different mode from the above is described with reference to FIGS. 2A to 2F.

Figure 2A:
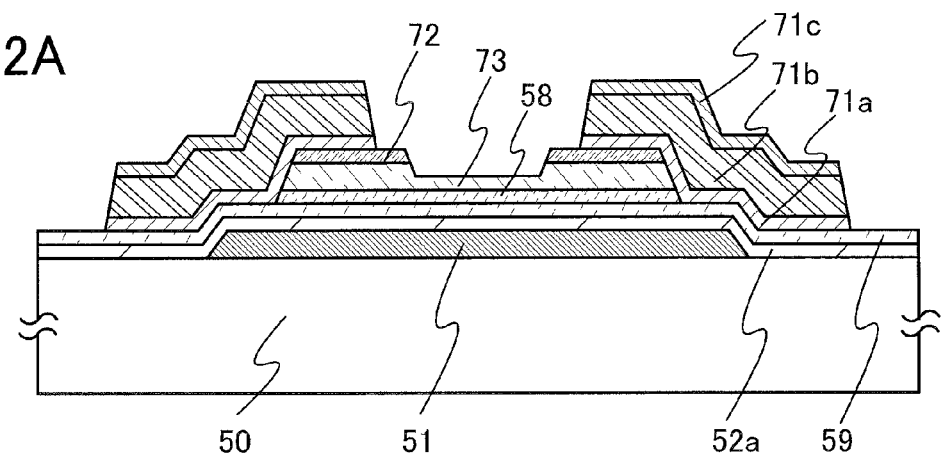
FIGS. 2A and 2E are cross-sectional views illustrating methods for manufacturing a display device of the present invention.

FIG. 2A shows a cross section of a thin film transistor of this embodiment mode.

In the thin film transistor shown in FIG. 2A, a gate electrode 51 is formed over a substrate 50; a gate insulating film 52a is formed over the gate electrode 51; a gate insulating film 59 including an impurity element which serves as a donor is formed over the gate insulating film 52a; a microcrystalline semiconductor film 58 is formed over the gate insulating film 59; a buffer layer 73 is formed over the microcrystalline semiconductor film 58; a pair of semiconductor films 72 to which an impurity element imparting one conductivity type is added are formed over the buffer layer 73; and wirings 71a to 71c are formed over the pair of semiconductor films 72 to which the impurity element imparting one conductivity type is added.

It is preferable that the peak concentration of phosphorus in the gate insulating film 59 including the impurity element which serves as a donor be from $6 \times 10^{15}$ atoms/cm$^3$ to $3 \times 10^{18}$ atoms/cm$^3$ inclusive, preferably from $3 \times 10^{16}$ atoms/cm$^3$ to $3 \times 10^{17}$ atoms/cm$^3$ inclusive. Further, the microcrystalline semiconductor film 58 has a thickness of from 1 nm to 50 nm inclusive.

The gate insulating film 52a can be formed using a similar material to that of the gate insulating film 52a shown in FIGS. 1A and 1D. Further, the gate insulating film 59 including the impurity element which serves as a donor can be formed using a silicon oxide film, a silicon nitride film, a silicon oxynitride film, a silicon nitride oxide film, or the like including the impurity element which serves as a donor (e.g., phosphorus, arsenic, or antimony).

Figure 2B:
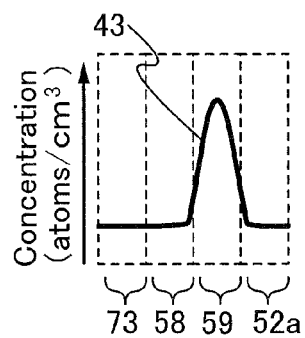
FIGS. 2B, 2C, 2D, and 2F are diagrams showing peak concentrations of an impurity element which serves as a donor in stacked films.
Figure 2C:
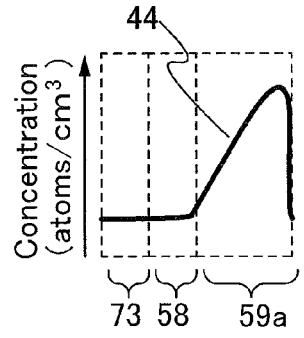
Figure 2D:
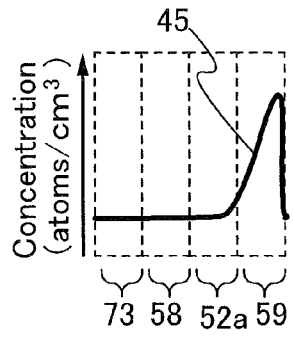

Next, with SIMS, concentration distribution of the impurity element which serves as a donor in a stacked-layer portion including the gate insulating film 52a, the gate insulating film 59 including the impurity element which serves as a donor, the microcrystalline semiconductor film 58, and the buffer layer 73 is schematically shown by curves 43, 44, and 45 in FIGS. 2B to 2D.

As shown in FIG. 2B, the concentration of the impurity element which serves as a donor in the thin film transistor shown in FIG. 2A has a peak in the gate insulating film 59 which includes the impurity element which serves as a donor and which is formed between the gate insulating film 52a and the microcrystalline semiconductor film 58.

Although a mode is described here in which the gate insulating film 52a does not include the impurity element which serves as a donor at a higher concentration than the detection limit of SIMS and only the gate insulating film 59 includes the impurity element which serves as a donor, the present invention is not limited to this structure. For example, a gate insulating film may consist of one layer and may include an impurity element which serves as a donor. With SIMS, concentration distribution of the impurity element which serves as a donor in the stacked-layer portion including a gate insulating film 59a including an impurity element which serves as a donor, the microcrystalline semiconductor film 58, and the buffer layer 73 in the above case is schematically shown by the curve 44 in FIG. 2C. In FIG. 2C, the curve 44, which shows concentration distribution of the impurity element which serves as a donor, has a peak on the gate electrode side in the gate insulating film 59a including the impurity element which serves as a donor, and the concentration decreases from the gate electrode side toward the microcrystalline semiconductor film 58 side. Note that the shape of the curve that shows the concentration distribution of the impurity element which serves as a donor is not limited to that shown in FIG. 2C, and the concentration may have a peak in or around the center of the gate insulating film 59a including the impurity element which serves as a donor.

In FIG. 2A, further, positions of the gate insulating film 52a and the gate insulating film 59 including the impurity element which serves as a donor may be reversed. In other words, the gate insulating film 59 including the impurity element which serves as a donor may be formed over the gate electrode 51, and the gate insulating film 52a may be formed over the gate insulating film 59 including the impurity element which serves as a donor. With SIMS, concentration distribution of the impurity element which serves as a donor in a stacked-layer portion including the gate insulating film 59 including the impurity element which serves as a donor, the gate insulating film 52a, the microcrystalline semiconductor film 58, and the buffer layer 73 in the above case is schematically shown by the curve 45 in FIG. 2D. In FIG. 2D, the curve 45, which shows concentration distribution of the impurity element which serves as a donor, has a peak on the gate electrode side in the gate insulating film 59 including the impurity element which serves as a donor, and the concentration decreases from the gate electrode side toward the gate insulating film 52a side. Note that the shape of the curve that shows the concentration distribution of the impurity element which serves as a donor is not limited to that shown in FIG. 2D, and the concentration may have a peak in or around the center of the gate insulating film 59 including the impurity element which serves as a donor.

Figure 2E:
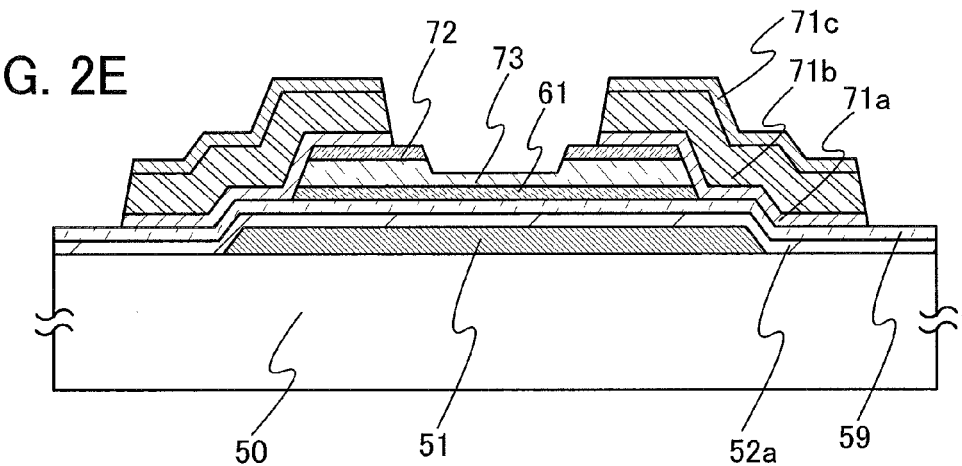

In a thin film transistor shown in FIG. 2E, a gate electrode 51 is formed over a substrate 50; a gate insulating film 52a is formed over the gate electrode 51; a gate insulating film 59 including an impurity element which serves as a donor is formed over the gate insulating film 52a; a microcrystalline semiconductor film 61 including an impurity element which serves as a donor is formed over the gate insulating film 59 including the impurity element which serves as a donor; a buffer layer 73 is formed over the microcrystalline semiconductor film 61 including the impurity element which serves as a donor; a pair of semiconductor films 72 to which an impurity element imparting one conductivity type is added are formed over the buffer layer 73; and wirings 71a to 71c are formed over the pair of semiconductor films 72 to which the impurity element imparting one conductivity type is added.

Figure 2F:
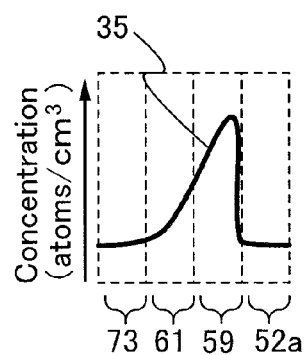

Next, with SIMS, concentration distribution of the impurity element which serves as a donor in a stacked-layer portion including the gate insulating film 52a, the gate insulating film 59 including the impurity element which serves as a donor, the microcrystalline semiconductor film 61 including the impurity element which serves as a donor, and the buffer layer 73 is schematically shown by a curve 35 in FIG. 2F.

As shown in FIG. 2F, the concentration of the impurity element which serves as a donor in the thin film transistor shown in FIG. 2E has a peak in the gate insulating film 59 including the impurity element which serves as a donor. Further, the peak is present at or around the interface between the gate insulating film 52a and the gate insulating film 59 including the impurity element which serves as a donor Furthermore, the shape of the curve that shows the concentration distribution of the impurity element which serves as a donor is not limited to that shown in FIG. 2F, and the concentration may have a peak in or around the center of the gate insulating film 59 including the impurity element which serves as a donor.

This mode has a feature that the gate insulating film 59, which is in contact with the microcrystalline semiconductor film 58 or the microcrystalline semiconductor film 61 including the impurity element which serves as a donor, includes the impurity element which serves as a donor. When the gate insulating film 59 on the microcrystalline semiconductor film 58 or 61 side includes the impurity element which serves as a donor, the impurity element which serves as a donor is deposited on the surface of the gate insulating film 59, whereby crystallinity of the microcrystalline semiconductor film 58 or 61 can be increased in starting deposition of the microcrystalline semiconductor film 58 or 61.

Further, another feature is that the gate insulating film on the gate electrode 51 side includes the impurity element which serves as a donor. When the gate insulating film on the gate electrode 51 side includes the impurity element which serves as a donor, the impurity element can be diffused into the gate insulating film on the microcrystalline semiconductor film side at a low concentration. Accordingly, crystallinity can be increased at the interface between the gate insulating film 59 and the microcrystalline semiconductor film 58 or 61 and resistivity of the microcrystalline semiconductor film 58 or 61 can be reduced; thus, a thin film transistor with high field effect mobility and high on current can be manufactured.

When the peak concentration of the impurity element which serves as a donor and is included in the gate insulating film 59 is lower than $6\times10^{15}$ atoms/cm$^3$, the amount of the impurity element which serves as a donor is insufficient, and thus increase in the field effect mobility and in the on current cannot be expected. Further, when the peak concentration of the impurity element which serves as a donor and is included in the gate insulating film 59 is higher than $3\times10^{18}$ atoms/cm$^3$, the threshold voltage shifts to the minus side of the gate voltage, and the transistor does not function well; therefore, it is preferable that the concentration of the impurity element which serves as a donor be from $6\times10^{15}$ atoms/cm$^3$ to $3\times10^{18}$ atoms/cm$^3$ inclusive, preferably from $3\times10^{16}$ atoms/cm$^3$ to $3\times10^{17}$ atoms/cm$^3$ inclusive.

By forming the microcrystalline semiconductor film 61 including the impurity element which serves as a donor over the gate insulating film 59 including the impurity element which serves as a donor, crystallinity of the microcrystalline semiconductor film 61 can be increased in starting deposition of the microcrystalline semiconductor film 61; in addition, resistivity of the microcrystalline semiconductor film can be reduced further because the impurity element which serves as a donor is included also in the microcrystalline semiconductor film 61, which functions as a channel. Thus, a thin film transistor with high on current and high field effect mobility can be manufactured.

Next, a different mode from the above is described with reference to FIGS. 3A and 3B.

Figure 3A:
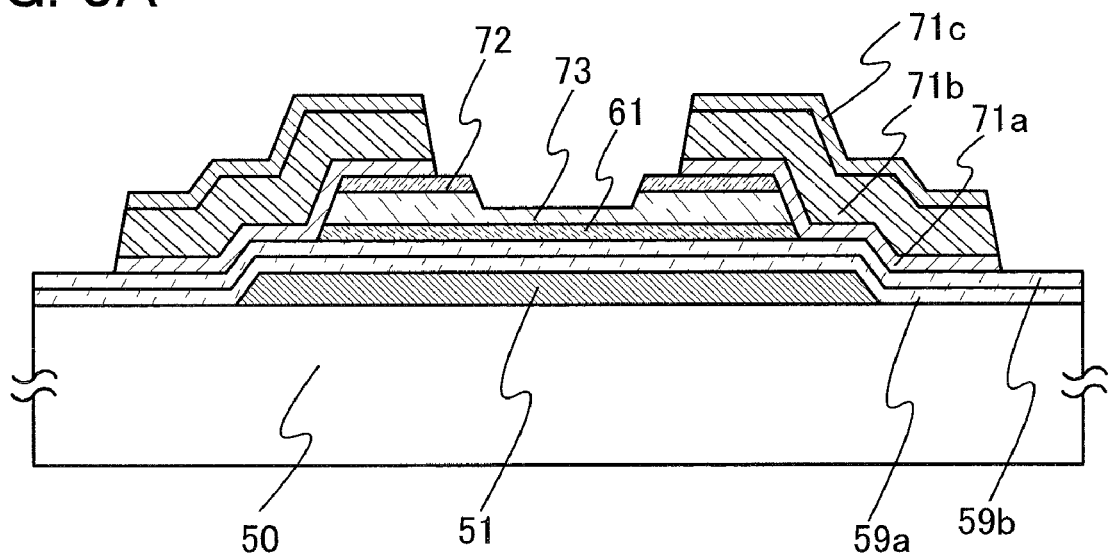
FIG. 3A is a cross-sectional view illustrating a method for manufacturing a display device of the present invention.

FIG. 3A shows a cross section of a thin film transistor of this embodiment mode.

In a thin film transistor shown in FIG. 3A, a gate electrode 51 is formed over a substrate 50; gate insulating films 59a and 59b including the impurity element which serves as a donor are formed over the gate electrode 51; a microcrystalline semiconductor film 61 including an impurity element which serves as a donor is formed over the gate insulating film 59b including the impurity element which serves as a donor; a buffer layer 73 is formed over the microcrystalline semiconductor film 61 including the impurity element which serves as a donor; a pair of semiconductor films 72 to which an impurity element imparting one conductivity type is added are formed over the buffer layer 73; and wirings 71a to 71c are formed over the pair of semiconductor films 72 to which the impurity element imparting one conductivity type is added.

It is preferable that the peak concentration of the impurity element which serves as a donor in the gate insulating films 59a and 59b including the impurity element which serves as a donor and in the microcrystalline semiconductor film 61 including the impurity element which serves as a donor be from $6\times10^{15}$ atoms/cm$^3$ to $3\times10^{18}$ atoms/cm$^3$ inclusive, more preferably from $3\times10^{16}$ atoms/cm$^3$ to $3\times10^{17}$ atoms/cm$^3$ inclusive.

Figure 3B:
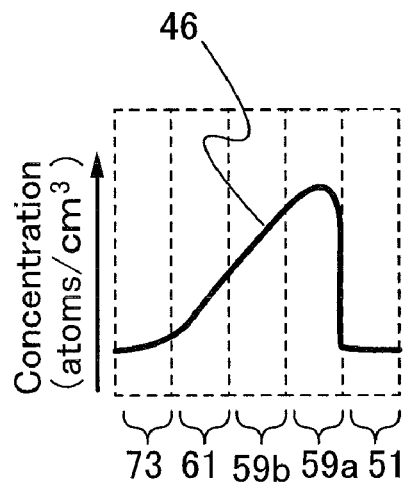
FIG. 3B is a diagram showing a peak concentration of an impurity element which serves as a donor in stacked films.

Next, with SIMS, concentration distribution of the impurity element which serves as a donor in a stacked-layer portion including the gate electrode 51, the gate insulating films 59a and 59b including the impurity element which serves as a donor, the microcrystalline semiconductor film 61 including the impurity element which serves as a donor, and the buffer layer 73 is schematically shown by a curve 46 in FIG. 3B.

As shown in FIG. 3B, the concentration of the impurity element which serves as a donor in the thin film transistor shown in FIG. 3A satisfies the above concentration range in the gate insulating films 59a and 59b and the microcrystalline semiconductor film 61, and has a peak therein. The peak is located at or around the interface between the gate electrode 51 and the gate insulating film 59a. The shape of the curve 46, which shows concentration distribution of the impurity element which serves as a donor, is not limited to that shown in FIG. 3B, and the concentration may have a peak in or around the center of the gate insulating film 59a including the impurity element which serves as a donor, in or around the center of the gate insulating film 59b including the impurity element which serves as a donor, or at or around the interface between the gate insulating films 59a and 59b including the impurity element which serves as a donor. Alternatively, the concentration may have a peak at or around the interface between the gate insulating film 59b including the impurity element which serves as a donor and the microcrystalline semiconductor film 61 including the impurity element which serves as a donor. Further alternatively, the concentration may have a peak in the center of the microcrystalline semiconductor film 61 including the impurity element which serves as a donor.

Figure 4A:
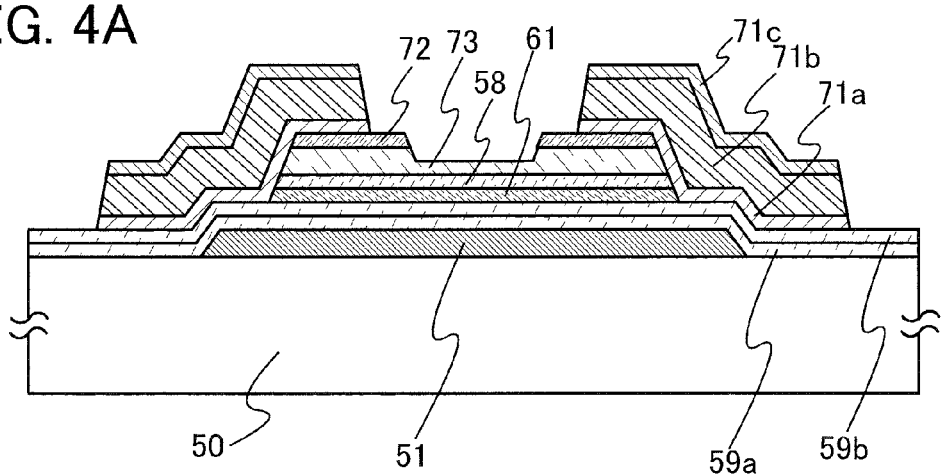
FIGS. 4A and 4C are cross-sectional views illustrating methods for manufacturing a display device of the present invention.

The thin film transistor shown in FIG. 3A may have a microcrystalline semiconductor film 58 between the microcrystalline semiconductor film 61 including the impurity element which serves as a donor and the buffer layer 73 (see FIG. 4A). Here, specifically, the microcrystalline semiconductor film 58 does not include the impurity element which serves as a donor at a higher concentration than the detection limit of SIMS. At the detection limit of SIMS, theoretically, the profile should be flat; practically, however, the profile is hardly flat because the signal/noise (S/N) ratio is poor at a low concentration region of ions which are objects to be measured. Therefore, a mean value of the concentrations of ions which are objects to be measured in the low concentration region is set to be the detection limit.

Figure 4B:
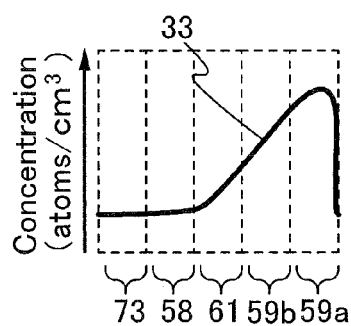
FIGS. 4B and 4D are diagrams showing peak concentrations of an impurity element which serves as a donor in stacked films.

Next, with SIMS, concentration distribution of the impurity element which serves as a donor in a stacked-layer portion including the gate insulating films 59a and 59b including the impurity element which serves as a donor, the microcrystalline semiconductor film 61 including the impurity element which serves as a donor, the microcrystalline semiconductor film 58, and the buffer layer 73 is schematically shown by a curve 33 in FIG. 4B.

As shown in FIG. 4B, the concentration of the impurity element which serves as a donor in the thin film transistor shown in FIG. 4A has a peak in the gate insulating film 59a including the impurity element which serves as a donor. Alternatively, the concentration may have a peak at or around the interface between the gate insulating film 59b including the impurity element which serves as a donor and the microcrystalline semiconductor film 61 including the impurity element which serves as a donor. Further alternatively, the concentration may have a peak in the center of the microcrystalline semiconductor film 61 including the impurity element which serves as a donor.

Forming the microcrystalline semiconductor film 58 over the microcrystalline semiconductor film 61 including the impurity element which serves as a donor can prevent the impurity element which serves as a donor in the microcrystalline semiconductor film 61 from being diffused into the buffer layer 73. If the impurity element which serves as a donor is diffused into the buffer layer 73, which is a high resistance region, resistance of the buffer layer 73 decreases and leak current flows between the microcrystalline semiconductor film 61 including the impurity element which serves as a donor and the source and drain regions 72, thereby degrading switching characteristics. Therefore, it is preferable to form the microcrystalline semiconductor film 58 not including the impurity element which serves as a donor at a higher concentration than the detection limit of SIMS between the microcrystalline semiconductor film 61 including the impurity element which serves as a donor and the buffer layer 73.

Figure 4C:
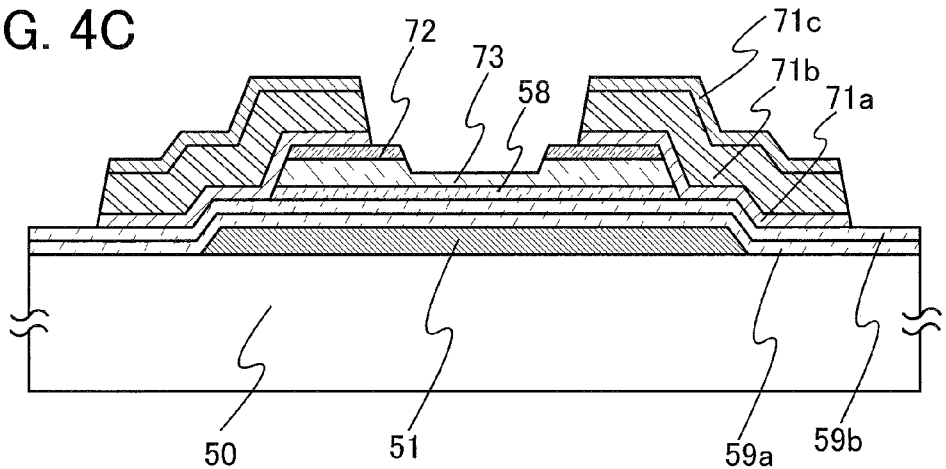

In FIG. 3A, further, the microcrystalline semiconductor film 58 may be formed instead of the microcrystalline semiconductor film 61 including the impurity element which serves as a donor (see FIG. 4C).

Figure 4D:
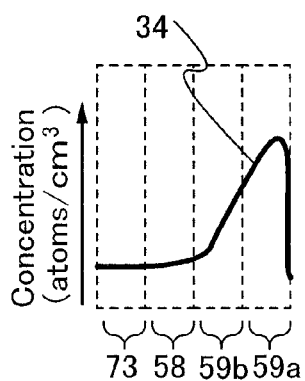

Next, with SIMS, concentration distribution of the impurity element which serves as a donor in a stacked-layer portion including the gate insulating films 59a and 59b including the impurity element which serves as a donor, the microcrystalline semiconductor film 58, and the buffer layer 73 is schematically shown by a curve 34 in FIG. 4D.

As shown in FIG. 4D, the concentration of the impurity element which serves as a donor in the thin film transistor shown in FIG. 4C has a peak in the gate insulating film 59a including the impurity element which serves as a donor. The shape of the curve 34, which shows concentration distribution of the impurity element which serves as a donor, is not limited to that shown in FIG. 4D; the concentration may have a peak in or around the center of the gate insulating film 59a including the impurity element which serves as a donor, in or around the center of the gate insulating film 59b including the impurity element which serves as a donor, or at or around the interface between the gate insulating films 59a and 59b including the impurity element which serves as a donor.

Next, a different mode from the above is described with reference to FIGS. 5A and 5B.

Figure 5A:
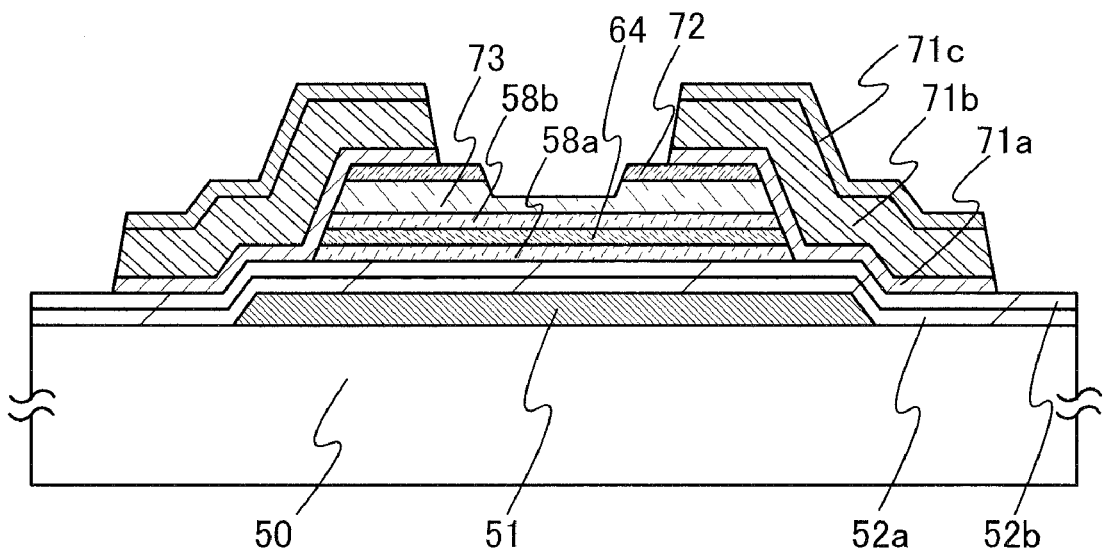
FIG. 5A is a cross-sectional view illustrating a method for manufacturing a display device of the present invention.

FIG. 5A shows a cross section of a thin film transistor of this embodiment mode.

In the thin film transistor shown in FIG. 5A, a gate electrode 51 is formed over a substrate 50; gate insulating films 52a and 52b are formed over the gate electrode 51; a first microcrystalline semiconductor film 58a is formed over the gate insulating films 52a and 52b; a second microcrystalline semiconductor film 64 including an impurity element which serves as a donor is formed over the first microcrystalline semiconductor film 58a; a third microcrystalline semiconductor film 58b is formed over the second microcrystalline semiconductor film 64 including the impurity element which serves as a donor; a buffer layer 73 is formed over the third microcrystalline semiconductor film 58b; a pair of semiconductor films 72 to which an impurity element imparting one conductivity type is added are formed over the buffer layer 73; and wirings 71a to 71c are formed over the pair of semiconductor films 72 to which the impurity element imparting one conductivity type is added.

This mode has a feature that the second microcrystalline semiconductor film 64 including the impurity element which serves as a donor is formed between the first microcrystalline semiconductor film 58a and the third microcrystalline semiconductor film 58b, which do not include the impurity element which serves as a donor at a higher concentration than the detection limit of SIMS. It is preferable that the peak concentration of the impurity element which serves as a donor be from $6 \times 10^{15}$ atoms/cm$^3$ to $3 \times 10^{18}$ atoms/cm$^3$ inclusive, more preferably from $3 \times 10^{16}$ atoms/cm$^3$ to $3 \times 10^{17}$ atoms/cm$^3$ inclusive.

Figure 5B:
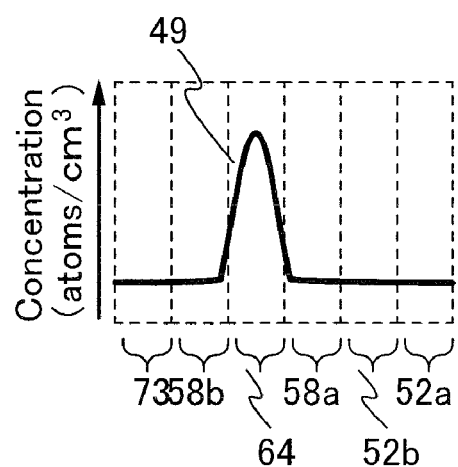
FIG. 5B is a diagram showing a peak concentration of an impurity element which serves as a donor in stacked films.

Next, with SIMS, concentration distribution of the impurity element which serves as a donor in a stacked-layer portion including the gate insulating films 52a and 52b, the first microcrystalline semiconductor film 58a, the second microcrystalline semiconductor film 64 including the impurity element which serves as a donor, the third microcrystalline semiconductor film 58b, and the buffer layer 73 is schematically shown by a curve 49 in FIG. 5B.

As shown in FIG. 5B, the concentration of the impurity element which serves as a donor in the thin film transistor shown in FIG. 5A satisfies the above peak concentration in the second microcrystalline semiconductor film 64 including the impurity element which serves as a donor. Further, the concentration has a peak in the center of the second microcrystalline semiconductor film 64 including the impurity element which serves as a donor. Furthermore, the shape of the curve that shows the concentration distribution of the impurity element which serves as a donor is not limited to that shown in FIG. 5B. The concentration may have a peak at or around the interface between the first microcrystalline semiconductor film 58a and the second microcrystalline semiconductor film 64 including the impurity element which serves as a donor, and may decrease toward the third microcrystalline semiconductor film 58b.

In the above manner, the accumulation-type thin film transistor in which the gate insulating film and/or the microcrystalline semiconductor film includes the impurity element which servers as a donor is formed, whereby crystallinity can be increased at the interface between the gate insulating film and the microcrystalline semiconductor film, and resistivity of the microcrystalline semiconductor film can be reduced; thus, a thin film transistor with high field effect mobility and high on current can be manufactured.

Further, forming a channel formation region with a microcrystalline semiconductor film suppresses variation in threshold voltage, improves field effect mobility, and lowers sub-threshold swing (S value); thus, a thin film transistor can achieve high performance. Accordingly, a driving frequency of a display device can be increased, whereby the panel size can be increased and high density of pixels in the display device can be achieved.

Embodiment Mode 2

This embodiment mode describes a thin film transistor in which a gate insulating film has a different structure from that of the thin film transistors shown in Embodiment Mode 1, with reference to FIG. 6 and FIGS. 7A to 7D. Here, as shown in FIG. 6 and FIGS. 7A to 7D, the thin film transistor has three gate insulating films instead of the two gate insulating films which are shown in FIGS. 1A to 1F, FIGS. 2A to 2F, FIGS. 3A and 3B, FIGS. 4A to 4D, and FIGS. 5A and 5B.

Figure 6:
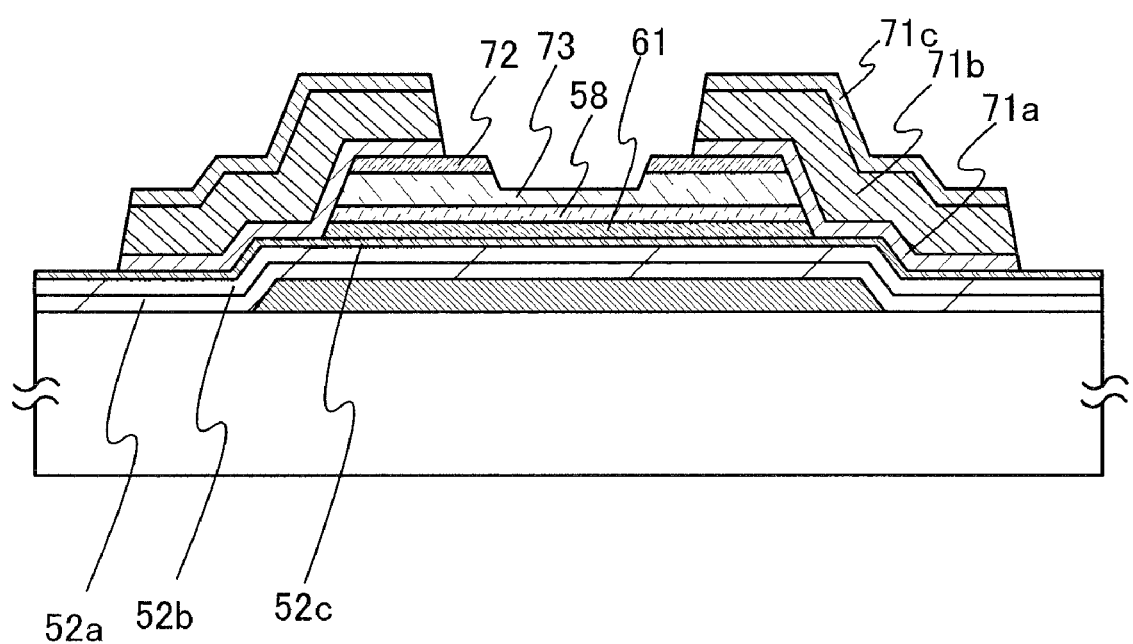
FIG. 6 is a cross-sectional view illustrating a method for manufacturing a display device of the present invention.

Instead of the gate insulating films 52a and 52b of the thin film transistor shown in FIG. 1A, three gate insulating films 52a, 52b, and 52c may be formed as shown in FIG. 6. The gate insulating films 52a and 52b, which are first and second layers, can be formed in a similar manner to Embodiment Mode 1. As the gate insulating film 52c, which is a third layer, a silicon nitride film or a silicon nitride oxide film with a thickness of from 1 nm to 5 nm approximately can be formed.

Figure 7A:
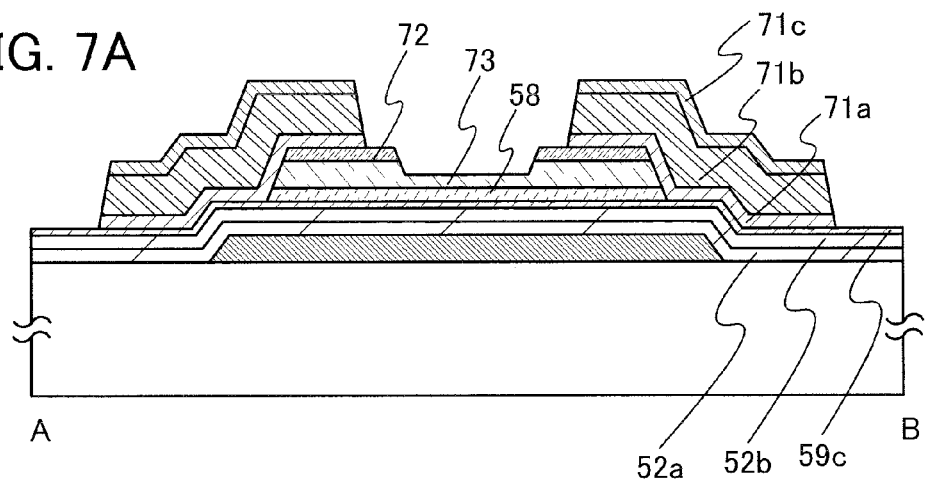
FIGS. 7A and 7C are cross-sectional views illustrating methods for manufacturing a display device of the present invention.

Further, instead of the two gate insulating films 52a and 52b, as shown in FIG. 7A, gate insulating films 52a and 52b and a gate insulating film 59c including an impurity element which serves as a donor may be formed over a substrate 50 and a gate electrode 51. Then, a microcrystalline semiconductor film 58, a buffer layer 73, a pair of semiconductor films 72 to which an impurity element imparting one conductivity type is added, and wirings 71a to 71c can be formed thereover.

As the gate insulating films 52a and 52b, which are first and second layers, a silicon nitride film, a silicon nitride oxide film, a silicon oxide film, or a silicon oxynitride film can be formed by a plasma CVD method or a sputtering method in a similar manner to Embodiment Mode 1. As the gate insulating film 59c including the impurity element which serves as a donor, which is a third layer, a silicon nitride film or a silicon nitride oxide film with a thickness of from 1 nm to 5 nm approximately which includes phosphorus, arsenic, or antimony can be formed.

Figure 7B:
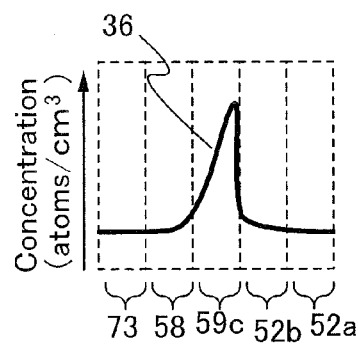
FIGS. 7B and 7D are diagrams showing peak concentrations of an impurity element which serves as a donor in stacked films.

Next, with SIMS, concentration distribution of the impurity element which serves as a donor in a stacked-layer portion including the gate insulating films 52a and 52b, the gate insulating film 59c including the impurity element which serves as a donor, the microcrystalline semiconductor film 58, and the buffer layer 73 is schematically shown by a curve 36 in FIG. 7B.

As shown in FIG. 7B, the concentration of the impurity element which serves as a donor in the thin film transistor shown in FIG. 7A has a peak in the gate insulating film 59c including the impurity element which serves as a donor. Further, the peak is present at or around the interface between the gate insulating film 52b and the gate insulating film 59c including the impurity element which serves as a donor. Furthermore, the shape of the curve that shows the concentration distribution of the impurity element which serves as a donor is not limited to that shown in FIG. 7B, and the concentration may have a peak in or around the center of the gate insulating film 59c including the impurity element which serves as a donor.

Figure 7C:
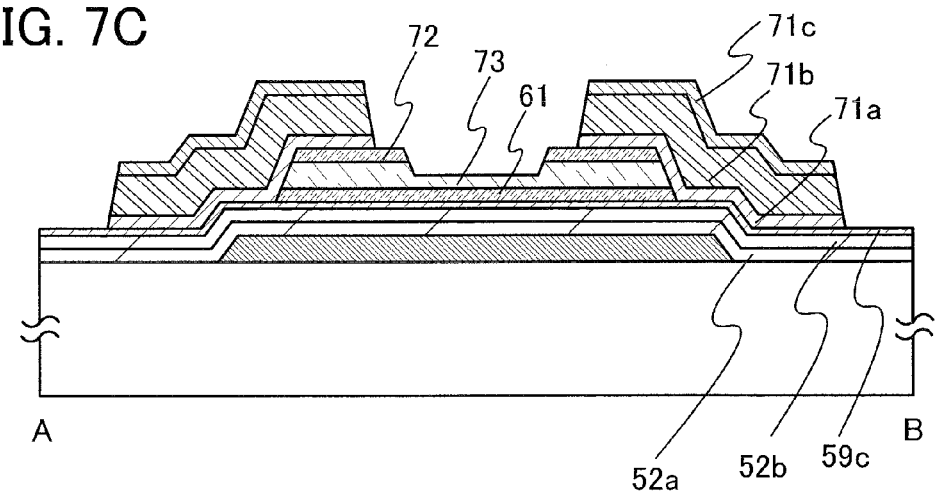

Instead of the microcrystalline semiconductor film 58 shown in FIG. 7A, a microcrystalline semiconductor film 61 including an impurity element which serves as a donor may be formed (see FIG. 7C). For example, after forming a gate insulating film 59c including an impurity element which serves as a donor, a microcrystalline semiconductor is deposited under the condition of forming the microcrystalline semiconductor film 58, with the impurity element which serves as a donor remaining in a reaction chamber. Then, a buffer layer 73 is formed and then the process described in Embodiment Mode 1 is carried out, so that a thin film transistor can be formed in which gate insulating films 52a and 52b and the gate insulating film 59c including the impurity element which serves as a donor are formed over a gate electrode 51; the microcrystalline semiconductor film 61 including the impurity element which serves as a donor is formed over the gate insulating film 59c; and the buffer layer 73 is formed over the microcrystalline semiconductor film 61 including the impurity element which serves as a donor, as shown in FIG. 7C.

Figure 7D:
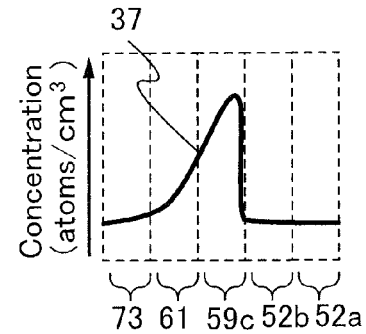

Next, with SIMS, concentration distribution of the impurity element which serves as a donor in a stacked-layer portion including the gate insulating films 52a and 52b, the gate insulating film 59c including the impurity element which serves as a donor, the microcrystalline semiconductor film 61 including the impurity element which serves as a donor, and the buffer layer 73 is schematically shown by a curve 37 in FIG. 7D.

As shown in FIG. 7D, the concentration of the impurity element which serves as a donor in the thin film transistor shown in FIG. 7C has a peak in the gate insulating film 59c including the impurity element which serves as a donor. Further, the peak is present at or around the interface between the gate insulating film 52b and the gate insulating film 59c including the impurity element which serves as a donor. Furthermore, the shape of the curve that shows the concentration distribution of the impurity element which serves as a donor is not limited to that shown in FIG. 7D, and the concentration may have a peak in or around the center of the gate insulating film 59c including the impurity element which serves as a donor.

When a silicon nitride film or a silicon nitride oxide film with a thickness of from 1 nm to 5 nm approximately, or a silicon nitride film or a silicon nitride oxide film which includes an impurity element which serves as a donor and has a thickness of from 1 nm to 5 nm approximately is formed as the gate insulating film 52c or 59c, which is the third layer, a plasma CVD method can be employed. Further, it is also possible to have the gate insulating film 52b undergo nitridation treatment with high-density plasma to form a silicon nitride layer over the surface of the gate insulating film 52b. By high-density plasma nitridation, a silicon nitride layer that includes nitrogen at a higher concentration can be obtained. The high-density plasma is generated by use of high-frequency microwaves, for example, microwaves with a frequency of 2.45 GHz. With high-density plasma, which has the characteristic of having a low electron temperature, a layer can be formed with less plasma damage and fewer defects compared to a layer formed by a conventional plasma treatment because the kinetic energy of an active species is low. In addition, carrier mobility can be increased because the level of roughness of the surface of the gate insulating film 52b can be reduced.

In a microcrystalline semiconductor film, an amorphous semiconductor and a crystalline semiconductor are mixed. Thus, when the amorphous semiconductor comes to be in contact with silicon oxide or silicon oxynitride, hydrogen in the amorphous semiconductor tends to react with the silicon oxide or the silicon oxynitride, so that hydrogen concentration in the microcrystalline semiconductor film decreases and the interface between the gate insulating film and the microcrystalline semiconductor film deteriorates. Therefore, a silicon nitride film or a silicon nitride oxide film with a small thickness that is formed as a base film for the microcrystalline semiconductor film can serve as a blocking film for preventing hydrogen from diffusing, so that deterioration of the interface between the gate insulating film and the microcrystalline semiconductor film can be reduced.

It is possible to apply the above structure of the gate insulating film to the gate insulating film of the thin film transistors shown in FIG. 1D, FIGS. 2A and 2E, FIG. 3A, FIGS. 4A and 4C, and FIG. 5A.

Embodiment Mode 3

This embodiment mode will describe manufacturing processes of the thin film transistors described in Embodiment Mode 1.

A thin film transistor having a microcrystalline semiconductor film, which is of an n-type, is more suitable for use in a driver circuit than that of a p-type because the n-type thin film transistor has a higher field effect mobility. It is desired that all thin film transistors formed over the same substrate have the same polarity, in order to reduce the number of manufacturing steps. Here, description is made using an n-channel thin film transistor.

First, manufacturing processes of the thin film transistors shown in FIGS. 1A and 1D are described below.

Figure 9A:
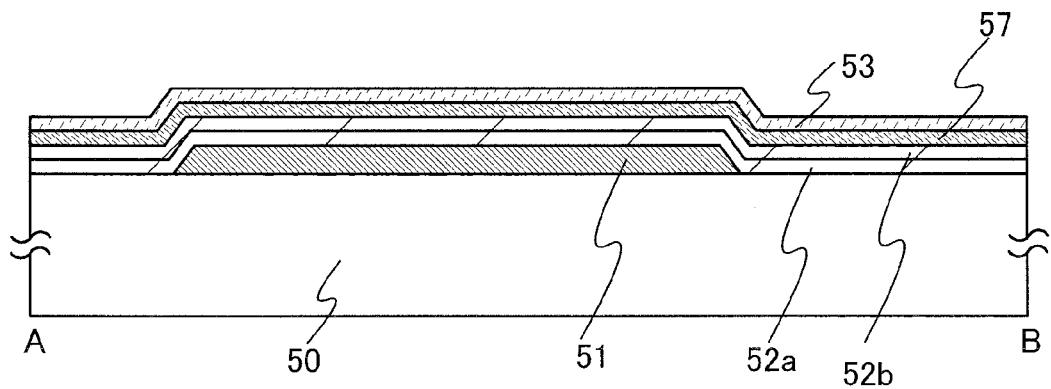
FIGS. 9A to 9C are cross-sectional views illustrating a method for manufacturing a display device of the present invention.

As shown in FIG. 9A, a gate electrode 51 is formed over a substrate 50, and gate insulating films 52a and 52b are formed over the gate electrode 51.

The gate electrode 51 is formed by a sputtering method, a CVD method, a plating method, a printing method, a droplet discharge method, or the like using any of the metal materials described in Embodiment Mode 1. In this embodiment mode, a molybdenum film is formed as a conductive film over the substrate 50 by a sputtering method and is etched by use of a resist mask which is formed using a first photomask, whereby the gate electrode 51 is formed.

Each of the gate insulating films 52a and 52b can be formed by a CVD method, a sputtering method, or the like using a silicon oxide film, a silicon nitride film, a silicon oxynitride film, or a silicon nitride oxide film.

Next, after an impurity element which serves as a donor is adsorbed onto the gate insulating film 52b, a microcrystalline semiconductor film is deposited by a plasma CVD method using a deposition gas including silicon or germanium, and hydrogen, whereby a microcrystalline semiconductor film 57 including the impurity element which serves as a donor is formed.

As a typical example of a method for forming a microcrystalline semiconductor film including an impurity element which serves as a donor, a process for forming a microcrystalline silicon film including phosphorus will be described in chronological order with reference to FIG. 8.

Figure 8:
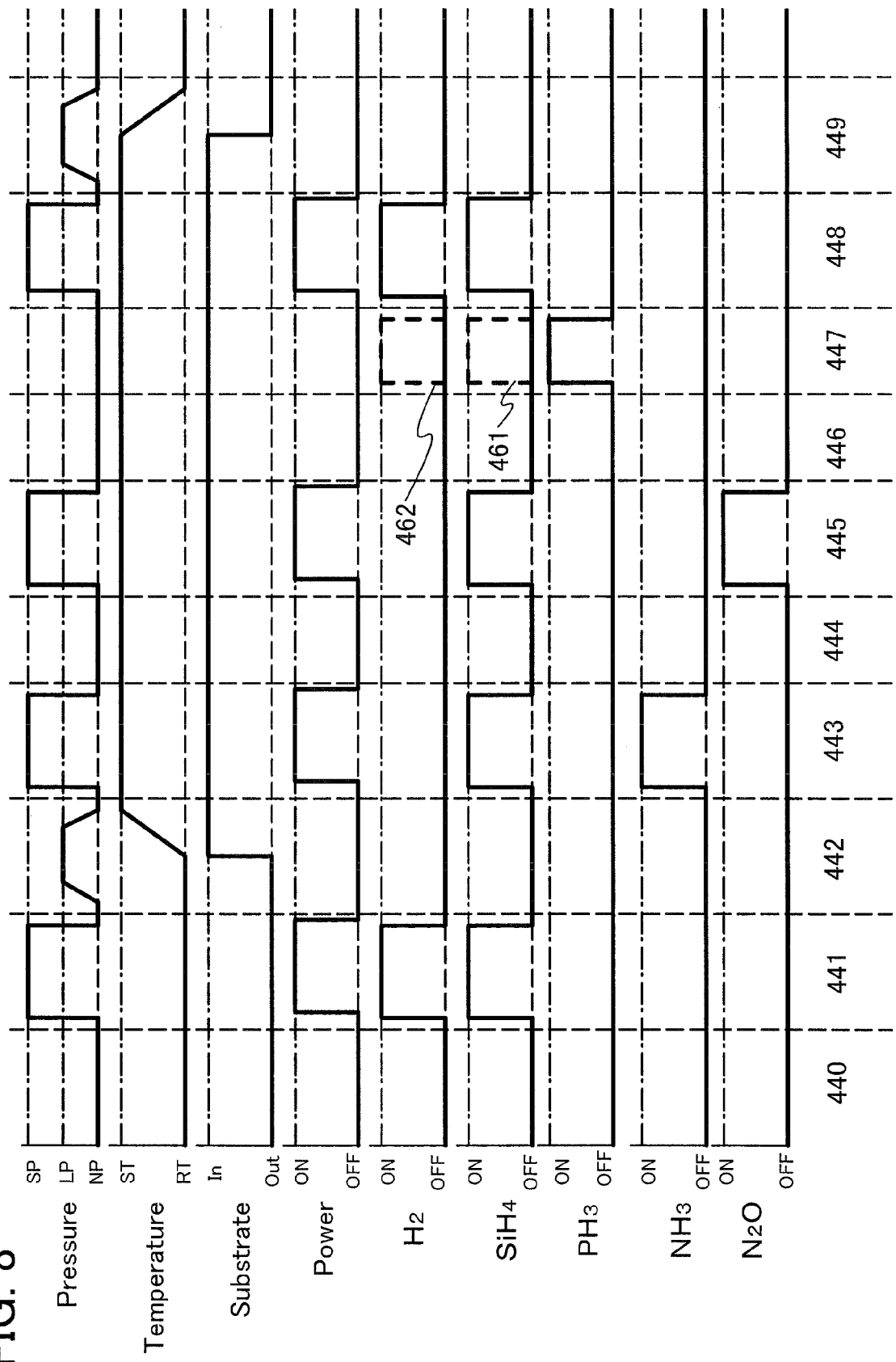
FIG. 8 is an example of a timing chart illustrating a process for forming gate insulating films and a microcrystalline semiconductor film.

FIG. 8 is a typical example of a timing chart for describing steps of forming the gate insulating films 52a and 52b and the microcrystalline semiconductor film 57 including the impurity element which serves as a donor. FIG. 8 shows a procedure starting from a step of vacuum evacuation 440 from atmospheric pressure in a reaction chamber of a plasma CVD apparatus. Then, the following treatments, which are carried out after the vacuum evacuation 440, are shown in chronological order: a precoating treatment 441, substrate carrying-in 442, a film formation treatment (1) 443 for forming the gate insulating film 52a, a vacuum evacuation treatment 444, a film formation treatment (2) 445 for forming the gate insulating film 52b, a vacuum evacuation treatment 446, a flush treatment 447, a film formation treatment (3) 448 for forming the microcrystalline semiconductor film 57 including the impurity element which serves as a donor, and substrate carrying-out 449.

First, vacuum evacuation is performed in a reaction chamber to a predetermined degree of vacuum. In the case of high vacuum evacuation, vacuum evacuation is performed by using a turbo molecular pump or the like to obtain a pressure lower than $10^{-1}$ Pa as a degree of vacuum. Alternatively, vacuum evacuation may be performed by using a cryopump to reduce a pressure in the reaction chamber to be lower than $10^{-5}$ Pa, i.e., to an ultra-high vacuum (hereinafter, such a pressure is called NP: normal pressure). In addition, preferably, a heat treatment is performed to the reaction chamber so as to degas the inner wall of the reaction chamber. Further, the temperature is stabilized by operating a heater for heating the substrate (hereinafter, such a temperature is called ST: Setting Temperature). The substrate heating temperature is 100° C. to 300° C., preferably 120° C. to 220° C.

In the precoating treatment 441, the inner wall of the reaction chamber of the plasma CVD apparatus is precoated with a film having a composition that is the same as or similar to the gate insulating film. Accordingly, it is possible to prevent a metal used to form the reaction chamber from entering the gate insulating film as an impurity. In other words, by covering the inner wall of the reaction chamber with the film having a composition that is the same as or similar to the gate insulating film, the inner wall of the reaction chamber can be prevented from being etched by plasma, and the concentration of the impurity which has entered the gate insulating film from the reaction chamber can be reduced.

In the substrate carrying-in 442, the substrate is carried into the reaction chamber from a load lock chamber connected to the reaction chamber. The pressure in the reaction chamber at this time is the same as that in the load lock chamber (hereinafter, such a pressure is called LP: Load Lock Pressure).

In the film formation treatment (1) 443 for forming the gate insulating film 52a, a source gas, here, hydrogen, silane, and ammonia are introduced and mixed, and a silicon nitride film is formed by glow discharge plasma which is generated by application of high-frequency power (hereinafter, such a pressure is called SP: Setting Pressure). Note that nitrogen may also be introduced in addition to the above source gas. After formation of the gate insulating film 52a, introduction of the above source gas is stopped, and the power is turned off, and then, generation of plasma is stopped.

In the vacuum evacuation treatment 444, vacuum evacuation is performed in the reaction chamber to a predetermined degree of vacuum.

In the film formation treatment (2) 445 for forming the gate insulating film 52b, a source gas, here, hydrogen, silane, and dinitrogen monoxide are introduced and mixed, and a silicon oxynitride film is formed by glow discharge plasma which is generated by application of high-frequency power. After formation of the gate insulating film 52b, introduction of the above source gas is stopped, and the power is turned off, and then, generation of plasma is stopped.

In the vacuum evacuation treatment 446, vacuum evacuation is performed in the reaction chamber to a predetermined degree of vacuum.

In the flush treatment 447, a gas including an impurity element which serves as a donor is introduced to the reaction chamber, and the impurity element which serves as a donor is adsorbed onto the surface of the gate insulating film 52b, furthermore, onto the inner wall of the reaction chamber. In this embodiment mode, 0.001% to 1% phosphine (diluted with hydrogen or silane) is introduced to the reaction chamber. Note that phosphine is not necessarily diluted with hydrogen or silane. In addition to the gas including the impurity element which serves as a donor, a deposition gas including silicon or germanium may be introduced as denoted by a dashed line 461 or hydrogen may be introduced as denoted by a dashed line 462, to the reaction chamber. By introducing a deposition gas including silicon or germanium, or hydrogen to the reaction chamber, an impurity such as oxygen, nitrogen, or fluorine in the reaction chamber can be discharged from the reaction chamber, so that contamination of a film to be formed can be prevented.

In the film formation treatment (3) 448 for forming the microcrystalline semiconductor film 57 including the impurity element which serves as a donor, a deposition gas including silicon or germanium, which is silane here, hydrogen, and/or a rare gas are introduced and mixed in the reaction chamber, and a microcrystalline semiconductor film is formed by glow discharge plasma which is generated by application of high-frequency power. Silane is diluted with hydrogen and/or a rare gas to be 10 to 2000 times thinner. Therefore, a large amount of hydrogen and/or a rare gas is needed. The substrate heating temperature is 100° C. to 300°

C., preferably 120° C. to 220° C. It is preferable that the film be formed at temperatures of 120° C. to 220° C. so that a growing surface of the microcrystalline silicon film is inactivated with hydrogen, and growth of microcrystalline silicon is promoted. At this time, the microcrystalline semiconductor grows using the impurity element which serves as a donor and is adsorbed onto the surface of the gate insulating film 52*b*, here, phosphorus, as a crystal nucleus. Thus, an amorphous semiconductor is not formed in an early stage of deposition of the semiconductor film, and crystals grow in a normal direction with respect to the gate insulating film 52*b*, so that a microcrystalline semiconductor film with high crystallinity in which columnar-like microcrystalline semiconductors are arranged can be formed. In addition, the impurity element which serves as a donor and is adsorbed onto the surface of the gate insulating film 52*b* is included in the microcrystalline semiconductor film, so that a highly conductive microcrystalline semiconductor film including the impurity element which serves as a donor can be formed.

Further, an energy band width may be adjusted to be 0.9 eV to 1.1 eV by mixing germanium hydride or germanium fluoride such as $GeH_4$ or $GeF_4$ into a gas such as silane. By adding germanium to silicon, the temperature characteristic of a thin film transistor can be changed.

In the substrate carrying-out 449, the substrate is taken out of the reaction chamber and carried into the load lock chamber connected to the reaction chamber. The pressure in the reaction chamber at this time is the same as that in the load lock chamber.

The film formation treatment (3) 448 for forming the microcrystalline semiconductor film 57 including the impurity element which serves as a donor is carried out after the flush treatment 447 in this embodiment mode. However, instead of these treatments, the microcrystalline semiconductor film 57 including the impurity element which serves as a donor can be formed without the flush treatment 447 as follows: a deposition gas including silicon or germanium, hydrogen, and/or a rare gas, and a gas including an impurity element which serves as a donor are introduced and mixed, and the microcrystalline semiconductor film 57 including the impurity element which serves as a donor is formed by glow discharge plasma which is generated by application of high-frequency power.

In a conventional method for forming a microcrystalline semiconductor film, an amorphous semiconductor layer is formed in an early stage of deposition due to impurities except the impurity element which serves as a donor, lattice mismatch, or the like. In an inverted staggered thin film transistor, carriers flow in a region of a microcrystalline semiconductor film around the gate insulating film. Thus, when an amorphous semiconductor layer is formed at the interface between the gate insulating film and the microcrystalline semiconductor film, field effect mobility is decreased, and further, the amount of current is reduced, so that electric characteristics of the thin film transistor are lowered.

However, by forming the microcrystalline semiconductor film including the impurity element which serves as a donor over the gate insulating film as in this embodiment mode, crystallinity in a film thickness direction can be improved, and crystallinity at the interface between the gate insulating film and the microcrystalline semiconductor film can be improved.

Next, as shown in FIG. 9A, a microcrystalline semiconductor film 53 is formed over the microcrystalline semiconductor film 57 including the impurity element which serves as a donor. The microcrystalline semiconductor film 53 is formed as follows: a deposition gas including silicon or germanium, which is silane here, hydrogen, and/or a rare gas are introduced and mixed in a reaction chamber, and a microcrystalline semiconductor film is formed by glow discharge plasma. Silane is diluted with hydrogen and/or a rare gas to be 10 to 2000 times thinner. Therefore, a large amount of hydrogen and/or a rare gas is needed. The substrate heating temperature is 100° C. to 300° C., preferably 120° C. to 220° C. It is preferable that the film be formed at temperatures of 120° C. to 220° C. so that a growing surface of the microcrystalline silicon film is inactivated with hydrogen, and growth of microcrystalline silicon is promoted. By forming the microcrystalline semiconductor film 53 in a reaction chamber different from that for forming the microcrystalline semiconductor film 57 including the impurity element which serves as a donor, the microcrystalline semiconductor film 53 not including the impurity element which serves as a donor at a higher concentration than the detection limit of SIMS can be formed. Also by forming the microcrystalline semiconductor film successively without the substrate carrying-out 449 shown in FIG. 8, the microcrystalline semiconductor film 53 not including the impurity element which serves as a donor at a higher concentration than the detection limit of SIMS can be formed; in this case, in the flush treatment 447, it is preferable to reduce the concentration of the impurity element which serves as a donor and is adsorbed onto the gate insulating film 52*b* and the inner wall of the reaction chamber.

Figure 9B:
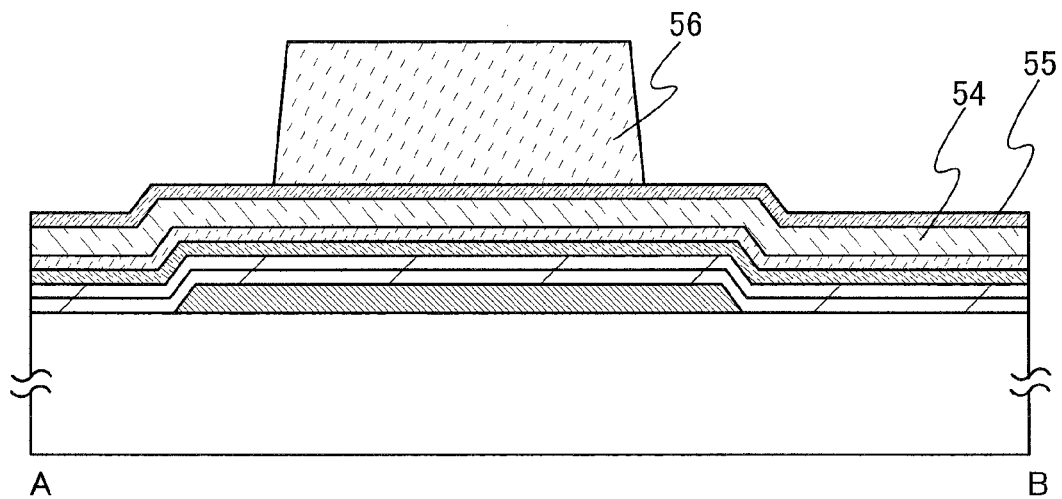

Next, as shown in FIG. 9B, a buffer layer 54 and a semiconductor film 55 to which an impurity element imparting one conductivity type is added are formed over the microcrystalline semiconductor film 53. Then, a resist mask 56 is formed over the semiconductor film 55 to which the impurity element imparting one conductivity type is added.

As the buffer layer 54, an amorphous semiconductor film can be formed by a plasma CVD method using a deposition gas including silicon or germanium. Alternatively, by dilution of a deposition gas including silicon or germanium with one or plural kinds of rare gases selected from helium, argon, krypton, and neon, an amorphous semiconductor film can be formed. Furthermore, an amorphous semiconductor film including hydrogen can be formed using hydrogen with a flow rate of 1 to 10 times, preferably 1 to 5 times as high as that of a deposition gas including silicon or germanium. In addition, halogen such as fluorine or chlorine, or nitrogen may be added to the above hydrogenated semiconductor film.

Also, as the buffer layer 54, an amorphous semiconductor film can be formed by sputtering with hydrogen or a rare gas, using a semiconductor such as silicon or germanium as a target.

The buffer layer 54 is preferably formed using an amorphous semiconductor film which does not include crystal grains. Therefore, in the case that the buffer layer 54 is formed by a high-frequency plasma CVD method with a frequency of several tens of MHz to several hundreds MHz or a microwave plasma CVD method, film formation conditions are preferably controlled such that an amorphous semiconductor film does not include crystal grains.

In some cases, the buffer layer 54 is partly etched in a later step for forming source and drain regions. Thus, the buffer layer 54 is preferably formed with such a thickness that a part of the buffer layer 54 is left at that time. Typically, it is preferable to form the buffer layer 54 with a thickness of from 30 nm to 500 nm inclusive, preferably from 50 nm to 200 nm inclusive. In a display device including a thin film transistor to which a high voltage (e.g., about 15 V) is applied, typically, in a liquid crystal display device, if the buffer layer 54 is formed thickly, withstand voltage is increased, so that deterioration of the thin film transistor can be prevented even if a high voltage is applied to the thin film transistor.

Formation of an amorphous semiconductor film or an amorphous semiconductor film including hydrogen, nitrogen, or halogen as the buffer layer 54 over the surface of the microcrystalline semiconductor film 53 can prevent a surface of a crystal grain included in the microcrystalline semiconductor film 53 from being naturally oxidized. In particular, in a region where an amorphous semiconductor is in contact with microcrystal grains, a crack is likely to be caused due to local stress. When this crack is exposed to oxygen, the crystal grains are oxidized, whereby silicon oxide is formed. However, by formation of the buffer layer 54 over the surface of the microcrystalline semiconductor film 53, the microcrystal grains can be prevented from being oxidized.

Since the buffer layer 54 is formed using an amorphous semiconductor film or an amorphous semiconductor film including hydrogen, nitrogen, or halogen, the buffer layer 54 has a larger energy gap and higher resistivity than the microcrystalline semiconductor film 53 and low mobility which is one fifth to one tenth that of the microcrystalline semiconductor film 53. Therefore, in a thin film transistor to be formed later, the buffer layer formed between source and drain regions and the microcrystalline semiconductor film 53 functions as a high-resistance region and the microcrystalline semiconductor film 57 including the impurity element which serves as a donor functions as a channel formation region. Accordingly, off current of the thin film transistor can be reduced. In addition, when the thin film transistor is used as a switching element of a display device, the display device can have an improved contrast.

The buffer layer 54 can also be formed at temperatures of 300° C. to 400° C. by a plasma CVD method after forming the microcrystalline semiconductor film 53. By this treatment, hydrogen is supplied to the microcrystalline semiconductor film 53, and the same effect as hydrogenizing the microcrystalline semiconductor film 53 can be obtained. In other words, by depositing the buffer layer 54 over the microcrystalline semiconductor film 53, hydrogen is diffused into the microcrystalline semiconductor film 53, and a dangling bond can be terminated.

After forming the microcrystalline semiconductor film 57 including the impurity element which serves as a donor, by forming the buffer layer 54 without forming the microcrystalline semiconductor film 53, the thin film transistor as shown in FIG. 1D can be manufactured.

As for the semiconductor film 55 to which the impurity element imparting one conductivity type is added, in the case that an n-channel thin film transistor is to be formed, phosphorus may be added as a typical impurity element, and an impurity gas such as $PH_3$ may be added to silicon hydride. When a p-channel thin film transistor is to be formed, boron may be added as a typical impurity element; for example, an impurity gas such as $B_2H_6$ may be added to silicon hydride. The semiconductor film 55 to which the impurity element imparting one conductivity type is added can be formed of a microcrystalline semiconductor or an amorphous semiconductor. The semiconductor film 55 to which the impurity element imparting one conductivity type is added is formed with a thickness of from 2 nm to 50 nm inclusive. By formation of the semiconductor film 55 to which the impurity element imparting one conductivity type is added with a small thickness, throughput can be improved.

Then, the resist mask 56 is formed over the semiconductor film 55 to which the impurity element imparting one conductivity type is added.

The resist mask 56 is formed by a photolithography technique. Here, using a second photomask, the resist mask 56 is formed by exposing a resist that is applied on the semiconductor film 55 to which the impurity element imparting one conductivity type is added to light and developing the resist.

Figure 9C:
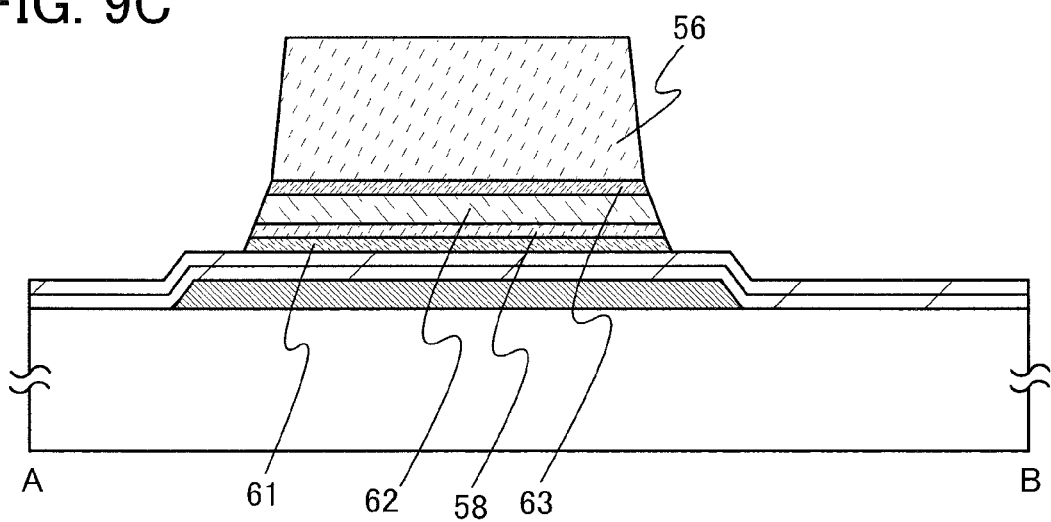
Figure 12A:
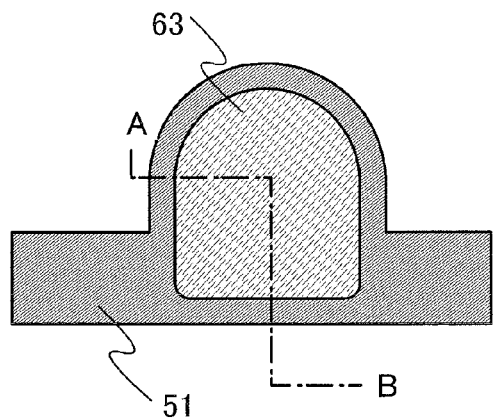
FIGS. 12A to 12C are top views illustrating a method for manufacturing a display device of the present invention.

Next, the microcrystalline semiconductor film 57 including the impurity element which serves as a donor, the microcrystalline semiconductor film 53, the buffer layer 54, and the semiconductor film 55 to which the impurity element imparting one conductivity is added are etched using the resist mask 56, whereby a microcrystalline semiconductor film 61 including the impurity element which serves as a donor, a microcrystalline semiconductor film 58, a buffer layer 62, and a semiconductor film 63 to which the impurity element imparting one conductivity type is added are formed as shown in FIG. 9C. After that, the resist mask 56 is removed. FIG. 9C shows a cross section taken along a line A-B in FIG. 12A (except for the resist mask 56).

With side surfaces of end portions of the microcrystalline semiconductor film 61, the microcrystalline semiconductor film 58, and the buffer layer 62 having inclines, the microcrystalline semiconductor film 58 and source and drain regions have a larger distance therebetween, so that leak current between the microcrystalline semiconductor film 61 and the source and drain regions formed over the buffer layer 62 can be prevented. In addition, leak current between wirings and the microcrystalline semiconductor film 61 can also be prevented. The inclination angle of the side surfaces of the end portions of the microcrystalline semiconductor film 61, the microcrystalline semiconductor film 58, and the buffer layer 62 is 30° to 90°, preferably 45° to 80°. With such an angle, disconnection of the wirings due to a step shape can be prevented.

Figure 10A:
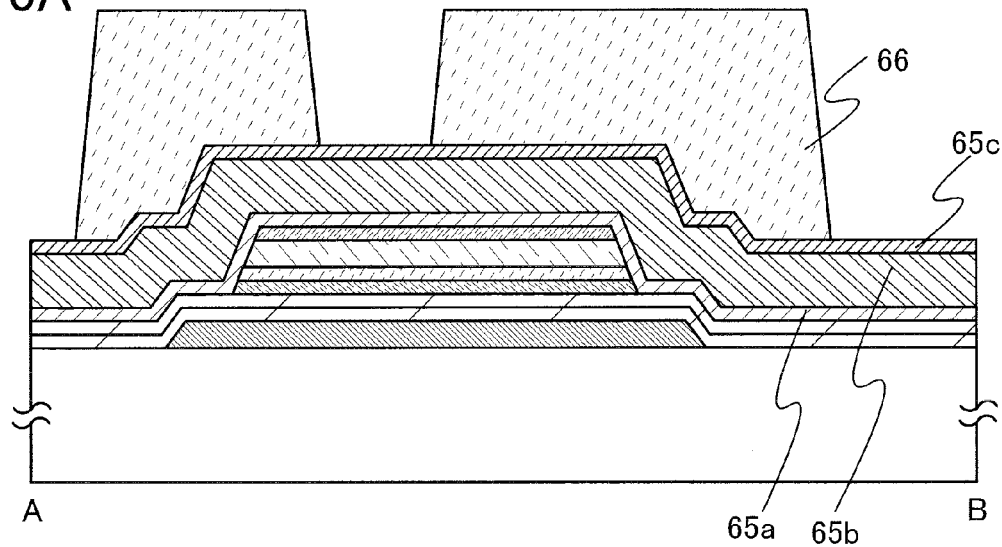
FIGS. 10A to 10C are cross-sectional views illustrating a method for manufacturing a display device of the present invention.

Next as shown in FIG. 10A, conductive films 65a to 65c are formed over the semiconductor film 63 to which the impurity element imparting one conductivity type is added and the gate insulating film 52b, and then, a resist mask 66 is formed over the conductive films 65a to 65c. The conductive films 65a to 65 are formed by a sputtering method, a CVD method, a printing method, a droplet discharge method, an evaporation method, or the like. Here, as the conductive film, a conductive film having a three-layer structure in which the conductive films 65a to 65c are stacked is shown; a molybdenum film is used for each of the conductive films 65a and 65c and an aluminum film is used for the conductive film 65b, or a titanium film is used for each of the conductive films 65a and 65c and an aluminum film is used for the conductive film 65b. The conductive films 65a to 65c are formed by a sputtering method or a vacuum evaporation method.

The resist mask 66 can be formed in a manner similar to the resist mask 56.

Figure 10B:
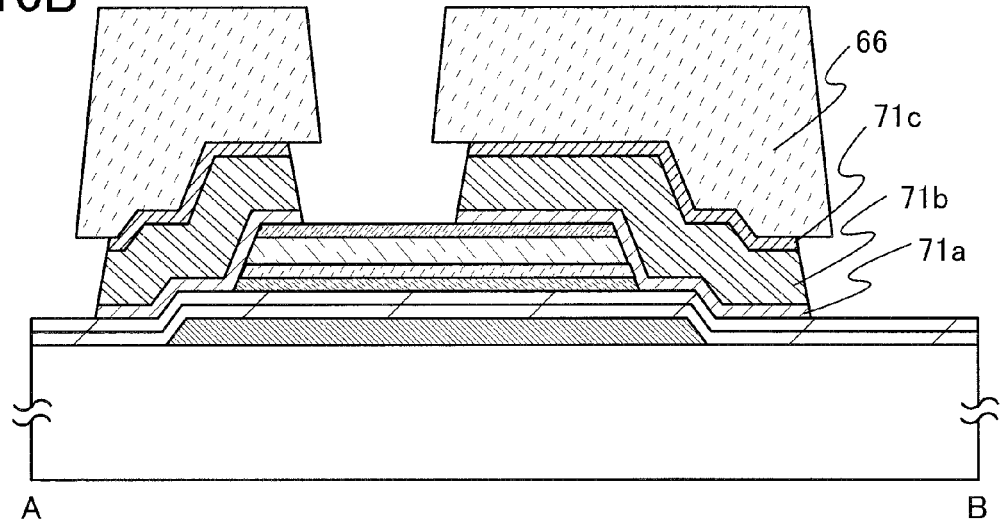

Next, as shown in FIG. 10B, the conductive films 65a to 65c are partly etched to form pairs of wirings 71a to 71c (functioning as source and drain electrodes). Here, the conductive films 65a to 65c are etched by wet etching using the resist mask 66 that is formed by a photolithography process using a third photomask, so that the conductive films 65a to 65c are etched as selected. Consequently, since the conductive films 65a to 65c are etched isotropically, the wirings 71a to 71c, which have smaller areas than the resist mask 66, can be formed.

Figure 10C:
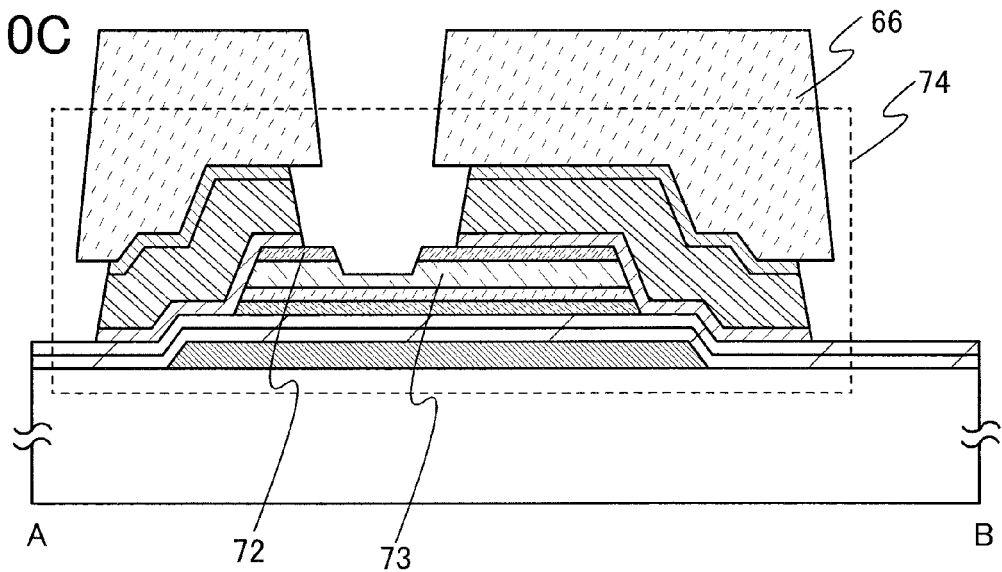

Then, the semiconductor film 63 to which the impurity element imparting one conductivity type is added is etched to be separated using the resist mask 66. As a result, a pair of source and drain regions 72 can be formed as shown in FIG. 10C. In this etching process, the buffer layer 62 is also partly etched. The buffer layer which is etched partly and has a recessed portion is referred to as a buffer layer 73. The source and drain regions and the recessed portion of the buffer layer can be formed in the same process. The depth of the recessed portion in the buffer layer is set to half to one third the thickness of the thickest region in the buffer layer, so that the source region and the drain region can have a distance therebetween. Accordingly, leak current between the source region and the drain region can be reduced. After that, the resist mask 66 is removed.

Next, dry etching is performed under such a condition that the buffer layer which is exposed is not damaged and an etching rate with respect to the buffer layer is low. Through this dry etching step, an etching residue on the buffer layer between the source region and the drain region, a residue of the resist mask, and a contamination source in the apparatus used for removal of the resist mask can be removed, whereby the source region and the drain region can be certainly insulated. As a result, leak current of the thin film transistor can be reduced, so that a thin film transistor with small off current and high withstand voltage can be manufactured. A chlorine gas can be used for an etching gas, for example.

Figure 12B:
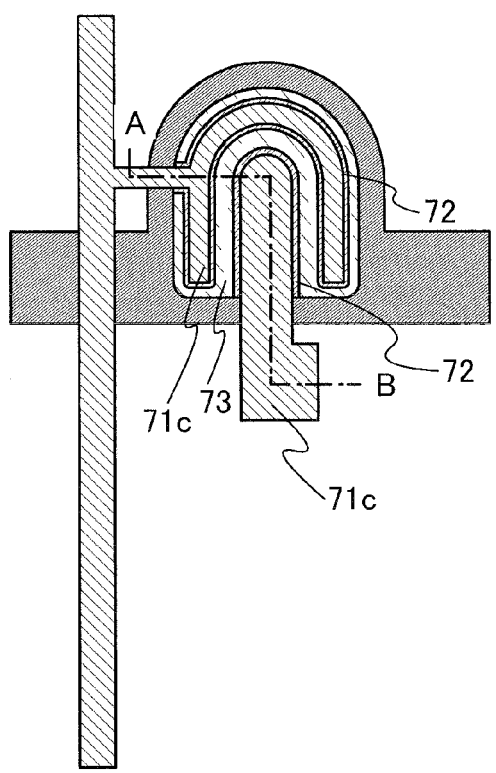

FIG. 10C shows a cross section taken along a line A-B in FIG. 12B (except for the resist mask 66). As shown in FIG. 12B, end portions of the source and drain regions 72 are located outside those of the wirings 71c. Further, end portions of the buffer layer 73 are located outside those of the wirings 71c and those of the source and drain regions 72. Furthermore, one of the wirings surrounds the other (specifically, the former wiring is in a U-shape or a C-shape). Thus, an area of a region in which carriers move can be increased, and thus, the amount of current can be increased and an area of a thin film transistor can be reduced. Over the gate electrode, the microcrystalline semiconductor film and the wirings are overlapped, and thus, an influence by unevenness of the gate electrode is small and reduction in coverage and generation of leak current can be suppressed.

Through the above-described process, a channel-etched thin film transistor 74 can be formed.

Figure 11A:
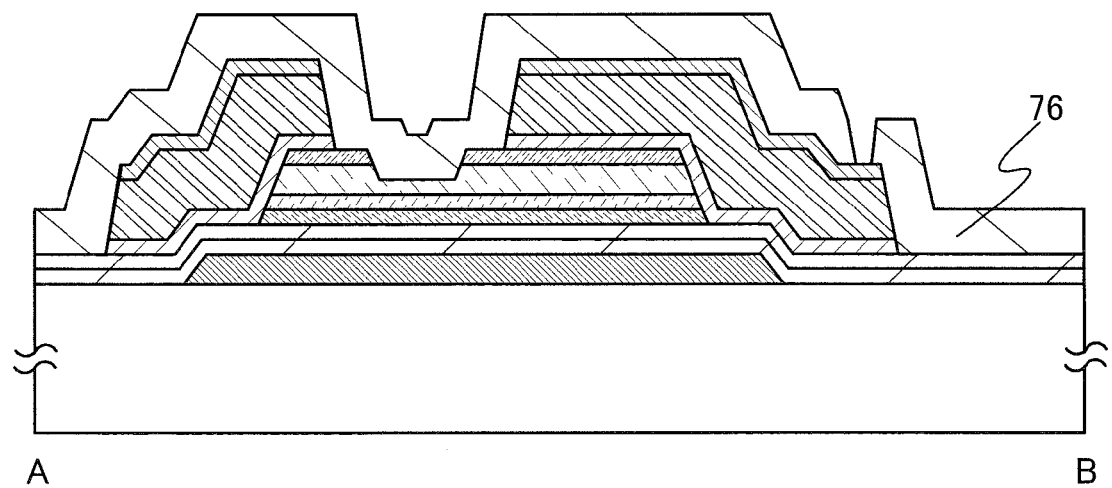
FIGS. 11A and 11B are cross-sectional views illustrating a method for manufacturing a display device of the present invention.

Next, as shown in FIG. 11A, a protective insulating film 76 is formed over the wirings 71a to 71c, the source and drain regions 72, the buffer layer 73, and the gate insulating film 52b. The protective insulating film 76 can be formed in a similar manner to the gate insulating films 52a and 52b. The protective insulating film 76 prevents intrusion of a contaminating impurity such as an organic matter, a metal, or water vapor included in the air; thus, a dense film is preferably used for the protective insulating film 76. Further, by using a silicon nitride film as the protective insulating film 76, the oxygen concentration in the buffer layer 73 can be set at less than or equal to $5 \times 10^{19}$ atoms/cm$^3$, preferably, less than or equal to $1 \times 10^{19}$ atoms/cm$^3$, so that the buffer layer 73 can be prevented from being oxidized.

Figure 11B:
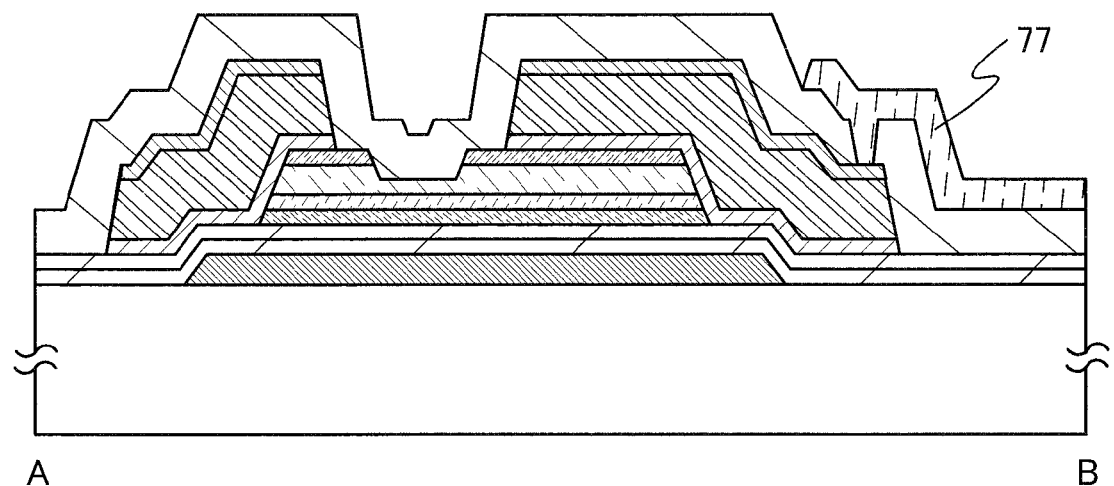
Figure 12C:
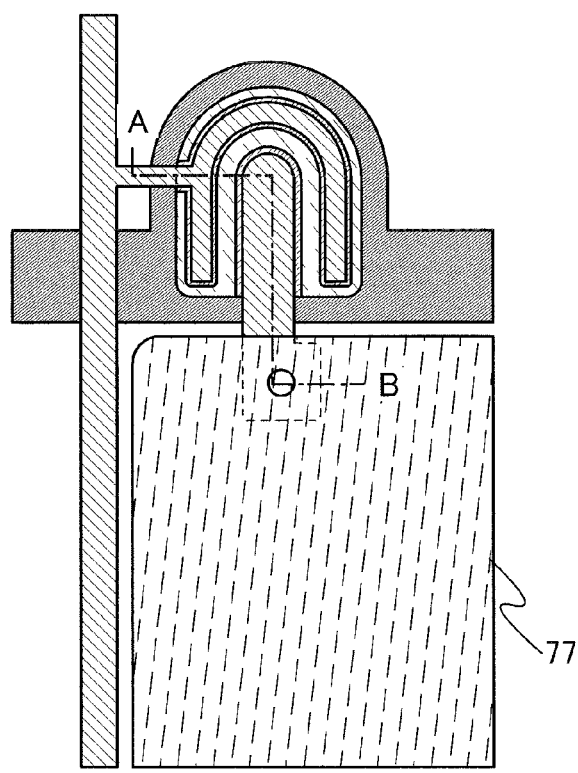

Next, as shown in FIG. 11B, a contact hole is formed in the protective insulating film 76 by partly etching the protective insulating film 76 using a resist mask formed using a fourth photomask. Then, a pixel electrode 77 that is in contact with the wiring 71c in the contact hole is formed. FIG. 11B shows a cross section taken along a line A-B in FIG. 12C.

The pixel electrode 77 can be formed of a light-transmitting conductive material such as indium oxide including tungsten oxide, indium zinc oxide including tungsten oxide, indium oxide including titanium oxide, indium tin oxide including titanium oxide, ITO, indium zinc oxide, or indium tin oxide to which silicon oxide is added.

The pixel electrode 77 can be formed using a conductive composition including a conductive high-molecular compound (also referred to as a conductive polymer). It is preferable that a pixel electrode formed using a conductive composition have sheet resistance of less than or equal to 10000 Ω/square, and light transmittance of greater than or equal to 70% at a wavelength of 550 nm. In addition, the resistivity of the conductive high-molecular compound which is included in the conductive composition is desirably less than or equal to 0.1 Ω·cm.

As the conductive high-molecular compound, a so-called π electron conjugated conductive high-molecular compound can be used. Examples thereof include polyaniline and its derivatives, polypyrrole and its derivatives, polythiophene and its derivatives, and copolymers of two or more kinds of them.

In this embodiment mode, the pixel electrode 77 is formed as follows: an ITO film is formed by a sputtering method; a resist is applied on the ITO film and exposed to light and developed using a fifth photomask, thereby forming a resist mask; and then, the ITO film is etched using the resist mask.

Accordingly, a thin film transistor and an element substrate that can be used for a display device can be formed.

Next, a manufacturing process of the thin film transistor shown in FIG. 2A will be described below.

As in the step shown in FIG. 9A, a gate electrode 51 is formed over a substrate 50, and a gate insulating film 52a is formed over the gate electrode 51.

Figure 14:
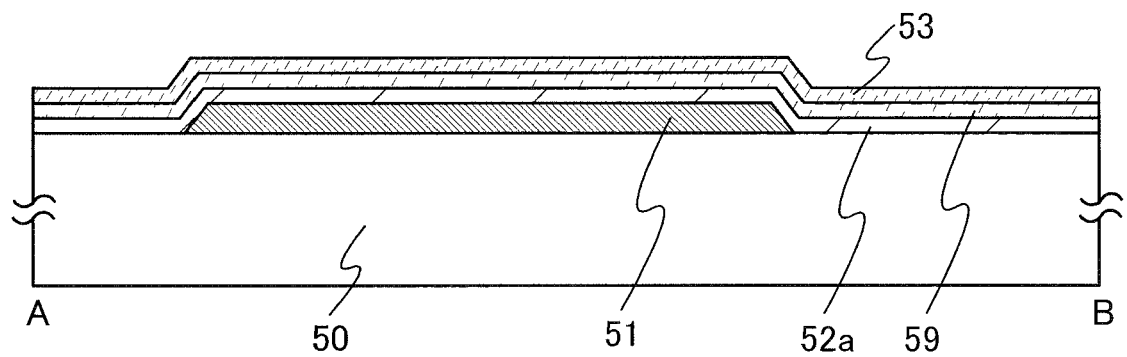
FIG. 14 is a cross-sectional view illustrating a method for manufacturing a display device of the present invention.

Next, as shown in FIG. 14, a gate insulating film 59 including an impurity element which serves as a donor is formed over the gate insulating film 52a, and a microcrystalline semiconductor film 53 is formed by a plasma CVD method using a deposition gas including silicon or germanium, and hydrogen over the gate insulating film 59.

As a typical example of a method for forming the gate insulating film 59 including the impurity element which serves as a donor, a process for forming a silicon oxynitride film including phosphorus will be described in chronological order with reference to FIG. 13.

Figure 13:
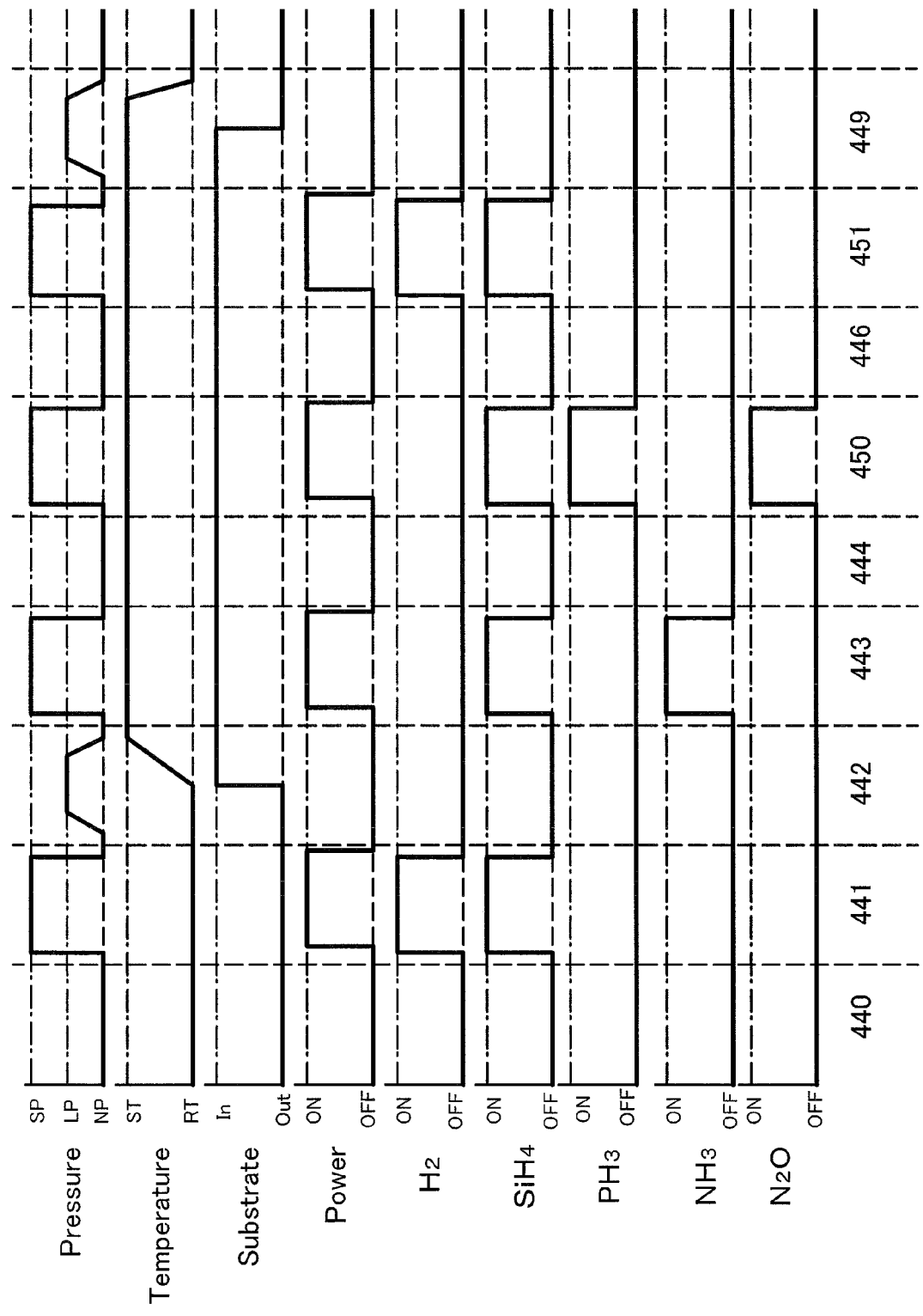
FIG. 13 is an example of a timing chart illustrating a process for forming gate insulating films and a microcrystalline semiconductor film.

FIG. 13 is a typical example of a timing chart for describing steps of forming the gate insulating film 52a, the gate insulating film 59 including the impurity element which serves as a donor, and the microcrystalline semiconductor film 53. FIG. 13 shows a procedure starting from a step of vacuum evacuation 440 from atmospheric pressure in a reaction chamber. Then, the following treatments, which are carried out after the vacuum evacuation 440, are shown in chronological order: a precoating treatment 441, substrate carrying-in 442, a film formation treatment (1) 443 for forming the gate insulating film 52a, a vacuum evacuation treatment 444, a film formation treatment (2) 450 for forming the gate insulating film 59 including the impurity element which serves as a donor, a vacuum evacuation treatment 446, a film formation treatment (3) 451 for forming the microcrystalline semiconductor film 53, and substrate carrying-out 449.

Note that the precoating treatment 441, the substrate carrying-in 442, the film formation treatment (1) 443 for forming the gate insulating film 52a, the vacuum evacuation treatment 444, the vacuum evacuation treatment 446, and the substrate carrying-out 449 are the same as in FIG. 8, and the film formation treatment (2) 450 for forming the gate insulating film 59 including the impurity element which serves as a donor and the film formation treatment (3) 451 for forming the microcrystalline semiconductor film 53 are carried out between the vacuum evacuation treatment 444 and the substrate carrying-out 449.

In the film formation treatment (2) 450 for forming the gate insulating film 59 including the impurity element which serves as a donor, a gas including the impurity element which serves as a donor is introduced to a source gas for forming the gate insulating film. In this embodiment mode, silane, dinitrogen monoxide, and 0.001% to 1% phosphine (diluted with hydrogen or silane) are introduced to the reaction chamber, and a silicon oxynitride film including phosphorus is formed by glow discharge plasma. After formation of the gate insulating film 59 including the impurity element which serves as a donor, introduction of the above source gas is stopped, and the power is turned off, and then, generation of plasma is stopped.

In the film formation treatment (3) 451 for forming the microcrystalline semiconductor film 53, a deposition gas including silicon or germanium, which is silane here, hydrogen, and/or a rare gas are introduced and mixed in the reaction chamber, and a microcrystalline semiconductor film is formed by glow discharge plasma which is generated by application of high-frequency power. Silane is diluted with hydrogen and/or a rare gas to be 10 to 2000 times thinner. Therefore, a large amount of hydrogen and/or a rare gas is needed. The substrate heating temperature is 100° C. to 300° C., preferably 120° C. to 220° C. After formation of the microcrystalline semiconductor film 53, introduction of the above source gas is stopped, and the power is turned off, and then, generation of plasma is stopped.

In order to form a microcrystalline semiconductor film not including the impurity element which serves as a donor at a higher concentration than the detection limit of SIMS as the microcrystalline semiconductor film 53, the following process is carried out. When the gate insulating film 59 including the impurity element which serves as a donor begins to be deposited, a gas including the impurity element which serves as a donor, here, phosphine is introduced to the reaction chamber, and then, introduction of phosphine is stopped, and a silicon oxynitride film is formed, so that almost all phosphorus in the reaction chamber is included in the silicon oxynitride film. Therefore, the microcrystalline semiconductor film 53 which is formed later does not include the impurity element which serves as a donor at a higher concentration than the detection limit of SIMS. Alternatively, after the gate insulating film 59 including the impurity element which serves as a donor is formed, the substrate is taken out of the reaction chamber, and the inside of the reaction chamber is cleaned, and then, the substrate is carried into the reaction chamber again and the microcrystalline semiconductor film 53 is formed, whereby the microcrystalline semiconductor film 53 not including the impurity element which serves as a donor at a higher concentration than the detection limit of SIMS can be formed. Further alternatively, after the gate insulating film 59 including the impurity element which serves as a donor is formed, the substrate is taken out of the reaction chamber, and the microcrystalline semiconductor film 53 is formed in a different reaction chamber, whereby the microcrystalline semiconductor film 53 not including the impurity element which serves as a donor at a higher concentration than the detection limit of SIMS can be formed.

Further, by forming a microcrystalline semiconductor film including an impurity element which serves as a donor instead of the microcrystalline semiconductor film 53 in FIG. 14, the thin film transistor as shown in FIG. 2E can be manufactured in which the microcrystalline semiconductor film 61 including the impurity element which serves as a donor is formed over the gate insulating film 59 including the impurity element which serves as a donor. The microcrystalline semiconductor film 61 including the impurity element which serves as a donor may be formed in such a manner that after phosphine is introduced to a reaction chamber in formation of the gate insulating film 59 including the impurity element which serves as a donor, a microcrystalline semiconductor film is formed while taking in phosphine left in the reaction chamber. Alternatively, when the microcrystalline semiconductor film is formed, phosphine may be introduced to the reaction chamber in addition to silane, hydrogen, and/or argon. Further alternatively, after the gate insulating film 59 including the impurity element which serves as a donor is formed, phosphine may be supplied to the reaction chamber and attached to the inner wall of the reaction chamber, and then, the microcrystalline semiconductor film is formed.

Next, through the steps shown in FIGS. 9B and 9C and FIGS. 10A to 10C, the thin film transistor as shown in FIG. 2A can be manufactured. In addition, through the steps shown in FIGS. 11A and 11B, an element substrate which can be used for a display device can be formed.

Next, another manufacturing method of the thin film transistor shown in FIG. 2A will be described below.

As a typical example of a method for forming the gate insulating film 59 including the impurity element which serves as a donor, a process for forming a silicon oxynitride film including phosphorus will be described in chronological order with reference to FIG. 15.

Figure 15:
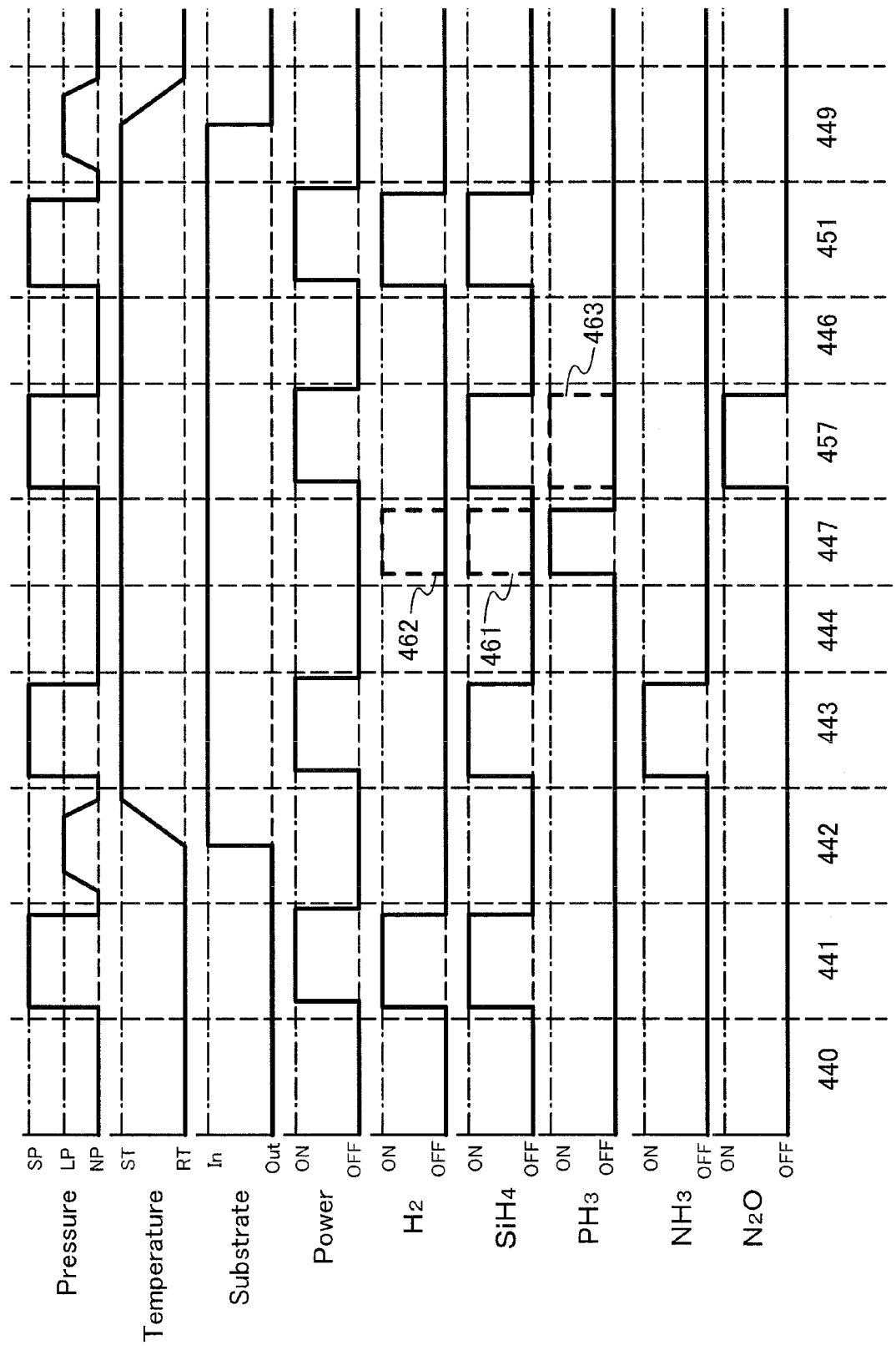
FIG. 15 is an example of a timing chart illustrating a process for forming gate insulating films and a microcrystalline semiconductor film.

FIG. 15 is a typical example of a timing chart for describing steps of forming the gate insulating film 52a, the gate insulating film 59 including the impurity element which serves as a donor, and the microcrystalline semiconductor film 53. FIG. 15 shows a procedure starting from a step of vacuum evacuation 440 from atmospheric pressure in a reaction chamber. Then, the following treatments, which are carried out after the vacuum evacuation 440, are shown in chronological order: a precoating treatment 441, substrate carrying-in 442, a film formation treatment (1) 443 for forming the gate insulating film 52a, a vacuum evacuation treatment 444, a flush treatment 447, a film formation treatment (2) 457 for forming the gate insulating film 59 including the impurity element which serves as a donor, a vacuum evacuation treatment 446, a film formation treatment (3) 451 for forming the microcrystalline semiconductor film 53, and substrate carrying-out 449.

Note that the precoating treatment 441, the substrate carrying-in 442, the film formation treatment (1) 443 for forming the gate insulating film 52a, the vacuum evacuation treatment 444, the vacuum evacuation treatment 446, the film formation treatment (3) 451 for forming the microcrystalline semiconductor film 53, and the substrate carrying-out 449 are the same as in FIG. 13, and the flush treatment 447 and the film formation treatment (2) 457 for forming the gate insulating film 59 including the impurity element which serves as a donor are carried out between the vacuum evacuation treatment 444 and the vacuum evacuation treatment 446.

In the flush treatment 447, a gas including the impurity element which serves as a donor is introduced to the reaction chamber, and the impurity element which serves as a donor is adsorbed onto the surface of the gate insulating film 52a, furthermore, onto the inner wall of the reaction chamber. In this embodiment mode, 0.001% to 1% phosphine (diluted with hydrogen or silane) is introduced to the reaction chamber. In addition to the gas including the impurity element which serves as a donor, hydrogen may be introduced as denoted by a dashed line 462, or a deposition gas including silicon or germanium may be introduced as denoted by a dashed line 461, to the reaction chamber.

In the film formation treatment (2) 457 for forming the gate insulating film 59 including the impurity element which serves as a donor, a source gas, here, hydrogen, silane, and dinitrogen monoxide are introduced to the reaction chamber, and a silicon oxynitride film is formed by glow discharge plasma which is generated by application of high-frequency power. At this time, the silicon oxynitride film is deposited while taking in the impurity element which serves as a donor and is deposited over the surface of the gate insulating film 52a and adsorbed onto the surface of the inner wall of the reaction chamber, which is phosphorus here. Thus, a silicon oxynitride film including phosphorus can be formed. After formation of the gate insulating film 59 including the impurity element which serves as a donor, introduction of the above source gas is stopped, and the power is turned off, and then, generation of plasma is stopped.

In the film formation treatment (3) 451 for forming the microcrystalline semiconductor film 53, in order to form a microcrystalline semiconductor film not including the impurity element which serves as a donor at a higher concentration than the detection limit of SIMS, the following process is carried out. When the gate insulating film 59 including the impurity element which serves as a donor begins to be deposited, a gas including the impurity element which serves as a donor, here, phosphine is introduced to the reaction chamber, and then, introduction of phosphine is stopped, and a silicon oxynitride film is formed, so that almost all phosphorus in the reaction chamber is included in the silicon oxynitride film. Therefore, the microcrystalline semiconductor film 53 which is formed later does not include the impurity element which serves as a donor at a higher concentration than the detection limit of SIMS. Alternatively, after the gate insulating film 59 including the impurity element which serves as a donor is formed, the substrate is taken out of the reaction chamber, and the inside of the reaction chamber is cleaned, and then, the substrate is carried into the reaction chamber again, and the microcrystalline semiconductor film 53 is formed, whereby the microcrystalline semiconductor film 53 not including the impurity element which serves as a donor at a higher concentration than the detection limit of SIMS can be formed. Further alternatively, after the gate insulating film 59 including the impurity element which serves as a donor is formed, the substrate is taken out of the reaction chamber, and the microcrystalline semiconductor film 53 is formed in a different reaction chamber, whereby the microcrystalline semiconductor film 53 not including the impurity element which serves as a donor at a higher concentration than the detection limit of SIMS can be formed.

Next, through the steps shown in FIGS. 9B and 9C and FIGS. 10A to 10C, the thin film transistor as shown in FIG. 2A can be manufactured. In addition, through the steps shown in FIGS. 11A and 11B, an element substrate which can be used for a display device can be formed.

Further, by forming a microcrystalline semiconductor film including an impurity element which serves as a donor instead of the microcrystalline semiconductor film 53, the thin film transistor as shown in FIG. 2E can be manufactured in which the microcrystalline semiconductor film 61 including the impurity element which serves as a donor is formed over the gate insulating film 59 including the impurity element which serves as a donor. The microcrystalline semiconductor film 61 including the impurity element which serves as a donor may be formed in such a manner that after phosphine is introduced to a reaction chamber in formation of the gate insulating film 59 including the impurity element which serves as a donor, a microcrystalline semiconductor film is formed while taking in phosphine left in the reaction chamber. Alternatively, when the microcrystalline semiconductor film is formed, phosphine may be introduced to the reaction chamber in addition to silane, hydrogen, and/or argon. Further alternatively, after the gate insulating film 59 including the impurity element which serves as a donor is formed, phosphine may be supplied to the reaction chamber and attached to the inner wall of the reaction chamber, and the microcrystalline semiconductor film may be formed.

Next, a manufacturing method of the thin film transistor shown in FIG. 3A will be described below.

As in the step shown in FIG. 9A, a gate electrode 51 is formed over a substrate 50.

Next, after a film including the impurity element which serves as a donor is formed as a protective film on the inner wall of a reaction chamber of a plasma CVD apparatus, the substrate 50 is carried into the reaction chamber, and then, gate insulating films and a microcrystalline semiconductor film are deposited over the gate electrode 51. In this case, by making the inside of the reaction chamber vacuum and by generating plasma, the impurity element which serves as a donor is released from the protective film formed on the inner wall of the reaction chamber to the inside of the reaction chamber. The gate insulating films and the microcrystalline semiconductor film are formed while taking in the impurity element which serves as a donor and is released from the protective film, so that gate insulating films each including the impurity element which serves as a donor and a microcrystalline semiconductor film including the impurity element which serves as a donor can be formed over the gate electrode.

As a typical example of a method for forming gate insulating films and a microcrystalline semiconductor film each including an impurity element which serves as a donor, a process for forming a silicon nitride film including phosphorus, a silicon oxynitride film including phosphorus, and a microcrystalline silicon film including phosphorus will be described in chronological order with reference to FIG. 16.

Figure 16:
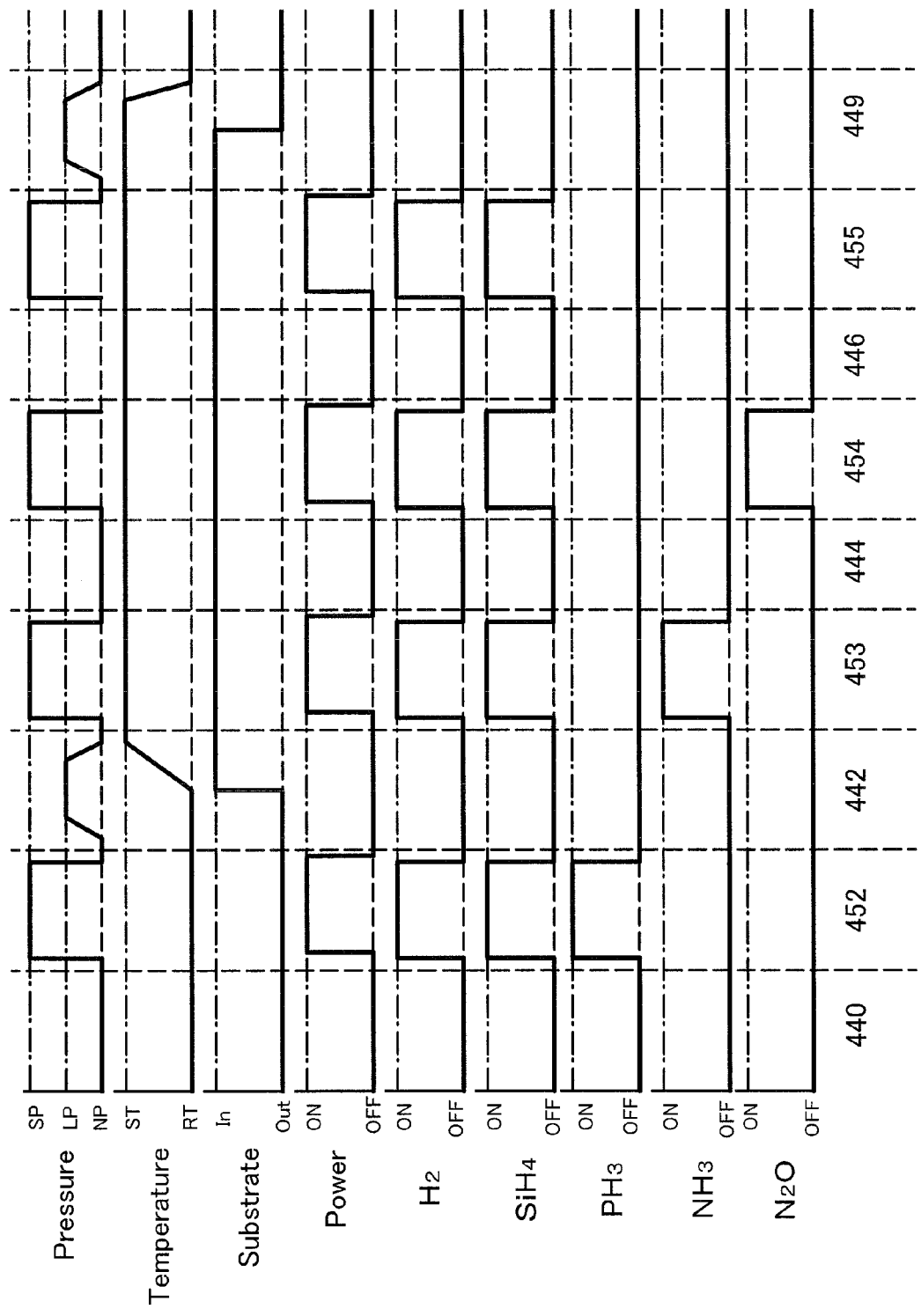
FIG. 16 is an example of a timing chart illustrating a process for forming gate insulating films and a microcrystalline semiconductor film.

FIG. 16 is a typical example of a timing chart for describing steps of forming gate insulating films 59a and 59b and a microcrystalline semiconductor film 67 each including an impurity element which serves as a donor. FIG. 16 shows a procedure starting from a step of vacuum evacuation 440 from atmospheric pressure in a reaction chamber. Then, the following treatments, which are carried out after the vacuum evacuation 440, are shown in chronological order: a precoating treatment 452, substrate carrying-in 442, a film formation treatment (1) 453 for forming the gate insulating film 59a including the impurity element which serves as a donor, a vacuum evacuation treatment 444, a film formation treatment (2) 454 for forming the gate insulating film 59b including the impurity element which serves as a donor, a vacuum evacuation treatment 446, a film formation treatment (3) 455 for forming the microcrystalline semiconductor film 67 including the impurity element which serves as a donor, and substrate carrying-out 449.

In the precoating treatment 452, the inner wall of the reaction chamber of the plasma CVD apparatus is precoated with, as a protective film, a film having a composition that is the same as or similar to the gate insulating film including the impurity element which serves as a donor. In this embodiment mode, 0.001% to 1% phosphine (diluted with hydrogen), a deposition gas including silicon or germanium, which is silane here, hydrogen, and at least one of ammonia, dinitrogen monoxide, and nitrogen are introduced to the reaction chamber. Then, by glow discharge plasma, a silicon oxynitride film including phosphorus, a silicon oxide film including phosphorus, a silicon nitride film including phosphorus, or a silicon nitride oxide film including phosphorus is formed. Accordingly, it is possible to prevent a metal used to form the reaction chamber from entering the gate insulating films as an impurity and to add the impurity element which serves as a donor to the gate insulating films and the microcrystalline semiconductor film which are formed later.

In the substrate carrying-in 442, the substrate is carried into the reaction chamber from a load lock chamber connected to the reaction chamber. Before and after the substrate carrying-in, the pressure in the reaction chamber is reduced for performing vacuum evacuation. At that time, the impurity element which serves as a donor is released from the precoating protective film formed on the inner wall of the reaction chamber into the inside of the reaction chamber.

In the film formation treatment (1) 453 for forming the gate insulating film 59a including the impurity element which serves as a donor, a source gas, here, hydrogen, silane, and ammonia are introduced and mixed. Then, a silicon nitride film is deposited by glow discharge plasma which is generated by application of high-frequency power, while taking in the impurity element which serves as a donor and is released into the inside of the reaction chamber, which is phosphorus here. When glow discharge plasma spreads to the inner wall of the reaction chamber, the impurity element which serves as a donor, here, phosphorus, is released from the precoating protective film formed on the inner wall of the reaction chamber, in addition to the above source gas. Accordingly, a silicon nitride film including phosphorus can be formed. Note that nitrogen may be introduced to the reaction chamber in addition to the above source gas. After formation of the gate insulating film 59a including the impurity element which serves as a donor, introduction of the above source gas is stopped, and the power is turned off, and then, generation of plasma is stopped.

In the vacuum evacuation treatment 444, vacuum evacuation is performed in the reaction chamber to a predetermined degree of vacuum.

In the film formation treatment (2) 454 for forming the gate insulating film 59b including the impurity element which serves as a donor, a source gas, here, hydrogen, silane, and dinitrogen monoxide are introduced and mixed. Then, a silicon oxynitride film is formed by glow discharge plasma which is generated by application of high-frequency power, while taking in the impurity element which serves as a donor and is released into the inside of the reaction chamber, which is phosphorus here. After formation of the gate insulating film 59b including the impurity element which serves as a donor, introduction of the above source gas is stopped, and the power is turned off, and then, generation of plasma is stopped.

In the vacuum evacuation treatment 446, vacuum evacuation is performed in the reaction chamber to a predetermined degree of vacuum.

In the film formation treatment (3) 455 for forming the microcrystalline semiconductor film 67 including the impurity element which serves as a donor, a deposition gas including silicon or germanium, which is silane here, hydrogen, and/or a rare gas are introduced and mixed in the reaction chamber, and a microcrystalline semiconductor film is formed by glow discharge plasma which is generated by application of high-frequency power. Silane is diluted with hydrogen and/or a rare gas to be 10 to 2000 times thinner. Therefore, a large amount of hydrogen and/or a rare gas is needed. The substrate heating temperature is 100° C. to 300° C., preferably 120° C. to 220° C. At this time, the microcrystalline semiconductor film is deposited while taking in the impurity element which serves as a donor and is released into the inside of the reaction chamber, and thus, a microcrystalline semiconductor film including phosphorus can be formed. Therefore, an amorphous semiconductor is not formed in an early stage of deposition of the semiconductor film, crystals grow in a normal direction with respect to the gate insulating film 59b, and a microcrystalline semiconductor film with high crystallinity in which columnar-like microcrystalline semiconductors are arranged can be formed. Further, a highly conductive microcrystalline semiconductor film including the impurity element which serves as a donor can be formed.

This mode has a feature that the gate insulating films 59a and 59b and the microcrystalline semiconductor film 67 each including the impurity element which serves as a donor are formed. The peak concentration of the impurity element which serves as a donor is from $6 \times 10^{15}$ atoms/cm$^3$ to $3 \times 10^{18}$ atoms/cm$^3$ inclusive, preferably from $3 \times 10^{16}$ atoms/cm$^3$ to $3 \times 10^{17}$ atoms/cm$^3$ inclusive.

In the substrate carrying-out 449, the substrate is taken out of the reaction chamber and carried into a load lock chamber connected to the reaction chamber. The pressure in the reaction chamber at this time is the same as that in the load lock chamber.

Figure 17A:
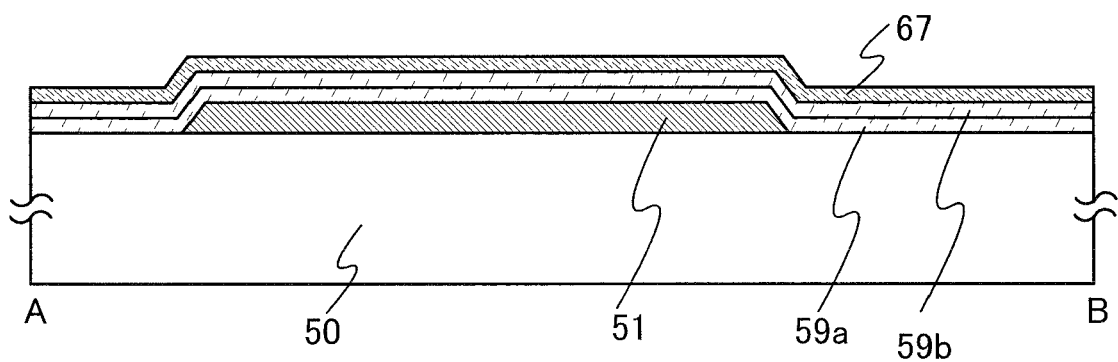
FIGS. 17A and 17B are cross-sectional views illustrating a method for manufacturing a display device of the present invention.
Figure 17B:
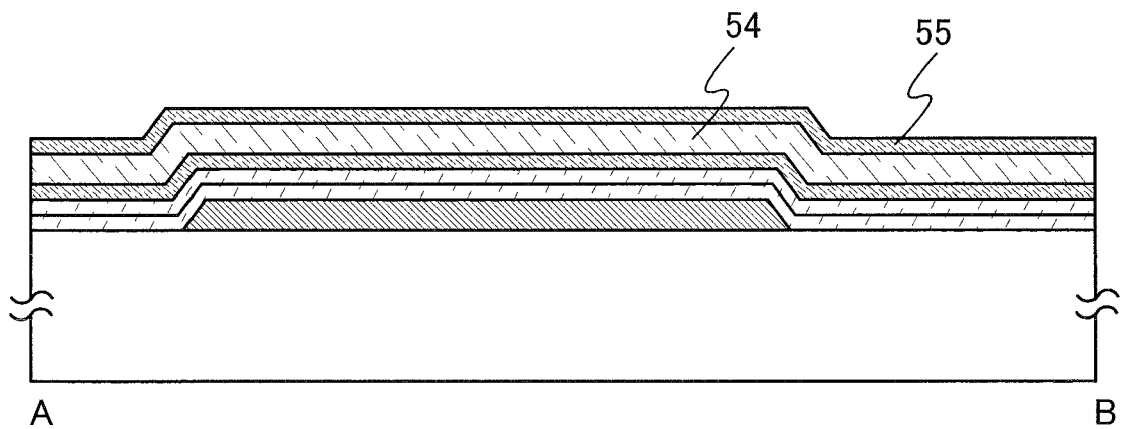

Next, as shown in FIG. 17B, a buffer layer 54 and a semiconductor film 55 to which an impurity element imparting one conductivity type is added are formed over the microcrystalline semiconductor film 67 including the impurity element which serves as a donor. Then, through the steps shown in FIGS. 9B and 9C and FIGS. 10A to 10C, the thin film transistor as shown in FIG. 3A can be manufactured. In addition, through the steps shown in FIGS. 11A and 11B, an element substrate which can be used for a display device can be formed.

Figure 19:
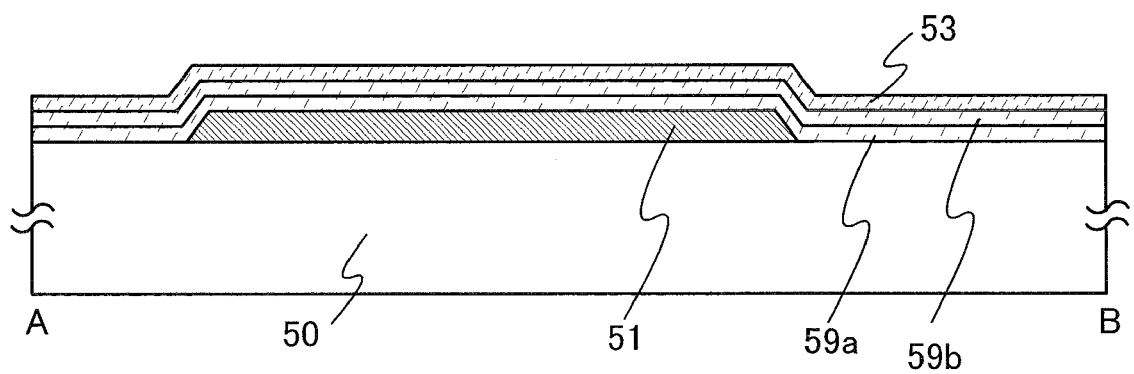
FIG. 19 is a cross-sectional view illustrating a method for manufacturing a display device of the present invention.

When a microcrystalline semiconductor film 53 not including the impurity element which serves as a donor at a higher concentration than the detection limit of SIMS is formed instead of the microcrystalline semiconductor film 67 including the impurity element which serves as a donor as shown in FIG. 19, the thin film transistor as shown in FIG. 4C can be manufactured. In order to form the microcrystalline semiconductor film 53, the following process is carried out. When the gate insulating film 59b including the impurity element which serves as a donor begins to be deposited, a gas including the impurity element which serves as a donor, here, phosphine is introduced to a reaction chamber, and then, introduction of phosphine is stopped, and a silicon oxynitride film is formed, so that almost all phosphorus in the reaction chamber is included in the silicon oxynitride film. Therefore, the microcrystalline semiconductor film 53 which is formed later does not include the impurity element which serves as a donor at a higher concentration than the detection limit of SIMS. Alternatively, the microcrystalline semiconductor film 53 not including the impurity element which serves as a donor at a higher concentration than the detection limit of SIMS can be formed in such a manner that after the gate insulating film 59b including the impurity element which serves as a donor is formed, the substrate is taken out of the reaction chamber, the inside of the reaction chamber is cleaned, and then, the substrate is carried into the reaction chamber again and the microcrystalline semiconductor film 53 is formed. Further alternatively, the microcrystalline semiconductor film 53 not including the impurity element which serves as a donor at a higher concentration than the detection limit of SIMS can be formed in such a manner that after the gate insulating film 59b including the impurity element which serves as a donor is formed, the substrate is taken out of the reaction chamber, and the microcrystalline semiconductor film 53 is formed in a different reaction chamber.

Next, another manufacturing method of the thin film transistor shown in FIG. 3A will be described below.

Figure 18:
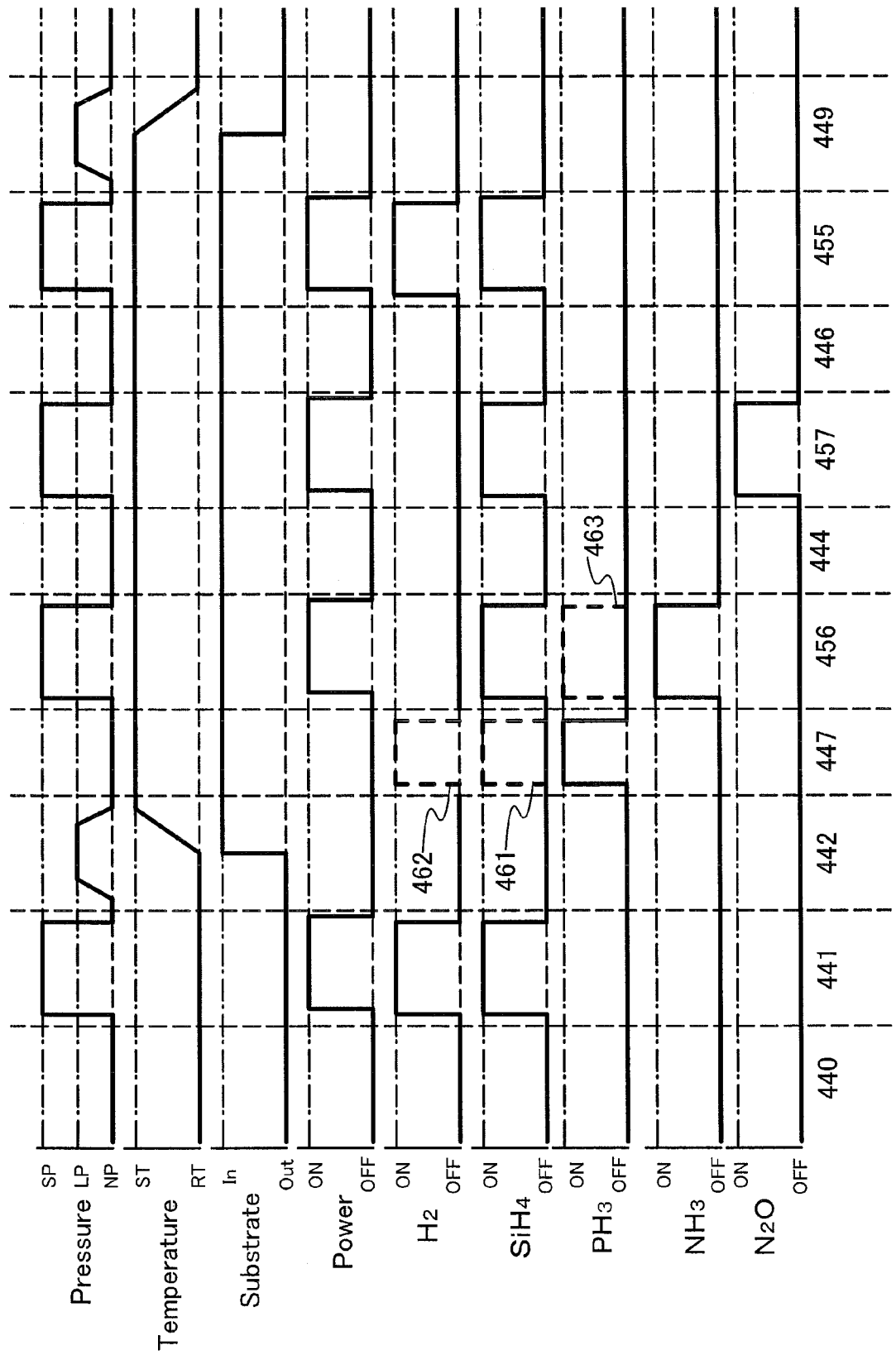
FIG. 18 is an example of a timing chart illustrating a process for forming gate insulating films and a microcrystalline semiconductor film.

FIG. 18 is a typical example of a timing chart for describing steps of forming the gate insulating films 59a and 59b each including the impurity element which serves as a donor and the microcrystalline semiconductor film 67 including the impurity element which serves as a donor, as shown in FIG.

17A. FIG. 18 shows a procedure starting from a step of vacuum evacuation 440 from atmospheric pressure in a reaction chamber. Then, the following treatments, which are carried out after the vacuum evacuation 440, are shown in chronological order: a precoating treatment 441, substrate carrying-in 442, a flush treatment 447, a film formation treatment (1) 456 for forming the gate insulating film 59a including the impurity element which serves as a donor, a vacuum evacuation treatment 444, a film formation treatment (2) 457 for forming the gate insulating film 59b including the impurity element which serves as a donor, a vacuum evacuation treatment 446, a film formation treatment (3) 455 for forming the microcrystalline semiconductor film 67 including the impurity element which serves as a donor, and substrate carrying-out 449.

Note that the precoating treatment 441, the substrate carrying-in 442, and the substrate carrying-out 449 are the same as in FIG. 13, and the flush treatment 447, the film formation treatment (1) 456 for forming the gate insulating film 59a including the impurity element which serves as a donor, the vacuum evacuation treatment 444, the film formation treatment (2) 457 for forming the gate insulating film 59b including the impurity element which serves as a donor, the vacuum evacuation treatment 446, and the film formation treatment (3) 455 for forming the microcrystalline semiconductor film 67 including the impurity element which serves as a donor are carried out between the substrate carrying-in 442 and the substrate carrying-out 449.

In the flush treatment 447, a gas including an impurity element which serves as a donor is introduced to a reaction chamber, and the impurity element which serves as a donor is adsorbed onto the substrate 50, the surface of the gate electrode 51, and furthermore, onto the inner wall of the reaction chamber. In this embodiment mode, 0.001% to 1% phosphine (diluted with hydrogen) is introduced to the reaction chamber. In addition to the gas including the impurity element which serves as a donor, hydrogen may be introduced as denoted by a dashed line 462, or a deposition gas including silicon or germanium may be introduced as denoted by a dashed line 461, to the reaction chamber. By introducing the deposition gas including silicon or germanium to the reaction chamber, an impurity such as oxygen, nitrogen, or fluorine in the reaction chamber can be discharged from the reaction chamber, so that a film to be formed can be prevented from being contaminated.

In the film formation treatment (1) 456 for forming the gate insulating film 59a including the impurity element which serves as a donor, a source gas, here, hydrogen, silane, and ammonia are introduced and mixed, and a silicon nitride film is formed by glow discharge plasma which is generated by application of high-frequency power Note that nitrogen may be introduced to the reaction chamber in addition to the above source gas. At this time, the silicon nitride film is deposited while taking in the impurity element which serves as a donor and is adsorbed onto the substrate 50, the gate electrode 51, and furthermore, the surface of the inner wall of the reaction chamber, which is phosphorus here. Thus, a silicon nitride film including phosphorus can be formed. After formation of the gate insulating film 59a including the impurity element which serves as a donor, introduction of the above source gas is stopped, and the power is turned off, and then, generation of plasma is stopped.

In the vacuum evacuation treatment 444, vacuum evacuation is performed in the reaction chamber to a predetermined degree of vacuum.

In the film formation treatment (2) 457 for forming the gate insulating film 59b including the impurity element which serves as a donor, a source gas, here, hydrogen, silane, and dinitrogen monoxide are introduced and mixed, and a silicon oxynitride film is formed by glow discharge plasma which is generated by application of high-frequency power. At this time, the silicon oxynitride film is deposited while taking in the impurity element which serves as a donor and is deposited over the surface of the gate insulating film 59a and adsorbed onto the surface of the inner wall of the reaction chamber, which is phosphorus here. Thus, a silicon oxynitride film including phosphorus can be formed as the gate insulating film 59b including the impurity element which serves as a donor. After formation of the gate insulating film 59b, introduction of the above source gas is stopped, and the power is turned off, and then, generation of plasma is stopped.

In the vacuum evacuation treatment 446, vacuum evacuation is performed in the reaction chamber to a predetermined degree of vacuum.

In the film formation treatment (3) 455 for forming the microcrystalline semiconductor film 67 including the impurity element which serves as a donor, a deposition gas including silicon or germanium, which is silane here, hydrogen, and/or a rare gas are introduced and mixed in the reaction chamber, and a microcrystalline semiconductor film is formed by glow discharge plasma which is generated by application of high-frequency power. Silane is diluted with hydrogen and/or a rare gas to be 10 to 2000 times thinner. Therefore, a large amount of hydrogen and/or a rare gas is needed. The substrate heating temperature is 100° C. to 300° C., preferably 120° C. to 220° C. It is preferable that the film be formed at temperatures of 120° C. to 220° C. so that a growing surface of the microcrystalline silicon film is inactivated with hydrogen, and growth of microcrystalline silicon is promoted. At this time, the microcrystalline semiconductor film is deposited while taking in the impurity element which serves as a donor and is released into the inside of the reaction chamber, so that a microcrystalline semiconductor film including phosphorus can be formed. Thus, an amorphous semiconductor is not formed in an early stage of deposition of the semiconductor film, crystals grow in a normal direction with respect to the gate insulating film 59b including the impurity element which serves as a donor, and a microcrystalline semiconductor film with high crystallinity in which columnar-like microcrystalline semiconductors are arranged can be formed. Further, since the microcrystalline semiconductor film includes the impurity element which serves as a donor and is deposited over the surface of the gate insulating film 59b, a highly conductive microcrystalline semiconductor film including the impurity element which serves as a donor can be formed.

This mode has a feature that the gate insulating films 59a and 59b and the microcrystalline semiconductor film 67 each including the impurity element which serves as a donor are formed. The peak concentration of the impurity element which serves as a donor is from $6 \times 10^{15}$ atoms/cm$^3$ to $3 \times 10^{18}$ atoms/cm$^3$ inclusive, preferably from $3 \times 10^{16}$ atoms/cm$^3$ to $3 \times 10^{17}$ atoms/cm$^3$ inclusive.

In the substrate carrying-out 449, the substrate is taken out of the reaction chamber and carried into a load lock chamber connected to the reaction chamber. The pressure in the reaction chamber at this time is the same as that in the load lock chamber.

Next, as shown in FIG. 17B, the buffer layer 54 and the semiconductor film 55 to which the impurity element imparting one conductivity type is added are formed over the microcrystalline semiconductor film 67 including the impurity element which serves as a donor. Then, through the steps shown in FIGS. 9B and 9C and FIGS. 10A to 10C, the thin film transistor as shown in FIG. 3A can be manufactured. In addition, through the steps shown in FIGS. 11A and 11B, an element substrate which can be used for a display device can be formed.

When a microcrystalline semiconductor film 53 not including the impurity element which serves as a donor at a higher concentration than the detection limit of SIMS is formed instead of the microcrystalline semiconductor film 67 including the impurity element which serves as a donor as shown in FIG. 19, the thin film transistor as shown in FIG. 4C can be manufactured. In order to form the microcrystalline semiconductor film 53, the following process is carried out. When the gate insulating film 59b including the impurity element which serves as a donor begins to be deposited, a gas including the impurity element which serves as a donor, here, phosphine is introduced to the reaction chamber, and then, introduction of phosphine is stopped, and a silicon oxynitride film is formed, so that almost all phosphorus in the reaction chamber is included in the silicon oxynitride film. Therefore, the microcrystalline semiconductor film 53 which is formed later does not include the impurity element which serves as a donor at a higher concentration than the detection limit of SIMS. Alternatively, the microcrystalline semiconductor film 53 not including the impurity element which serves as a donor at a higher concentration than the detection limit of SIMS can be formed in such a manner that after the gate insulating film 59b including the impurity element which serves as a donor is formed, the substrate is taken out of the reaction chamber, and the inside of the reaction chamber is cleaned, and then, the substrate is carried into the reaction chamber again and the microcrystalline semiconductor film 53 is formed. Further alternatively, the microcrystalline semiconductor film 53 not including the impurity element which serves as a donor at a higher concentration than the detection limit of SIMS can be formed in such a manner that after the gate insulating film 59b including the impurity element which serves as a donor is formed, the substrate is taken out of the reaction chamber, and the microcrystalline semiconductor film 53 is formed in a different reaction chamber.

Next, a manufacturing method of the thin film transistor shown in FIG. 7A will be described below.

As a typical example of a method for forming the gate insulating film 59c including the impurity element which serves as a donor, a process for forming a silicon nitride film including phosphorus will be described in chronological order with reference to FIG. 20.

Figure 20:
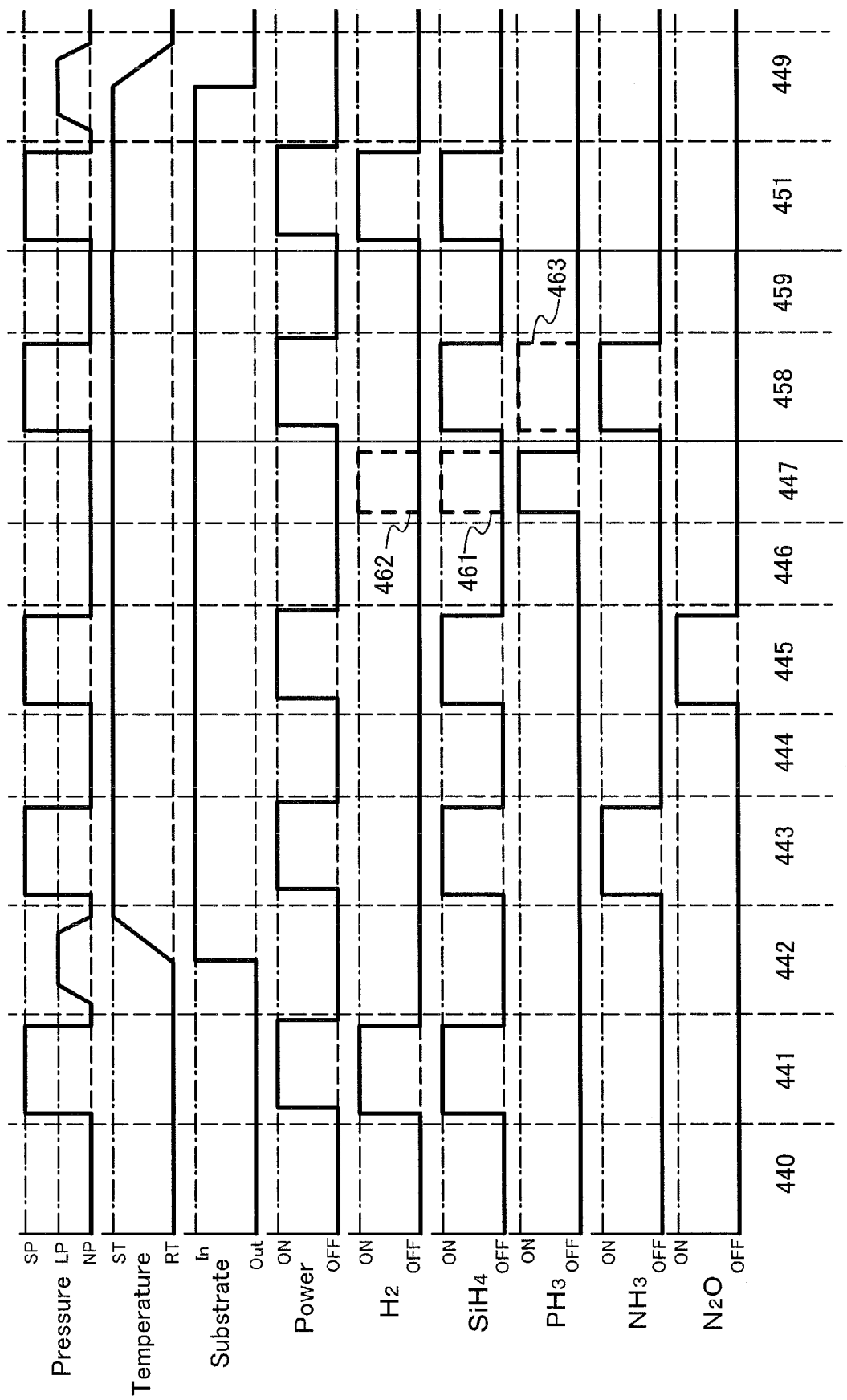
FIG. 20 is an example of a timing chart illustrating a process for forming gate insulating films and a microcrystalline semiconductor film.
Figure 21:
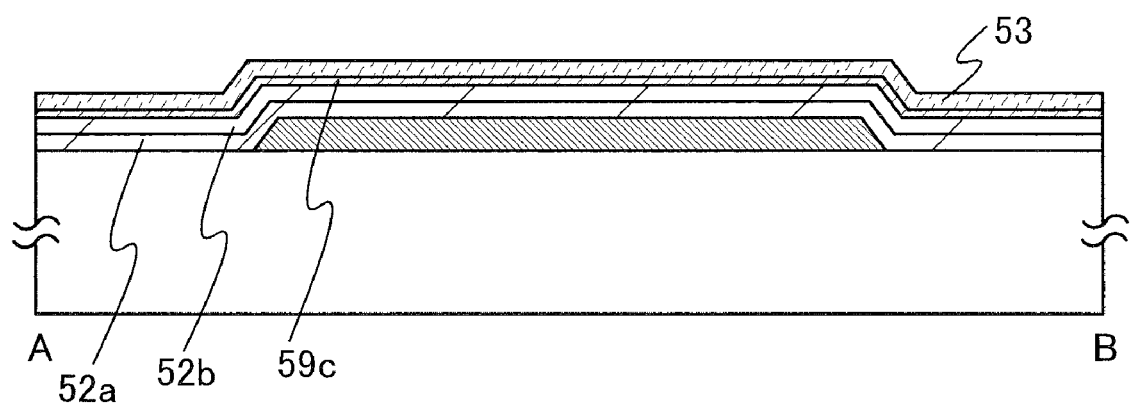
FIG. 21 is a cross-sectional view illustrating a method for manufacturing a display device of the present invention.

FIG. 20 is a typical example of a timing chart for describing steps of forming the gate insulating films 52a and 52b, the gate insulating film 59c including the impurity element which serves as a donor, and a microcrystalline semiconductor film 53 over a gate electrode 51 and a substrate 50, as shown in FIG. 21. FIG. 20 shows a procedure starting from a step of vacuum evacuation 440 from atmospheric pressure in a reaction chamber. Then, the following treatments, which are carried out after the vacuum evacuation 440, are shown in chronological order: a precoating treatment 441, substrate carrying-in 442, a film formation treatment (1) 443 for forming the gate insulating film 52a, a vacuum evacuation treatment 444, a film formation treatment (2) 445 for forming the gate insulating film 52b, a vacuum evacuation treatment 446, a flush treatment 447, a film formation treatment (4) 458 for forming the gate insulating film 59c including the impurity element which serves as a donor, a vacuum evacuation treatment 459, a film formation treatment (3) 451 for forming the microcrystalline semiconductor film 53, and substrate carrying-out 449.

Note that the precoating treatment 441, the substrate carrying-in 442, the vacuum evacuation treatment 444, the film formation treatment (1) 443 for forming the gate insulating film 52a, the film formation treatment (2) 445 for forming the gate insulating film 52b, the vacuum evacuation treatment 446, and the substrate carrying-out 449 are the same as in FIG. 8; the film formation treatment (3) 451 for forming the microcrystalline semiconductor film 53 is the same as in FIG. 13; and the flush treatment 447, the film formation treatment (4) 458 for forming the gate insulating film 59c including the impurity element which serves as a donor, and the vacuum evacuation treatment 459 are carried out between the vacuum evaporation treatment 446 and the film formation treatment (3) 451.

In the flush treatment 447, a gas including an impurity element which serves as a donor is introduced to the reaction chamber, and the impurity element which serves as a donor is adsorbed onto the surface of the gate insulating film 52b, furthermore, onto the inner wall of the reaction chamber. In this embodiment mode, 0.001% to 1% phosphine (diluted with hydrogen) is introduced to the reaction chamber. In addition to the gas including the impurity element which serves as a donor, hydrogen may be introduced as denoted by a dashed line 462, or a deposition gas including silicon or germanium may be introduced as denoted by a dashed line 461, to the reaction chamber.

In the film formation treatment (4) 458 for forming the gate insulating film 59c including the impurity element which serves as a donor, a source gas of the gate insulating film, here, hydrogen, silane, and ammonia are introduced and mixed, and a silicon nitride film is formed by glow discharge plasma which is generated by application of high-frequency power. At this time, the silicon nitride film is deposited while taking in the impurity element which serves as a donor and is deposited over the surface of the gate insulating film 52b and adsorbed onto the surface of the inner wall of the reaction chamber, which is phosphorus here. Thus, a silicon nitride film including phosphorus can be formed. After formation of the gate insulating film 59c including the impurity element which serves as a donor, introduction of the above source gas is stopped, and the power is turned off, and then, generation of plasma is stopped.

In the vacuum evacuation treatment 459, vacuum evacuation is performed in the reaction chamber to a predetermined degree of vacuum.

After that, the microcrystalline semiconductor film 53 is formed over the gate insulating film 59c including the impurity element which serves as donor.

In the film formation treatment (3) 451 for forming the microcrystalline semiconductor film 53, in order to form a microcrystalline semiconductor film not including the impurity element which serves as a donor at a higher concentration than the detection limit of SIMS, the amount of introducing a gas including the impurity element which serves as a donor, which is phosphine here, to the reaction chamber is controlled in the flush treatment 447, so that the microcrystalline semiconductor film 53 formed later does not include the impurity element which serves as a donor at a higher concentration than the detection limit of SIMS. Alternatively, after the gate insulating film 59c including the impurity element which serves as a donor is formed, the substrate is taken out of the reaction chamber, and the inside of the reaction chamber is cleaned, and then, the substrate is carried into the reaction chamber again, and the microcrystalline semiconductor film 53 is formed, whereby the microcrystalline semiconductor film 53 not including the impurity element which serves as a donor at a higher concentration than the detection limit of SIMS can be formed. Further alternatively, after the gate insulating film 59c including the impurity element which serves as a donor is formed, the substrate is taken out of the reaction chamber, and the microcrystalline semiconductor film 53 is formed in a different reaction chamber, whereby the microcrystalline semiconductor film 53 not including the impurity element which serves as a donor at a higher concentration than the detection limit of SIMS can be formed.

In a method for forming the gate insulating film 59c including the impurity element which serves as a donor, after the flush treatment 447, the gate insulating film 52b is nitrided with high-density plasma, whereby a silicon nitride layer including the impurity element which serves as a donor can be formed over the surface of the gate insulating film 52b. High-density plasma is produced by using a microwave with a high frequency, for example, 2.45 GHz. Since high-density plasma having the low electron temperature has a low kinetic energy of active species, a layer having fewer defects can be formed with fewer plasma damages, compared to a conventional plasma treatment. In addition, because the surface of the gate insulating film 52b can be less rough, carrier mobility can be increased.

Further, the gate insulating film 59c including the impurity element which serves as a donor can also be formed by using a gas including the impurity element which serves as a donor as denoted by a dashed line 463 shown in FIG. 20 in addition to the source gas for forming the gate insulating film, without performing the flush treatment 447 shown in FIG. 20.

After that, by performing the same process as in Embodiment Mode 1, the thin film transistor as shown in FIG. 7A can be manufactured.

In the process of this embodiment mode, glow discharge plasma is generated by applying high-frequency power with a frequency of 1 MHz to 20 MHz, typically 13.56 MHz, or high-frequency power with a frequency in the VHF band of 20 MHz to 120 MHz.

In the film formation treatment of the microcrystalline semiconductor film, helium may be added as a rare gas to a reaction gas, in addition to silane and hydrogen. Since helium has an ionization energy of 24.5 eV that is the largest among all gases, and has a metastable state in the level of about 20 eV that is a little lower than the ionization energy, only the difference of about 4 eV is necessary for ionization while keeping discharge. Therefore, the discharge starting voltage also shows the lowest value among all gases. By such characteristics, plasma can be held stably with helium. Further, since uniform plasma can be formed with helium, even if the area of a substrate over which a microcrystalline silicon film is deposited is large, an effect of making plasma density uniform can be obtained.

In the thin film transistor manufactured in this embodiment mode, the gate insulating film and/or the microcrystalline semiconductor film includes the impurity element which serves as a donor. Thus, crystallinity of the microcrystalline semiconductor film at the interface with the gate insulating film is high and crystallinity of the microcrystalline semiconductor film can be improved. Accordingly, a thin film transistor using the microcrystalline semiconductor film has higher field effect mobility and higher on current than a thin film transistor using an amorphous semiconductor film or a conventional microcrystalline semiconductor film. Thus, with the use of a thin film transistor, a channel formation region of which is formed of the microcrystalline semiconductor film, for switching of a display element, the area of the channel formation region, that is, the area of the thin film transistor can be decreased. Accordingly, the area of the thin film transistor in a single pixel is reduced, and thus, the aperture ratio of the pixel can be increased. Accordingly, the display device can have high definition.

Since the channel formation region of the thin film transistor manufactured in this embodiment mode is formed using a microcrystalline semiconductor film, resistivity thereof is lower than that of the channel formation region formed using an amorphous semiconductor film. Therefore, a thin film transistor using the microcrystalline semiconductor film 53 has current-voltage characteristics represented by a curve with a steep slope in a rising portion, has an excellent response as a switching element, and can be operated at high speed. With the use of the microcrystalline semiconductor film in a channel formation region of a thin film transistor, fluctuation of a threshold voltage of a thin film transistor can be suppressed. Therefore, a display device with less variation of electric characteristics can be manufactured.

Further, in the thin film transistor manufactured in this embodiment mode, an amorphous semiconductor film with high resistivity is formed as the buffer layer between the microcrystalline semiconductor film which serves as a channel formation region and the semiconductor film to which the impurity element imparting one conductivity type is added and which functions as source and drain regions. Off current flows through the buffer region. However, because the buffer layer is a high-resistance region, off current can be suppressed, and furthermore, the microcrystalline semiconductor film can be prevented from being oxidized. Accordingly, off current can be suppressed, and increase in on current which is due to reduction of defects in the channel formation region can be realized.

Next, as an example of a plasma CVD apparatus to which the above-mentioned reaction chamber is applied, an example of a structure which is suitable for deposition of a gate insulating film and a microcrystalline semiconductor film is described.

Figure 22:
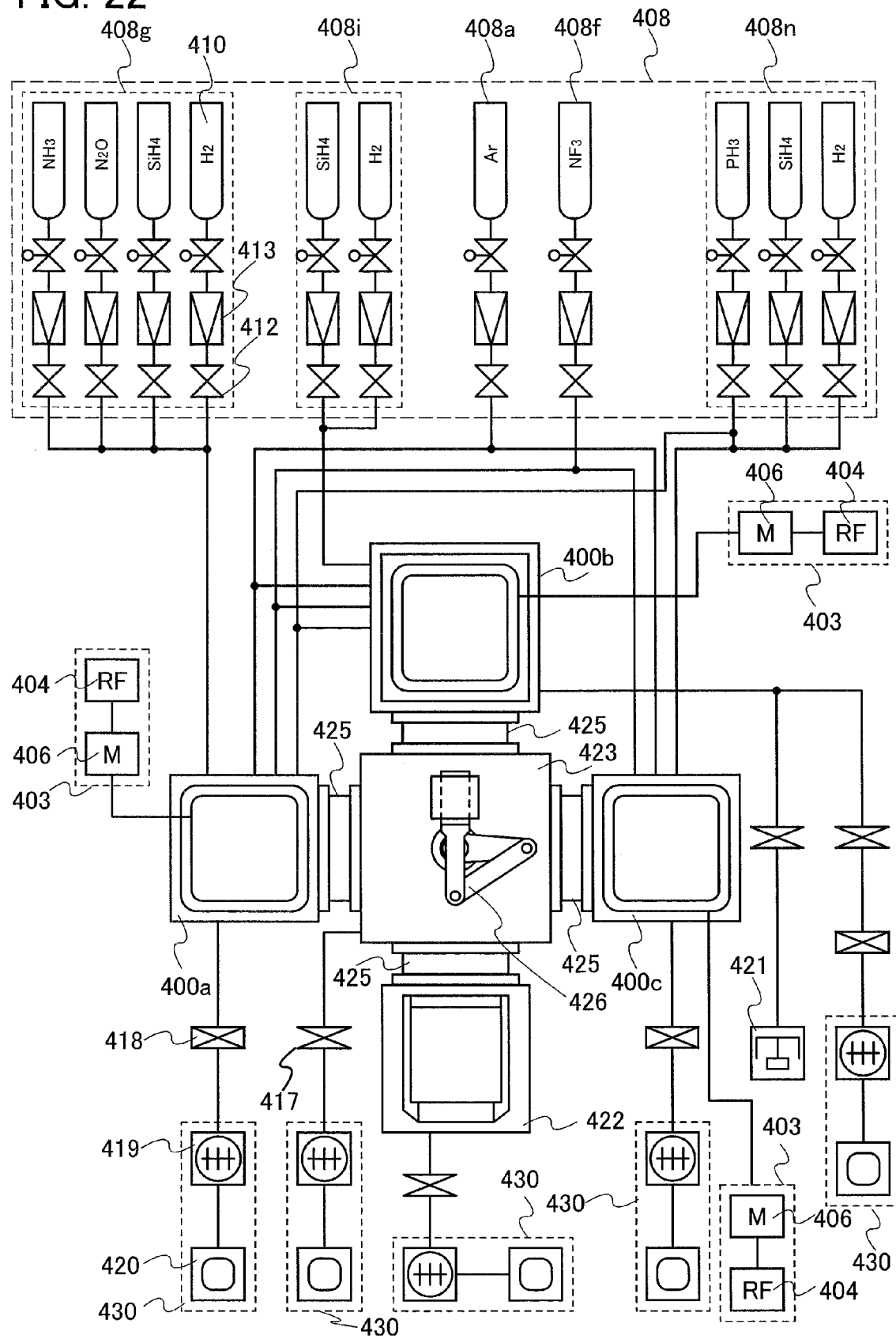
FIG. 22 is a drawing showing a structure of a plasma CVD apparatus applicable to the present invention.

FIG. 22 shows an example of a multi-chamber plasma CVD apparatus including a plurality of reaction chambers. The apparatus is provided with a common chamber 423, a load/unload chamber 422, a first reaction chamber 400a, a second reaction chamber 400b, and a third reaction chamber 400c. This apparatus is a single wafer-processing type in which a substrate set in a cassette in the load/unload chamber 422 is transferred to/from each reaction chamber by a transfer unit 426 in the common chamber 423. A gate valve 425 is provided between the common chamber 423 and each chamber such that treatments performed in different reaction chambers do not interfere each other.

Each reaction chamber is used for a different purpose, depending on the kinds of thin films to be formed. For example, an insulating film such as a gate insulating film is formed in the first reaction chamber 400a, a microcrystalline semiconductor film which forms a channel and a buffer layer are formed in the second reaction chamber 400b, and a semiconductor film to which an impurity element imparting one conductivity type is added and which forms a source and a drain is formed in the third reaction chamber 400c. Of course, the number of the reaction chambers is not limited to three, and can be increased or decreased as needed. One film may be formed in one reaction chamber, or a plurality of films may be formed in one reaction chamber.

A turbo-molecular pump 419 and a dry pump 420 are connected to each reaction chamber as exhaust units. The exhaust units are not limited to a combination of these vacuum pumps and can employ other vacuum pumps as long as they can evacuate the reaction chamber to a degree of vacuum of about $10^{-5}$ Pa to $10^{-1}$ Pa. A butterfly valve 417 is provided between the exhaust units 430 and each reaction chamber, which can interrupt vacuum evacuation, and a conductance valve 418 can control exhaust velocity to adjust the pressure in each reaction chamber.

Note that the second reaction chamber 400b in which a microcrystalline semiconductor film is formed may be connected to a cryopump 421 which performs vacuum evacuation to an ultra-high vacuum. By use of the cryopump 421, the reaction chamber can be evacuated to an ultra-high vacuum of a pressure of lower than $10^{-5}$ Pa. In this embodiment mode, with an ultra-high vacuum with a pressure of lower than $10^{-5}$ Pa in the reaction chamber, the oxygen concentration in the microcrystalline semiconductor film can be effectively reduced. Consequently, the oxygen concentration in the microcrystalline semiconductor film 53 can be set at less than or equal to $1 \times 10^{16}$ atoms/cm$^3$. With the reduced oxygen concentration in the microcrystalline semiconductor film, defects in the film can be reduced, whereby crystallinity can be improved and thus carrier mobility can be improved.

A gas supply unit 408 includes a cylinder 410 filled with a gas used for the process, such as a rare gas or a semiconductor source gas typified by silane, a stop valve 412, a mass flow controller 413, and the like. A gas supply unit 408g is connected to the first reaction chamber 400a and supplies a gas for forming a gate insulating film. A gas supply unit 408i is connected to the second reaction chamber 400b and supplies a gas for forming a microcrystalline semiconductor film and a buffer layer. A gas supply unit 408n is connected to the third reaction chamber 400c and supplies a gas for forming an n-type semiconductor film, for example. In addition, phosphine which is one of gases including an impurity element which serves as a donor is connected and supplied to the first reaction chamber 400a and the second reaction chamber 400b. A gas supply unit 408a supplies argon, and a gas supply unit 408f supplies an etching gas used for cleaning of the inside of the reaction chambers. Thus, the gas supply units 408a and 408f are provided in common for each reaction chamber.

A high-frequency power supply unit 403 for generating plasma is connected to each reaction chamber. The high-frequency power supply unit 403 includes a high-frequency power source 404 and a matching box 406.

Figure 23:
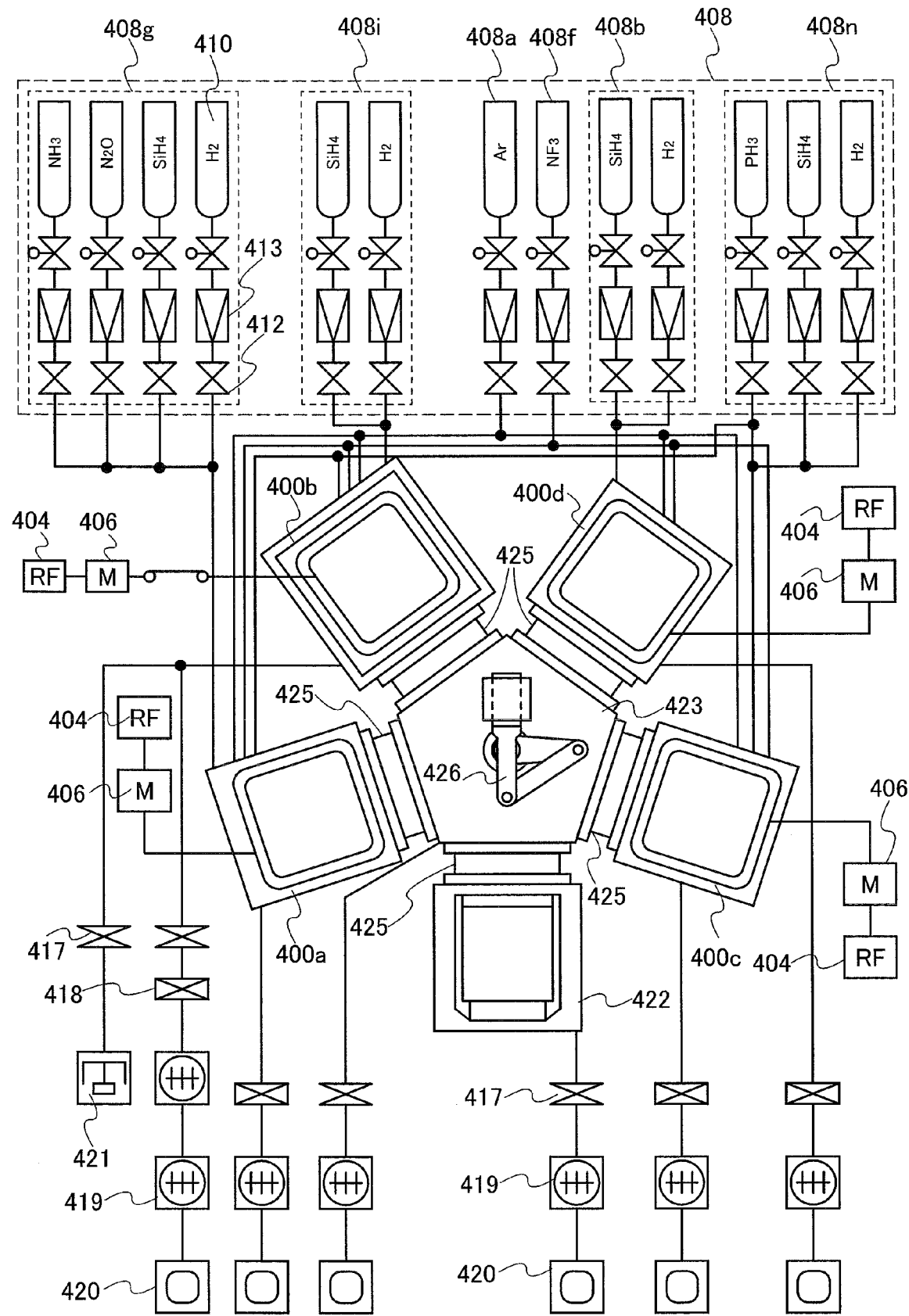
FIG. 23 is a drawing showing a structure of a plasma CVD apparatus applicable to the present invention.

FIG. 23 shows a structure in which a fourth reaction chamber 400d is added to the structure of the multi-chamber plasma CVD apparatus of FIG. 22. A gas supply unit 408b is connected to the fourth reaction chamber 400d. High-frequency power supply units and evacuation units have the same structure as those of FIG. 22. Each reaction chamber can be used for a different purpose, depending on the kinds of thin films to be formed. For example, an insulating film such as a gate insulating film can be formed in the first reaction chamber 400a. A semiconductor film and a microcrystalline semiconductor film for forming a channel formation region can be formed in the second reaction chamber 400b. A buffer layer which protects the microcrystalline semiconductor film for forming a channel formation region can be formed in the fourth reaction chamber 400d. A semiconductor film to which an impurity element imparting one conductivity type is added and which forms a source and a drain can be formed in the third reaction chamber 400c. Since each thin film has an optimum temperature for being formed, each thin film is formed in a different reaction chamber, so that film formation temperatures can be easily controlled. Further, the same kind of films can be repeatedly formed, so that an influence of a residual impurity due to a film which has been formed can be eliminated.

A microcrystalline semiconductor film, a buffer layer, and a semiconductor film to which an impurity element imparting one conductivity type is added may be formed successively in one reaction chamber. Specifically, a substrate provided with a gate insulating film is carried into a reaction chamber, and a microcrystalline semiconductor film, a buffer layer, and a semiconductor film to which an impurity element imparting one conductivity type is added are formed therein successively. Then, after the substrate is taken out of the reaction chamber, the inside of the reaction chamber is cleaned with fluorine radicals. However, even when the inside of the reaction chamber is cleaned, an impurity element which serves as a donor is left in the reaction chamber in some cases. When a substrate provided with a gate insulating film is carried into such a reaction chamber and a microcrystalline semiconductor film is formed, the microcrystalline semiconductor film includes the impurity element which serves as a donor. Accordingly, a microcrystalline semiconductor film which has high crystallinity at the interface with a gate insulating film and includes an impurity element which serves as a donor can be formed.

Next, a method for manufacturing a thin film transistor, which is different from that in the above mode, is described with reference to FIGS. 24A and 24B, FIGS. 25A to 25D, FIGS. 26A to 26C, FIGS. 27A and 27B, FIGS. 28A and 28B, FIGS. 29A to 29C, and FIGS. 30A to 30C. Here, a process is shown through which the number of photomasks can be smaller than that of the above modes and through which a thin film transistor can be manufactured. A manufacturing process of the thin film transistor shown in FIG. 1A is described here; however, the following mode can be applied to the manufacturing processes of the thin film transistors shown in FIG. 1D, FIGS. 2A and 2E, FIG. 3A, FIGS. 4A and 4C, and FIG. 5A.

Figure 24A:
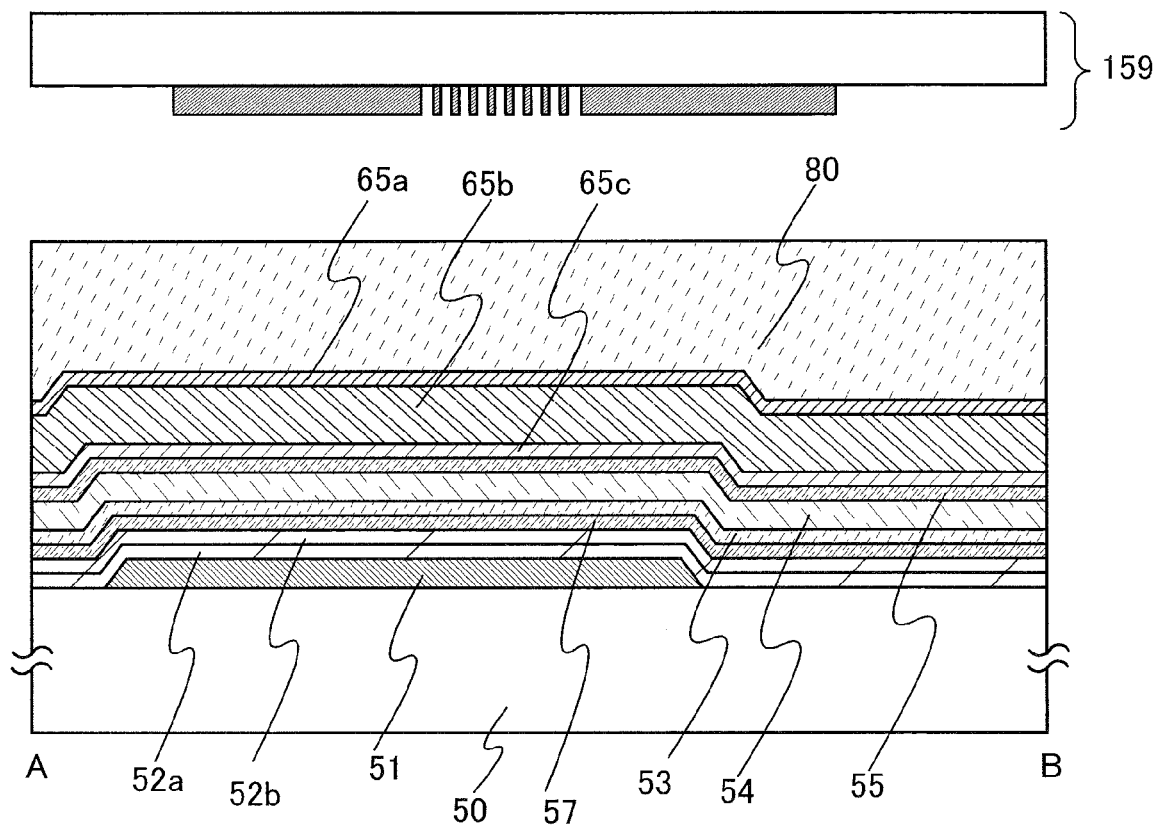
FIGS. 24A and 24B are cross-sectional views illustrating a method for manufacturing a display device of the present invention.

In a similar manner to FIG. 1A, a conductive film is formed over a substrate 50; a resist is applied on the conductive film; and a part of the conductive film is etched using a resist mask which is formed by a photolithography process using a first photomask, so that a gate electrode 51 is formed. Then, as shown in FIG. 24A, gate insulating films 52a and 52b are formed over the gate electrode 51. In a similar manner to FIGS. 9B and 9C, a microcrystalline semiconductor film 57 including an impurity element which serves as a donor is formed. Then, a microcrystalline semiconductor film 53, a buffer layer 54, a semiconductor film 55 to which an impurity element imparting one conductivity type is added, and conductive films 65a to 65c are formed in order over the microcrystalline semiconductor film 57 including the impurity element which serves as a donor. Then, a resist 80 is applied on the conductive film 65a.

The resist 80 can be a positive type resist or a negative type resist. In this case, a positive type resist is used.

Next, a multi-tone mask 159 is used as a second photomask and the resist 80 is irradiated with light, whereby the resist 80 is exposed to light.

Now, light exposure using the multi-tone mask 159 is described with reference to FIGS. 25A to 25D.

A multi-tone mask can achieve three levels of light exposure, an exposed portion, a half-exposed portion, and an unexposed portion; one-time light exposure and development process allows a resist mask with regions of plural thicknesses (typically, two kinds of thicknesses) to be formed. Thus, the use of the multi-tone mask can reduce the number of photomasks.

Figure 25A:
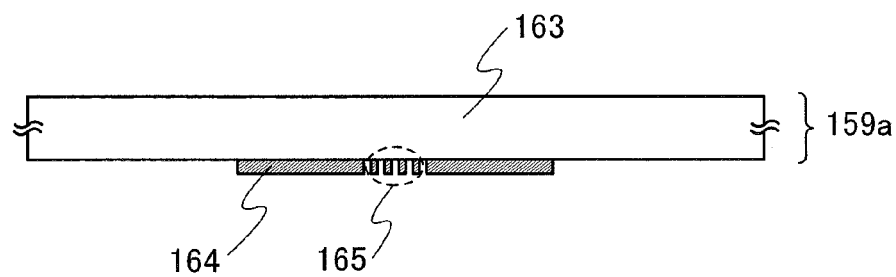
FIGS. 25A to 25D are drawings illustrating multi-tone masks applicable to the present invention.
Figure 25B:
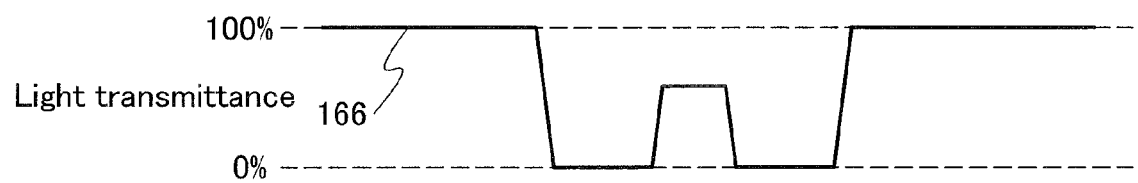
Figure 25C:
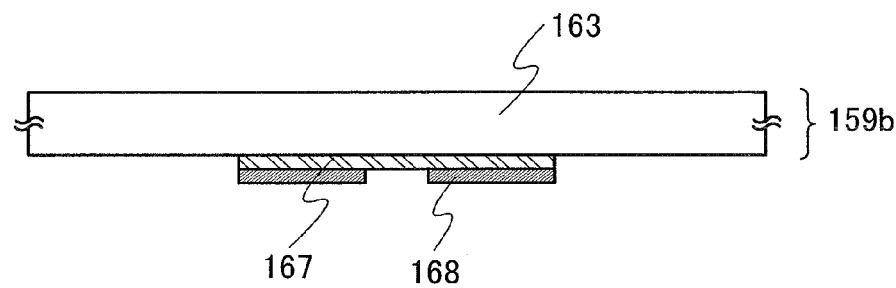

Typical examples of a multi-tone mask include a gray-tone mask 159a shown in FIG. 25A and a half-tone mask 159b shown in FIG. 25C.

As shown in FIG. 25A, the gray-tone mask 159a includes a light-transmitting substrate 163 provided with a light-blocking portion 164 and a diffraction grating 165. The light transmittance of the light-blocking portion 164 is 0%. The diffraction grating 165 has a light-transmitting portion in a slit form, a dot form, a mesh form, or the like with intervals which are less than or equal to the resolution limit of light used for the exposure; thus, the light transmittance can be controlled. The diffraction grating 165 can be in a slit form, a dot form, or a mesh form with regular intervals; or in a slit form, a dot form, or a mesh form with irregular intervals.

For the light-transmitting substrate 163, a substrate having a light-transmitting property, such as a quartz substrate, can be used. The light-blocking portion 164 and the diffraction grating 165 can be formed using a light-blocking material such as chromium or chromium oxide, which absorbs light.

When the gray-tone mask 159a is irradiated with light for exposure, a light transmittance 166 of the light-blocking portion 164 is 0% and that of a region where neither the light-blocking portion 164 nor the diffraction grating 165 is provided is 100%, as shown in FIG. 25B. The light transmittance of the diffraction grating 165 can be controlled in a range of 10% to 70%. The light transmittance of the diffraction grating 165 can be controlled with an interval or a pitch of slits, dots, or meshes of the diffraction grating 165.

As shown in FIG. 25C, the half-tone mask 159b includes a light-transmitting substrate 163 provided with a semi-light-transmitting portion 167 and a light-blocking portion 168. MoSiN, MoSi, MoSiO, MoSiON, CrSi, or the like can be used for the semi-light-transmitting portion 167. The light-blocking portion 168 can be formed using a light-blocking material such as chromium or chromium oxide, which absorbs light.

Figure 25D:
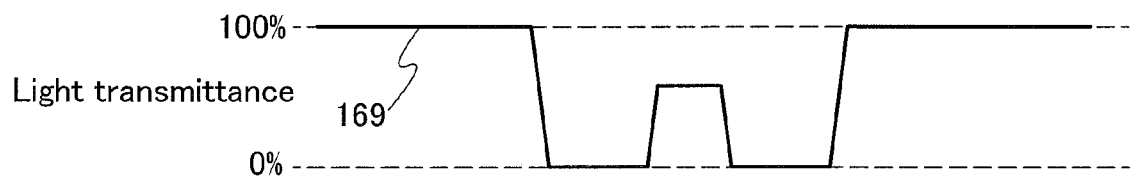

When the half-tone mask 159b is irradiated with light for exposure, a light transmittance 169 of the light-blocking portion 168 is 0% and that of a region where neither the light-blocking portion 168 nor the semi-light-transmitting portion 167 is provided is 100%, as shown in FIG. 25D. The light transmittance of the semi-light-transmitting portion 167 can be controlled in a range of 10% to 70%. The light transmittance of the semi-light-transmitting portion 167 can be controlled with the material of the semi-light-transmitting portion 167.

Figure 24B:
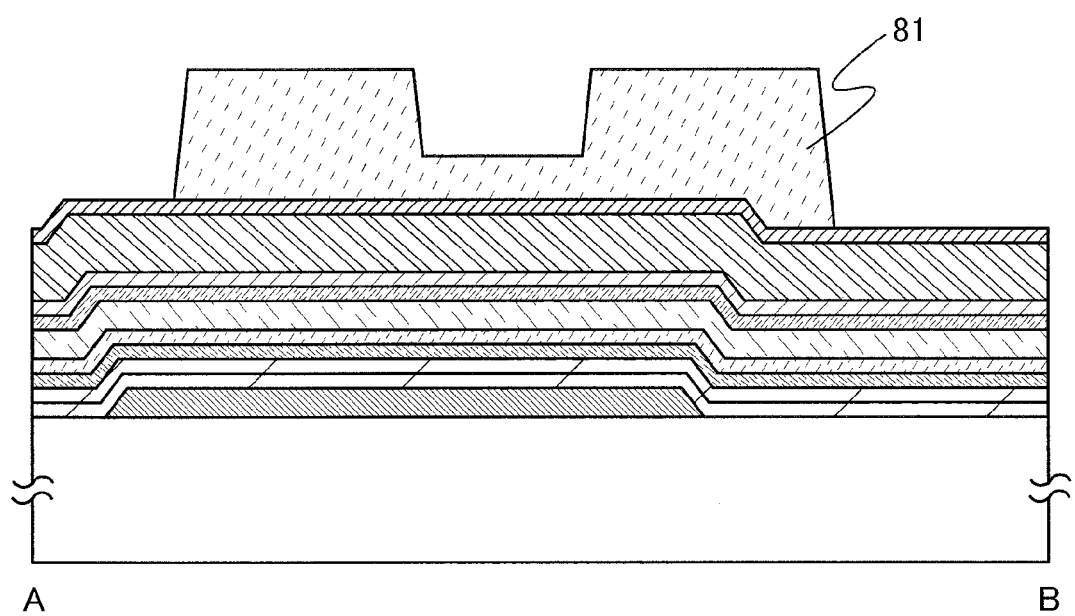

After the light exposure using the multi-tone mask is performed, development is carried out, whereby a resist mask 81 having regions with different thicknesses can be formed, as shown in FIG. 24B.

Figure 26A:
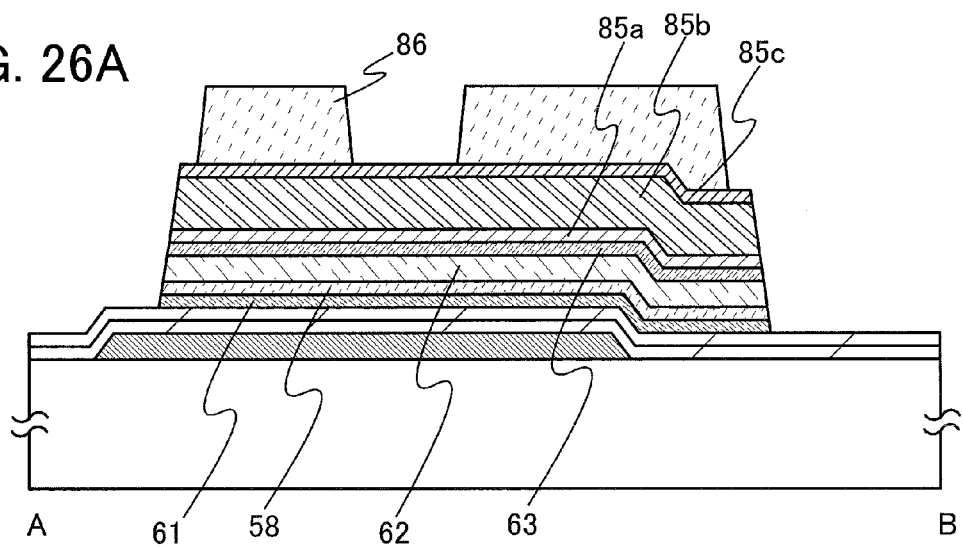
FIGS. 26A to 26C are cross-sectional views illustrating a method for manufacturing a display device of the present invention.

Next, with the resist mask 81, the microcrystalline semiconductor film 57 including the impurity element which serves as a donor, the microcrystalline semiconductor film 53, the buffer layer 54, the semiconductor film 55 to which the impurity element imparting one conductivity type is added, and the conductive films 65a to 65c are etched. As a result, a microcrystalline semiconductor film 61 including the impurity element which serves as a donor, a microcrystalline semiconductor film 58, a buffer layer 62, a semiconductor film 63 to which the impurity element imparting one conductivity type is added, and conductive films 85a to 85c can be formed, as shown in FIG. 26A. FIG. 26A shows a cross section taken along the line A-B of FIG. 30A (except for the resist mask 81).

Next, ashing is conducted on the resist mask 81. As a result, the area and the thickness of the resist are reduced. At this time, the resist in a region with a small thickness (a region overlapping with part of the gate electrode 51) is removed to form a separated resist mask 86, as shown in FIG. 26A.

Figure 26B:
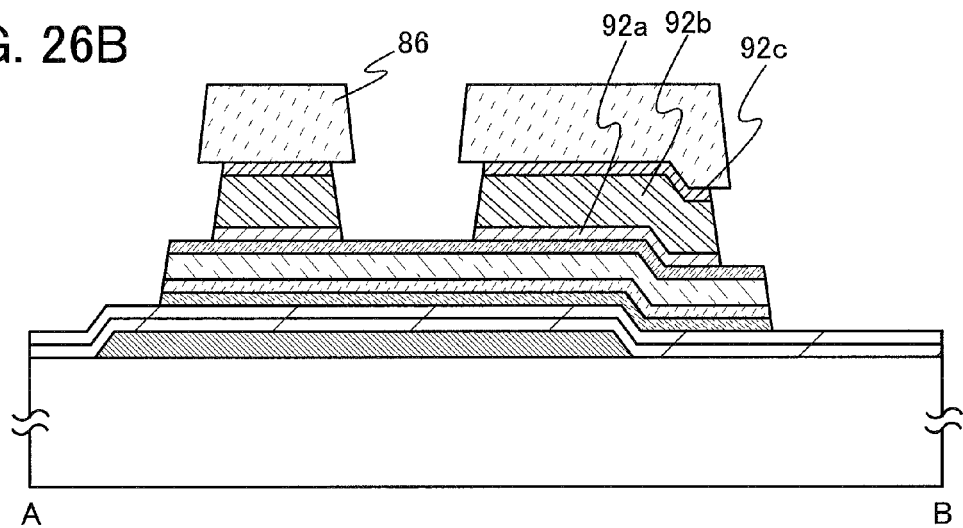

Next, the conductive films 85a to 85c are etched to be separated using the resist mask 86. As a result, pairs of wirings 92a to 92c can be formed as shown in FIG. 26B. Here, by wet etching of the conductive films 85a to 85c with use of the resist mask 86, the conductive films 85a to 85c are etched as selected. And, since the conductive films are isotropically etched, the wirings 92a to 92c with smaller areas than the resist mask 86 can be formed.

Next, the semiconductor film 63 to which the impurity element imparting one conductivity type is added is etched using the resist mask 86, so that a pair of source and drain regions 88 are formed. Note that, in this etching step, a part of the buffer layer 62 is also etched. The buffer layer which is partly etched is referred to as a buffer layer 87. The buffer layer 87 has a recessed portion. The source and drain regions and the recessed portion of the buffer layer can be formed in the same process. Here, the buffer layer 62 is partly etched with use of the resist mask 86 having a smaller area than the resist mask 81, so that end portions of the buffer layer 87 are located outside those of the source and drain regions 88. In addition, the end portions of the wirings 92a to 92c are not aligned with those of the source and drain regions 88, and the end portions of the source and drain regions 88 are formed outside those of the wirings 92a to 92c. After that, the resist mask 86 is removed.

Next, dry etching is performed under such a condition that the buffer layer which is exposed is not damaged and an etching rate with respect to the buffer layer is low. Through this dry etching step, an etching residue on the buffer layer between the source region and the drain region, a residue of the resist mask, and a contamination source in the apparatus used for removal of the resist mask can be removed, whereby the source region and the drain region can be certainly insulated. As a result, leak current of the thin film transistor can be reduced, so that a thin film transistor with small off current and high withstand voltage can be manufactured. A chlorine gas can be used for an etching gas, for example.

Figure 26C:
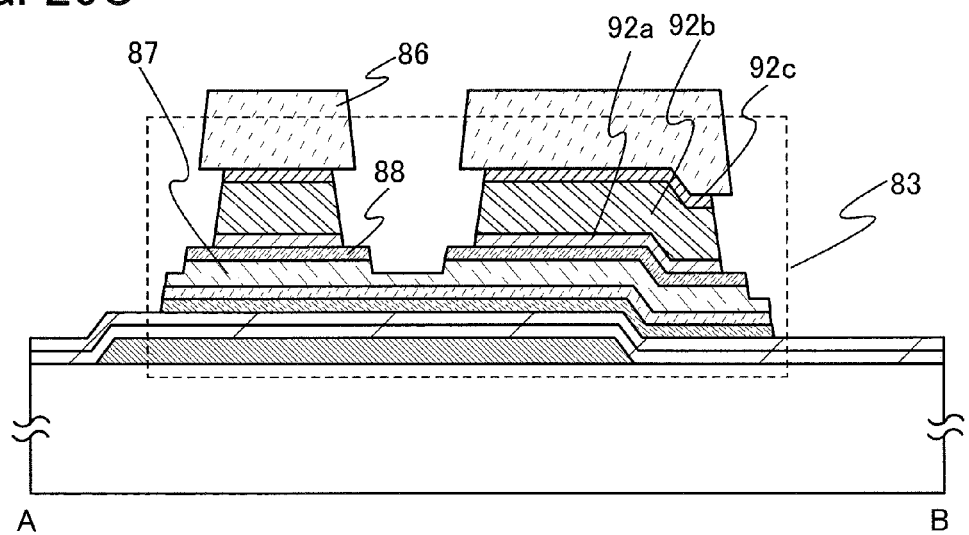

As shown in FIG. 26C, the end portions of the wirings 92a to 92c are not aligned with those of the source and drain regions 88, whereby the end portions of the wirings 92a to 92c can have a larger distance therebetween; thus, leak current or short-circuit between the wirings can be prevented. Accordingly, an inverted staggered thin film transistor can be manufactured.

Through the above-described process, a channel-etched thin film transistor 83 can be formed. In addition, the thin film transistor can be formed using two photomasks.

Figure 27A:
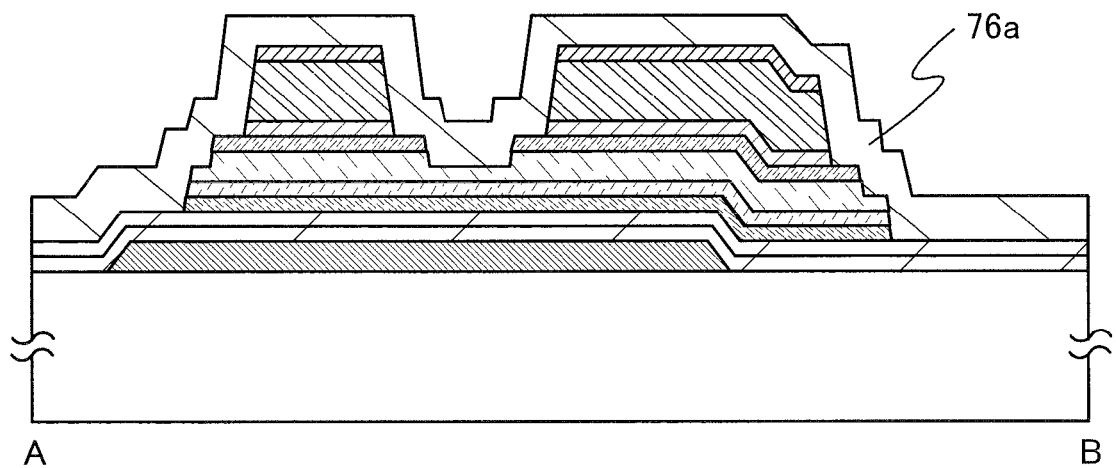
FIGS. 27A and 27B are cross-sectional views illustrating a method for manufacturing a display device of the present invention.

Next, as shown in FIG. 27A, a protective insulating film 76a is formed over the wirings 92a to 92c, the source and drain regions 88, the buffer layer 87, the microcrystalline semiconductor film 58, the microcrystalline semiconductor film 61 including the impurity element which serves as a donor, and the gate insulating film 52b. The protective insulating film 76a can be formed in a similar manner to the gate insulating films 52a and 52b.

Figure 27B:
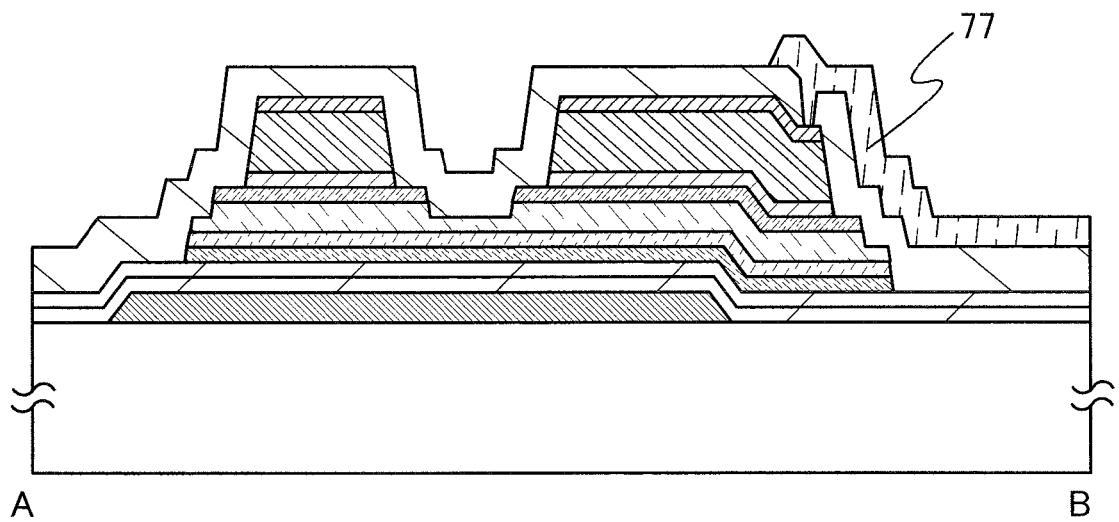

Next, a part of the protective insulating film 76a is etched using a resist mask formed using a third photomask, so that a contact hole is formed. Next, a pixel electrode 77 is formed in the contact hole to be in contact with the wiring 92c. In this example, an ITO film is formed as the pixel electrode 77 by a sputtering method, and then, a resist is applied on the ITO film. Then, the resist is exposed to light and developed using a fourth photomask, thereby forming a resist mask, and then, the ITO film is etched using the resist mask to form the pixel electrode 77. FIG. 27B shows a cross section taken along the line A-B in FIG. 30C.

Through the above process, a thin film transistor and an element substrate which includes the thin film transistor and can be used for a display device can be formed.

Figure 30A:
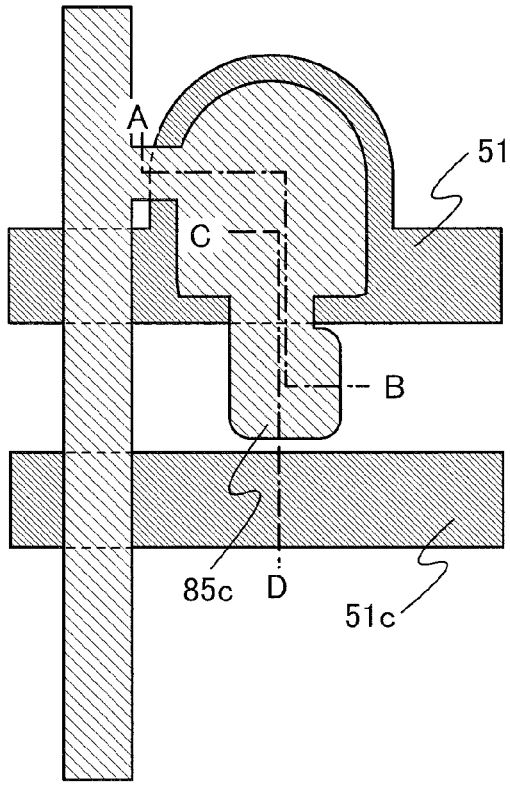
FIGS. 30A to 30C are top views illustrating a method for manufacturing a display device of the present invention.
Figure 30B:
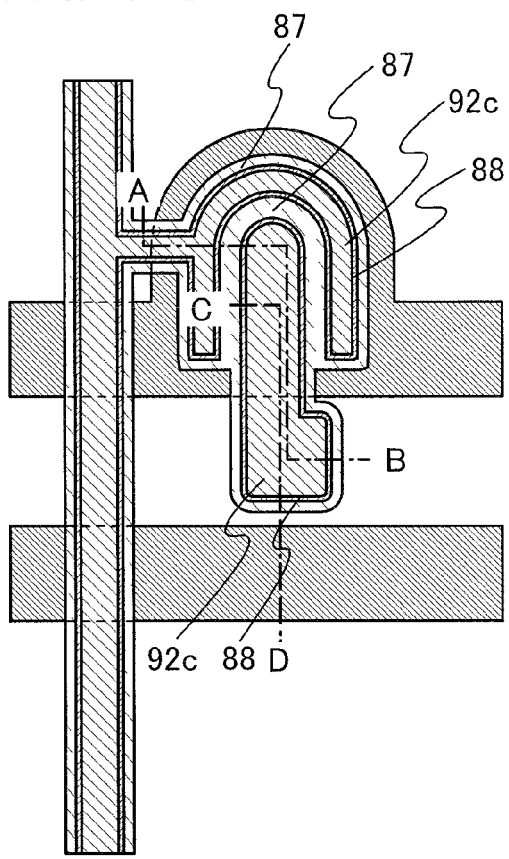
Figure 30C:
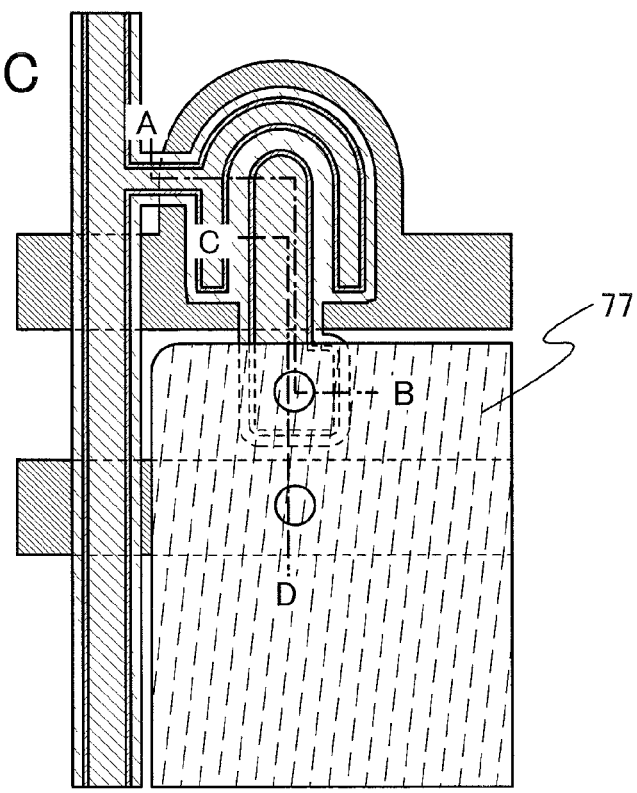

Next, a process capable of forming a contact hole and a capacitor element with one photomask will be described below. Cross-sectional views taken along lines C-D in FIGS. 30A to 30C are used here.

Figure 28A:
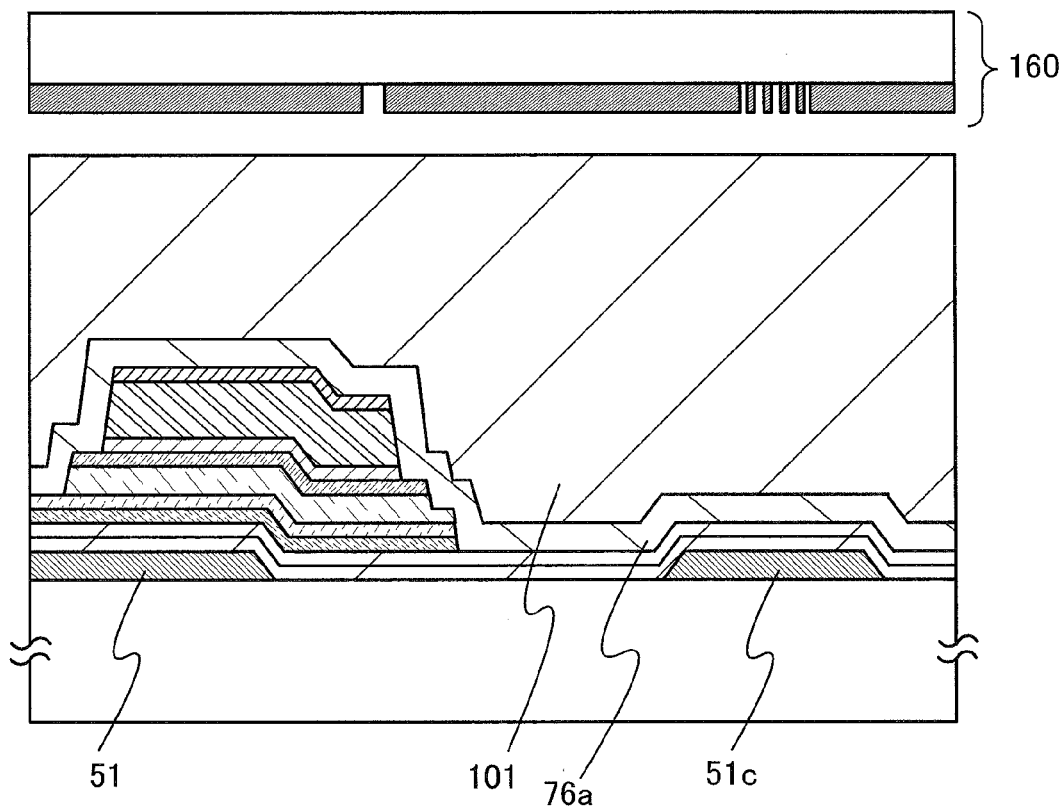
FIGS. 28A and 28B are cross-sectional views illustrating a method for manufacturing a display device of the present invention.
Figure 28B:
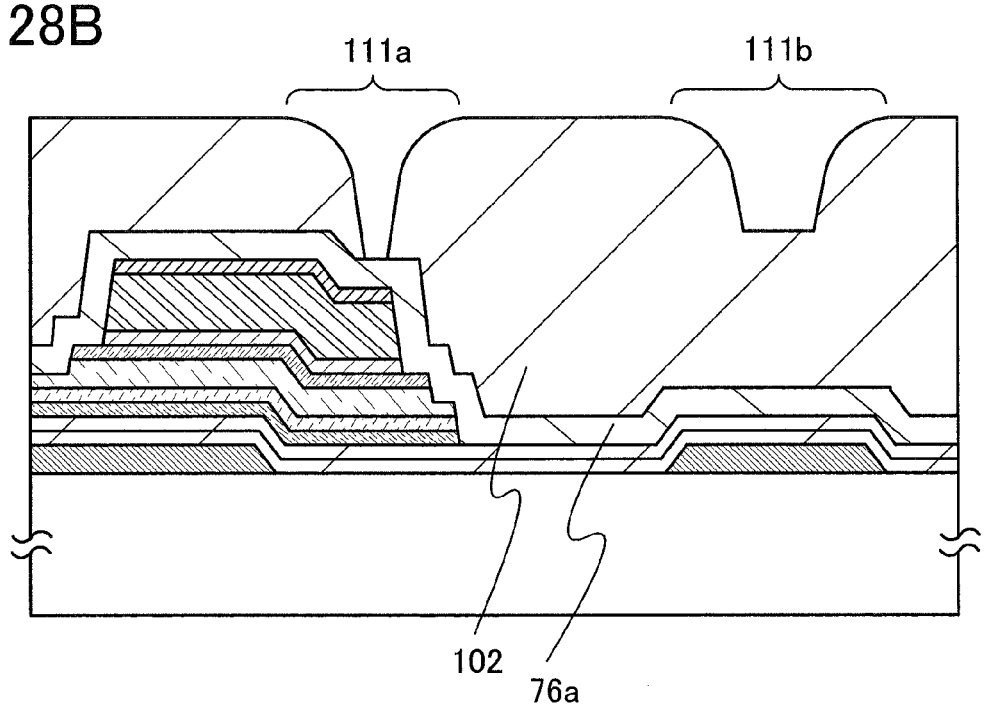

After the step shown in FIG. 27A, an insulating film 101 is formed over the protective insulating film 76a as shown in FIG. 28A. The insulating film 101 is formed using a photosensitive organic resin here. Then, the insulating film 101 is exposed to light using a multi-tone mask 160 and developed, whereby an insulating film 102 having a recessed portion 111a which exposes the protective insulating film 76a covering the wirings of the thin film transistor and a recessed portion 111b over a capacitor wiring 51c is formed as shown in FIG. 28B. Here, by use of the multi-tone mask 160, the insulating film 101 can be exposed to light by 100% over the wirings of the thin film transistor, and the insulating film 101 can be exposed to light by 10% to 70% over the capacitor wiring 51c.

Figure 29A:
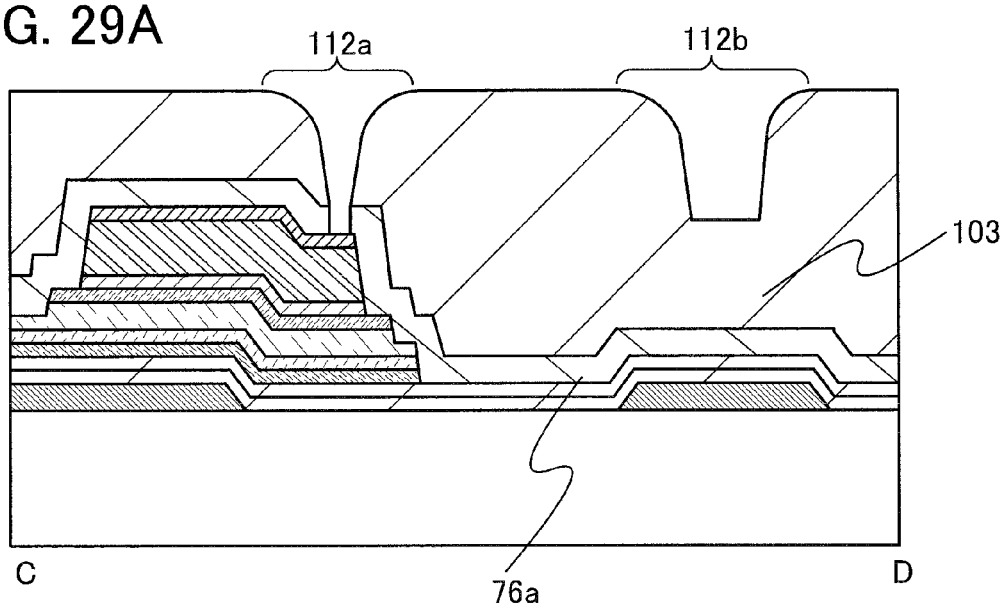
FIGS. 29A to 29C are cross-sectional views illustrating a method for manufacturing a display device of the present invention.
Figure 29B:
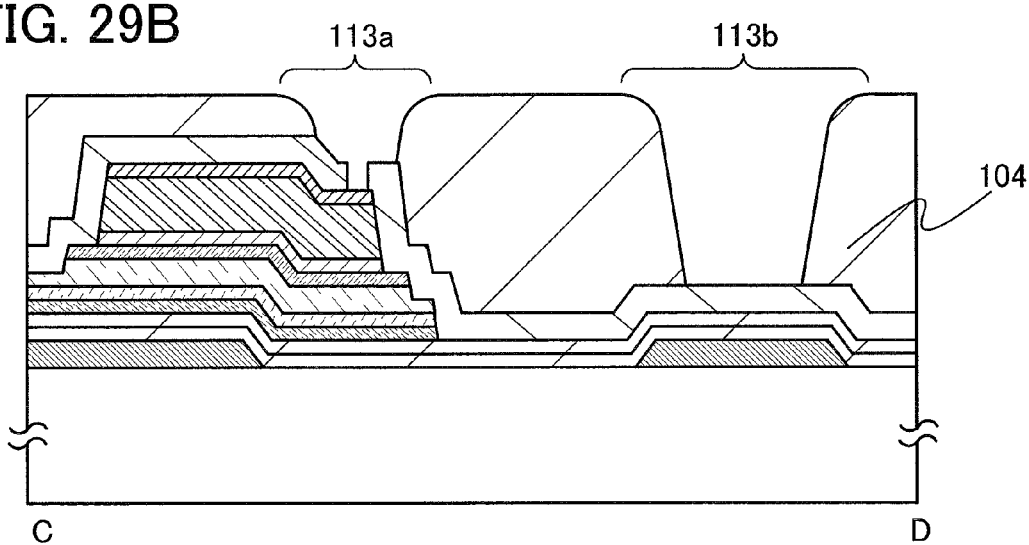
Figure 29C:
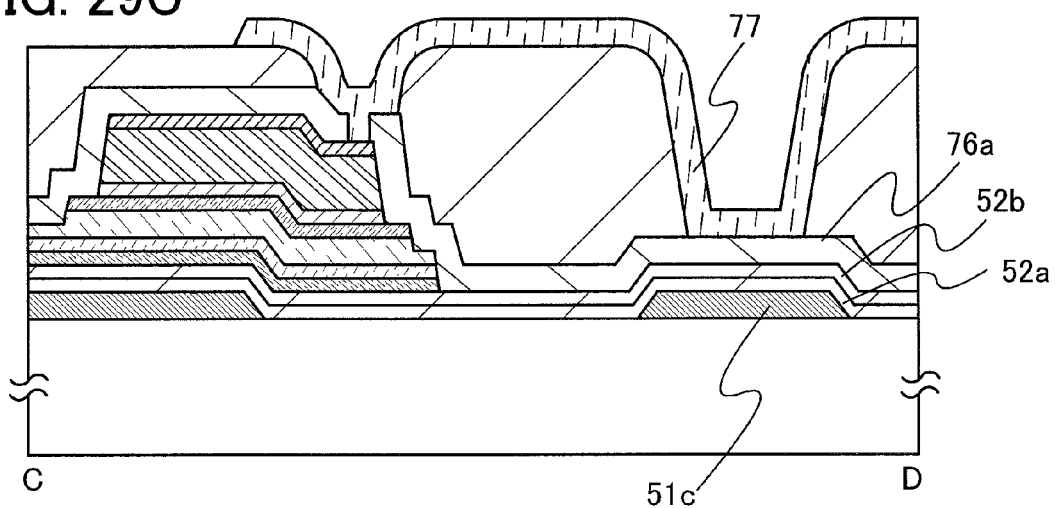

Next, the insulating film 102 having the recessed portions is entirely etched (etch back), and a part of the protective insulating film 76a is etched. As a result, an insulating film 103 having a contact hole 112a which exposes the wiring 92c and a recessed portion 112b over the capacitor wiring 51c is formed as shown in FIG. 29A.

Next, ashing is conducted on the insulating film 103, and the areas of the contact hole 112a and the recessed portion 112b are widened, so that a contact hole 113a and a recessed portion 113b are formed. Since the protective insulating film 76a is not formed of a photosensitive organic resin but formed of an inorganic insulating film, it is not processed by ashing. Therefore, the contact hole 113a over the wirings has a top shape with double circles.

After that, a pixel electrode 77 is formed, and a capacitor element including the capacitor wiring 51c, the gate insulating films 52a and 52b, the protective insulating film 76a, and the pixel electrode 77 can be formed.

Through the above process, the contact hole connecting the pixel electrode and the wiring, and the capacitor element can be formed by using only one multi-tone mask.

Figure 31:
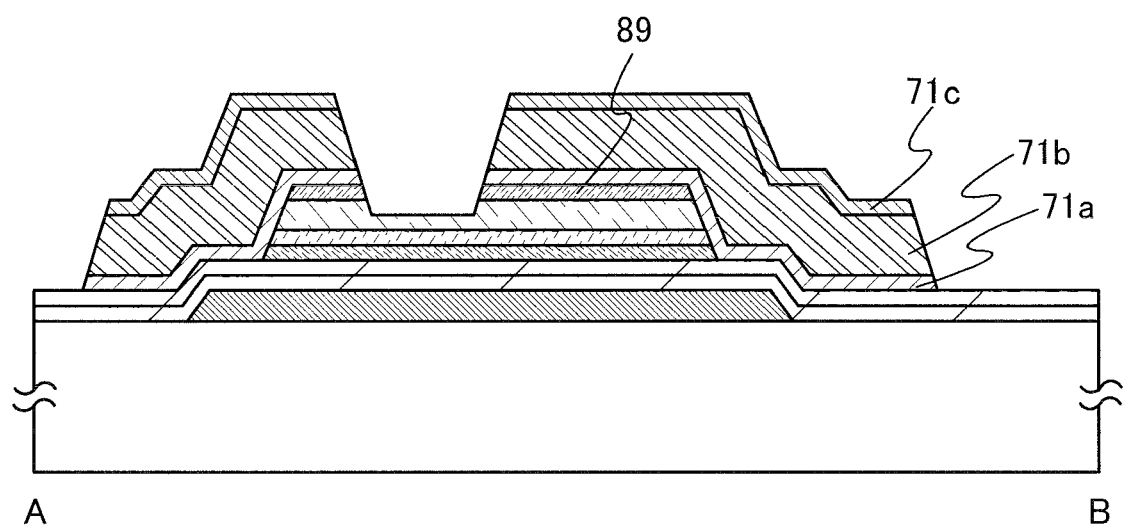
FIG. 31 is a cross-sectional view illustrating a method for manufacturing a display device of the present invention.

Further, in FIG. 10B or FIG. 26B, after forming the wirings 71a to 71c or 92a to 92c, the resist mask 66 or 86 may be removed, and the semiconductor film 63 to which the impurity element imparting one conductivity type is added may be etched using the wirings 71a to 71c or 92a to 92c as masks. As a result, a thin film transistor in which end portions of the wirings 71a to 71c or 92a to 92c are aligned with those of the source and drain regions 72 or 88 can be formed. Here, after removing the resist mask 66 shown in FIG. 10B, the semiconductor film 63 to which the impurity element imparting one conductivity type is added is etched using the wirings 71a to 71c as masks, so that a thin film transistor in which end portions of source and drain regions 89 are aligned with those of the wirings 71a to 71c can be formed as shown in FIG. 31.

Although this embodiment mode describes a channel-etched thin film transistor, a microcrystalline semiconductor film can also be used for a channel formation region of a channel protective thin film transistor.

In accordance with this embodiment mode, an inverted staggered thin film transistor with high electric characteristics and an element substrate provided with the inverted staggered thin film transistor can be manufactured.

This embodiment mode describes an inverted staggered thin film transistor as a thin film transistor, but the present invention is not limited thereto. A method for forming an insulating film and a microcrystalline semiconductor film each including an impurity element which serves as a donor can be applied to a staggered thin film transistor, a top gate thin film transistor, and the like. Specifically, an insulating film functioning as a base film or a microcrystalline semiconductor film is made to include an impurity element which serves as a donor, and a gate insulating film and a gate electrode are formed over the microcrystalline semiconductor film, whereby a thin film transistor having a microcrystalline semiconductor film with high crystallinity at the interface with the insulating film can be manufactured. Accordingly, a thin film transistor with excellent electric characteristics can be formed.

Embodiment Mode 4

In this embodiment mode, a liquid crystal display device including the thin film transistor described in Embodiment Mode 1 will be described below as one mode of a display device. Here, a vertical alignment (VA) liquid crystal display device will be described with reference to FIG. 32, FIG. 33, and FIG. 34. The VA liquid crystal display device employs one mode for controlling alignment of liquid crystal molecules of a liquid crystal panel. The VA liquid crystal display device employs a mode in which liquid crystal molecules are vertical to a panel surface when voltage is not applied. In particular, in this embodiment mode, it is devised that a pixel is divided into several regions (sub-pixels) so that molecules are aligned in different directions in different regions. This is referred to as multi-domain or multi-domain design. In the following description, a liquid crystal display device with multi-domain design is described.

Figure 32:
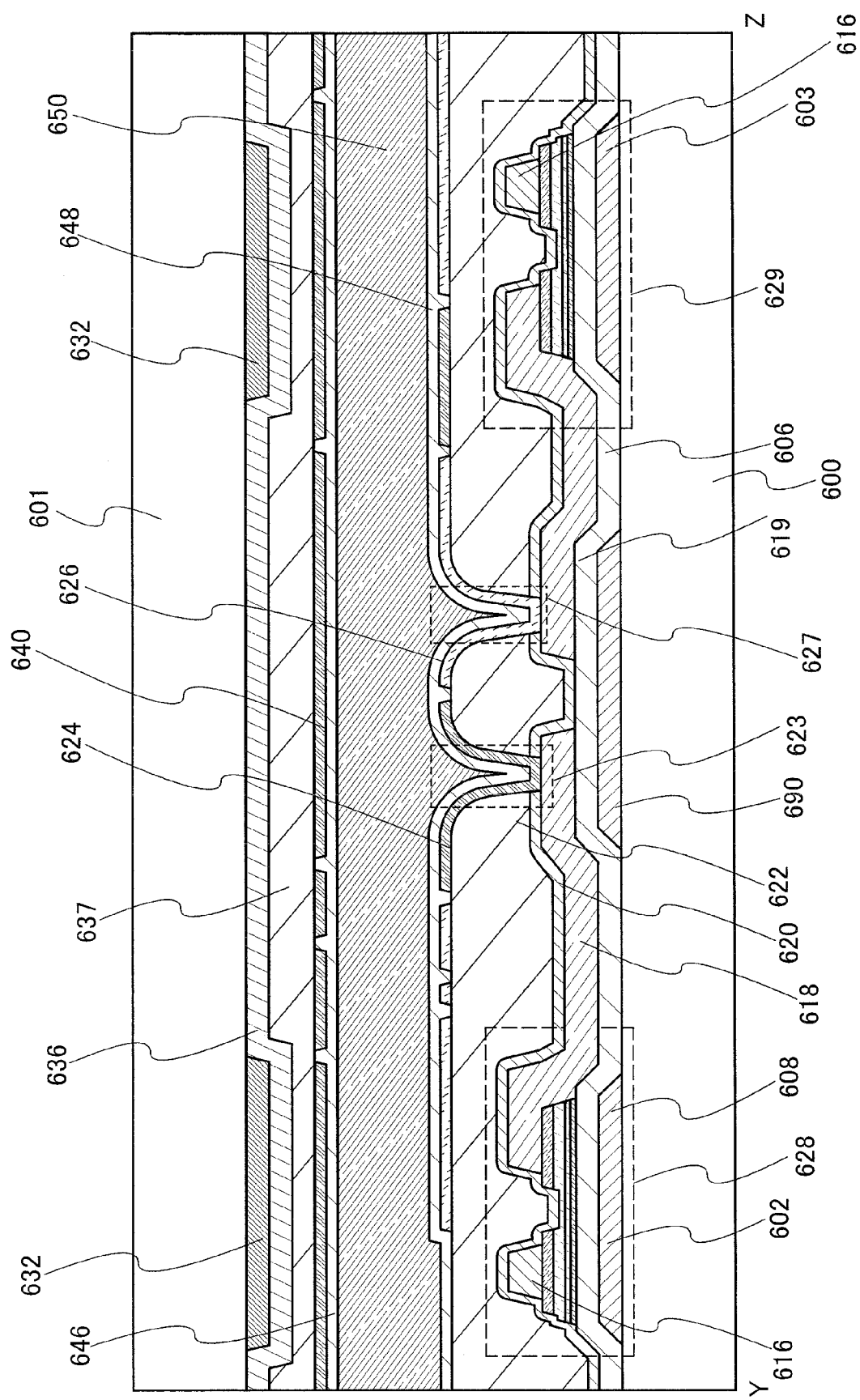
FIG. 32 is a cross-sectional view illustrating a display device of the present invention.
Figure 33:
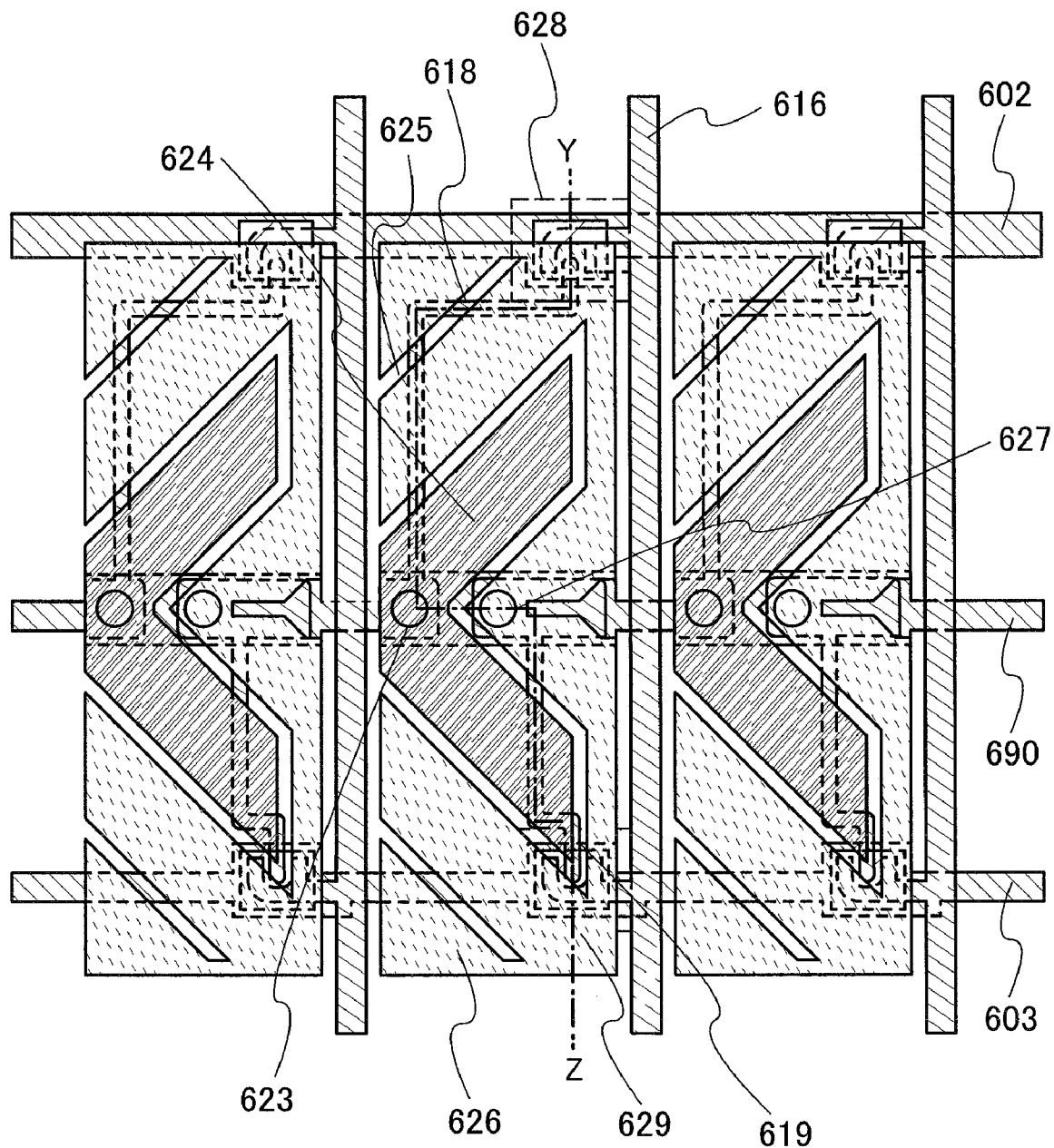
FIG. 33 is a top view illustrating a display device of the present invention.

FIG. 32 and FIG. 33 show a pixel structure of a VA liquid crystal panel. FIG. 33 is a plan view of a substrate 600. FIG. 32 shows a cross-sectional structure along a line Y-Z in FIG. 33. The following description will be made with reference to both the drawings.

In this pixel structure, a plurality of pixel electrodes 624 and 626 is included in one pixel, and thin film transistors 628 and 629 are connected to the pixel electrodes 624 and 626, respectively, through a planarization film 622. The thin film transistors 628 and 629 are driven by different gate signals. That is, a pixel of multi-domain design has a structure in which a signal applied to each of the pixel electrodes 624 and 626 is independently controlled.

The pixel electrode 624 is connected to the thin film transistor 628 through a wiring 618 in a contact hole 623. In a contact hole 627, the pixel electrode 626 is connected to the thin film transistor 629 through a wiring 619. A gate wiring 602 of the thin film transistor 628 and a gate wiring 603 of the thin film transistor 629 are separated so that different gate signals can be given thereto. In contrast, a wiring 616 functioning as a data line is used in common for the thin film transistors 628 and 629. The thin film transistors 628 and 629 can be manufactured by the methods described in Embodiment Mode 3.

The pixel electrodes 624 and 626 have different shapes and are separated by a slit 625. The pixel electrode 626 surrounds the pixel electrode 624, which has a V-shape. Timings of voltage application are varied between the pixel electrode 624 and the pixel electrode 626 by the thin film transistor 628 and the thin film transistor 629, so that alignment of liquid crystals is controlled. When different gate signals are supplied to the gate wiring 602 and the gate wiring 603, operation timings of the thin film transistor 628 and the thin film transistor 629 can be varied. An alignment film 648 is formed over the pixel electrodes 624 and 626.

Figure 34:
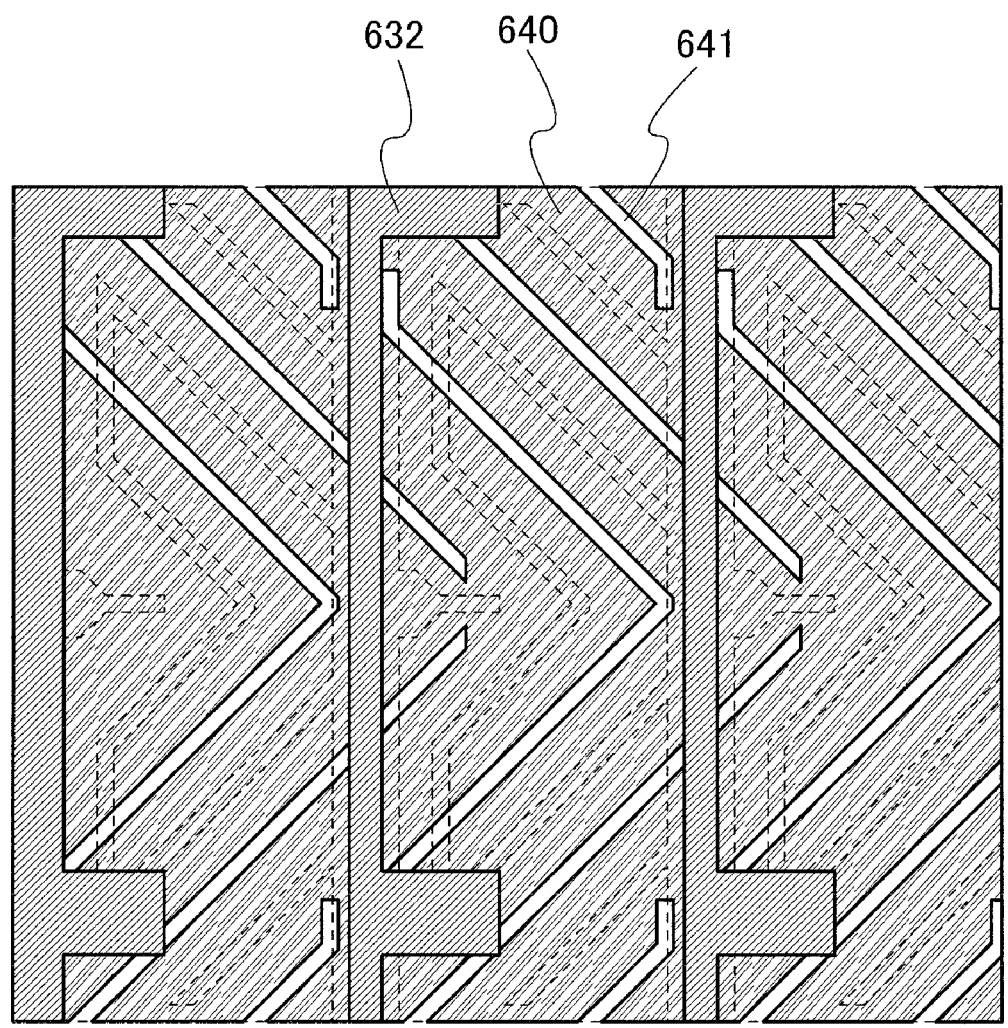
FIG. 34 is a top view illustrating a display device of the present invention.

A counter substrate 601 is provided with a light-blocking film 632, a coloring film 636, and a counter electrode 640. In addition, a planarization film 637 is formed between the coloring film 636 and the counter electrode 640 so that alignment disorder of liquid crystals is prevented. Further, an alignment film 646 is formed on the counter electrode 640. FIG. 34 shows a structure of a counter substrate side. A slit 641 is formed in the counter electrode 640 which is used in common between different pixels. The slit 641 and the slit 625 on the side of the pixel electrodes 624 and 626 are alternately arranged in an engaging manner; thus, an oblique electric field is effectively generated, and the alignment of liquid crystals can be controlled. Accordingly, a direction of alignment of the liquid crystals can be made different depending on location and the viewing angle is widened.

In this specification, a substrate, a coloring film, a light-blocking film, and a planarization film form a color filter. Note that either the light-blocking film or the planarization film, or neither of them is not necessarily formed over the substrate.

The coloring film has a function of preferentially transmitting light of a predetermined wavelength range, among light of the wavelength range of visible light. In general, a coloring film which preferentially transmits light of a wavelength range of red light, a coloring film which preferentially transmits light of a wavelength range of blue light, and a coloring film which preferentially transmits light of a wavelength range of green light are combined to be used for the color filter. However, the combination of the coloring films is not limited to the above combination.

The pixel electrode 624, a liquid crystal layer 650, and the counter electrode 640 overlap with each other to form a first liquid crystal element. Further, a second liquid crystal element is formed by overlapping of the pixel electrode 626, the liquid crystal layer 650, and the counter electrode 640. Furthermore, the multi-domain structure is employed in which the first liquid crystal element and the second liquid crystal element are provided for one pixel.

Although a vertical alignment (VA) liquid crystal display device is described here, the element substrate formed in accordance with Embodiment Mode 1 can also be applied to an FFS mode liquid crystal display device, an IPS mode liquid crystal display device, a TN mode liquid crystal display device, and the like.

The liquid crystal display device can be manufactured through the above-described process. Since an inverted staggered thin film transistor with small off current and high electric characteristics is used for the liquid crystal display device of this embodiment mode, the liquid crystal display device has high contrast and high visibility.

Embodiment Mode 5

In this embodiment mode, a light-emitting display device including the thin film transistor described in Embodiment Mode 1 will be described below as one mode of a display device, and a structure of a pixel included in the light-emitting display device will be described. FIG. 35A shows one mode of a top view of a pixel. FIG. 35B shows one mode of a cross-sectional structure of the pixel along a line A-B in FIG. 35A.

A display device including a light-emitting element utilizing electroluminescence is shown as a light-emitting device. Light-emitting elements utilizing electroluminescence are classified according to whether a light-emitting material is an organic compound or an inorganic compound. In general, the former is referred to as an organic EL element, and the latter as an inorganic EL element. In this embodiment mode, the manufacturing process of the thin film transistor in accordance with Embodiment Mode 1 can be used.

In the case of an organic EL element, by applying voltage to a light-emitting element, electrons and holes are injected from a pair of electrodes into a layer including an organic compound with a light-emitting property to cause a current flow. Then, by recombination of these carriers (electrons and holes), the organic compound with a light-emitting property forms an excited state, and light is emitted when the excited state returns to a ground state. Due to such a mechanism, such a light-emitting element is called a current excitation type light-emitting element.

Inorganic EL elements are classified according to their element structures, into a dispersion type inorganic EL element and a thin-film type inorganic EL element. The dispersion type inorganic EL element has a light-emitting layer in which particles of a light-emitting material are dispersed in a binder. The mechanism of light emission of the dispersion type inorganic EL element is donor acceptor recombination light emission, which utilizes a donor level and an acceptor level. The thin-film type inorganic EL element has a structure in which a light-emitting layer is interposed between dielectric layers and the light-emitting layer interposed between the dielectric layers is further interposed between electrodes and adopts local emission in which inner shell electron transition of a metal ion is utilized. Note that the description is made here using an organic EL element as a light-emitting element. In addition, the description is made using channel-etched thin film transistors as a switching thin film transistor for controlling input of a signal to a first electrode and a driving thin film transistor which controls driving of a light-emitting element, but a channel protective thin film transistor can also be used as appropriate.

In FIGS. 35A and 35B, a first thin film transistor 74a is a switching thin film transistor for controlling input of a signal to a first electrode, and a second thin film transistor 74b is a driving thin film transistor for controlling current or voltage supply to a light-emitting element 94.

A gate electrode of the first thin film transistor 74a is connected to a wiring 51a functioning as a scanning line, one of a source and a drain is connected to wirings 71a to 71c which function as signal lines, and the other of the source and the drain is electrically connected to a gate electrode 51b of the second thin film transistor 74b. One of a source and a drain of the second thin film transistor 74b is connected to power source lines 93a to 93c, and the other of the source and the drain is electrically connected to a first electrode 79 of a display device. A gate electrode, a gate insulating film, and the power source line 93a of the second thin film transistor 74b form a capacitor element 96, and the other of the source and the drain of the first thin film transistor 74a is connected to the capacitor element 96.

The capacitor element 96 corresponds to a capacitor element for holding a voltage between the gate and the source or between the gate and the drain (hereinafter referred to as a gate voltage) of the second thin film transistor 74b when the first thin film transistor 74a is turned off, and is not necessarily provided.

In this embodiment mode, the first thin film transistor 74a and the second thin film transistor 74b can be each formed using the thin film transistor described in Embodiment Mode 1. In addition, although each of the first thin film transistor 74a and the second thin film transistor 74b is an n-channel thin film transistor, the first thin film transistor 74a and the second thin film transistor 74b may also be formed using an n-channel thin film transistor and a p-channel thin film transistor, respectively. Furthermore, both the first thin film transistor 74a and the second thin film transistor 74b may be formed using p-channel thin film transistors.

A protective insulating film 76 is formed over the first thin film transistor 74a and the second thin film transistor 74b, and a planarization film 78 is formed over the protective insulating film 76, and then the first electrode 79 is formed to be connected to a wiring 93f in a contact hole formed in the planarization film 78 and the protective insulating film 76. The planarization film 78 is preferably formed using an organic resin such as acrylic, polyimide, or polyamide, or a siloxane polymer. Since the first electrode 79 is uneven in the contact hole, a partition wall 91 having an opening is provided to cover the uneven portion of the first electrode 79. In the opening of the partition wall 91, an EL layer 92 is formed so as to be in contact with the first electrode 79, and a second electrode 93 is formed so as to cover the EL layer 92. A protective insulating film 95 is formed so as to cover the second electrode 93 and the partition wall 91.

A light-emitting element 94 having a top emission structure is shown as a light-emitting element. Note that the light-emitting element 94 with a top emission structure can emit light even in the case where it is over the first thin film transistor 74a or the second thin film transistor 74b; thus, a light emission area can be increased. However, if the layers located under the EL layer 92 are uneven, the thickness is nonuniform due to unevenness, and the second electrode 93 and the first electrode 79 are short-circuited, so that a display defect is caused. Therefore, it is preferable to provide the planarization film 78.

The light-emitting element 94 corresponds to a region where the first electrode 79 and the second electrode 93 sandwich the EL layer 92. In the case of the pixel shown in FIG. 35A, light from the light-emitting element 94 is emitted to the second electrode 93 side as shown by an outline arrow.

As the first electrode 79 functioning as a cathode, a known conductive film can be used as long as it has a low work function and reflects light. For example, Ca, Al, MgAg, AlLi, or the like is preferably used. The EL layer 92 may be formed using a single layer or by stacking a plurality of layers. When the EL layer 92 is formed using a plurality of layers, an electron-injection layer, an electron-transporting layer, a light-emitting layer, a hole-transporting layer, and a hole-injecting layer are stacked in this order over the first electrode 79. It is not necessary to form all of these layers. The second electrode 93 functioning as an anode is formed using a light-transmitting conductive material such as a film of indium oxide including tungsten oxide, indium zinc oxide including tungsten oxide, indium oxide including titanium oxide, indium tin oxide including titanium oxide, ITO, indium zinc oxide, or indium tin oxide to which silicon oxide is added.

A light-emitting element having a top emission structure, in which light is extracted from a side opposite to a substrate, is described here; however, a light-emitting element having a bottom emission structure, in which light is extracted from the substrate side, or a light-emitting element having a dual emission structure, in which light is extracted from both the substrate side and the side opposite to the substrate, can also be employed.

Although an organic EL element is described here as a light-emitting element, an inorganic EL element can also be provided as a light-emitting element.

Note that, in this embodiment mode, an example in which a thin film transistor for controlling the driving of a light-emitting element (the driving thin film transistor) is electrically connected to the light-emitting element is described; however, a thin film transistor for controlling current may be connected between the driving thin film transistor and the light-emitting element.

Through the above-described process, a light-emitting display device can be manufactured. The light-emitting display device of this embodiment mode can have high contrast and high visibility because an inverted staggered thin film transistor with small off current and excellent electric characteristics is used.

Embodiment Mode 6

This embodiment mode will describe a structure of a display panel, which is one mode of a display device of the present invention.

Figure 36A:
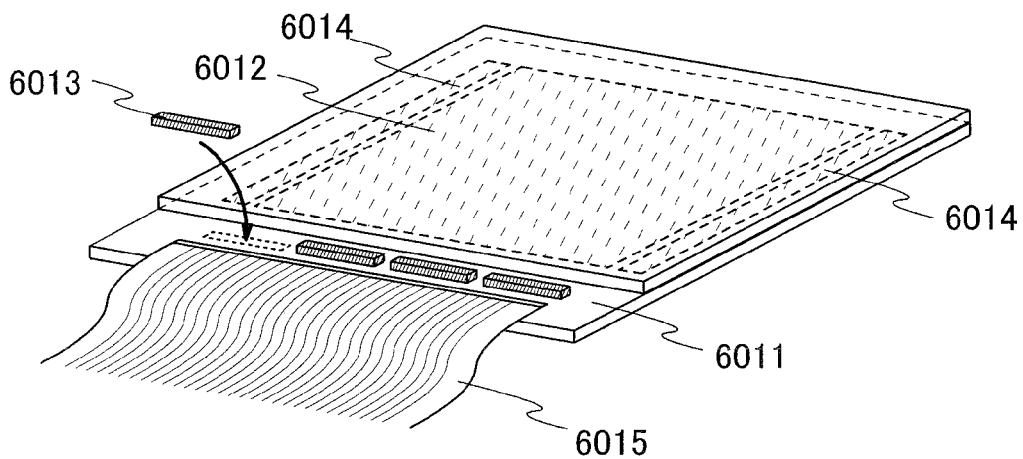
FIGS. 36A to 36C are perspective views illustrating display panels of the present invention.

FIG. 36A shows a mode of a display panel in which a pixel portion 6012 formed over a substrate 6011 is connected to a signal line driver circuit 6013 that is formed separately. The pixel portion 6012 and a scanning line driver circuit 6014 are each formed using a thin film transistor in which a microcrystalline semiconductor film is used for a channel formation region. By forming the signal line driver circuit using a transistor which has higher field effect mobility than the thin film transistor in which the microcrystalline semiconductor film is used for the channel formation region, an operation of the signal line driver circuit which demands higher driving frequency than the scanning line driver circuit can be stabilized. Note that the signal line driver circuit 6013 may be formed using a transistor in which a single crystal semiconductor is used for a channel formation region, a thin film transistor in which a polycrystalline semiconductor is used for a channel formation region, or a transistor in which SOI is used for a channel formation region. The pixel portion 6012, the signal line driver circuit 6013, and the scanning line driver circuit 6014 are each supplied with potential of a power source, a variety of signals, and the like through an FPC 6015. Further, a protection circuit may be provided between the signal line driver circuit 6013 and the FPC 6015 or between the signal line driver circuit 6013 and the pixel portion 6012. The protection circuit includes one or more elements selected from a thin film transistor, a diode, a resistor element, a capacitor element, and the like. For example, a diode obtained by connecting the thin film transistor described in Embodiment Mode 1 or 2 as a diode can also be used.

Note that both the signal line driver circuit and the scanning line driver circuit may be formed over the same substrate as the pixel portion.

Also, when a driver circuit is separately formed, a substrate provided with the driver circuit is not always required to be attached to a substrate provided with a pixel portion, and may be attached to, for example, an FPC. FIG. 36 B shows a mode of a display panel in which a signal line driver circuit 6023 is formed separately and is connected to a pixel portion 6022 and a scanning line driver circuit 6024 that are formed over a substrate 6021. The pixel portion 6022 and the scanning line driver circuit 6024 are each formed using a thin film transistor in which a microcrystalline semiconductor film is used for a channel formation region. The signal line driver circuit 6023 is connected to the pixel portion 6022 through an FPC 6025. The pixel portion 6022, the signal line driver circuit 6023, and the scanning line driver circuit 6024 are each supplied with potential of a power source, a variety of signals, and the like through the FPC 6025. Further, a protection circuit may be provided between the signal line driver circuit 6023 and the FPC 6025 or between the signal line driver circuit 6023 and the pixel portion 6022.

Furthermore, only a part of the signal line driver circuit or only a part of the scanning line driver circuit may be formed over the same substrate as the pixel portion with use of a thin film transistor in which a microcrystalline semiconductor film is used for a channel formation region, and the rest may be formed separately and electrically connected to the pixel portion. FIG. 36C shows a mode of a display panel in which an analog switch 6033a included in the signal driver circuit is formed over a substrate 6031, over which a pixel portion 6032 and a scanning line driver circuit 6034 are formed, and a shift register 6033b included in the signal line driver circuit is formed separately over a different substrate and then attached to the substrate 6031. The pixel portion 6032 and the scanning line driver circuit 6034 are each formed using a thin film transistor in which a microcrystalline semiconductor film is used for a channel formation region. The shift register 6033b included in the signal line driver circuit is connected to the pixel portion 6032 through an FPC 6035. The pixel portion 6032, the signal line driver circuit, and the scanning line driver circuit 6034 are each supplied with a potential of a power source, a variety of signals, and the like through the FPC 6035. Further, a protection circuit may be provided between the signal line driver circuit 6033 and the FPC 6035 or between the signal line driver circuit 6033 and the pixel portion 6032.

Figure 36B:
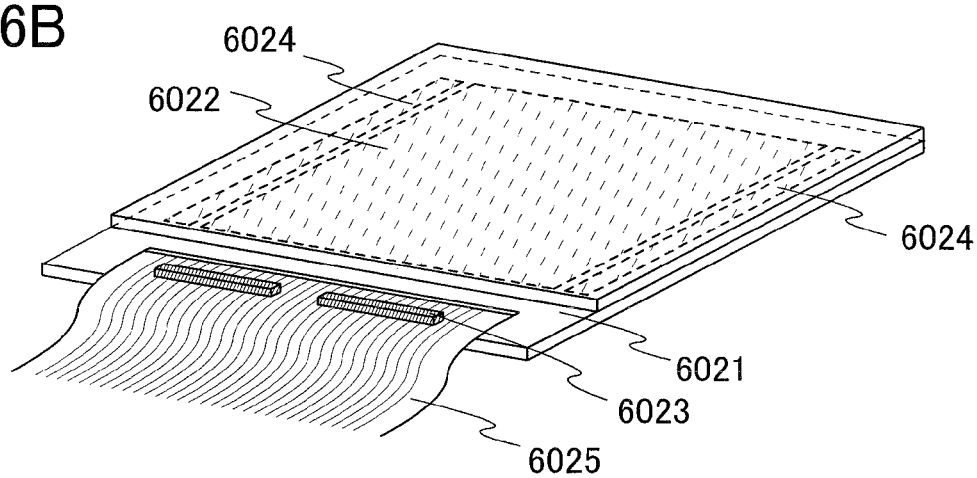
Figure 36C:
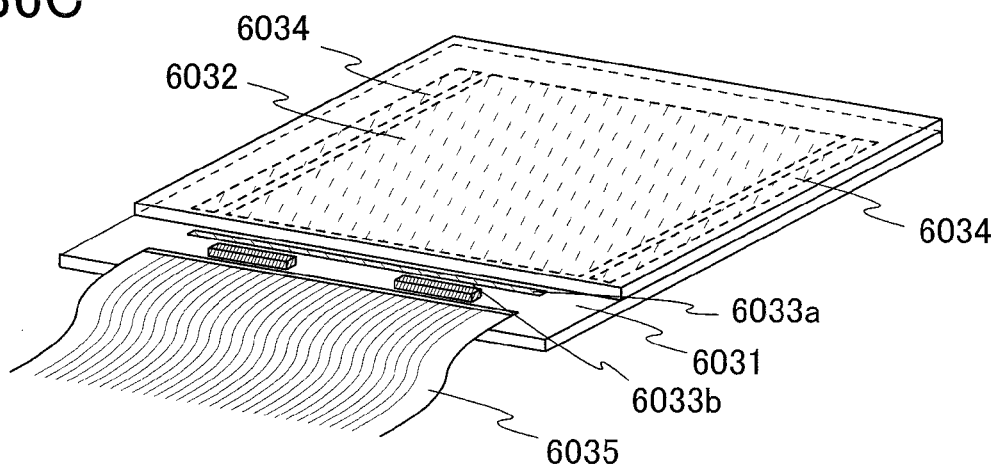

As shown in FIGS. 36A to 36C, in the display device of this embodiment mode, an entire driver circuit or a part thereof can be formed over the same substrate as a pixel portion, using a thin film transistor in which a microcrystalline semiconductor films is used for a channel formation region.

Note that there is no particular limitation on a connection method of the substrate formed separately, and a known method such as a COG method, a wire bonding method, or a TAB method can be used. Further, a connection position is not limited to the position illustrated in FIGS. 36A to 36C, as long as electrical connection is possible. Alternatively, a controller, a CPU, a memory, and/or the like may be formed separately and connected.

Note that the signal line driver circuit used in the present invention includes a shift register and an analog switch. In addition to the shift register and the analog switch, another circuit such as a buffer, a level shifter, or a source follower may be included. Moreover, the shift register and the analog switch are not necessarily provided. For example, a different circuit such as a decoder circuit by which a signal line can be selected may be used instead of the shift register, or a latch or the like may be used instead of the analog switch.

Embodiment Mode 7

The display device obtained by the present invention and the like can be used for an active matrix display panel. That is, the present invention can be applied to all electronic devices in which these display panels are incorporated into a display portion.

Examples of such electronic devices include cameras such as video cameras and digital cameras, head-mounted displays (goggle-type displays), car navigation systems, projectors, car stereo sets, personal computers, and portable information terminals (e.g., mobile computers, cellular phones, and e-book readers). Examples of these devices are shown in FIGS. 37A to 37D.

Figure 37A:
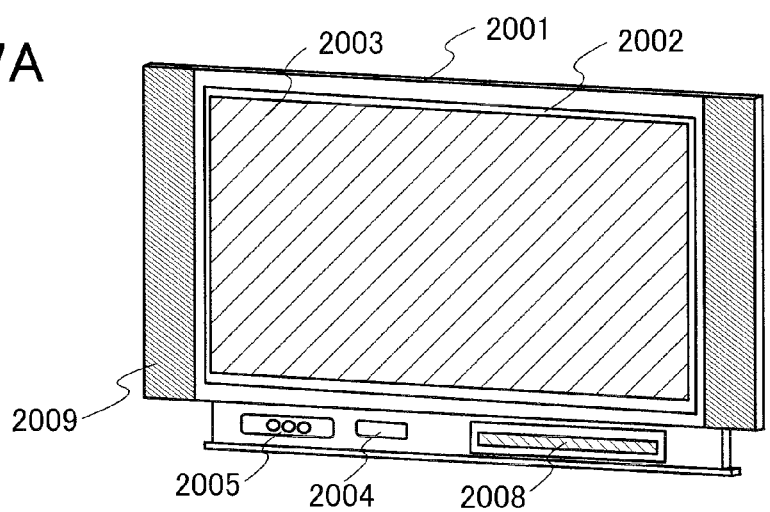
FIGS. 37A to 37D are perspective views illustrating electronic devices having display devices of the present invention.
Figure 37A:
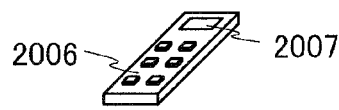

FIG. 37A shows a television device. A television device can be completed by incorporation of a display panel into a chassis as shown in FIG. 37A. A main screen 2003 is formed using the display panel, and a speaker portion 2009, operation switches, and the like are provided as other additional accessories. In such a manner, a television device can be completed.

As shown in FIG. 37A, a display panel 2002 using display elements is incorporated into a chassis 2001, and in addition to reception of general television broadcast by a receiver 2005, communication of information in one direction (from a transmitter to a receiver) or in two directions (between a transmitter and a receiver or between receivers) can be performed by connection to a wired or wireless communication network via a modem 2004. Operation of the television device can be carried out using switches that are incorporated into the chassis or by a remote control device 2006 provided separately. A display portion 2007 that displays information output may be provided for the remote control device 2006.

Further, the television device may include a sub-screen 2008 formed using a second display panel for displaying channels, volume, or the like, in addition to the main screen 2003. In this structure, the main screen 2003 may be formed with a liquid crystal display panel, and the sub-screen 2008 may be formed with a light-emitting display panel. In addition, the main screen 2003 and the sub-screen 2008 may be each formed with a light-emitting display panel and the sub-screen may be set to be turned on or off.

Figure 38:
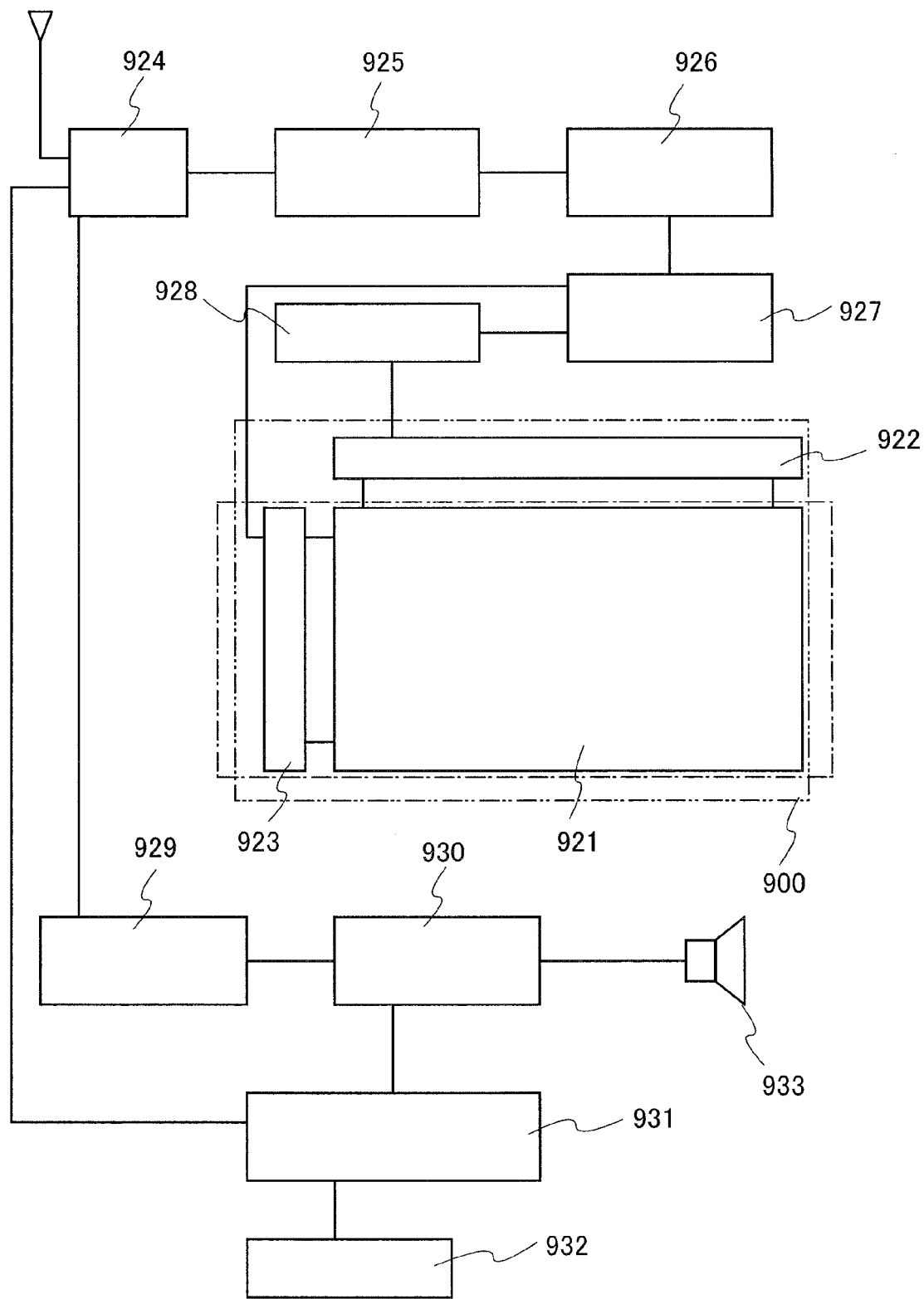
FIG. 38 is a diagram illustrating an electronic device having a display device of the present invention.

FIG. 38 shows a block diagram showing the main structure of a television device. A display panel 900 is provided with a pixel portion 921. A signal line driver circuit 922 and a scanning line driver circuit 923 may be mounted on the display panel 900 by a COG method.

As structures of other external circuits, a video signal amplifier circuit 925 amplifying a video signal among signals received by a tuner 924, a video signal processing circuit 926 converting signals output from the video signal amplifier circuit 925 into chrominance signals corresponding to red, green, and blue, a control circuit 927 for converting the video signal into a signal which meets input specifications of a driver IC, and the like are provided on an input side of the video signal. The control circuit 927 outputs signals to the scanning line side and the signal line side. When digital driving is performed, a structure may be adopted in which a signal dividing circuit 928 is provided on the signal line side and an input digital signal is divided into m signals to be supplied.

An audio signal among signals received by the tuner 924 is sent to an audio signal amplifier circuit 929, and output from the audio signal amplifier circuit 929 is supplied to a speaker 933 through an audio signal processing circuit 930. A control circuit 931 receives control information on receiving station (receiving frequency) and volume from an input portion 932 and transmits a signal to the tuner 924 and the audio signal processing circuit 930.

It is needless to say that the present invention is not limited to a television device and can be applied to a variety of uses, such as a monitor of a personal computer, a large display medium such as an information display board at the train station, the airport, or the like, or an advertisement display board on the street.

The display device described in any of the above embodiment modes is applied to the main screen 2003 and the sub-screen 2008, so that mass productivity of the television device can be improved.

Figure 37B:
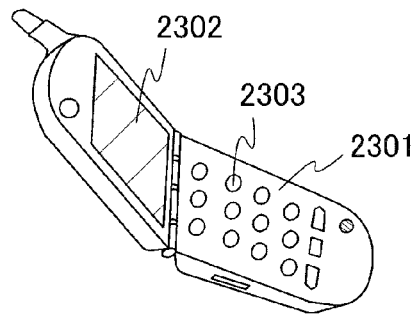

FIG. 37B shows one mode of a cellular phone 2301. The cellular phone 2301 includes a display portion 2302, operation switches 2303, and the like. The display device described in any of the above embodiment modes is applied to the display portion 2302, so that mass productivity of the cellular phone can be improved.

Figure 37C:
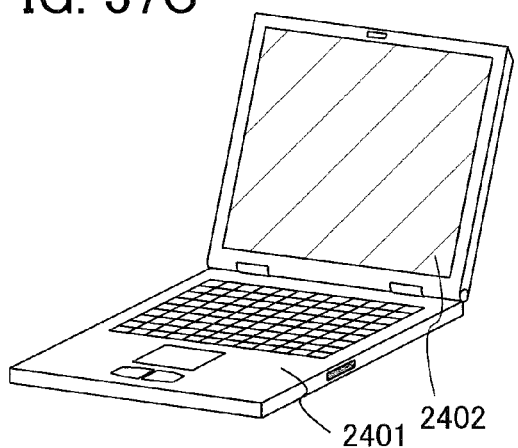

A portable computer shown in FIG. 37C includes a main body 2401, a display portion 2402, and the like. The display device described in any of the above embodiment modes is applied to the display portion 2402, so that mass productivity of the computer can be improved.

Figure 37D:
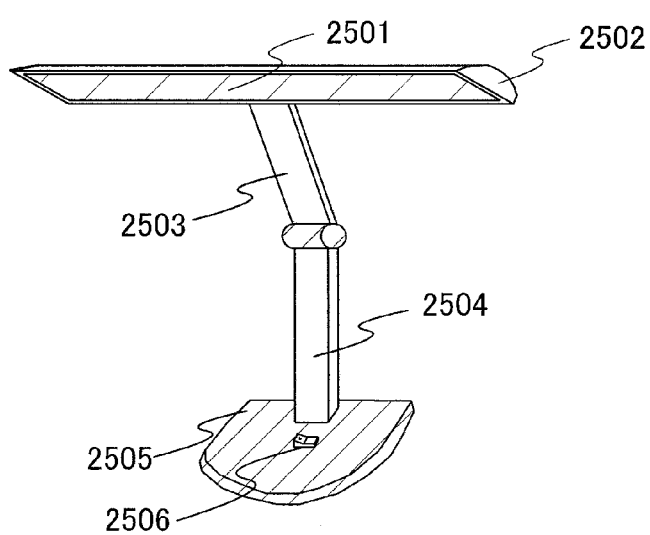

FIG. 37D shows a desk lamp including a lighting portion 2501, a shade 2502, an adjustable arm 2503, a support 2504, a base 2505, and a power source switch 2506. The desk lamp is manufactured with use of the light-emitting device of the present invention for the lighting portion 2501. Note that the lighting equipment includes a ceiling light, a wall light, and the like. Use of the display device shown in any of the above embodiment modes can increase mass productivity and provide inexpensive desk lamps.

Embodiment 1

Figure 39:
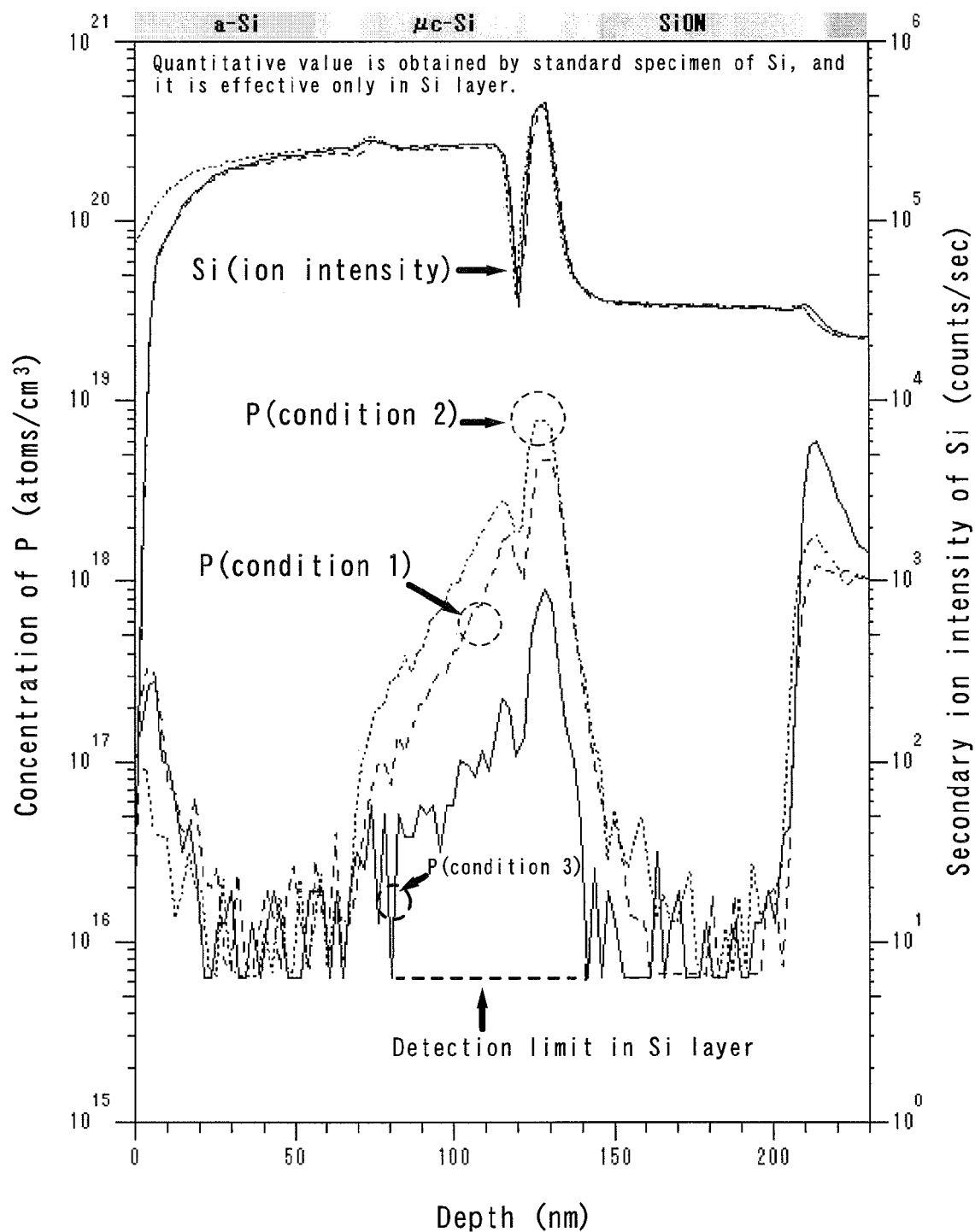
FIG. 39 is a graph illustrating a result of measuring phosphorus concentrations in microcrystalline silicon films of the present invention with SIMS.

A gate insulating film was formed over a glass substrate; a flush treatment was performed using phosphine, which is a gas including an impurity element which serves as a donor; then, a microcrystalline silicon film was formed. FIG. 39 shows a result of measuring peak concentrations of phosphorus by SIMS.

As the gate insulating film, a silicon oxynitride film with a thickness of 100 nm was formed over a glass substrate with a thickness of 0.7 mm by a plasma CVD method under the following condition: the RF power source frequency was 13.56 MHz; the power of the RF power source was 50 W; the film formation temperature was 280° C.; the flow rates of a silane gas and dinitrogen monoxide were 30 sccm and 1200 sccm, respectively; and the pressure was 40 Pa.

Then, a gas including phosphine was introduced to a reaction chamber to perform a flush treatment. The conditions at this time were as follows:

(Condition 1)
flow rate of 0.1% $PH_3$ (diluted with Ar): 500 sccm
(Condition 2)
flow rate of $SiH_4$: 100 sccm; flow rate of 0.5% $PH_3$ (diluted with $H_2$):170 sccm
(Condition 3)
flow rate of $SiH_4$: 100 sccm; flow rate of $H_2$: 153 sccm; flow rate of 0.5% $PH_3/H_2$: 17 sccm Next, a microcrystalline silicon film with a thickness of 50 nm was formed over the gate insulating film by a plasma CVD method under the following condition: the RF power source frequency was 13.56 MHz; the power of the RF power source was 50 W; the film formation temperature was 280° C.; the flow rates of a silane gas and hydrogen were 10 sccm and 1500 sccm, respectively; and the pressure was 280 Pa.

The substrate was carried out of the reaction chamber and the inside of the reaction chamber was cleaned with fluorine radicals. Then, the substrate was carried into the reaction chamber again.

Next, an amorphous silicon film was formed as a buffer layer over the microcrystalline silicon film. The amorphous silicon film was formed with a thickness of 100 nm over the microcrystalline silicon film by a plasma CVD method under the following condition: the RF power source frequency was 13.56 MHz; the power of the RF power source was 60 W; the film formation temperature was 280° C.; the flow rates of a silane gas and hydrogen were 280 sccm and 300 sccm, respectively; and the pressure was 170 Pa. At this time, on each of the substrates which had undergone the flush treatment under the conditions 1 to 3, secondary ion mass spectroscopy (SIMS) was performed in a direction of the depth from a surface of the substrate. FIG. 39 shows the measurement results.

In FIG. 39, a vertical axis represents a concentration (atoms/cm$^3$) of phosphorus and a horizontal axis represents a depth (nm) to which a sample was etched. Further, the film from the surface to a depth of approximately 70 nm was the amorphous silicon film, which was the buffer layer; the film from a depth of approximately 70 nm to a depth of approximately 120 nm was the microcrystalline silicon film; and the film from a depth of approximately 120 nm to a depth of approximately 220 nm was the silicon oxynitride film, which was the gate insulating film.

Concentrations of phosphorus in the microcrystalline silicon films in FIG. 39 are shown below. Note that the concentration of phosphorus at the interface between the microcrystalline silicon film and the silicon oxynitride film is excluded here because the ionic strength of silicon is not in a normal condition at the peak of phosphorus concentration at the interface between the microcrystalline silicon film and the silicon oxynitride film.

Sample under Condition 1: $5 \times 10^{16}$ atoms/cm$^3$ to $2 \times 10^{18}$ atoms/cm$^3$
Sample under Condition 2: $6 \times 10^{16}$ atoms/cm$^3$ to $3 \times 10^{18}$ atoms/cm$^3$
Sample under Condition 3: $3 \times 10^{16}$ atoms/cm$^3$ to $2 \times 10^{17}$ atoms/cm$^3$ As is seen from the above, by forming a microcrystalline silicon film after a phosphine flush treatment, the microcrystalline silicon film including phosphorus can be formed.

Embodiment 2

Figure 40:
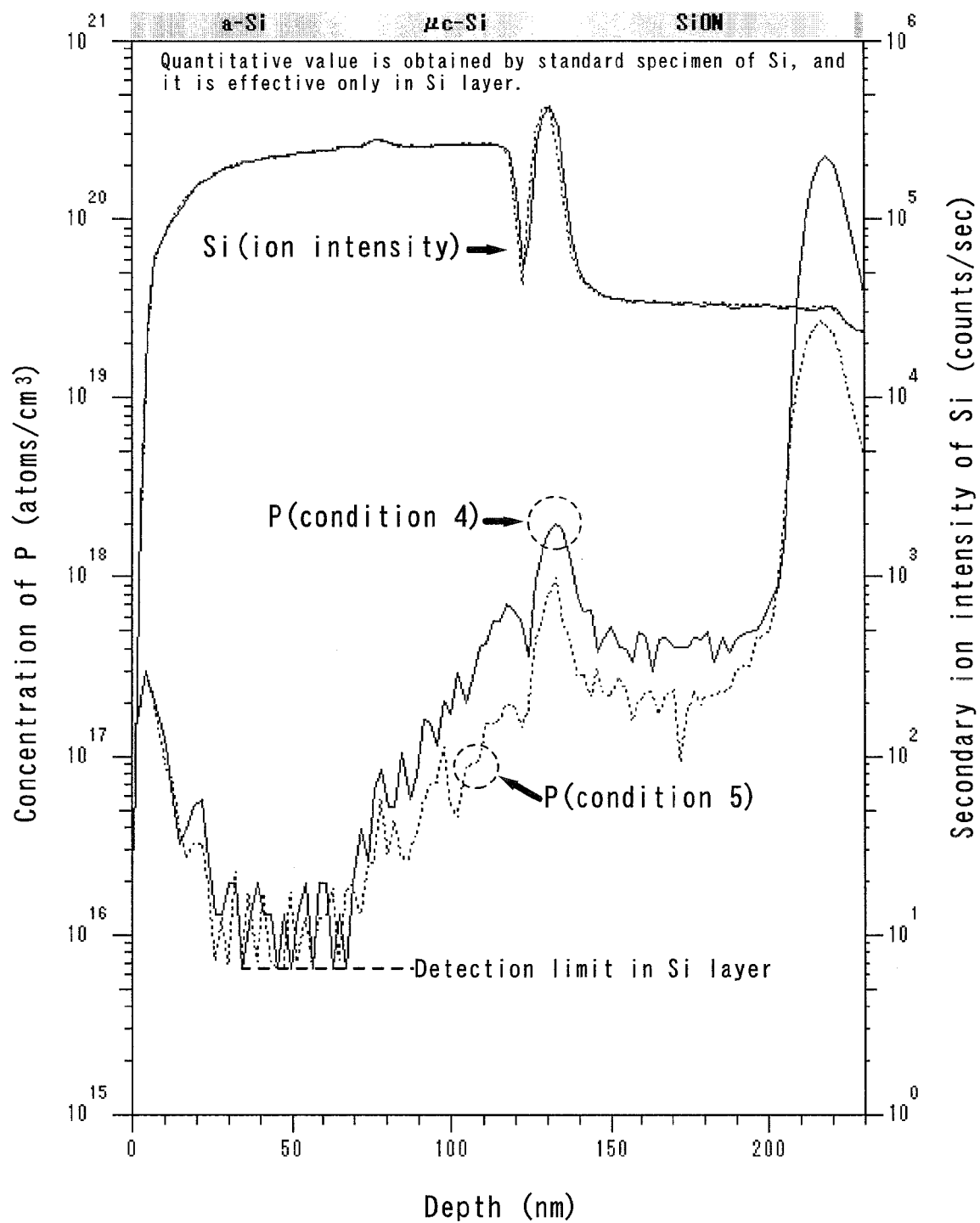
FIG. 40 is a graph illustrating a result of measuring phosphorus concentrations in microcrystalline silicon films of the present invention with SIMS.

A gate insulating film including phosphorus, which is an impurity element which serves as a donor, was formed over a glass substrate, and then a microcrystalline silicon film was formed. FIG. 40 shows a result of measuring peak concentrations of phosphorus by SIMS. Here, a silicon oxynitride film was formed as a first gate insulating film so as to include phosphorus, and a silicon oxynitride film was formed as a second gate insulating film.

As the first gate insulating film, a silicon oxynitride film including phosphorus with a thickness of 10 nm was formed over a glass substrate with a thickness of 0.7 mm by a plasma CVD method under the following condition: the RF power source frequency was 13.56 MHz; the power of the RF power source was 50 W; the film formation temperature was 280° C.; and the pressure was 40 Pa. The conditions of the flow rates of source gases are shown below.

(Condition 4)
flow rate of $SiH_4$: 30 sccm; flow rate of $N_2O$: 1200 sccm; flow rate of 0.5% $PH_3$ (diluted with $H_2$): 60 sccm
(Condition 5)
flow rate of $SiH_4$: 30 sccm; flow rate of $N_2O$: 1200 sccm; flow rate of 0.5% $PH_3$ (diluted with $H_2$): 6 sccm Next, the second gate insulating film was formed over the first gate insulating film. As the second gate insulating film, a silicon oxynitride film with a thickness of 100 nm was formed over the glass substrate by a plasma CVD method under the following condition: the RF power source frequency was 13.56 MHz; the power of the RF power source was 50 W; the film formation temperature was 280° C.; the flow rates of a silane gas and dinitrogen monoxide were 30 sccm and 1200 sccm, respectively; and the pressure was 40 Pa.

Next, a microcrystalline silicon film with a thickness of 50 nm was formed over the gate insulating film by a plasma CVD method under the following condition: the RF power source frequency was 13.56 MHz; the power of the RF power source was 50 W; the film formation temperature was 280° C.; the flow rates of a silane gas and hydrogen were 10 sccm and 1500 sccm, respectively; and the pressure was 280 Pa.

The substrate was carried out of the reaction chamber and the inside of the reaction chamber was cleaned with fluorine radicals. Then, the substrate was carried into the reaction chamber again.

Next, an amorphous silicon film was formed as a buffer layer over the microcrystalline silicon film. The amorphous silicon film was formed with a thickness of 100 nm over the microcrystalline silicon film by a plasma CVD method under the following condition: the RF power source frequency was 13.56 MHz; the power of the RF power source was 60 W; the film formation temperature was 280° C.; the flow rates of a silane gas and hydrogen were 280 sccm and 300 sccm, respectively; and the pressure was 170 Pa. At this time, on each of the substrates over which the first gate insulating film had been formed under the conditions 4 and 5, secondary ion mass spectroscopy (SIMS) was performed in a direction of the depth from a surface of the substrate. FIG. 40 shows the measurement results.

In FIG. 40, a vertical axis represents a concentration (atoms/cm$^3$) of phosphorus and a horizontal axis represents a depth (nm) to which a sample was etched. Further, the film from the surface to a depth of approximately 70 nm was the amorphous silicon film, which was the buffer layer; the film from a depth of approximately 70 nm to a depth of approximately 120 nm was the microcrystalline silicon film; and the film from a depth of approximately 120 nm to a depth of approximately 220 nm was the silicon oxynitride film, which was the gate insulating film.

Concentrations of phosphorus in the microcrystalline silicon films in FIG. 40 are shown below. Note that the concentration of phosphorus at the interface between the microcrystalline silicon film and the silicon oxynitride film is excluded here because the ionic strength of silicon is not in a normal condition at the peak of phosphorus concentration at the interface between the microcrystalline silicon film and the silicon oxynitride film.

| | |
|---|---|
| Sample under Condition 4: | $3 \times 10^{16}$ atoms/cm$^3$ to $7 \times 10^{17}$ atoms/cm$^3$ |
| Sample under Condition 5: | $3 \times 10^{16}$ atoms/cm$^3$ to $2 \times 10^{17}$ atoms/cm$^3$ |

Although the concentration of phosphorus in the silicon oxynitride film cannot be measured accurately in FIG. 40 because it was quantified with the use of a silicon standard sample, the peak form makes it possible to estimate whether phosphorus was included or not. There is a large peak of the phosphorus concentration also at depths of 200 nm to 230 nm, which shows that the gate insulating film, which was not in contact with the microcrystalline silicon film, included phosphorus.

As is seen from the above, by forming a microcrystalline silicon film after forming a gate insulating film including phosphorus, the microcrystalline silicon film and the gate insulating film can include phosphorus; in other words, the gate insulating film and the microcrystalline silicon film that include phosphorus can be formed.

Embodiment 3

Figure 41:
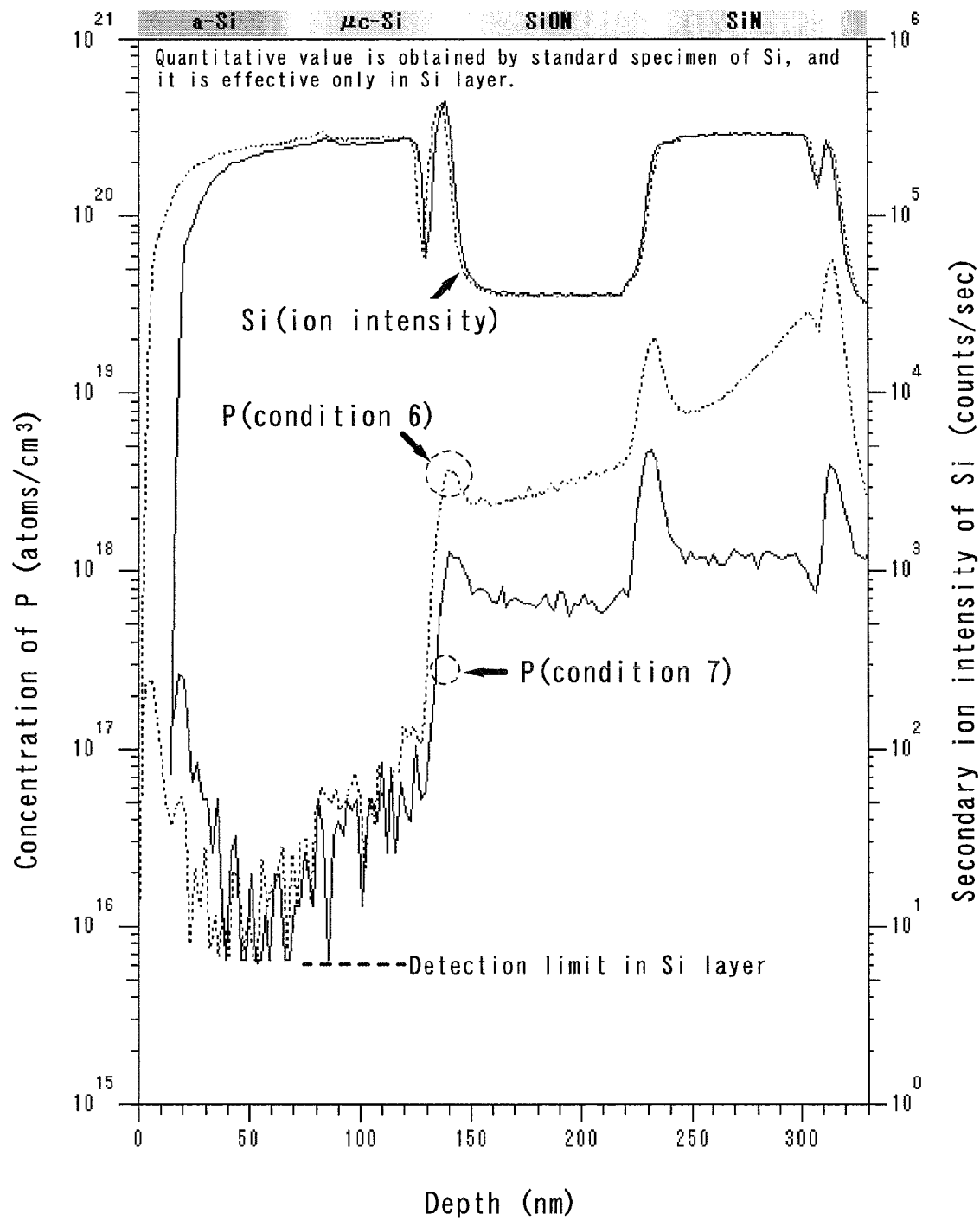
FIG. 41 is a graph illustrating a result of measuring phosphorus concentrations in microcrystalline silicon films of the present invention with SIMS.

After precoating the inner wall of a reaction chamber of a plasma CVD apparatus with a protective film, a glass substrate was carried into the reaction chamber, and a first gate insulating film, a second gate insulating film, a microcrystalline silicon film, and an amorphous silicon film for functioning as a buffer layer were formed. FIG. 41 shows a result of measuring peak concentrations of phosphorus by SIMS.

Here, a silicon nitride film was formed as the first gate insulating film, and a silicon oxynitride film was formed as the second gate insulating film.

The inner wall of the reaction chamber was precoated with the protective film. The condition at this time is described below.

(Condition 6)

An amorphous silicon film including phosphorus with a thickness of 50 nm was formed as the protective film on the inner wall of a reaction chamber under the following condition: the RF power source frequency was 13.56 MHz; the power of the RF power source was 370 W; and the pressure was 170 Pa. Further, the conditions of the flow rates of source gases are shown below.

flow rate of SiH$_4$: 100 sccm; flow rate of 0.5% PH$_3$ (diluted with H$_2$): 170 sccm (Condition 7)

A silicon nitride film, a silicon oxynitride film, and an amorphous silicon film were stacked as the protective film. At this time, the silicon nitride film was formed with a thickness of 110 nm on the inner wall of the reaction chamber under the following condition: the RF power source frequency was 13.56 MHz; the power of the RF power source was 370 W; the flow rates of silane, hydrogen, nitrogen, and ammonia were 10 sccm, 500 sccm, 550 sccm, and 140 sccm, respectively; and the pressure was 100 Pa. Further, the silicon oxynitride film was formed with a thickness of 110 nm over the silicon nitride film by a plasma CVD method under the following condition: the RF power source frequency was 13.56 MHz; the power of the RF power source was 50 W; the film formation temperature was 280° C.; the flow rates of a silane gas and dinitrogen monoxide were 30 sccm and 1200 sccm, respectively; and the pressure was 40 Pa. Furthermore, the amorphous silicon film was formed with a thickness of 200 nm over the silicon oxynitride film by a plasma CVD method under the following condition: the RF power source frequency was 13.56 MHz; the power of the RF power source was 120 W; the film formation temperature was 280° C.; the flow rate of a silane gas was 300 sccm; and the pressure was 170 Pa.

Next, a substrate (a glass substrate with a thickness of 0.7 mm) was carried into the reaction chamber, and then as the first gate insulating film, a silicon nitride film with a thickness of 100 nm was formed over the glass substrate by a plasma CVD method under the following condition: the RF power source frequency was 13.56 MHz; the power of the RF power source was 370 W; the film formation temperature was 280° C.; the flow rates of silane, hydrogen, nitrogen, and ammonia were 10 sccm, 500 sccm, 550 sccm, and 140 sccm, respectively; and the pressure was 100 Pa.

Then, the second gate insulating film was formed over the first gate insulating film. As the second gate insulating film, a silicon oxynitride film with a thickness of 100 nm was formed over the glass substrate by a plasma CVD method under the following condition: the RF power source frequency was 13.56 MHz; the power of the RF power source was 50 W; the film formation temperature was 280° C.; the flow rates of a silane gas and dinitrogen monoxide were 30 sccm and 1200 sccm, respectively; and the pressure was 40 Pa.

Next, a microcrystalline silicon film with a thickness of 50 nm was formed over the gate insulating film by a plasma CVD method under the following condition: the RF power source frequency was 13.56 MHz; the power of the RF power source was 50 W; the film formation temperature was 280° C.; the flow rates of a silane gas and hydrogen were 10 sccm and 1500 sccm, respectively; and the pressure was 280 Pa.

The substrate was carried out of the reaction chamber and the inside of the reaction chamber was cleaned with fluorine radicals. Then, the substrate was carried into the reaction chamber again.

Next, an amorphous silicon film was formed as a buffer layer over the microcrystalline silicon film. The amorphous silicon film was formed with a thickness of 100 nm over the microcrystalline silicon film by a plasma CVD method under the following condition: the RF power source frequency was 13.56 MHz; the power of the RF power source was 60 W; the film formation temperature was 280° C.; the flow rates of a silane gas and hydrogen were 280 sccm and 300 sccm, respectively; and the pressure was 170 Pa. At this time, on each of the substrates over which the films were formed in the reaction chamber which had undergone precoating under the conditions 6 and 7, secondary ion mass spectroscopy (SIMS) was performed in a direction of the depth from a surface of the substrate. FIG. 41 shows the measurement results.

In FIG. 41, a vertical axis represents a concentration (atoms/cm$^3$) of phosphorus and a horizontal axis represents a depth (nm) to which a sample was etched. Further, the film from the surface to a depth of approximately 70 nm was the amorphous silicon film, which was the buffer layer; the film from a depth of approximately 70 nm to a depth of approximately 120 nm was the microcrystalline silicon film; and the film from a depth of approximately 120 nm to a depth of approximately 220 nm was the silicon oxynitride film, which was the gate insulating film.

Concentrations of phosphorus in the microcrystalline silicon films in FIG. 41 are shown below. Note that the concentration of phosphorus at the interface between the microcrystalline silicon film and the silicon oxynitride film is excluded here because the ionic strength of silicon is not in a normal condition at the peak of phosphorus concentration at the interface between the microcrystalline silicon film and the silicon oxynitride film.

| | |
|---|---|
| Sample under Condition 6: | $5 \times 10^{16}$ atoms/cm$^3$ to $1 \times 10^{17}$ atoms/cm$^3$ |
| Sample under Condition 7: | $3 \times 10^{16}$ atoms/cm$^3$ to $5 \times 10^{16}$ atoms/cm$^3$ |

As is seen from the above, by forming a gate insulating film and a microcrystalline silicon film after precoating the inner wall of a reaction chamber of a plasma CVD apparatus with an amorphous silicon film including phosphorus as a protective film, the microcrystalline silicon film can includes phosphorus.

Embodiment 4

In this embodiment, the lifetime of carriers which are included in a microcrystalline silicon film formed over an insulating film was measured. An influence of the insulating film on the microcrystalline silicon film is described below.

Figure 42A:
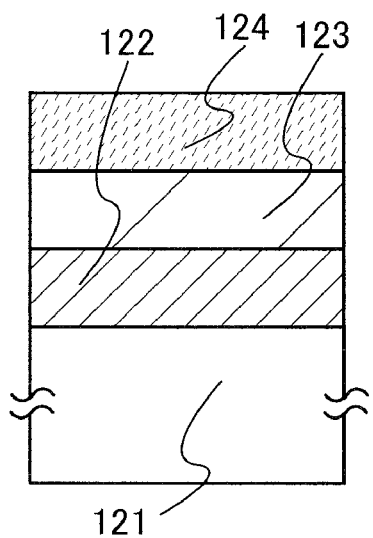
FIGS. 42A to 42E are drawings illustrating structures of Samples 1 to 5, respectively.

FIG. 42A shows a cross-sectional structure of Sample 1. A silicon nitride film 122 with a thickness of 110 nm was formed over a glass substrate 121; a silicon oxynitride film 123 with a thickness of 110 nm was formed thereover; and a microcrystalline silicon film 124 with a thickness of 95 nm was formed thereover.

Figure 42B:
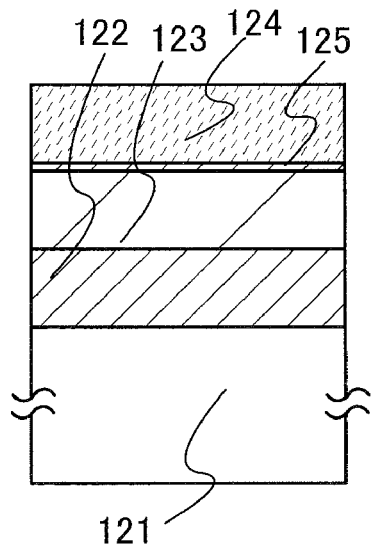

FIG. 42B shows a cross-sectional structure of Sample 2. A silicon nitride film 122 with a thickness of 110 nm was formed over a glass substrate 121; a silicon oxynitride film 123 with a thickness of 110 nm was formed thereover; a silicon nitride film 125 with a thickness of 1 nm was formed thereover; and a microcrystalline silicon film 124 with a thickness of 95 nm was formed thereover.

Figure 42C:
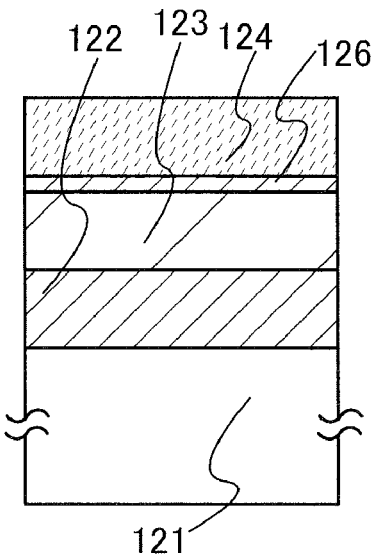

FIG. 42C shows a cross-sectional structure of Sample 3. A silicon nitride film 122 with a thickness of 110 nm was formed over a glass substrate 121; a silicon oxynitride film 123 with a thickness of 110 nm was formed thereover; a silicon nitride film 126 with a thickness of 3 nm was formed thereover; and a microcrystalline silicon film 124 with a thickness of 95 nm was formed thereover.

Figure 42D:
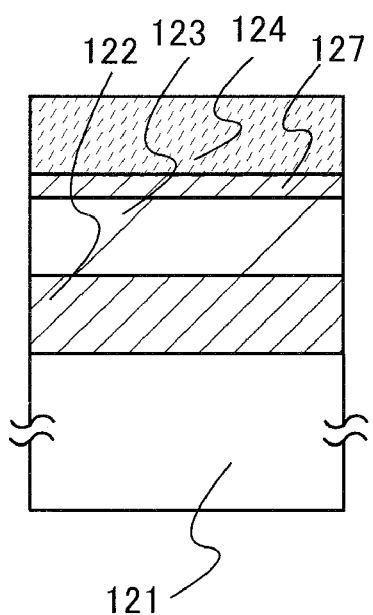

FIG. 42D shows a cross-sectional structure of Sample 4. A silicon nitride film 122 with a thickness of 110 nm was formed over a glass substrate 121; a silicon oxynitride film 123 with a thickness of 110 nm was formed thereover; a silicon nitride film 127 with a thickness of 5 nm was formed thereover; and a microcrystalline silicon film 124 with a thickness of 95 nm was formed thereover.

Figure 42E:
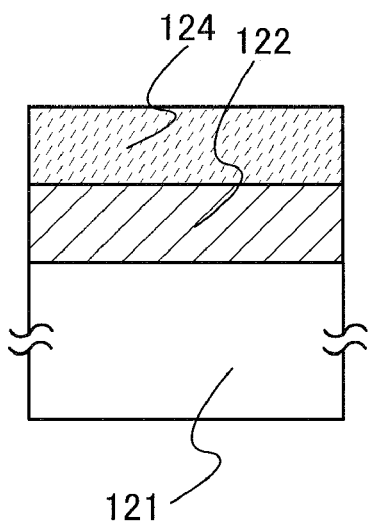

FIG. 42E shows a cross-sectional structure of Sample 5. A silicon nitride film 122 with a thickness of 110 nm was formed over a glass substrate 121, and a microcrystalline silicon film 124 with a thickness of 95 nm was formed thereover.

The silicon nitride film 122 was formed under a similar condition to that of the silicon nitride film which was formed as the first gate insulating film in Embodiment 3. Further, the silicon oxynitride film 123 was formed under a similar condition to that of the silicon oxynitride film which was formed as the second gate insulating film in Embodiment 3. Furthermore, the microcrystalline silicon film 124 was formed under a similar condition to that of the microcrystalline silicon film in Embodiment 3. Still furthermore, the silicon nitride films 125 to 127 were formed under a similar condition to that of the silicon nitride film 122.

In Samples 1 to 5, the lifetime of carriers included in the microcrystalline silicon film was measured by a microwave photoconductivity decay method (a μ-PCD method). In the μ-PCD method, the microcrystalline silicon film was irradiated with pulsed laser beams to measure the lifetime of carriers from when an excessive amount of carriers are generated in the microcrystalline silicon film and until when the carriers are recombined and disappear Generation of the carriers increases the conductivity of the microcrystalline silicon film, and thus the reflectance of microwaves with which the microcrystalline silicon film is irradiated changes in accordance with the excessive carrier density. The time of decrease in the reflectance of the microwaves is measured, whereby the lifetime of carriers can be measured.

Figure 43:
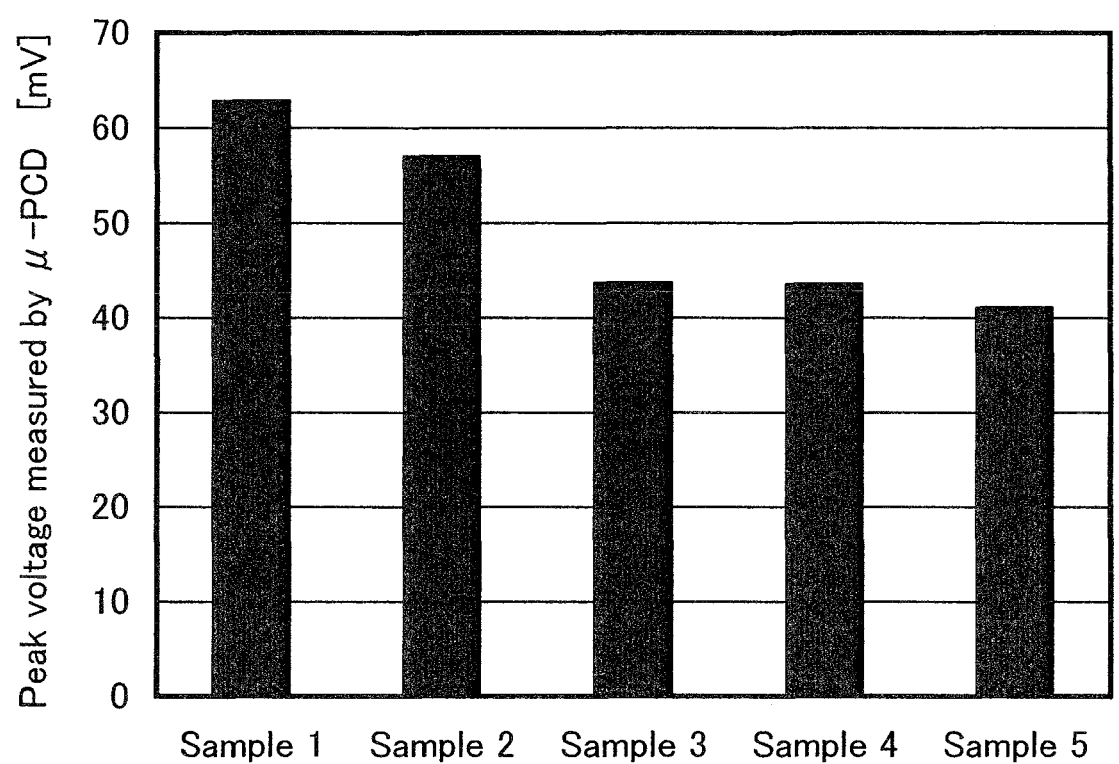
FIG. 43 is a graph illustrating a result of measuring the lifetime of carriers in microcrystalline silicon films by a μ-PCD method.

In this embodiment, with the use of a crystallinity evaluation equipment for a thin polysilicon film in which microwaves are used (produced by KOBELCO RESEARCH INSTITUTE, INC.), Samples 1 to 5 were irradiated with microwaves with a frequency of 13.56 MHz and with third harmonic of a YLG laser with a wavelength of 349 nm, and the phase contrast of the microwaves, which changes according to generation of carriers, was measured with a voltmeter for measuring a phase contrast of microwaves. FIG. 43 shows the measurement results. Note that the peak of the measured values is steep and thus the time of disappearance caused by carrier recombination cannot be measured. However, as the peak value is higher, the lifetime of carriers is relatively longer and the crystallinity is better. Thus, the lifetime of carriers in the above samples was compared with each other with the use of the peak values.

FIG. 43 shows that in Sample 1, i.e., in a sample in which a base film for the microcrystalline silicon film is a silicon oxynitride film, the peak value is higher and the lifetime of carriers is longer than a sample in which a base film is a silicon nitride film; and that the lifetime of carriers is long also in the case where a highly thin silicon nitride film is formed over the silicon oxynitride film. Accordingly, it is found that, when a silicon oxynitride film is formed as the base film for the microcrystalline silicon film or when a highly thin silicon nitride film is formed over the silicon oxynitride film as the base film for the microcrystalline silicon film, the number of carrier recombination centers is small; the number of defects is small; and the crystallinity is high,. Therefore, a thin film transistor utilizing such a stacked-layer structure can have higher on current and lower off current, and thus can have excellent current-voltage characteristics.

Embodiment 5

This embodiment shows calculation results of a donor concentration of a microcrystalline semiconductor film including an impurity element which serves as a donor and electric characteristics, of a thin film transistor in which the microcrystalline semiconductor film including the impurity element which serves as a donor is used for a channel formation region.

Here, a microcrystalline semiconductor film to which an impurity element is not added is referred to as µc-Si (i); a microcrystalline semiconductor film to which an impurity element (e.g., phosphorus) which serves as a donor is added is referred to as µc-Si (n−); a buffer layer to which an impurity element is not added is referred to as a-Si (i); an amorphous semiconductor film to which an impurity element (e.g., phosphorus) imparting one conductivity type is added is referred to as a-Si (n−); and an amorphous semiconductor film to which a large amount of impurity elements (e.g., phosphorus) imparting one conductivity type is added so that the amorphous semiconductor film can have conductivity is referred to as a-Si (n+).

When an impurity element is added to a microcrystalline semiconductor film or an amorphous semiconductor film, the impurity concentration is defined as the number of atoms of the added impurity element per unit volume. Further, if the added impurity element is a fifth group element or a third group element, the impurity concentration is multiplied by the activation rate, which is defined as the donor concentration or the acceptor concentration. The activation rate of a microcrystalline semiconductor film is from 40% to 60%, typically 50%, and the activation rate of an amorphous semiconductor film is from 1% to 5%, typically 3%. Therefore, the peak concentration of the impurity element which serves as a donor is two times as high as the donor concentration which was calculated in this embodiment.

A device model which was used for the simulation is described below.

A device simulator "ATLAS" developed by Silvaco Data Systems Inc. was used for the device simulation. Table 1 shows model parameters of a-Si and µc-Si, which were used for the device simulation. In the device simulation, modeling of a-Si and µc-Si was achieved mainly by defining the state density. Specifically, as for the model parameter of a-Si, such a parameter as shown in Table 1 was defined as appropriate, and the DC characteristics of an inverted-staggered a-Si TFT were calculated with the use of a device simulator. Further, the model parameter of µc-Si was defined so that the maximum filed effect mobility which was determined by the DC characteristics of the inverted staggered µc-Si TFT which was calculated with a device simulator is approximately 10 times as high as the maximum filed effect mobility which was determined by the DC characteristics of the inverted staggered a-Si TFT which was calculated with a device simulator.

TABLE 1

|  |  | a-Si | µc-Si |
|---|---|---|---|
| Energy gap | Eg [eV] | 1.9 | 1.4 |
| Density of states (DOS) of acceptor in edge of conduction band | nta [/eV] | 7.4E+21 | 7.4E+20 |
| DOS of donor in valence band | ntd [/ev] | 7.4E+21 | 7.4E+20 |
| Attenuation coefficient of DOS of acceptor in edge of conduction band | wta | 0.04 | 0.04 |
| Attenuation coeffcient of DOS of donor in valence band | wtd | 0.04 | 0.04 |
| Total DOS of acceptor level in Gaussian distribution | nga [/eV] | 3E+16 | 7E+15 |
| Total DOS of donor level in Gaussian distribution | ngd [/eV] | 5E+18 | 5E+17 |
| Peak energy of acceptor level in Gaussian distribution | ega [eV] | 0.5 | 0.5 |
| Peak energy of donor level in Gaussian distribution | egd [eV] | 0.9 | 0.9 |
| Attenumation coefficient of total DOS of acceptor level in Gaussian distribution | wga | 0.4 | 0.4 |
| Attenumation coefficient of total DOS of donor level in Gaussian distribution | wgd | 0.3 | 0.3 |

Next, a structure of a device which was used for the simulation is shown.

(Model 1)

Figure 44:
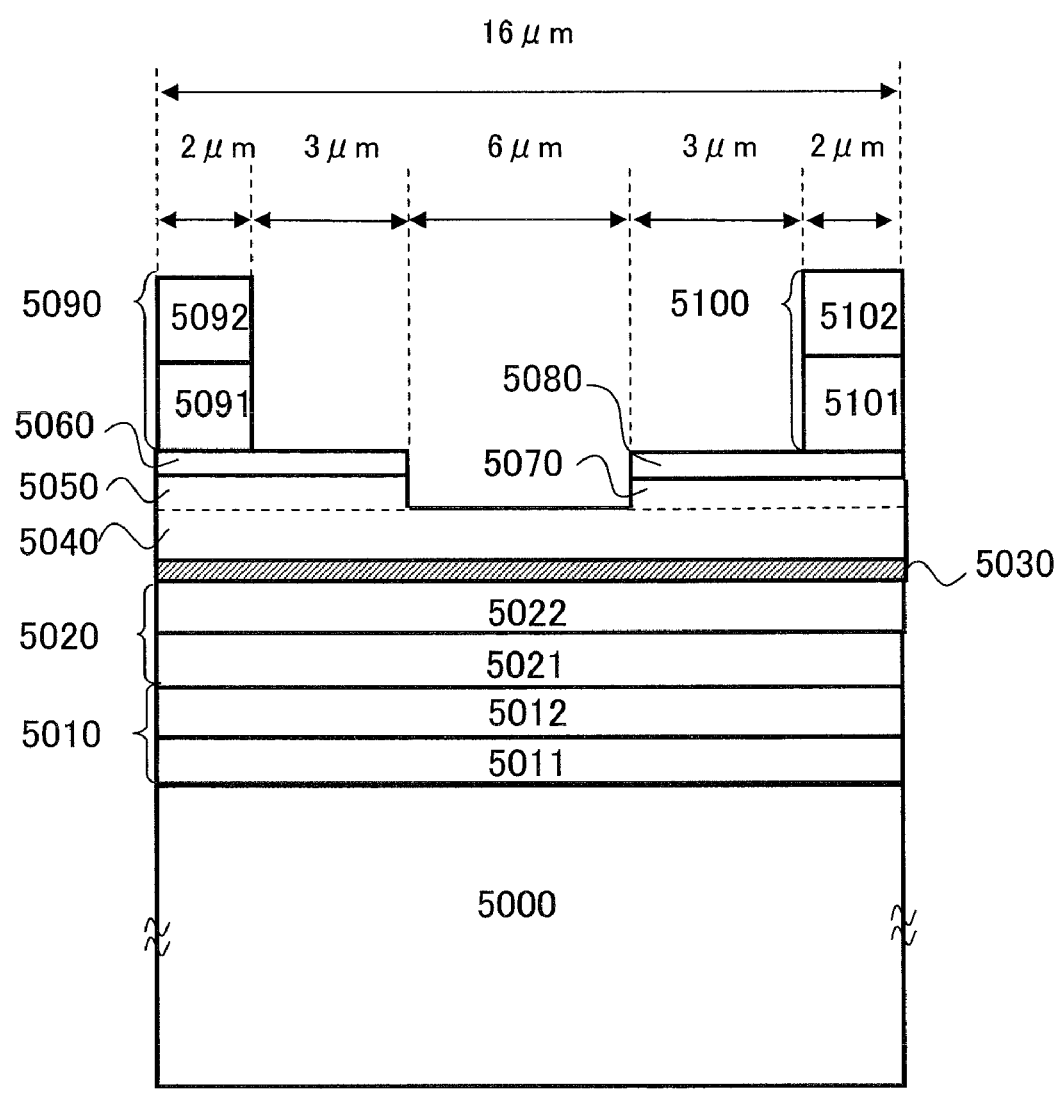
FIG. 44 is a cross-sectional view illustrating a model used for simulation.

FIG. 44 shows a device structure. An insulating substrate 5000 is used, which is assumed to be a glass substrate (with a thickness of 0.5 µm) including silicon oxide (with a dielectric constant of 4.1) as its main component. Although an insulating substrate with a thickness of 0.5 mm, 0.7 mm, or the like is often used in an actual manufacturing process, the thickness of the insulating substrate is defined so as to be sufficiently large so that an electric field at a lower surface of the insulating substrate does not have influence on the TFT characteristics, in consideration of calculation efficiency.

A gate electrode 5010 with a stacked-layer structure of aluminum (Al) 5011 and molybdenum (Mo) 5012 (with a total thickness of 150 nm) is formed over the insulating substrate 5000. The work function of molybdenum (Mo) is assumed to be 4.6 eV In the device structure shown in FIG. 44, the TFT characteristics do not depend on the material of a lower layer (aluminum (Al) in this case) of the gate electrode. For the above reason, calculation was performed on the assumption that the gate electrode is formed of only molybdenum (Mo) (with a thickness of 150 nm) for sake of simplification of the calculation.

A gate insulating film 5020 with a stacked-layer structure of a silicon nitride film 5021 (with a dielectric constant of 7.0 and a thickness of 110 nm) and a silicon oxynitride film 5022 (with a dielectric constant of 4.1 and a thickness of 110 nm) is formed over the gate electrode 5010.

A μc-Si (n−) 5030 (with a thickness varied to be 10 nm, 20 nm, and 50 nm; and a donor concentration varied to be $1\times10^{15}$ atoms/cm$^3$ to $5\times10^{17}$ atoms/cm$^3$) and a third a-Si (i) (with a thickness varied to be 90 nm, 80 nm, and 50 nm) are stacked over the gate insulating film 5020. Over the third a-Si (i) 5040, further, a first a-Si (i) 5050 (with a thickness of 50 nm) is formed on the left and a second a-Si (i) 5070 (with a thickness of 50 nm) is formed on the right. The first to third a-Si (i) 5040 serve as a channel-etched layer and have a recessed portion.

A first a-Si (n+) 5060 (with a thickness of 50 nm) and a second a-Si (n+) 5080 (with a thickness of 50 nm) are formed over the first a-Si (i) 5050 and the second a-Si (i) 5070, respectively. In FIG. 44, the distance between the first a-Si (n+) 5060 and the second a-Si (n+) 5080 is the channel length L of the TFT. In this case, it is assumed that the channel length L=6 [μm], and that the donor concentration in the first a-Si (n+) 5060 and the second a-Si (n+) 5080 is $1\times10^{19}$ atoms/cm$^3$, and thus, the first a-Si (n+) 5060 and the second a-Si (n+) 5080 have high conductivity.

A source electrode 5090 and a drain electrode 5100 that have a stacked-layer structure (with a thickness of 300 nm) of molybdenum (Mo) 5091, 5101 and aluminum (Al) 5092, 5102 are formed over the first a-Si (n+) 5060 and the second a-Si (n+) 5080, respectively. It is assumed that ohmic contact is formed between the molybdenum and each of the first a-Si (n+) 5060 and the second a-Si (n+) 5080,. In the device structure shown in FIG. 44, the TFT characteristics do not depend on the material of an upper layer (aluminum (Al) in this case) of the source electrode 5090 and the drain electrode 5100. For the above reason, calculation was performed on the assumption that the source and drain electrodes are formed of only molybdenum (Mo) (with a thickness of 300 nm) for sake of simplification of the calculation.

(Model 2)

Figure 52:
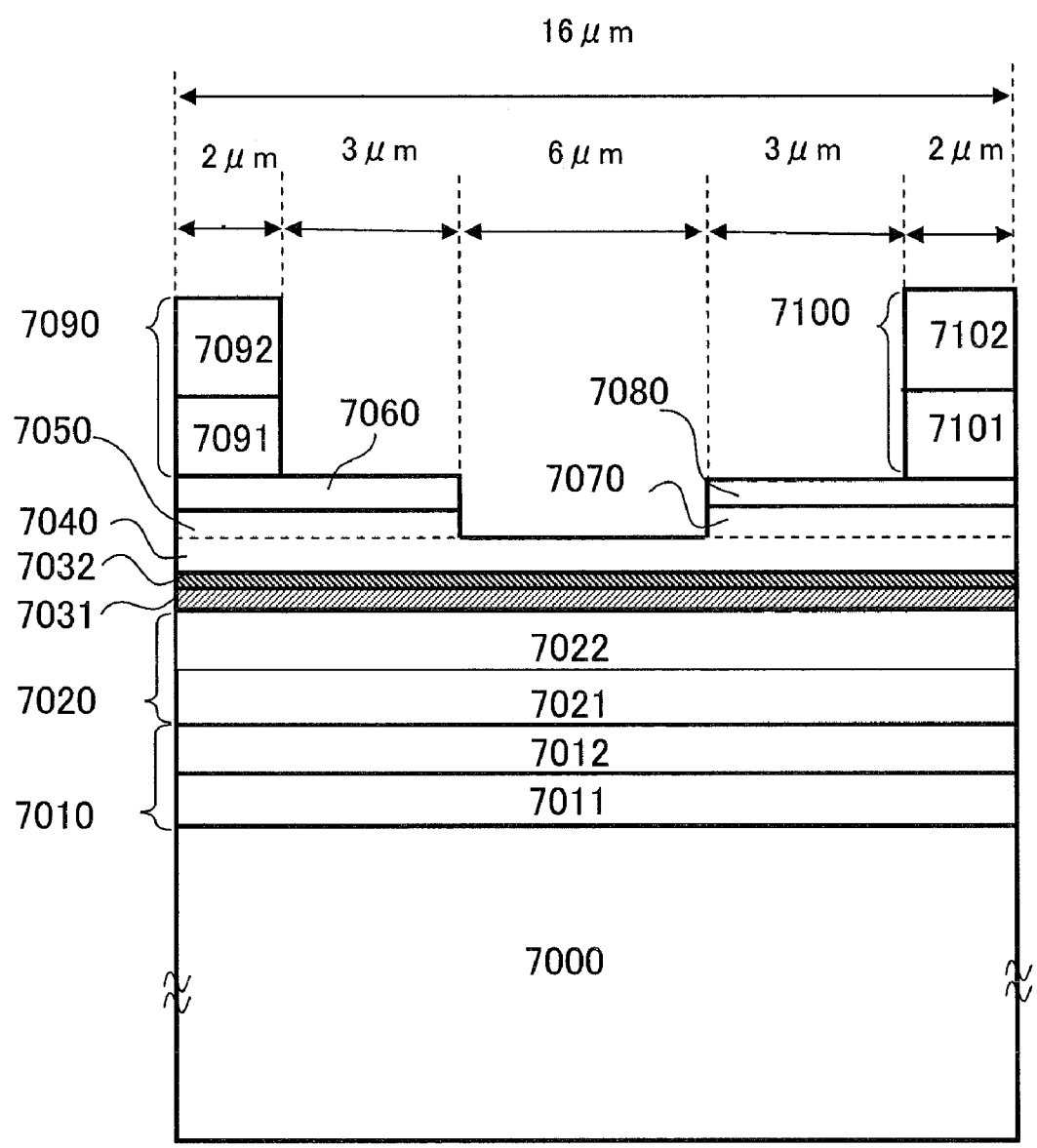
FIG. 52 is a cross-sectional view illustrating a model used for simulation.

FIG. 52 shows another device structure. A gate electrode 7010 with a stacked-layer structure of aluminum (Al) 7011 and molybdenum (Mo) 7012 is formed over an insulating substrate 7000. A stacked-layer structure from the insulating substrate 7000 to a gate insulating film 7020 is the same as in Model 1. The gate insulating film 7020 with a stacked-layer structure of a silicon nitride film 7021 and a silicon oxynitride film 7022 is formed over the gate electrode 7010.

A μc-Si (n−) 7031 (with a thickness varied to be 10 nm, 20 nm, and 50 nm; and a donor concentration varied to be $1\times10^{15}$ atoms/cm$^3$ to $5\times10^{17}$ atoms/cm$^3$), a μc-Si (i) 7032 (with a thickness of 20 nm), and a third a-Si (i) 7040 (with a thickness varied to be 70 nm, 60 nm, and 30 nm) are stacked over the gate insulating film 7020.

A stacked-layer structure of the third a-Si (i) 7040, a first a-Si (i) 7050, a second a-Si (i) 7070, a first a-Si (n+) 7060, a second a-Si (n+) 7080, a source electrode 7090, and a drain electrode 7100 are the same as in Model 1. A source electrode 7090 and a drain electrode 7100 that have a stacked-layer structure of molybdenum (Mo) 7091, 7101 and aluminum (Al) 7092, 7102 are formed over the first a-Si (n+) 7060 and the second a-Si (n+) 7080, respectively.

Model 2 is different from Model 1 in that the μc-Si (i) is formed between the μc-Si (n−) and the third a-Si (i).

Results of the device simulation are shown below. FIG. 45A, FIG. 46A, FIG. 47A, FIG. 48A, FIG. 49A, FIG. 50A, and FIG. 51A each show a simulation result where Vd=1 V. FIG. 45B, FIG. 46B, FIG. 47B, FIG. 48B, FIG. 49B, FIG. 50B, and FIG. 51B each show a simulation result where Vd=14 V.

Figure 45A:
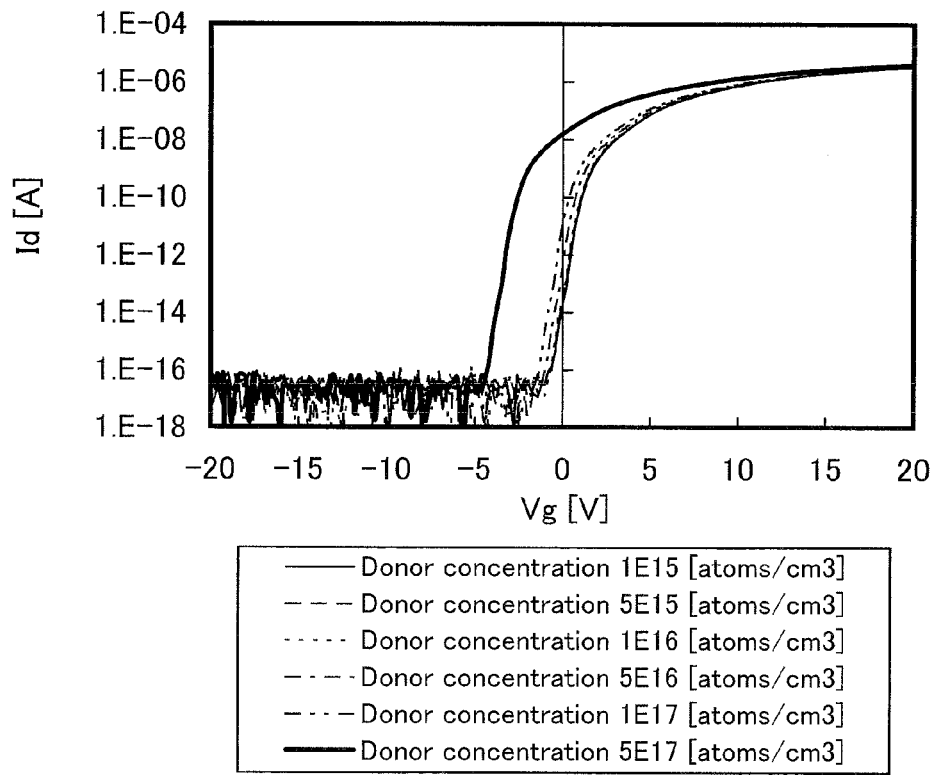
FIGS. 45A and 45B are graphs showing DC characteristics which are calculated by simulation.
Figure 45B:
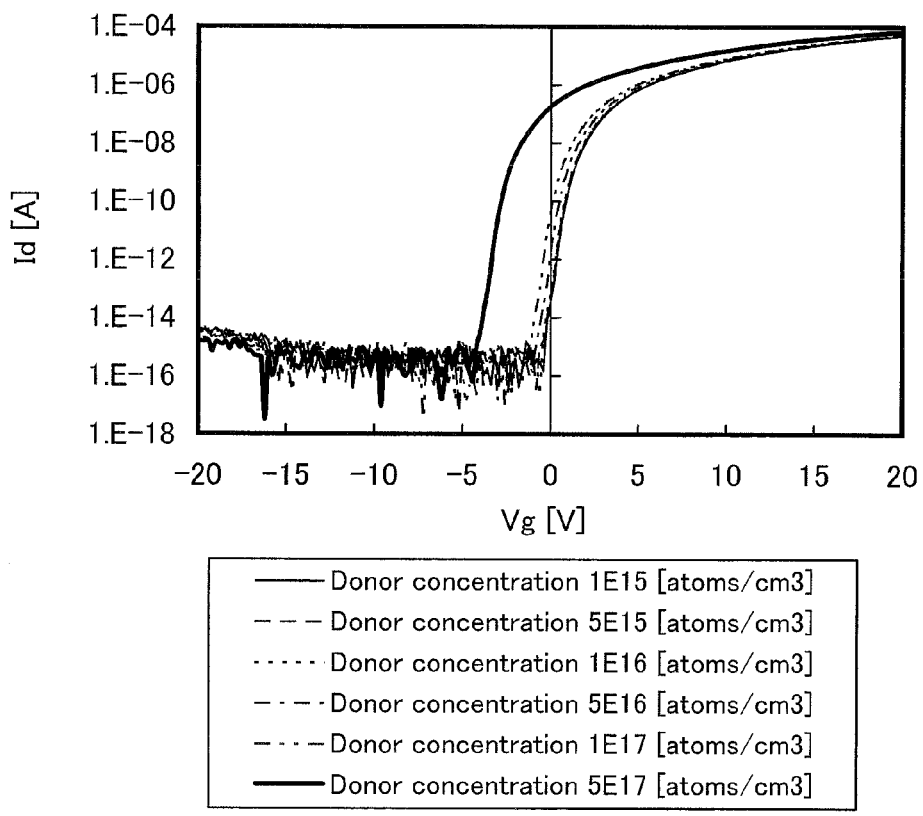
Figure 46A:
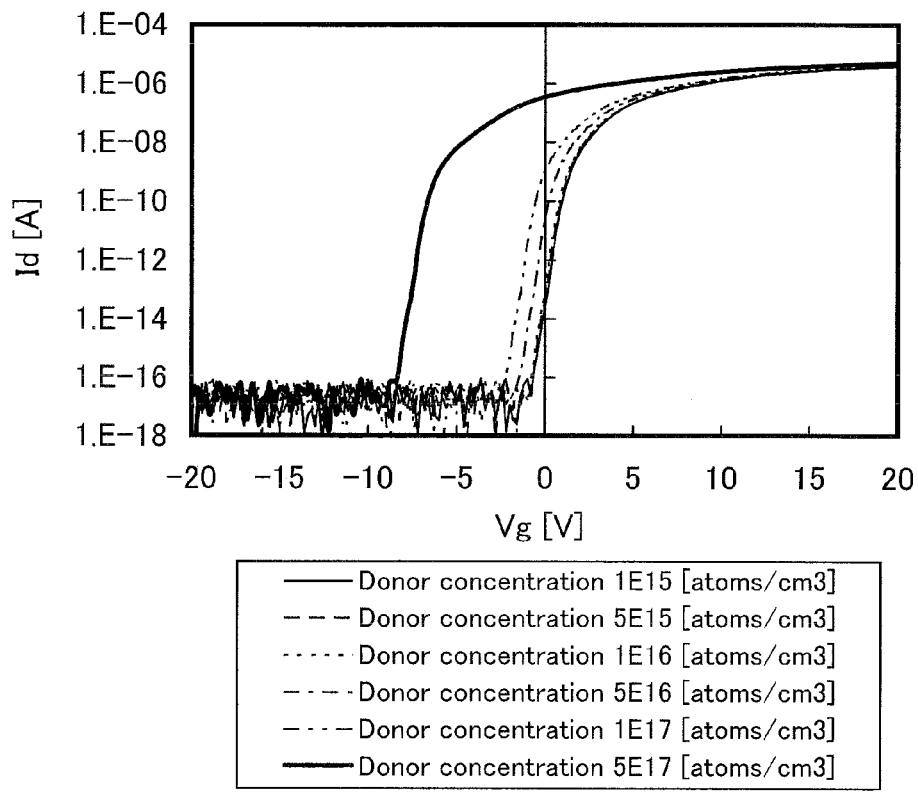
FIGS. 46A and 46B are graphs showing DC characteristics which are calculated by simulation.
Figure 46B:
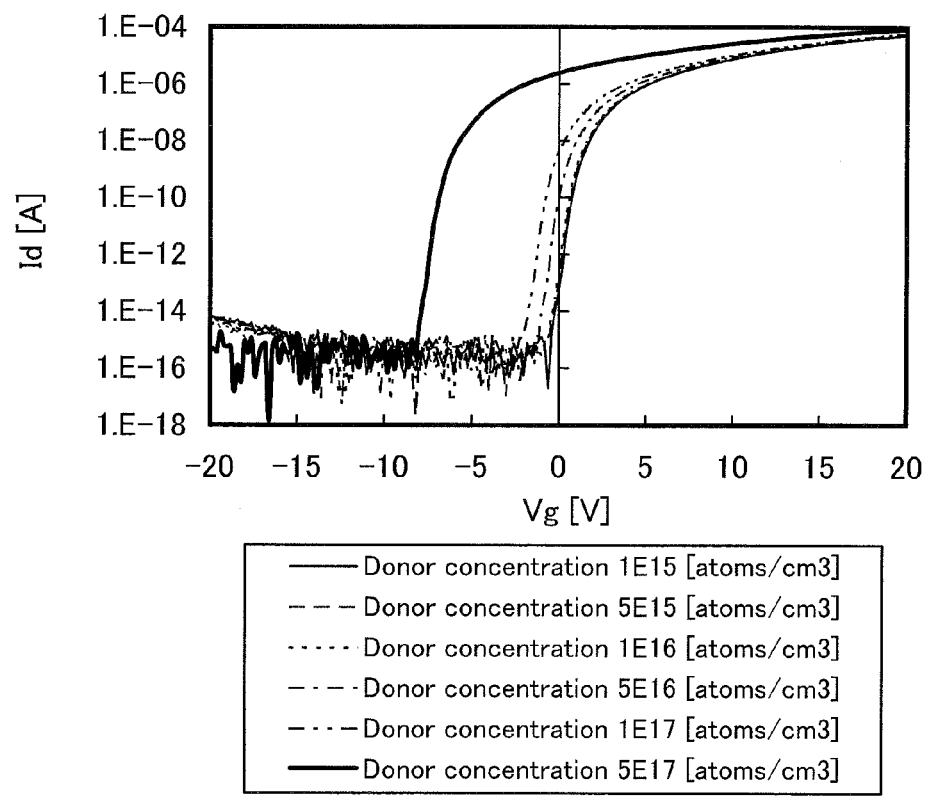
Figure 47A:
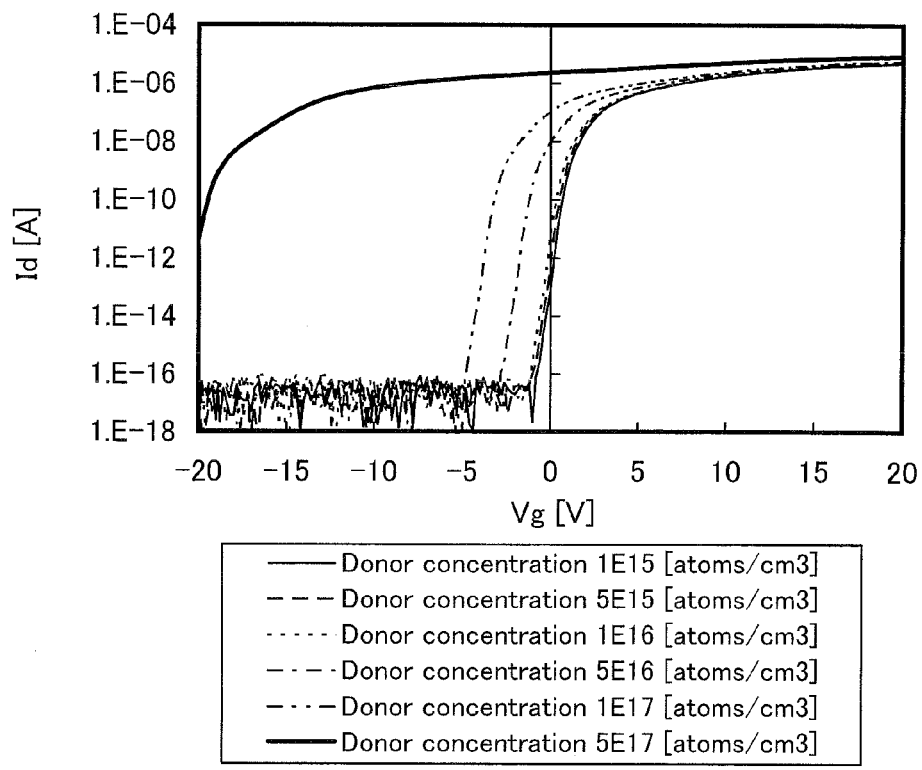
FIGS. 47A and 47B are graphs showing DC characteristics which are calculated by simulation.
Figure 47B:
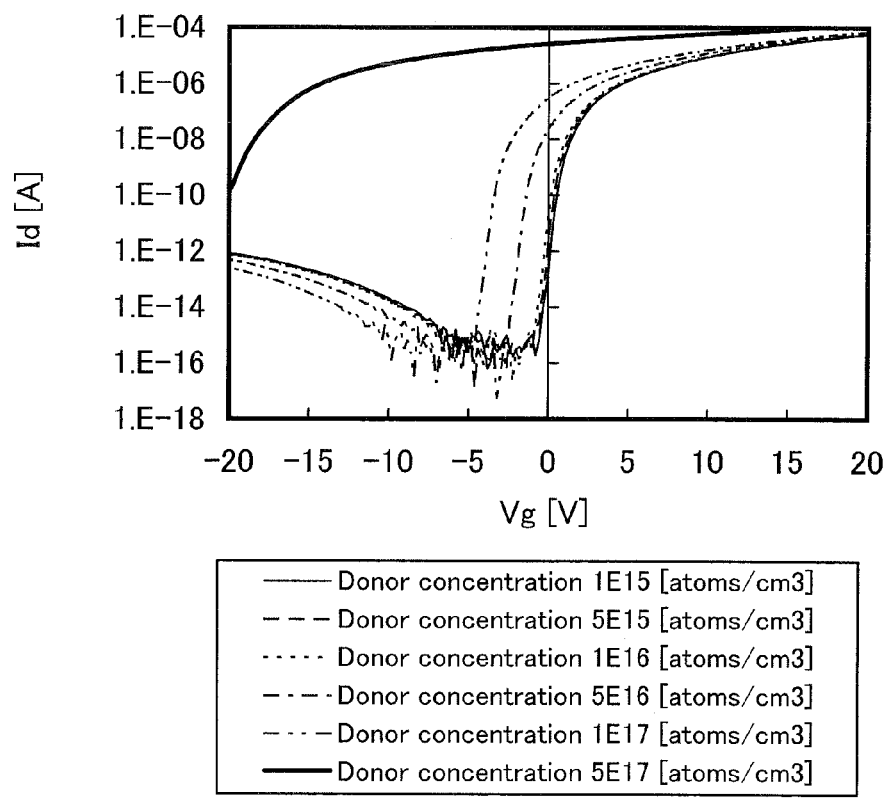
Figure 48A:
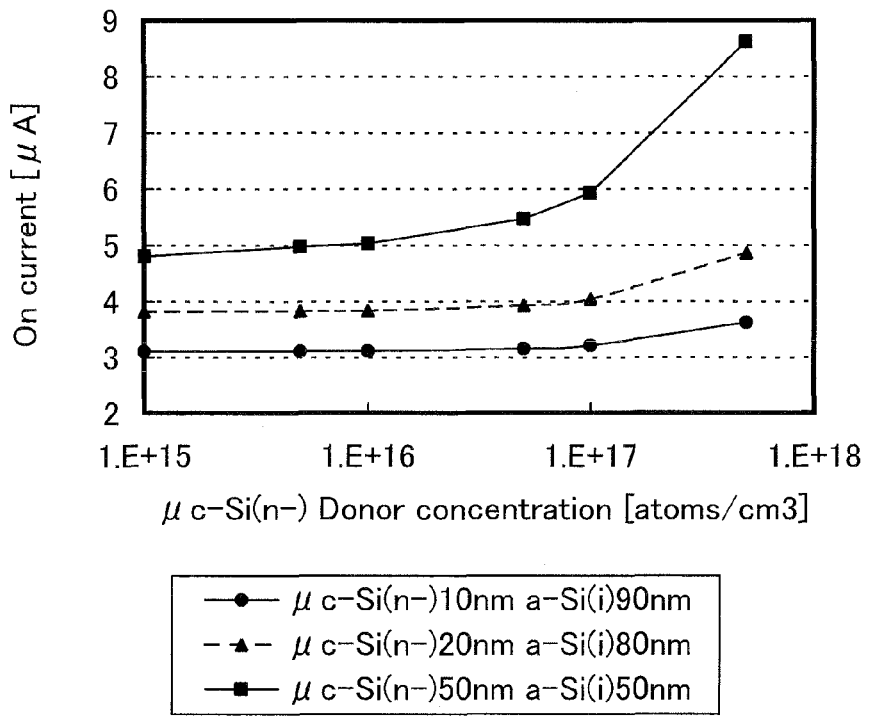
FIGS. 48A and 48B are graphs showing on currents which are calculated by simulation.
Figure 48B:
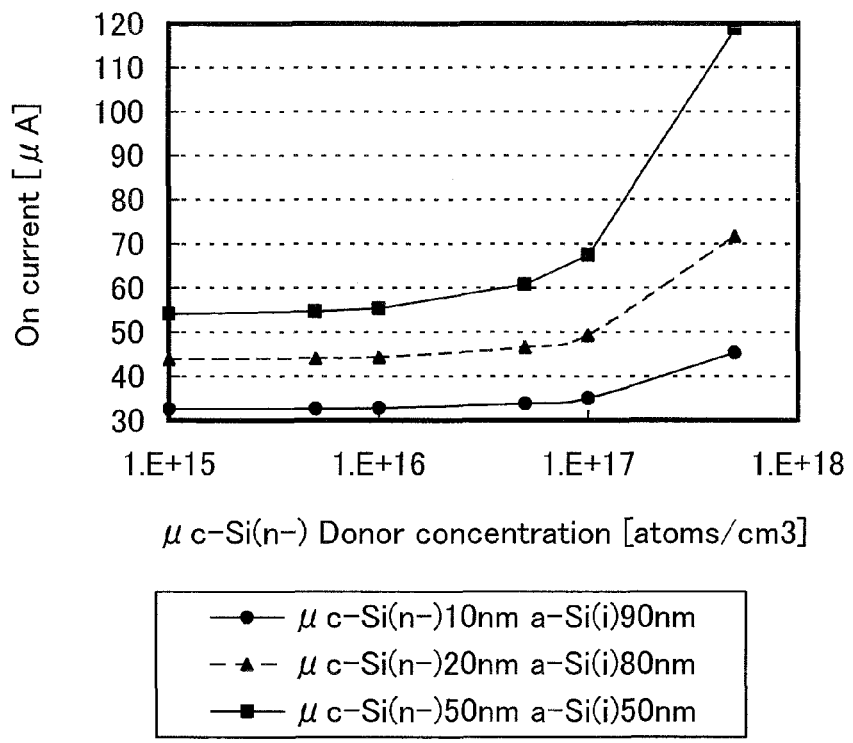
Figure 49A:
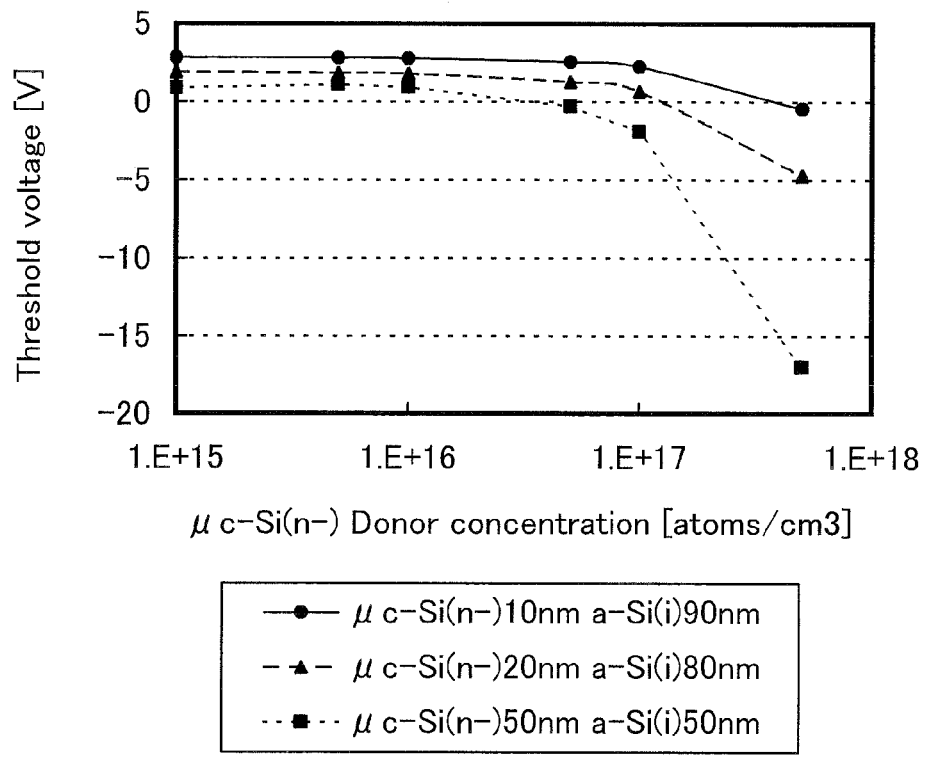
FIGS. 49A and 49B are graphs showing threshold voltages which are calculated by simulation.
Figure 49B:
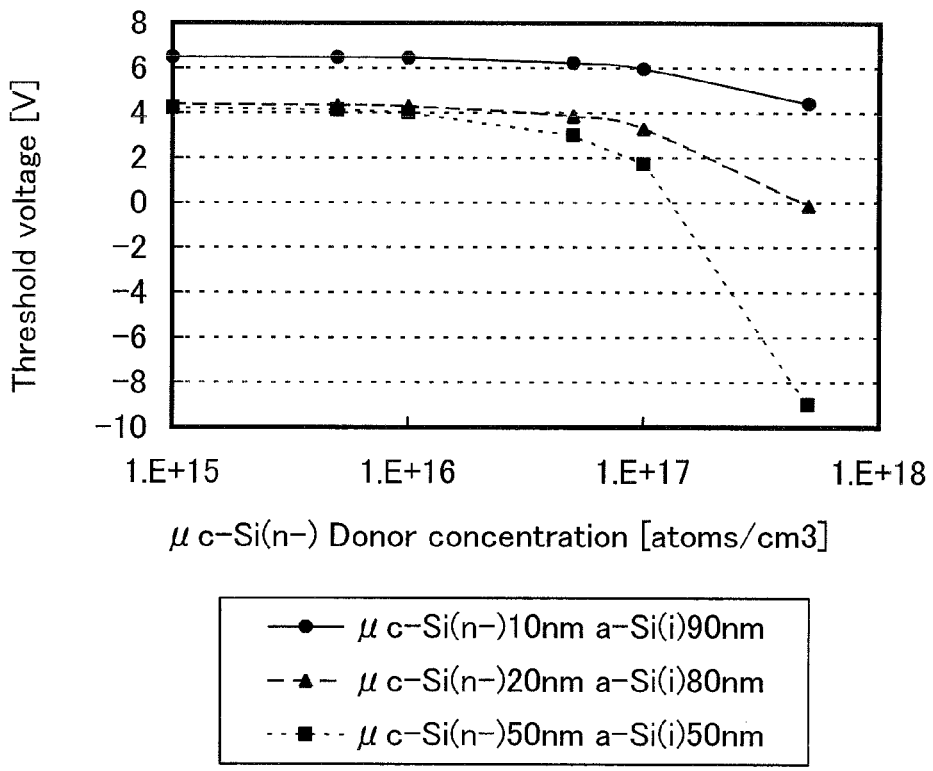
Figure 50A:
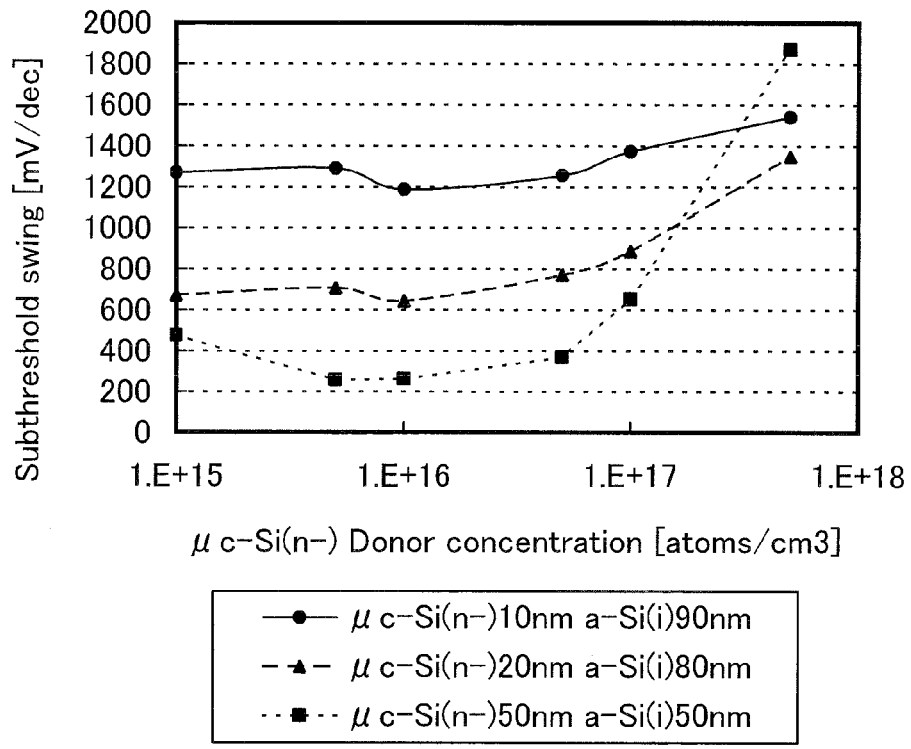
FIGS. 50A and 50B are graphs showing subthreshold swings which are calculated by simulation.
Figure 50B:
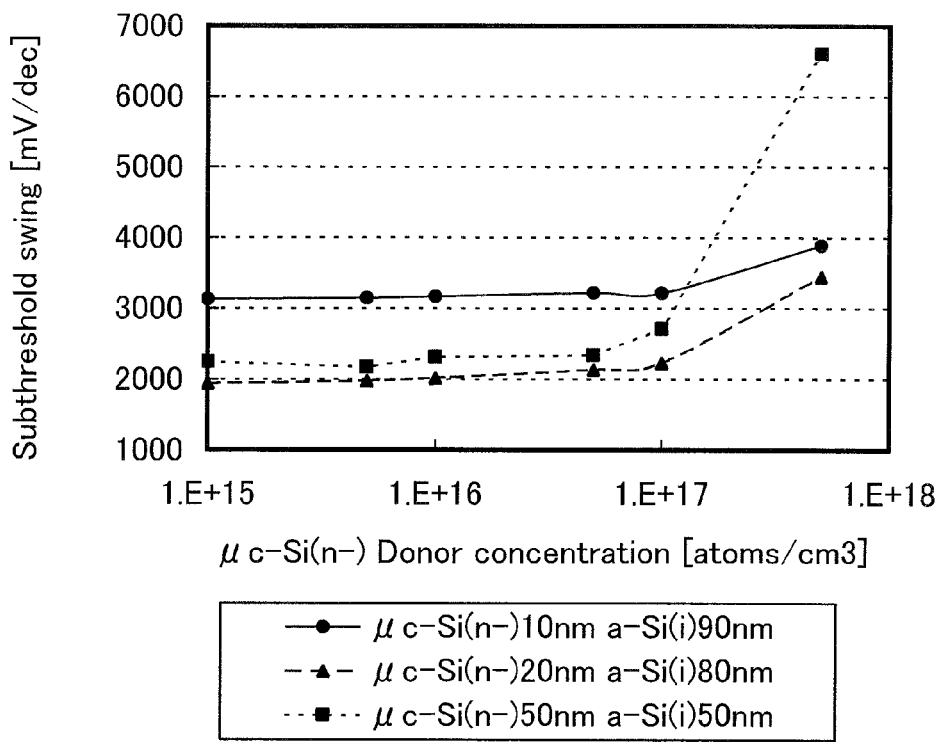

FIGS. 45A and 45B, FIGS. 46A and 46B, and FIGS. 47A and 47B show the results of the DC characteristics (Vg-Id characteristics; Vd=1 V, 14 V) when the device simulation was performed as the thickness of the μc-Si (n−) and the a-Si (i), and the donor concentration in the μc-Si (n−) are changed. In FIGS. 45A and 45B, the thickness of the μc-Si (n−) was set to be 10 nm and that of the third a-Si (i) was set to be 90 nm. Further, in FIGS. 46A and 46B, the thickness of the μc-Si (n−) was set to be 20 nm and that of the third a-Si (i) was set to be 80 nm. Furthermore, in FIGS. 47A and 47B, the thickness of the μc-Si (n−) was set to be 50 nm and that of the third a-Si (i) was set to be 50 nm. FIGS. 48A and 48B, FIGS. 49A and 49B, FIGS. 50A and 50B, and FIGS. 51A and 51B show results of on current, threshold voltage, subthreshold swing, and maximum filed effect mobility, respectively.

Figure 53A:
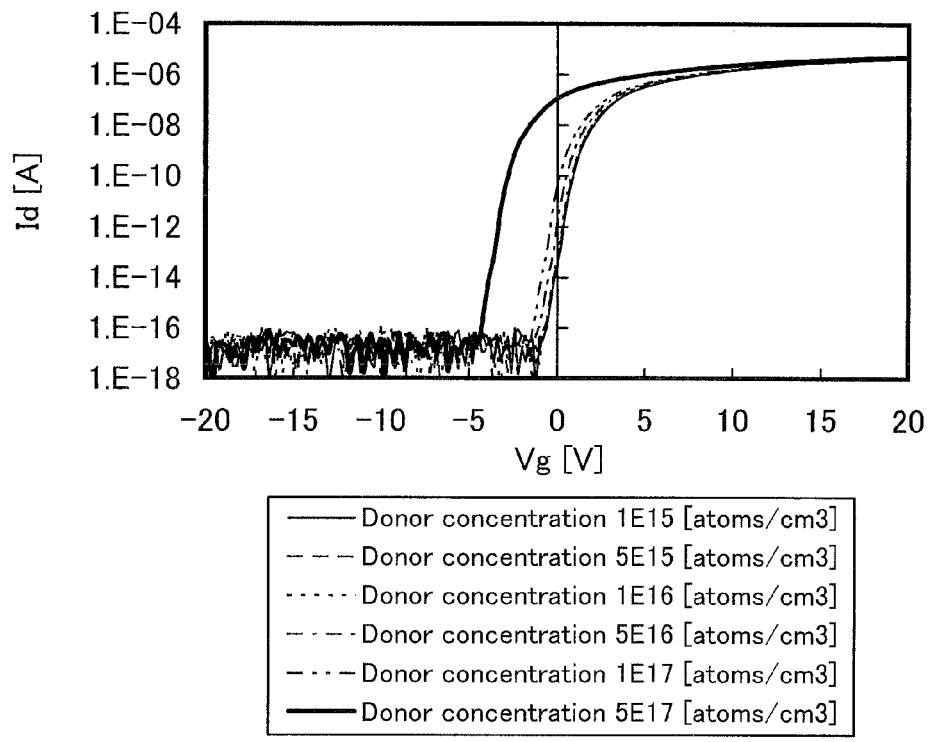
FIGS. 53A and 53B are graphs showing DC characteristics which are calculated by simulation.
Figure 53B:
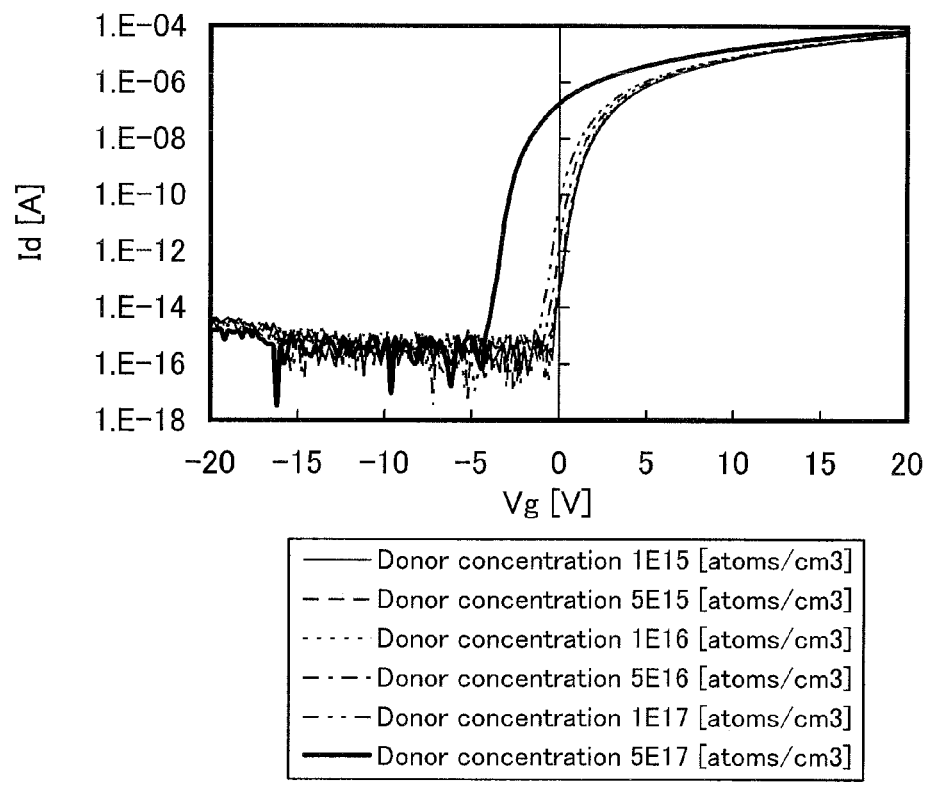
Figure 54A:
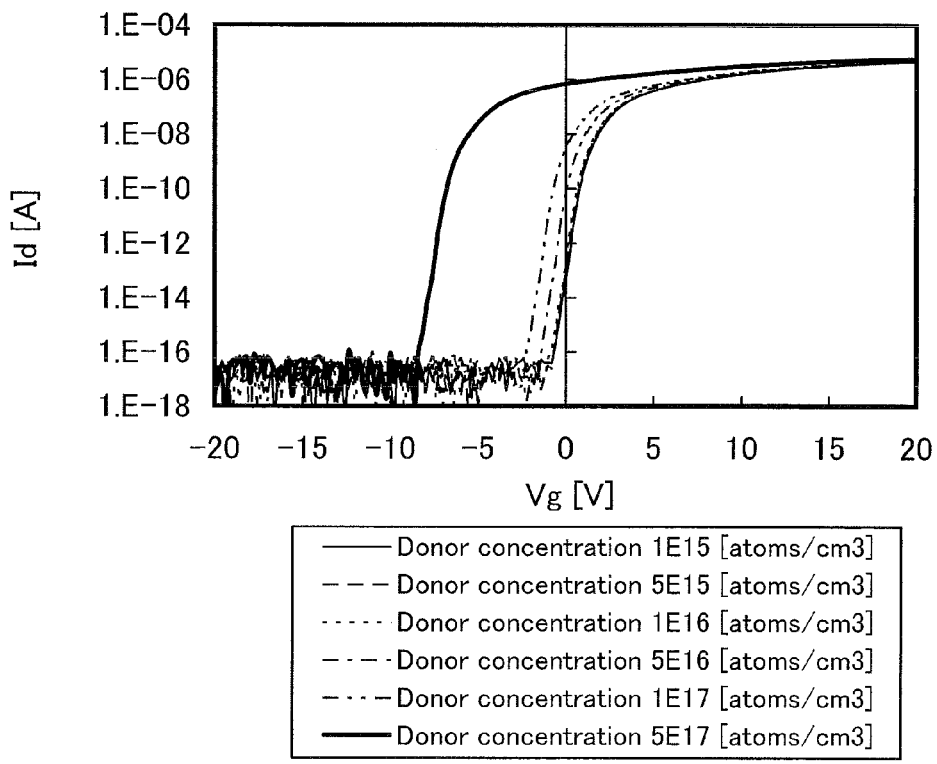
FIGS. 54A and 54B are graphs showing DC characteristics which are calculated by simulation.
Figure 54B:
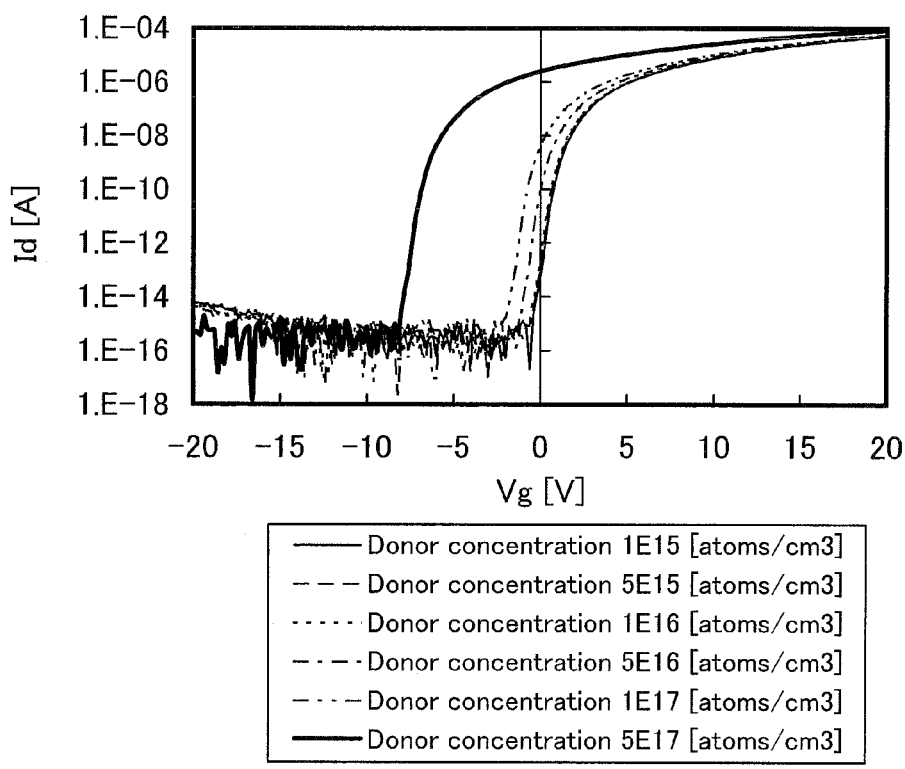
Figure 55A:
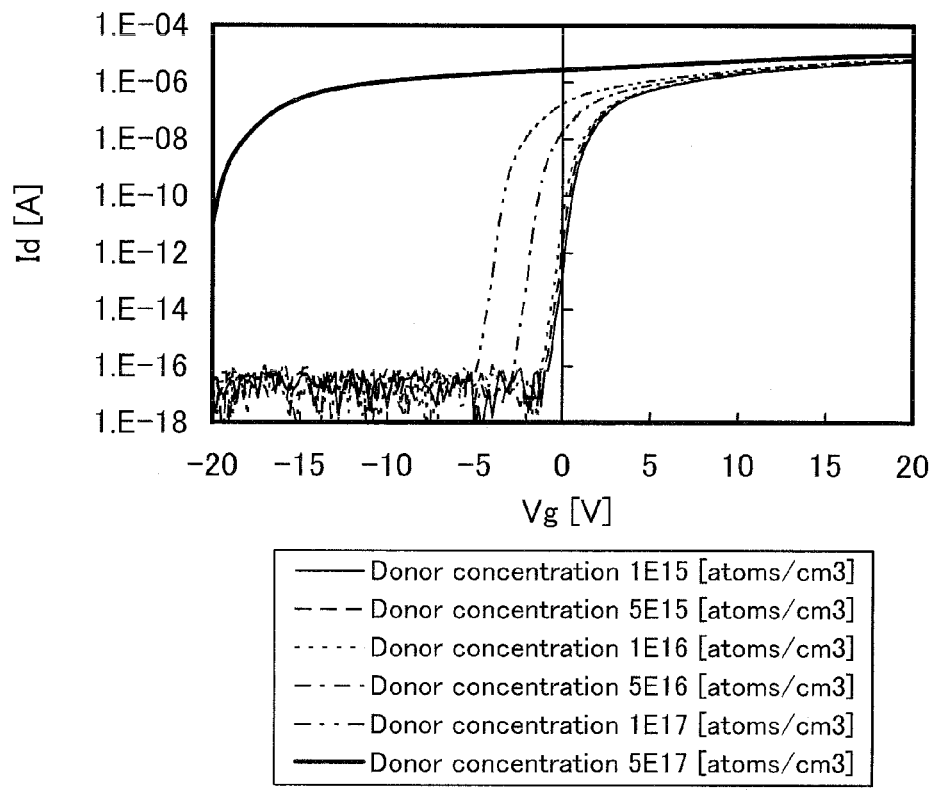
FIGS. 55A and 55B are graphs showing DC characteristics which are calculated by simulation.
Figure 55B:
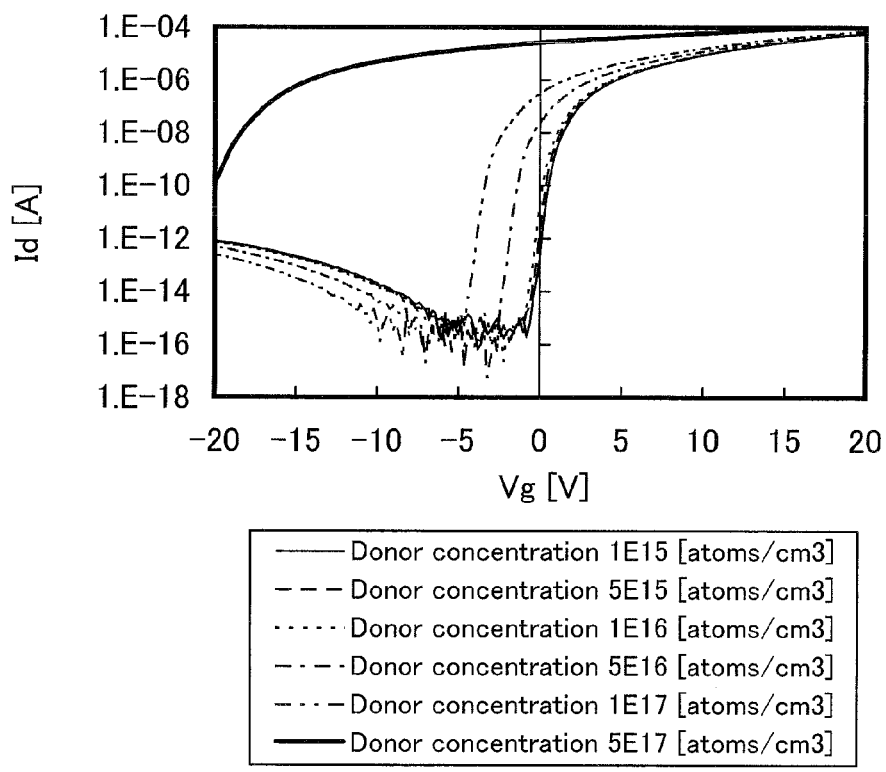
Figure 56A:
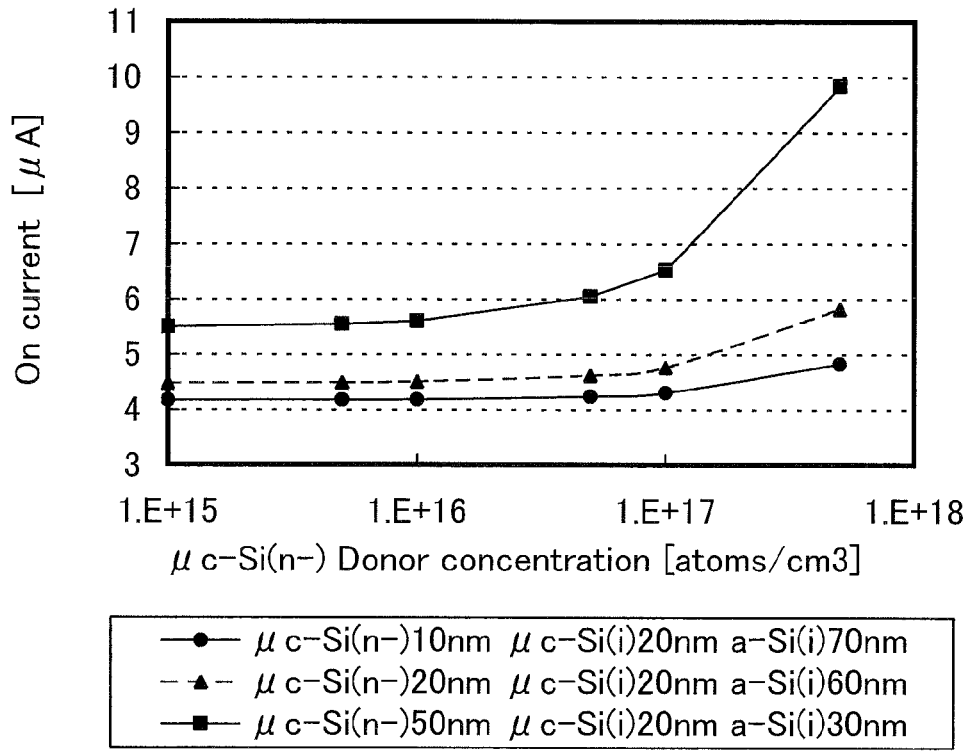
FIGS. 56A and 56B are graphs showing on currents which are calculated by simulation.
Figure 56B:
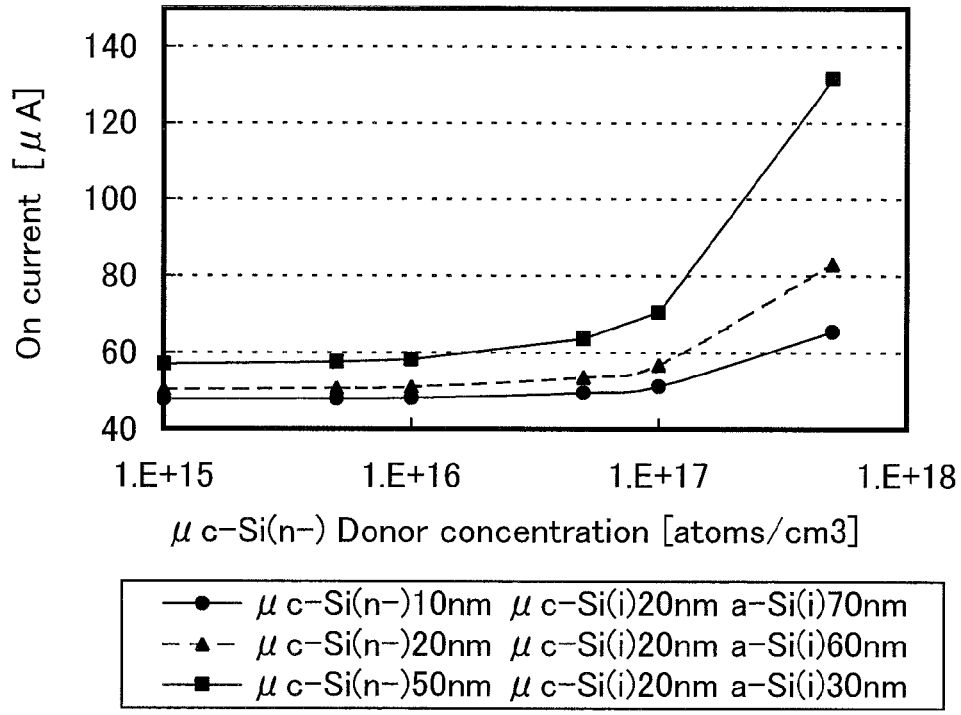
Figure 57A:
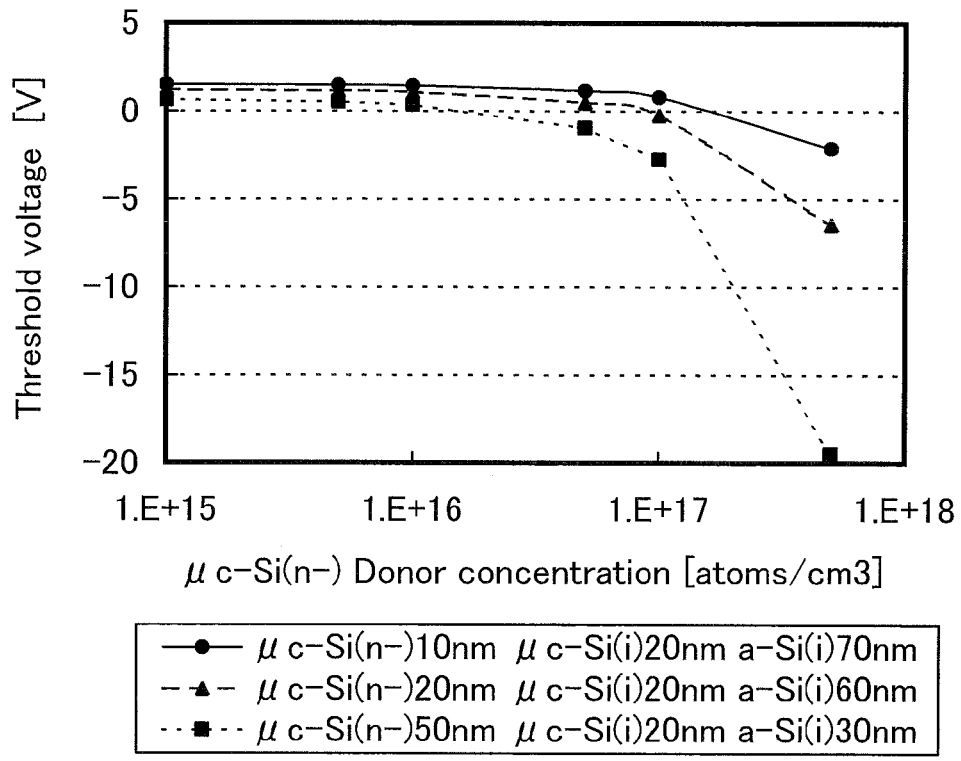
FIGS. 57A and 57B are graphs showing threshold voltages which are calculated by simulation.
Figure 57B:
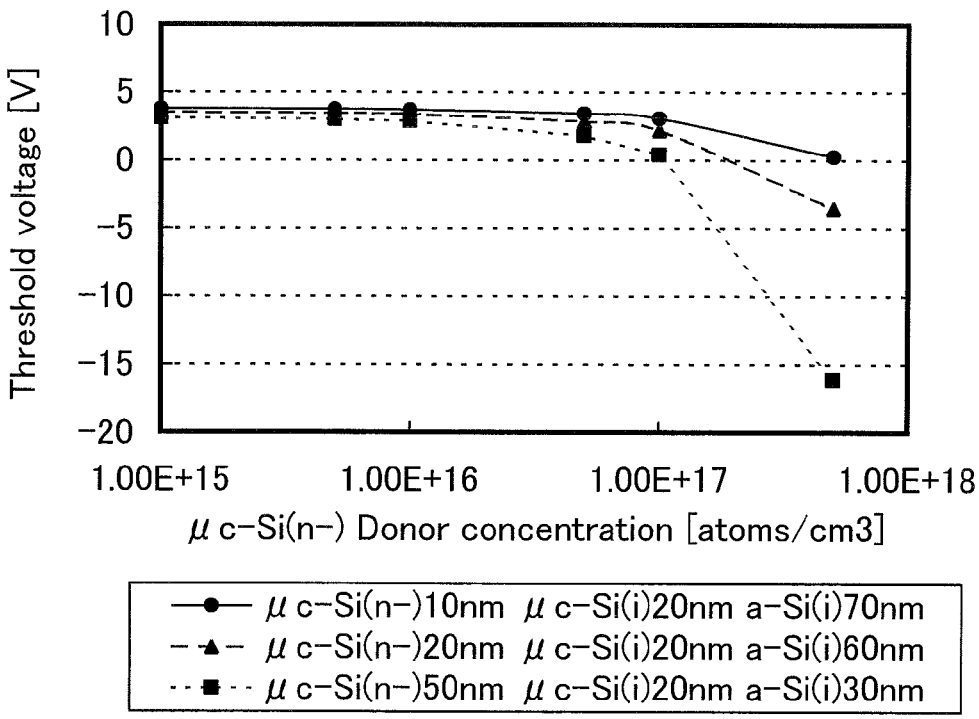
Figure 58A:
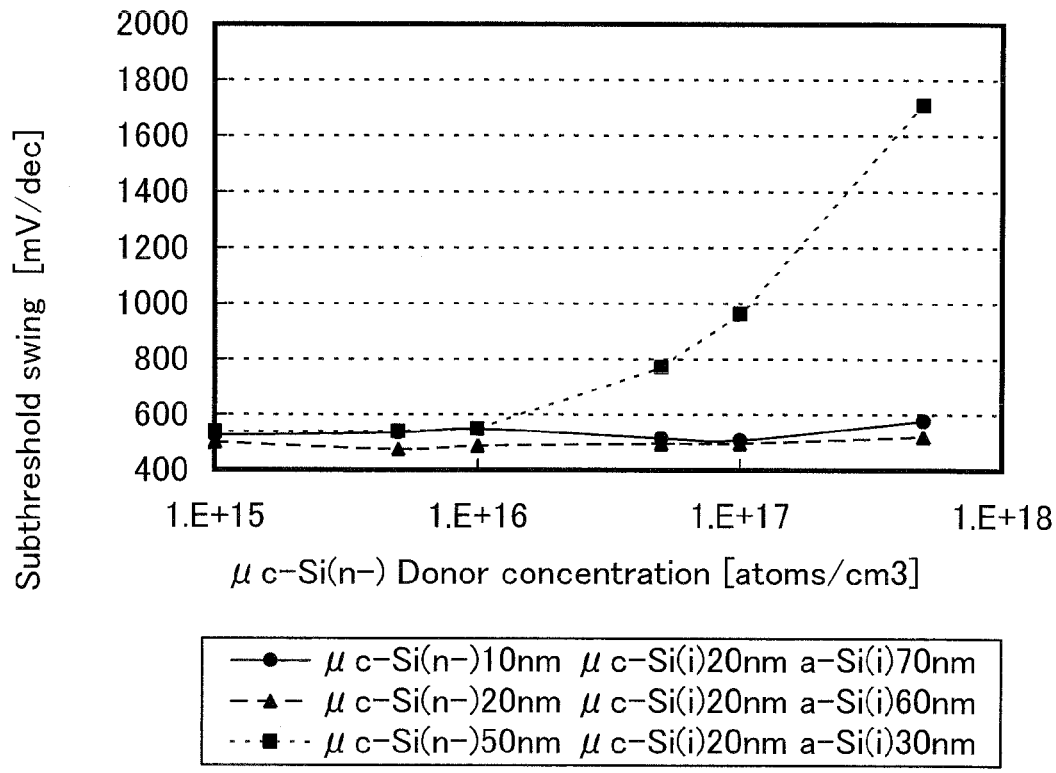
FIGS. 58A and 58B are graphs showing subthreshold swings which are calculated by simulation.
Figure 58B:
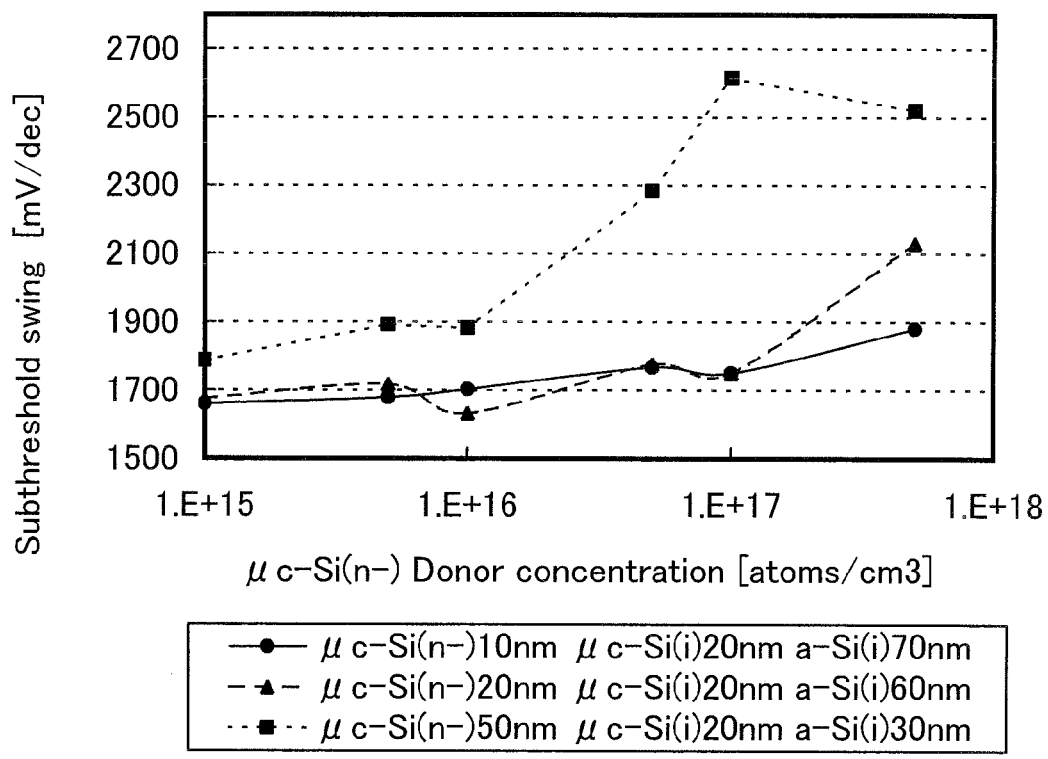

FIGS. 53A and 53B, FIGS. 54A and 54B, and FIGS. 55A and 55B show the results of the DC characteristics (Vg-Id characteristics; Vd=1 V, 14 V) when the device simulation was performed as the thickness of the μc-Si (n−) and the a-Si (i), and the donor concentration in the μc-Si (n−) are changed. In FIGS. 53A and 53B, the thickness of the μc-Si (n−) was set to be 10 nm and that of the third a-Si (i) was set to be 90 nm. Further, in FIGS. 54A and 54B, the thickness of the μc-Si (n−) was set to be 20 nm and that of the third a-Si (i) was set to be 80 nm. Furthermore, in FIGS. 55A and 55B, the thickness of the μc-Si (n−) was set to be 50 nm and that of the third a-Si (i) was set to be 50 nm. FIGS. 56A and 56B, FIGS. 57A and 57B, FIGS. 58A and 58B, and FIGS. 59A and 59B show results of on current, threshold voltage, subthreshold swing, and maximum filed effect mobility, respectively.

Vg-Id characteristics in Model 1 and Model 2 are shown below based on the result of the device simulation.

A shift in the threshold voltage which is caused by adding an impurity element to a semiconductor layer corresponds to a minus shift in the Id curve in the direction of the Vg axis which is caused by increasing the donor concentration, in the Vg-Id characteristics. FIGS. 45A and 45B, FIGS. 46A and 46B, FIGS. 47A and 47B, FIGS. 53A and 53B, FIGS. 54A and 54B, and FIGS. 55A and 55B which show the above calculation results, apparently show such a tendency. Furthermore, a larger thickness of the semiconductor layer to which the impurity element is added leads to a further minus shift of the Id curve in the direction of the Vg axis. This is caused by the fact that the total number of donors increases and the number of donor levels increases, whereby the Fermi energy comes to be closer to the conduction band energy Ec; i.e., an inversion layer can be formed at lower gate potential.

On currents in Model 1 and Model 2 are shown below based on the result of the device simulation.

As is apparent from FIGS. 45A and 45B, FIGS. 46A and 46B, and FIGS. 47A and 47B, the drain current Id is a monotone increasing function with respect to the gate voltage Vd in an on state. The reason is that the number of conduction electrons in the semiconductor layer which are induced at an interface between the semiconductor layer and the gate insulating film increases as the gate voltage Vg increases. Therefore, when an increase in the donor concentration shifts the Id curve toward the minus side in the direction of the Vg axis, the on current (the drain current when the gate voltage Vg is 20 V) increases. Although the drain current is reduced by an impurity diffusion, an increase in the number of the conduction electrons contributes more to the drain current, and as a result, the drain current increases. Further, a larger thickness of the semiconductor layer to which the impurity element is added leads to an increase in a portion of the semiconductor layer which contributes to the conductivity. Thus, the on current increases. FIGS. 48A and 48B and FIGS. 56A and 56B, which show the above calculation results, apparently show such a tendency.

When the donor concentration is $1 \times 10^{15}$ atoms/cm$^3$, it can be considered that the microcrystalline semiconductor film substantially does not include a donor, i.e., an impurity element which serves as a donor. FIGS. 48A and 48B and FIGS. 56A and 56B show that the donor included in the microcrystalline semiconductor film increases the on current.

Threshold voltages in Model 1 and Model 2 are shown below based on the result of the device simulation.

An increase in the donor concentration shifts the threshold voltage toward the minus side. FIGS. 49A and 49B and FIGS. 57A and 57B, which show the above calculation results, apparently show such a tendency. Further, a larger thickness of the semiconductor layer to which the impurity element is added leads to a further shift of the threshold voltage toward the minus side. This is caused by the fact that the total number of donors increases and the number of donor levels increases, whereby the Fermi energy comes to be closer to the conduction band energy Ec; i.e., an inversion layer can be formed at lower gate potential.

Subthreshold swings in Model 1 and Model 2 are shown below based on the result of the device simulation.

Adding the impurity element to the semiconductor layer increases the subthreshold swing due to impurity scattering. FIGS. 50A and 50B and FIGS. 58A and 58B, which show the above calculation results, apparently show such a tendency. Further, the subthreshold swing also increases by increasing the thickness of the semiconductor layer to which the impurity element is added. A probable cause of this is that the total number of impurity elements increases and the number of donor levels increases, whereby the conduction electrons are more likely to be diffused.

Maximum filed effect mobilities in Model 1 and Model 2 are shown below based on the result of the device simulation.

Figure 60A:
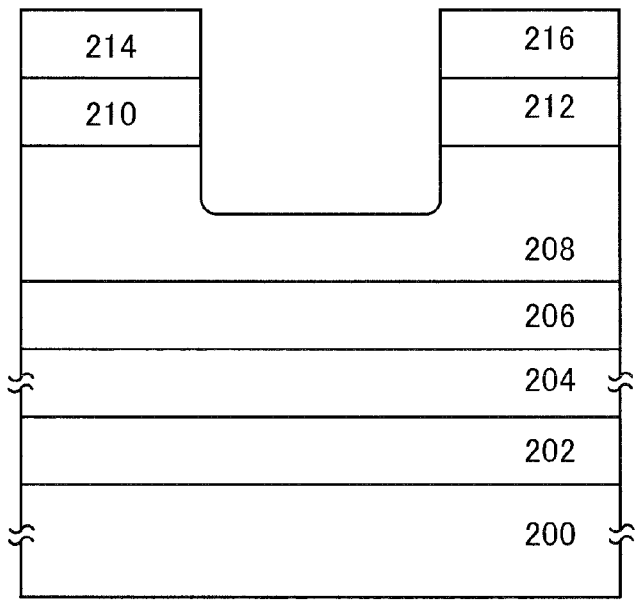
FIGS. 60A and 60B are drawings showing an element structure of a thin film transistor and FIG. 60C is an equivalent circuit diagram thereof.

To examine the maximum filed effect mobility, it is necessary to examine the field effect mobility in more detail. Thus, such a device structure as shown in FIG. 60A is given: a TFT including an insulating substrate 200, a gate electrode 202, a gate insulating film 204, a first semiconductor layer 206, a second semiconductor layer 208, a source region 210, a drain region 212, a source electrode 214, and a drain electrode 216.

Figure 60B:
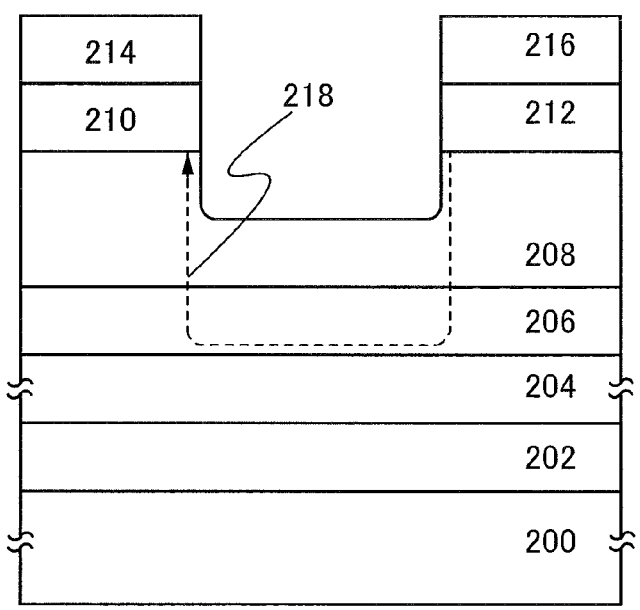

In FIG. 60B, a dashed line 218 shows a path through which a drain current flows between the drain electrode 216 and the source electrode 214 when the TFT is turned on, in other words, adequate positive potential is applied to the gate electrode 202; the source electrode 214 is grounded to have ground potential; and positive potential is applied to the drain electrode 216.

Figure 60C:
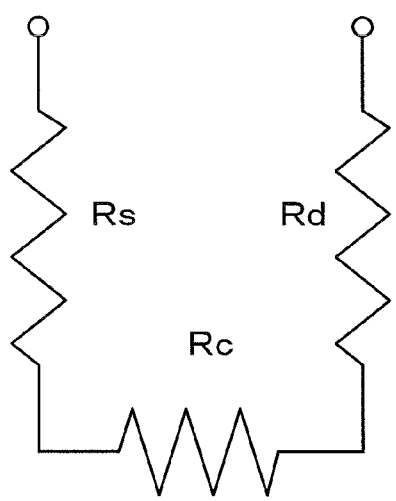

The drain current flows through the drain electrode 216, the drain region 212, the second semiconductor layer 208, a region in the first semiconductor layer 206 around an interface with the gate insulating film 204, the second semiconductor layer 208, the source region 210, and the source electrode 214. FIG. 60C shows an equivalent circuit diagram at this time. Here, a resistance Rs mainly shows a forward resistance value of the second semiconductor layer 208; a resistance Rd mainly shows a resistance value of a portion of the second semiconductor layer 208 which is depleted; and a resistance Rc(on) mainly shows a resistance value of a portion of the first semiconductor layer 206 which is inverted.

Here, the portion of the first semiconductor layer 206 which is inverted means a portion of the first semiconductor layer 206 in a state where conduction electrons are induced at the interface between the first semiconductor layer 206 and the gate insulating film 204 by applying potential to the gate electrode 202. It can be considered that the resistance Rs is much smaller than the resistance Rd and the resistance Rc(on).

In an actual device structure, typically, the resistance Rd is formed in the second semiconductor layer 208 with a thickness of approximately 200 nm. Typically, further, the resistance Rc(on) is formed in the first semiconductor layer 206 with a length of approximately 6 μm. Therefore, when the resistance value per unit length of the portion of the second semiconductor layer 208 which is depleted is approximately 30 times or more that of the portion of the first semiconductor layer 206 which is inverted, it is probable that the resistance Rd will have the great influence on the drain current. Furthermore, when the resistance value per unit length of the portion of the second semiconductor layer 208 which is depleted is approximately 30 times or less that of the portion of the first semiconductor layer 206 which is inverted, it is probable that the resistance Rc(on) will have the great influence on the drain current.

It is probable that the resistance Rc(on) decreases from a value which is much higher than the resistance Rd to a value which is as high as or almost as high as the resistance Rd, and further to a value which is much lower than the resistance Rd as the gate voltage increases. Further, it is probable that the drain current increases suddenly as the resistance Rc(on) decreases from a value much higher than the resistance Rd to a value which is as high as or almost as high as the resistance Rd. On the other hand, when the resistance Rc(on) comes to have a value which is much lower than the resistance Rd, decrease in the resistance Rc(on) has less influence on the drain current. Further, it is probable that the resistance Rd decreases as the drain voltage increases.

Figure 61:
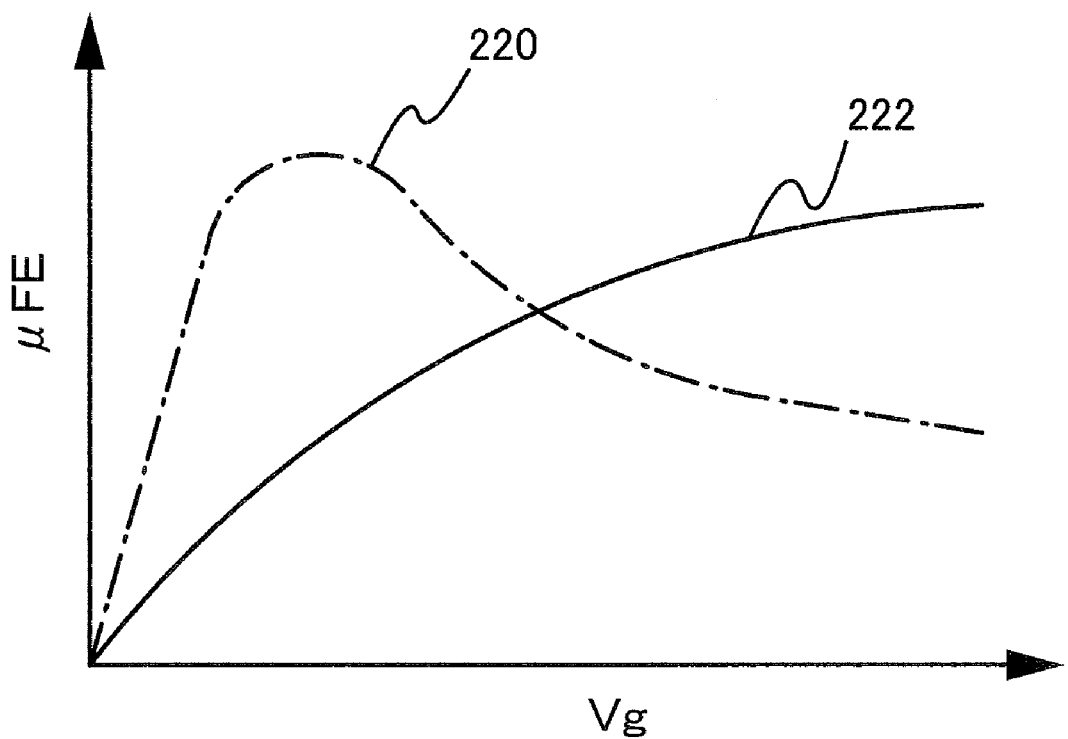
FIG. 61 is a graph illustrating maximum field effect mobilities of a thin film transistor.

The field effect mobility can be considered as the rate of increase in the drain current Id with respect to an increase in the gate voltage Vg. That is to say, when the drain voltage is low (the resistance Rd is high), the field effect mobility has a maximum value as the gate voltage increases. Further, when the drain voltage is high (the resistance Rd is low), the field effect mobility increases monotonously as the gate voltage increases. FIG. 61 shows such a situation. The field effect mobility when the drain voltage is low is designated by a dashed line 220. When the drain voltage is low, the maximum filed effect mobility has a maximum value in FIG. 61. Further, a solid line 222 shows the field effect mobility when the drain voltage is high. When the drain voltage is high, the maximum filed effect mobility has a maximum value when Vg has a maximum value in FIG. 61.

In addition to the above examination, the minus shift of Id curve in the direction of the Vg axis which is caused by increasing the donor concentration is considered, and description is made on FIGS. 51A and 51B and FIGS. 59A and 59B, which show the calculation results of the above.

Figure 51A:
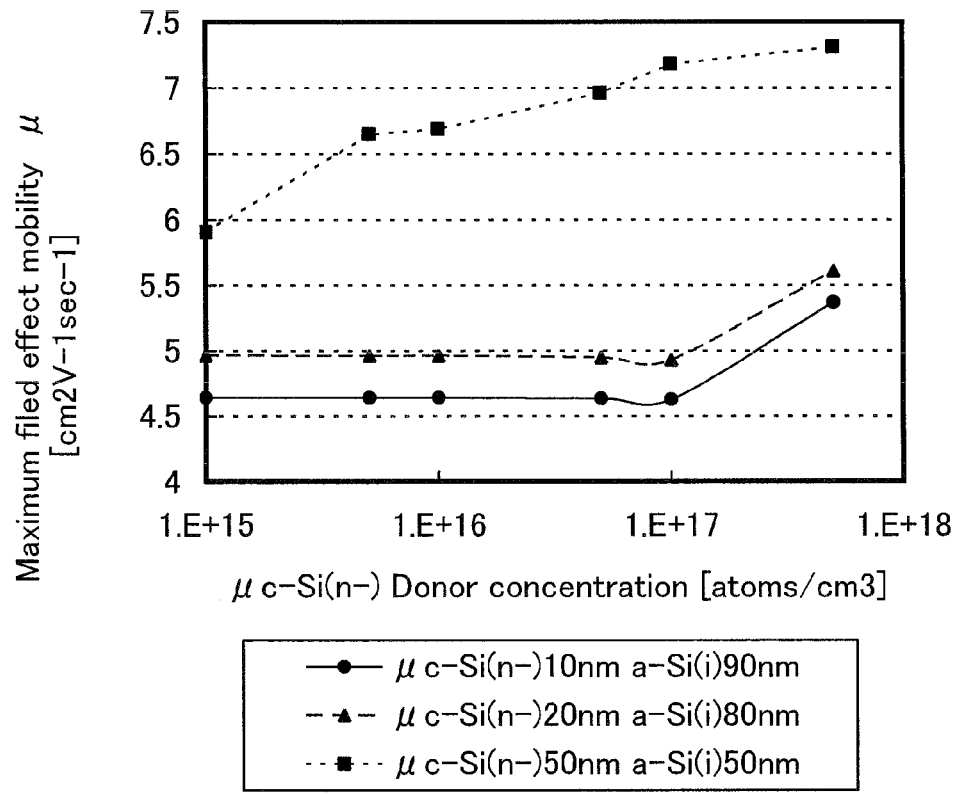
FIGS. 51A and 51B are graphs showing maximum field effect mobilities which are calculated by simulation.
Figure 51B:
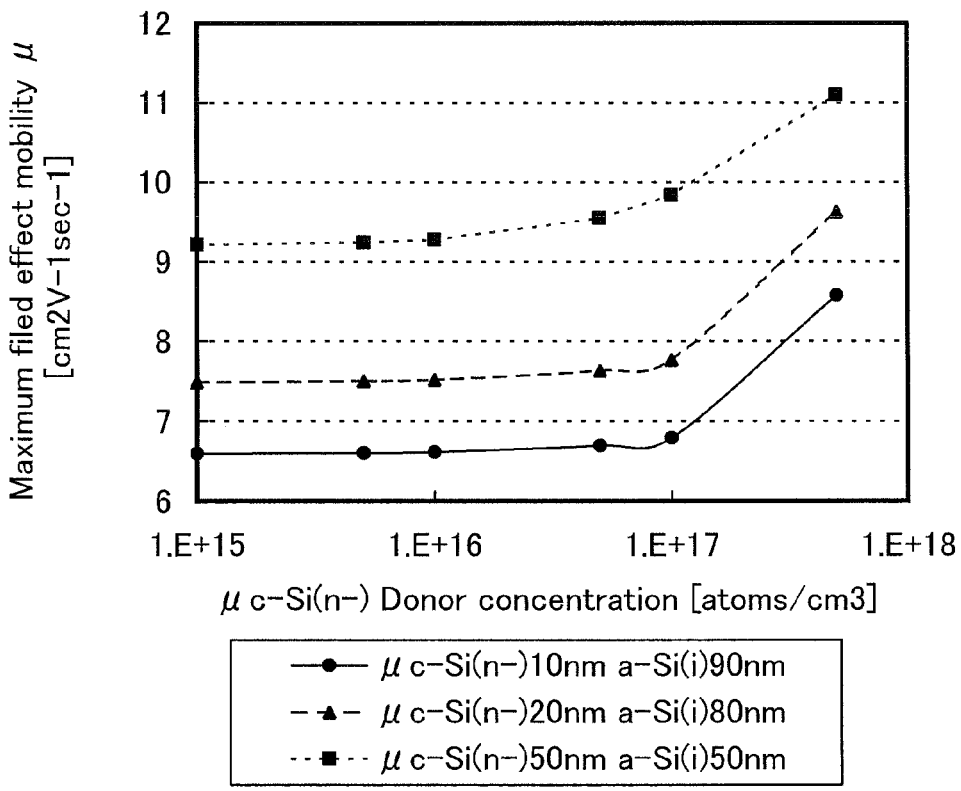
Figure 59A:
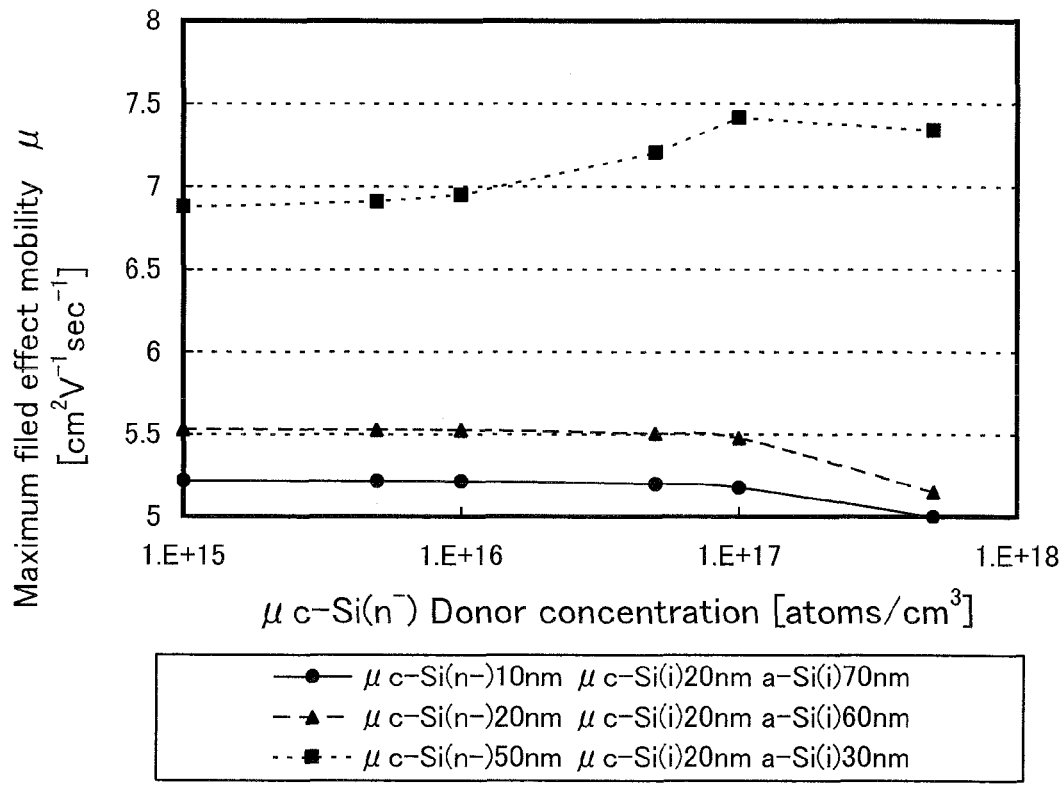
FIGS. 59A and 59B are graphs showing maximum field effect mobilities which are calculated by simulation.
Figure 59B:
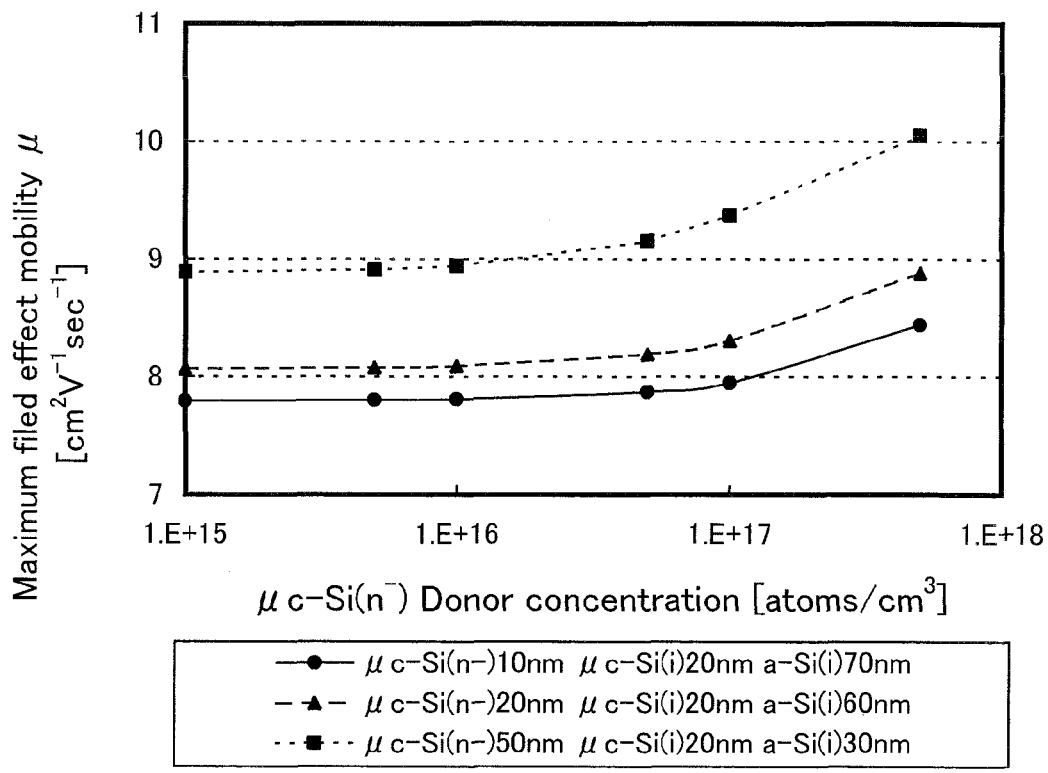

In FIG. 51B and FIG. 59B, when the drain voltage is high (Vd=14 V), the maximum filed effect mobility increases as the donor concentration increases. A cause of the above phenomenon can be explained easily when the minus shift of the threshold voltage which is caused by adding an impurity element is taken into consideration of the above case where the drain voltage is high in FIG. 61.

On the other hand, when the drain voltage is low (Vd=1 V), there arise some patterns of tendency, as shown in FIG. 51A and FIG. 59A. When the semiconductor layer to which the impurity element is added has a small thickness, for example, in the results of µc-Si (n−) with thicknesses of 10 nm and 20 nm in FIG. 51A and FIG. 59A, the maximum filed effect mobility decreases or only slightly increases as the donor concentration increases. A cause of the above phenomenon can be explained easily when decrease in the field effect mobility which is caused by increasing of impurity scattering is taken into consideration of the above case where the drain voltage is low.

When the semiconductor layer to which the impurity element is added has a large thickness, for example, in the result of µc-Si (n−) with a thickness of 50 nm in FIG. 51A and FIG. 59A, the maximum filed effect mobility increases as the donor concentration increases. By increasing the thickness of the semiconductor layer to which the impurity element is added, a region of the semiconductor layer which contributes to conduction increases. Thus, the field effect mobility increases. It is probable that a cause of the result of µc-Si (n−) with a thickness of 50 nm in FIG. 51A and FIG. 59A is that improvement in the field effect mobility which is due to increase in the thickness of the semiconductor layer counteracts decrease in the field effect mobility which is due to increasing of impurity scattering.

When the donor concentration is $1 \times 10^{15}$ atoms/cm$^3$, the microcrystalline semiconductor film can be regarded as not including a donor substantially, i.e., not including the impurity element which serves as a donor substantially. FIGS. 51A and 51B and FIGS. 59A and 59B show that the maximum filed effect mobility increases when the microcrystalline semiconductor film includes the donor.

Embodiment 6

Since the thin film transistor of the present invention can operate at high speed, the frame frequency can be increased in a method for operating a liquid crystal display device. Here, characteristics of a thin film transistor which can be manufactured in a pixel portion of a liquid crystal display device, and the concentration of an impurity element which serves as a donor which is included in a channel formation region and contributes to achieving the characteristics were calculated. Note that in the liquid crystal display device, display characteristics of moving images are improved and smooth display can be performed by quadrupling the frame frequency (e.g., 480 Hz or 400 Hz) and interpolating image data.

Figure 62:
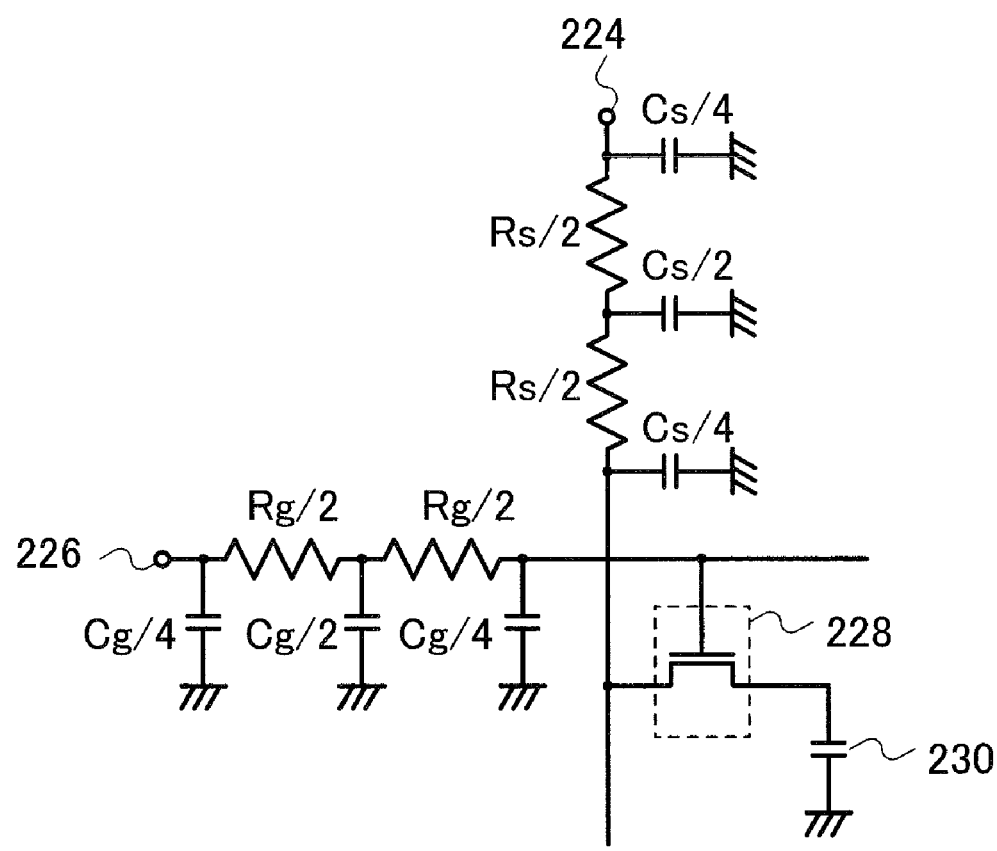
FIG. 62 is a circuit diagram used for circuit simulation.

The specification of the liquid crystal display device which is used in this simulation is as follows:
HDTV: (number of pixels: 1920×1080) 1125 p, 11.7 inches (278.4 mm×156.6 mm)
VA mode
pixel capacity: 88 fF
gate signal line (sheet resistance: 0.3 Ω/square; line width: 7 µm) resistance: 11.9 kΩ;
capacity: 495 pF
video signal line (sheet resistance: 0.14 Ω/square; line width 5 µm) resistance: 4.4 kΩ;
capacity: 126 pF
pixel TFT: L/W=6 µm/15 µm
driving voltage of the gate signal line: 24 V
video signal: 4.5 V to 17.5 V FIG. 62 is a circuit diagram which is used for the circuit simulation. A pixel TFT 228 is used in which there occurs maximum signal delay because of parasitic capacitance and wiring resistance of a video signal line 224 and a gate signal line 226. In FIG. 62, Cg, Rg, Cs, and Rs represent parasitic capacitance of the gate signal line 226, wiring resistance of the gate signal line 226, parasitic capacitance of the video signal line 224, and wiring resistance of the video signal line 224, respectively. The circuit simulation is carried out using a double-π circuit.

In the circuit shown in FIG. 62, high potential (24 V) is applied to the gate signal line 226 and a video signal (17.5 V) is input to the video signal line 224, and delay time until when the potential of a pixel electrode 230 reaches a desired value (17.5 V (video signal)−0.1 V=17.4 V) is calculated with a circuit simulator. When the delay time is within 3.7 µs (a period in which one gate is selected in quadruple frame rate display), the pixel TFT 228 can be regarded to have the TFT characteristics which are required for the quadruple frame rate display. The above operation is repeated while changing model parameters of the pixel TFT 228, whereby requisites for the TFT characteristics which are necessary for the pixel TFT 228 are obtained.

Characteristics of a pixel TFT which are required for quadruple frame rate display are as follows:
on current: greater than or equal to $4.11 \times 10^{-6}$ A (Vd=1 V, Vg=20 V); greater than or equal to $5.54 \times 10^{-4}$ A (Vd=14 V, Vg=20 V)
threshold voltage: less than or equal to 0.98 V (Vd=1 V); less than or equal to 1.94 V (Vd=14 V)
subthreshold swing: less than or equal to 0.836 V/dec. (Vd=1 V); less than or equal to 0.845 V/dec. (Vd=14 V)
field effect mobility: greater than or equal to 5.46 cm$^2$/Vs (Vd=1 V); greater than or equal to 69.4 cm$^2$/Vs (Vd=14 V)

The thin film transistor in which the microcrystalline silicon film is used for the channel formation region has less variation in the threshold voltage than a thin film transistor in which amorphous silicon is used for a channel formation region, and thus the threshold voltage was set to be greater than or equal to −3 V.

Figure 63A:
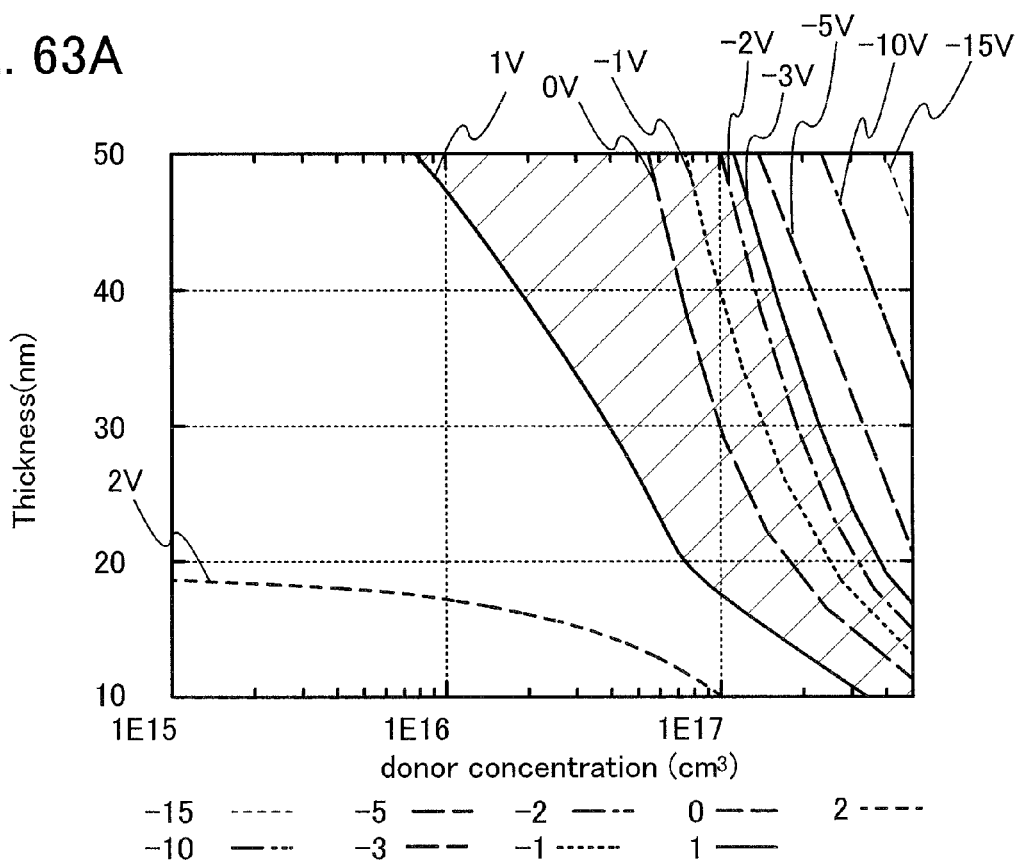
FIGS. 63A and 63B are graphs illustrating thicknesses and donor concentrations of microcrystalline silicon films, and threshold voltages.

In FIG. 63A, a curve shows threshold voltage which is obtained when the thickness of the microcrystalline silicon film including the impurity element which serves as a donor is set to be from 10 nm to 50 nm and the donor concentration is set to be from $1 \times 10^{15}$ atoms/cm$^3$ to $5 \times 10^{17}$ atoms/cm$^3$ in the thin film transistor of Model 1 in Embodiment 5. The threshold voltage is from −3 V to 1 V inclusive according to the above requisites of the TFT characteristics; thus, when the thickness of the microcrystalline silicon film including the impurity element which serves as a donor is from 10 nm to 50 nm, the donor concentration which satisfies the above range is from $8 \times 10^{15}$ atoms/cm$^3$ to $5 \times 10^{17}$ atoms/cm$^3$. Note that the donor concentration is shown here, which is different from the concentration of the impurity element which serves as a donor in that the donor concentration depends on the activation rate of the impurity element which serves as a donor.

Figure 63B:
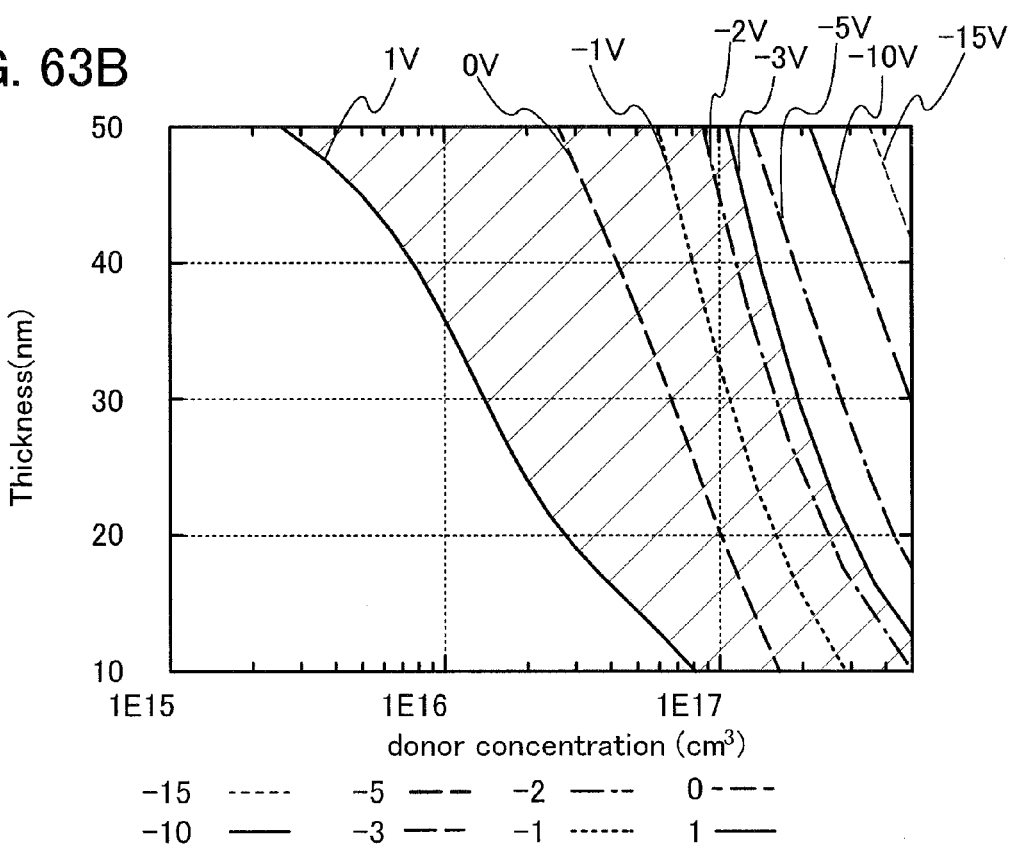

In FIG. 63B, a curve shows threshold voltage which is obtained when the thickness of the microcrystalline silicon film including the impurity element which serves as a donor is set to be from 10 nm to 50 nm and the donor concentration is set to be from $1 \times 10^{15}$ atoms/cm$^3$ to $5 \times 10^{17}$ atoms/cm$^3$ in the thin film transistor of Model 2 in Embodiment 5. The threshold voltage is from −3 V to 1 V inclusive according to the above requisites of the TFT characteristics; thus, when the thickness of the microcrystalline silicon film including the impurity element which serves as a donor is from 10 nm to 50 nm, the donor concentration which satisfies the above range is from $2 \times 10^{15}$ atoms/cm$^3$ to $5 \times 10^{17}$ atoms/cm$^3$. Note that the donor concentration is shown here, which is different from the concentration of the impurity element which serves as a donor in that the donor concentration depends on the activation rate of the impurity element which serves as a donor.

Therefore, when a thin film transistor in which a microcrystalline silicon film with a donor concentration of from $2\times10^{15}$ atoms/cm$^3$ to $5\times10^{17}$ atoms/cm$^3$ is used for a channel formation region is formed in a pixel portion and is used as a switching element of a liquid crystal element, a liquid crystal display device capable of quadruple frame rate display can be manufactured.

This application is based on Japanese Patent Application serial No. 2007-262738 filed with Japan Patent Office on Oct. 5, 2007 and Japanese Patent Application serial No. 2007-267075 filed with Japan Patent Office on Oct. 12, 2007, the entire contents of which are hereby incorporated by reference.

What is claimed is:

1. A thin film transistor comprising:
   a gate insulating film including an impurity element formed over a gate electrode;
   a microcrystalline semiconductor film formed over the gate insulating film;
   a buffer layer formed over the microcrystalline semiconductor film; and
   a pair of semiconductor films formed over the buffer layer, wherein the impurity element serves as a donor.

2. The thin film transistor according to claim 1, wherein the impurity element is phosphorus, arsenic, or antimony.

3. The thin film transistor according to claim 1, wherein a peak concentration of the impurity element in the gate insulating film obtained by secondary ion mass spectrometry (SIMS) is greater than or equal to $6\times10^{15}$ atoms/cm$^3$ and less than or equal to $3\times10^{18}$ atoms/cm$^3$.

4. A thin film transistor comprising:
   a gate insulating film formed over a gate electrode;
   a microcrystalline semiconductor film including an impurity element formed over the gate insulating film;
   a buffer layer formed over the microcrystalline semiconductor film; and
   a pair of semiconductor films formed over the buffer layer, wherein the impurity element serves as a donor.

5. The thin film transistor according to claim 4, wherein the impurity element is phosphorus, arsenic, or antimony.

6. The thin film transistor according to claim 4, wherein a peak concentration of the impurity element in the microcrystalline semiconductor film obtained by secondary ion mass spectrometry (SIMS) is greater than or equal to $6\times10^{15}$ atoms/cm$^3$ and less than or equal to $3\times10^{18}$ atoms/cm$^3$.

7. A thin film transistor comprising:
   a gate insulating film formed over a gate electrode;
   a first microcrystalline semiconductor film including an impurity element formed over the gate insulating film;
   a second microcrystalline semiconductor film formed over the first microcrystalline semiconductor film;
   a buffer layer formed over the second microcrystalline semiconductor film; and
   a pair of semiconductor films formed over the buffer layer, wherein the impurity element serves as a donor.

8. The thin film transistor according to claim 7, wherein the impurity element is phosphorus, arsenic, or antimony.

9. The thin film transistor according to claim 7, wherein a peak concentration of the impurity element in the first microcrystalline semiconductor film obtained by secondary ion mass spectrometry (SIMS) is greater than or equal to $6\times10^{15}$ atoms/cm$^3$ and less than or equal to $3\times10^{18}$ atoms/cm$^3$.

10. The thin film transistor according to claim 7, wherein the second microcrystalline semiconductor film does not include the impurity element which serves as a donor at a higher concentration than a detection limit of secondary ion mass spectrometry (SIMS).

11. The thin film transistor according to claim 7, wherein the first microcrystalline semiconductor film includes the impurity element at a higher concentration than the second microcrystalline semiconductor film.

12. A thin film transistor comprising:
    a gate insulating film including a first impurity element formed over a gate electrode;
    a microcrystalline semiconductor film including a second impurity element formed over the gate insulating film;
    a buffer layer formed over the microcrystalline semiconductor film; and
    a pair of semiconductor films formed over the buffer layer, wherein the first impurity element and the second impurity element serve as a donor.

13. The thin film transistor according to claim 12, wherein each of the first impurity element and the second impurity element is phosphorus, arsenic, or antimony.

14. The thin film transistor according to claim 12, wherein a peak concentration of the first impurity element in the gate insulating film and a peak concentration of the second impurity element in the microcrystalline semiconductor film, each obtained by secondary ion mass spectrometry (SIMS) are greater than or equal to $6\times10^{15}$ atoms/cm$^3$ and less than or equal to $3\times10^{18}$ atoms/cm$^3$.

15. A display device comprising a pixel electrode which is electrically connected to the thin film transistor according to any one of claims 1, 4, 7 and 12.

* * * * *